US012207571B2

(12) United States Patent
Nishikawa et al.

(10) Patent No.: US 12,207,571 B2
(45) Date of Patent: Jan. 21, 2025

(54) INTERCONNECT STRUCTURE OF SEMICONDUCTOR DEVICE

(71) Applicant: Panasonic Intellectual Property Management Co., Ltd., Osaka (JP)

(72) Inventors: Asami Nishikawa, Osaka (JP); Satoshi Shibata, Osaka (JP); Yu Nishitani, Osaka (JP); Tetsuya Asano, Nara (JP); Takuji Tsujita, Osaka (JP); Yuta Sugimoto, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 792 days.

(21) Appl. No.: 17/007,382

(22) Filed: Aug. 31, 2020

(65) Prior Publication Data

US 2021/0050513 A1 Feb. 18, 2021

Related U.S. Application Data

(63) Continuation-in-part of application No. PCT/JP2019/026877, filed on Jul. 5, 2019.

(30) Foreign Application Priority Data

Mar. 4, 2019 (JP) ................................. 2019-038864
Jun. 28, 2019 (JP) ................................. 2019-122061

(51) Int. Cl.
*H10N 70/20* (2023.01)
*G01R 27/14* (2006.01)
(Continued)

(52) U.S. Cl.
CPC ............. *H10N 70/24* (2023.02); *G01R 27/14* (2013.01); *H10B 63/80* (2023.02);
(Continued)

(58) Field of Classification Search
CPC ..................................................... H01L 23/528
See application file for complete search history.

(56) References Cited

U.S. PATENT DOCUMENTS

2006/0187701 A1\* 8/2006 Liaw ................... G11C 13/0011
  365/148
2011/0140068 A1\* 6/2011 Ozawa ................... H10B 63/22
  257/4

(Continued)

FOREIGN PATENT DOCUMENTS

| JP | 2015-12049 | 1/2015 |
| JP | 2017-25403 | 2/2017 |
| JP | 2017-199825 | 11/2017 |

OTHER PUBLICATIONS

International Search Report (ISR) issued on Oct. 1, 2019 in International (PCT) Application No. PCT/JP2019/026877.

(Continued)

*Primary Examiner* — Moazzam Hossain
*Assistant Examiner* — Hajar Kolahdouzan
(74) *Attorney, Agent, or Firm* — Wenderoth, Lind & Ponack, L.L.P.

(57) ABSTRACT

An interconnect structure includes: an interconnect layer containing a metal element as a main component and extending in a direction; a metal layer opposite to the interconnect layer, and a solid electrolyte layer between the interconnect layer and the metal layer. The solid electrolyte layer encloses the interconnect layer at least in a cross-sectional view taken along a plane orthogonal to the direction. The interconnect layer and the metal layer are electrically insulated from each other by the solid electrolyte layer.

18 Claims, 78 Drawing Sheets

(51) Int. Cl.
*H10B 63/00* (2023.01)
*H10N 70/00* (2023.01)

(52) U.S. Cl.
CPC ......... *H10N 70/023* (2023.02); *H10N 70/063* (2023.02); *H10N 70/066* (2023.02); *H10N 70/245* (2023.02); *H10N 70/841* (2023.02); *H10N 70/8836* (2023.02)

(56) References Cited

U.S. PATENT DOCUMENTS

| | | | |
|---|---|---|---|
| 2015/0084157 A1* | 3/2015 | Tegen | H01M 10/4257 257/528 |
| 2016/0309596 A1 | 10/2016 | Shaviv et al. | |
| 2017/0005358 A1 | 1/2017 | Nakai et al. | |
| 2017/0005365 A1 | 1/2017 | Nakai et al. | |
| 2018/0006327 A1* | 1/2018 | Shibata | C23C 16/45531 |

OTHER PUBLICATIONS

D. Daghero, et al., "Large Conductance Modulation of Gold Thin Films by Huge Charge Injection via Electrochemical Gating", Physical Review Letters, vol. 108, Issue 6, 066807, Feb. 2012.

Takashi Tsuchiya, et al., "Modulation of superconducting critical temperature in niobium film by using all-solid-state electric-double-layer transistor", Applied Physics Letters, vol. 107, Issue 1, 013104, 2015.

Kou Ho, et al., "Electric-field-induced insulator-to-metal transition in large-area $MoS_2$ monolayers", Proceedings of the 78th Japan Society of Applied Physics (JSAP) Autumn Meeting, 2017, 6p-C16-12, with English translation.

Xiaohua Yu, et al., "A Stable Thin-Film Lithium Electrolyte: Lithium Phosphorus Oxynitride", Journal of the Electrochemical Society, vol. 144, No. 2, Feb. 1997, pp. 524-532.

* cited by examiner

[p-type]

[n-type]

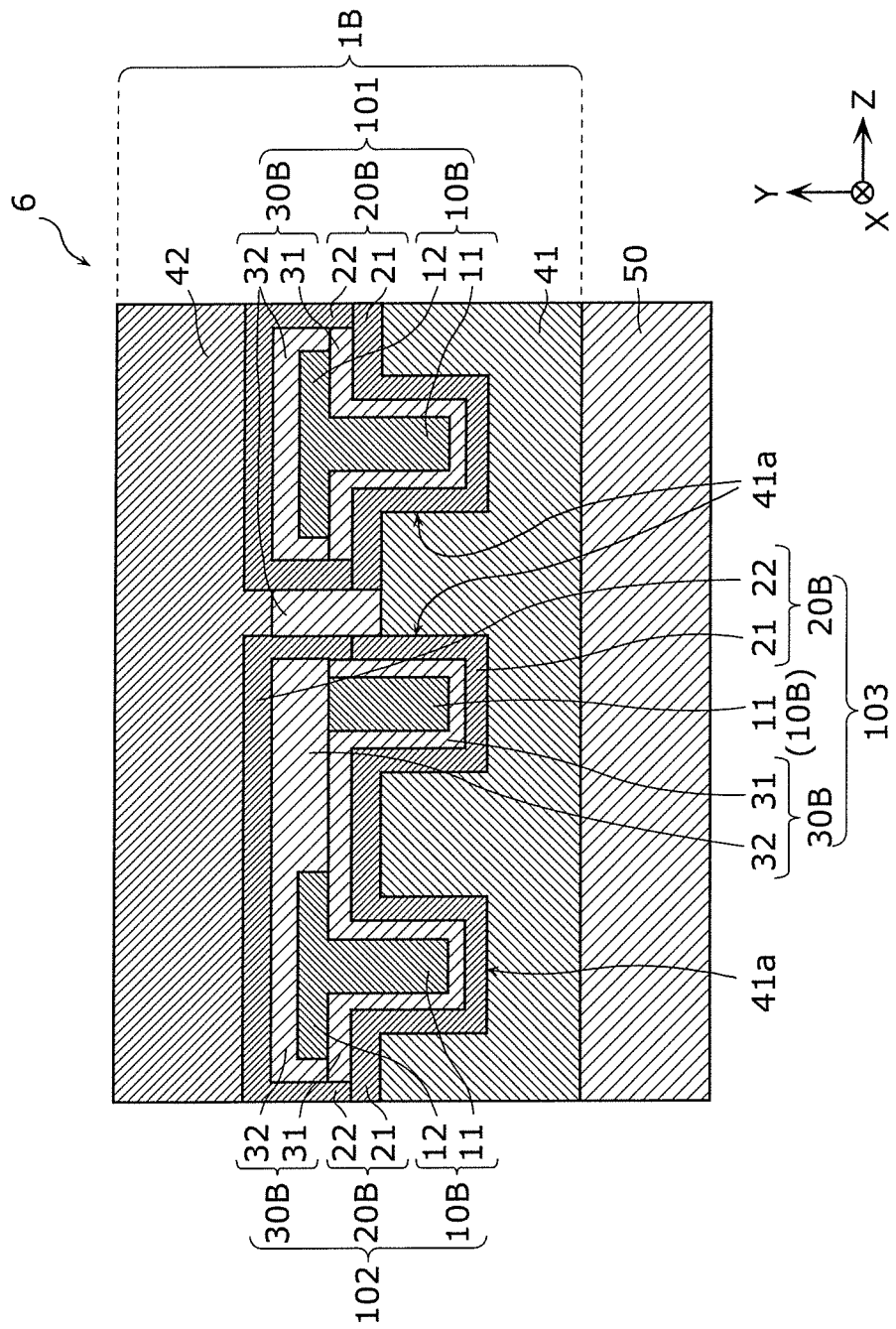

INTERCONNECT STRUCTURE OF SEMICONDUCTOR DEVICE

CROSS REFERENCE TO RELATED APPLICATIONS

This application is a continuation-in-part of PCT International Application No. PCT/JP2019/026877 filed on Jul. 5, 2019, designating the United States of America, which is based on and claims priority of Japanese Patent Application No. 2019-038864 filed on Mar. 4, 2019 and Japanese Patent Application No. 2019-122061 filed on Jun. 28, 2019. The entire disclosures of the above-identified applications, including the specifications, drawings and claims are incorporated herein by reference in their entirety.

FIELD

The present disclosure relates to an interconnect structure, a semiconductor device, a method of operating an active element, a method of manufacturing the interconnect structure, a method of using the interconnect structure, a method of controlling the interconnect resistance of the interconnect structure, a method of evaluating the interconnect structure, a method of evaluating a device, a method of driving the device, and an evaluation device, for example.

BACKGROUND

Patent Literature (PTL) 1 discloses a method of forming a cobalt interconnect made of cobalt (Co).

CITATION LIST

Patent Literature

PTL 1: United States Patent Application Publication No. 2016/0309596

SUMMARY

Technical Problem

In semiconductor devices such as semiconductor integrated circuit devices, passive elements such as capacitors or resistors are, together with active elements such as transistors or diodes, formed as circuit elements by semiconductor microfabrication. In addition, in the semiconductor devices, interconnects for connecting these circuit elements together are also formed by the semiconductor microfabrication.

In recent years, miniaturization in the interconnects are required in accordance with further miniaturization in the semiconductor devices. However, a miniaturization in the interconnects increases the resistance values of the interconnects.

It is an objective of the present disclosure to provide an interconnect structure and a semiconductor device, for example, capable of reducing an increase in the resistance value of an interconnect layer caused by the miniaturization.

Solution to Problem

An interconnect structure according to one aspect of the present disclosure includes: an interconnect layer containing a metal element as a main component and extending in a direction; a metal layer opposite to the interconnect layer; and a solid electrolyte layer between the interconnect layer and the metal layer, the solid electrolyte layer enclosing the interconnect layer at least in a cross-sectional view taken along a plane orthogonal to the direction. The interconnect layer and the metal layer are electrically insulated from each other by the solid electrolyte layer.

A semiconductor device according to one aspect of the present disclosure includes: a substrate; a transistor in the substrate; and the interconnect structure above the substrate.

One aspect of the present disclosure is directed to a method of operating an active element electrically connected to an interconnect structure. The interconnect structure includes: an interconnect layer containing metal as a main component and extending in a direction; a metal layer opposite to the interconnect layer; and a solid electrolyte layer between the interconnect layer and the metal layer, the solid electrolyte layer enclosing the interconnect layer in a cross-sectional view taken along a plane orthogonal to the direction. The method includes: electrically insulating the interconnect layer and the metal layer from each other by the solid electrolyte layer; electrically connecting the active element to the interconnect layer; and transmitting an electrical signal from the active element to the interconnect layer or from the interconnect layer to the active element with a voltage applied to the solid electrolyte layer.

One aspect of the present disclosure is directed to a method of manufacturing an interconnect structure. The method includes: forming a metal layer along an inner surface of a recess formed in an insulating layer and extending in a direction; forming a solid electrolyte layer to cover the metal layer and to not fill the recess; and forming a first interconnect layer to be enclosed by the solid electrolyte layer and to fill the recess. The first interconnect layer and the metal layer are electrically insulated from each other by the solid electrolyte layer.

One aspect of the present disclosure is directed to a method of using an interconnect structure. The interconnect structure includes: an interconnect layer containing metal as a main component and extending in a direction; a metal layer opposite to the interconnect layer; and a solid electrolyte layer between the interconnect layer and the metal layer, the solid electrolyte layer enclosing the interconnect layer in a cross-sectional view taken along a plane orthogonal to the direction. The method includes: electrically insulating the interconnect layer and the metal layer from each other by the solid electrolyte layer; and transmitting an electrical signal to the interconnect layer with a voltage applied to the solid electrolyte layer.

One aspect of the present disclosure is directed to a method of controlling an interconnect resistance of an interconnect structure. The interconnect structure includes: an interconnect layer containing metal as a main component and extending in a direction; a metal layer opposite to the interconnect layer; and a solid electrolyte layer between the interconnect layer and the metal layer, the solid electrolyte layer enclosing the interconnect layer in a cross-sectional view taken along a plane orthogonal to the direction. The method includes: electrically insulating the interconnect layer and the metal layer from each other by the solid electrolyte layer; and changing a voltage to be applied to the solid electrolyte layer to change a resistance value of the interconnect layer, Advantageous Effects The present disclosure achieves an interconnect structure, for example, capable of reducing an increase in the resistance value of an interconnect layer caused by miniaturization,

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 7 is a cross-sectional view showing configurations of an interconnect structure and a semiconductor device according to Aspect 3 of Embodiment 1.

FIG. 31B is a cross-sectional view of the interconnect structure according to Aspect 1 of Embodiment 4.

FIG. 31C is a cross-sectional view of the interconnect structure according to Aspect 1 of Embodiment 4 taken along line 31C-31C in FIG. 31B.

FIG. 32 shows configurations of an interconnect structure and a semiconductor device according to Aspect 2 of Embodiment 4.

FIG. 33 shows the configuration of the semiconductor device according to Aspect 2 of Embodiment 4.

FIG. 34 is a cross-sectional view showing configurations of an interconnect structure and a semiconductor device according to Aspect 3 of Embodiment 4.

FIG. 35 is a perspective view showing a configuration of an evaluation device according to Embodiment 5.

FIG. 36 is a flowchart for illustrating a method of evaluating an interconnect structure of the evaluation device according to Embodiment 5.

FIG. 37 shows a change in the resistance value of an interconnect layer of the evaluation device according to Embodiment 5 over time.

FIG. 38A shows an example of a normal interconnect structure (i.e., a normal interconnect).

FIG. 38B shows an example of an abnormal interconnect structure (i.e., an abnormal interconnect) in contrast to the normal interconnect.

FIG. 39 is a cross-sectional view showing a configuration of an evaluation device according to Variation 1 of Embodiment 5.

FIG. 40 is a cross-sectional view showing a configuration of an evaluation device according to Variation 2 of Embodiment 5.

Figure 41:
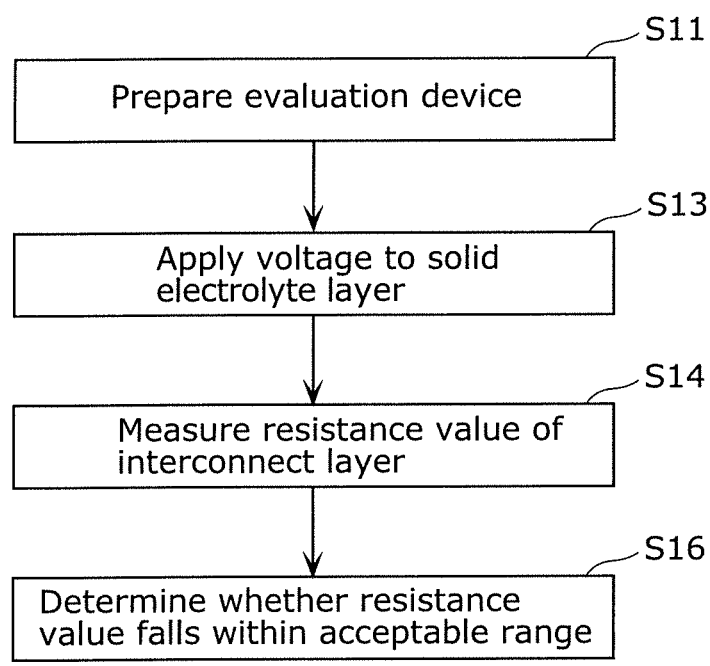

FIG. 41 is a flowchart for illustrating a method of evaluating an interconnect structure in an evaluation device according to Variation 3 of Embodiment 5.

Figure 42:
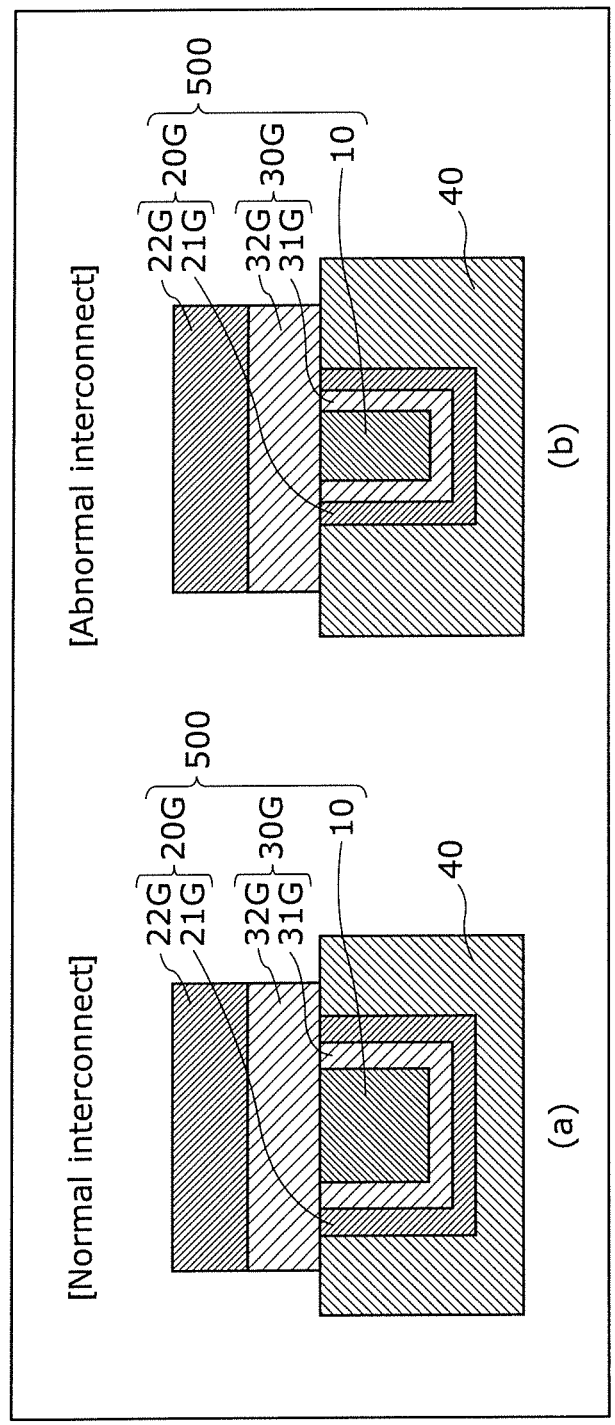

FIG. 42 shows an example of a normal interconnect passage (i.e., a normal interconnect) and an abnormal interconnect passage (i.e., an abnormal interconnect) in contrast to the normal interconnect.

Figure 43:
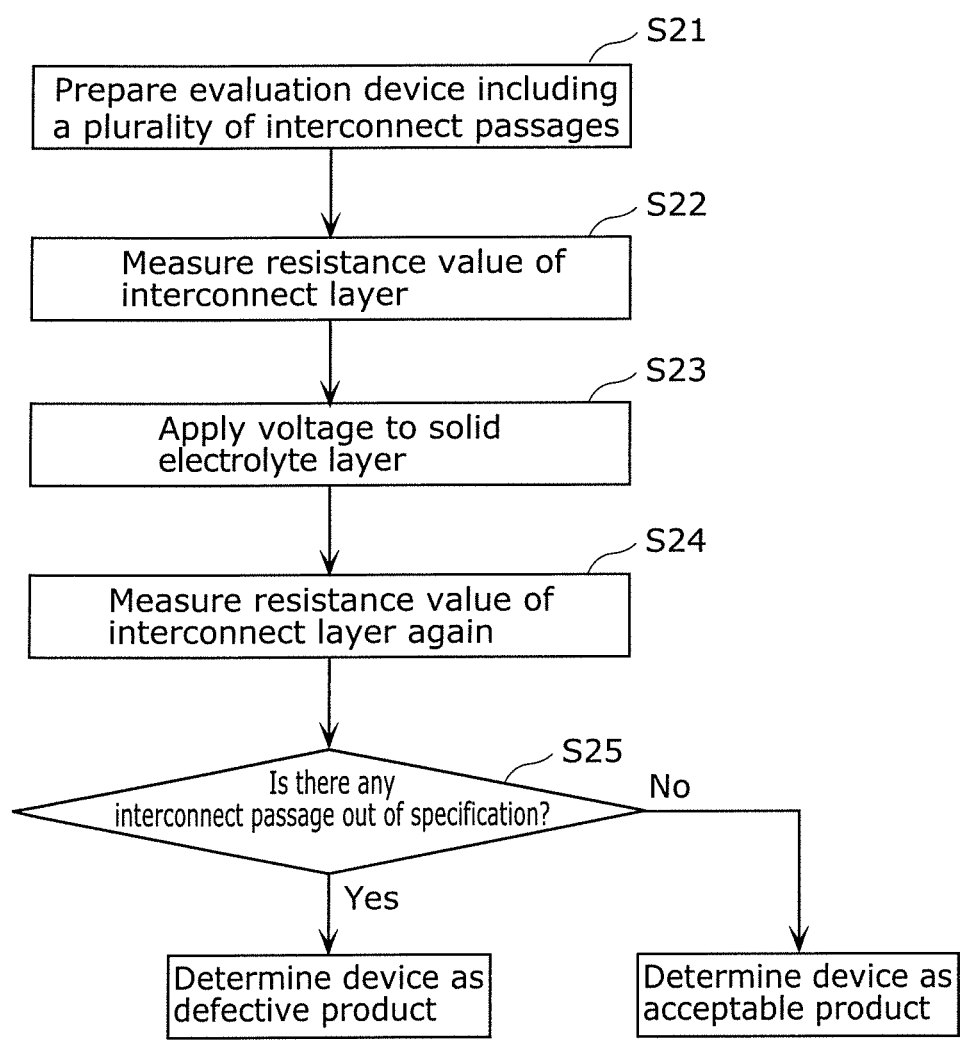

FIG. 43 is a flowchart for illustrating a method of evaluating a device according to Embodiment 5.

Figure 44:
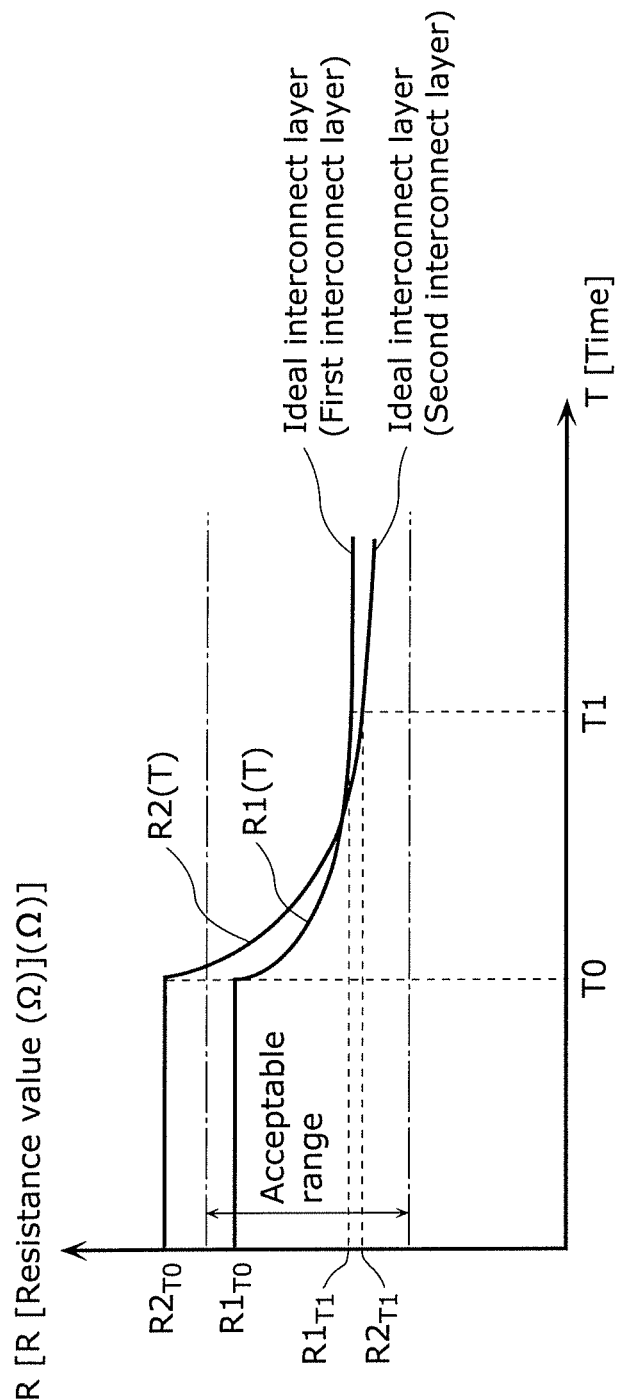

FIG. 44 shows changes in resistance values of interconnect layers in two interconnect passages of the device according to Embodiment 5 over time.

DESCRIPTION OF EMBODIMENTS

An interconnect structure according to one aspect of the present disclosure includes: an interconnect layer containing a metal element as a main component and extending in a direction; a metal layer opposite to the interconnect layer; and a solid electrolyte layer between the interconnect layer and the metal layer, the solid electrolyte layer enclosing the interconnect layer at least in a cross-sectional view taken along a plane orthogonal to the direction. The interconnect layer and the metal layer are electrically insulated from each other by the solid electrolyte layer.

With this configuration, upon application of a voltage to the solid electrolyte layer, ions move inside the solid electrolyte layer, which increases the electron concentration of the interconnect layer. Accordingly, the resistance value of the interconnect layer decreases, which reduces an increase in the resistance value of the interconnect layer caused by a decrease in the line width of the interconnect layer. Moreover, the resistance value decreases as compared to the interconnect structure without any solid electrolyte layer but with the same line width.

In the interconnect structure according to the aspect of the present disclosure, in the cross-sectional view, the interconnect layer may have a pair of side surfaces opposite to each other and a bottom surface. Both the metal layer and the solid electrolyte layer may be opposite to each of the pair of side surfaces and the bottom surface.

With this configuration, the interconnect structure is easily achieved which includes the interconnect layer whose cross-sectional shape has, like a rectangle, straight sides.

Alternatively, in the interconnect structure according to the aspect of the present disclosure, in the cross-sectional view, the interconnect layer may have a circular or oval shape.

With this configuration, the interconnect structure is easily achieved which includes the interconnect layer whose cross-sectional shape is circular or oval.

In this case, the interconnect layer may serve as a columnar contact plug.

With this configuration, the interconnect structure may serve as the contact plug used for, for example, an interlayer insulating layer, for example, of a semiconductor device.

In the interconnect structure according to the aspect of the present disclosure, in the cross-sectional view, an entire periphery of the interconnect layer may be covered by the solid electrolyte layer. In the cross-sectional view, an entire periphery of the solid electrolyte layer may be covered by the metal layer.

This configuration improves the advantage of the solid electrolyte layer of reducing the resistance value of the interconnect layer, which further reduces an increase in the resistance value of the interconnect layer caused by a decrease in the line width.

In the interconnect structure according to the aspect of the present disclosure, in the cross-sectional view, an entire periphery of the interconnect layer may be covered by a first insulating layer. In the cross-sectional view, an entire periphery of the first insulating layer may be covered by the solid electrolyte layer. In the cross-sectional view, an entire periphery of the solid electrolyte layer may be covered by the metal layer.

This configuration reduces electron leakage from the interconnect layer. In particular, the electron leakage tends to occur from an interconnect layer with a smaller line width. However, the provided first insulating layer efficiently reduces the electron leakage.

Alternatively, in the interconnect structure according to the aspect of the present disclosure, in the cross-sectional view, an entire periphery of the interconnect layer may be covered by the solid electrolyte layer. In the cross-sectional view, an entire periphery of the solid electrolyte layer may be covered by a second insulating layer. In the cross-sectional view, an entire periphery of the second insulating layer may be covered by the metal layer.

This configuration reduces electron leakage from the interconnect layer. In particular, the electron leakage tends to occur from an interconnect layer with a smaller line width. However, the provided second insulating layer efficiently reduces the electron leakage.

Alternatively, in the interconnect structure according to the aspect of the present disclosure, in the cross-sectional view, an entire periphery of the interconnect layer may be covered by a first insulating layer. In the cross-sectional view, an entire periphery of the first insulating layer may be covered by the solid electrolyte layer. In the cross-sectional view, an entire periphery of the solid electrolyte layer may be covered by a second insulating layer. In the cross-sectional view, an entire periphery of the second insulating layer may be covered by the metal layer.

This configuration efficiently reduces electron leakage from the interconnect layer. In particular, the electron leakage tends to occur from an interconnect layer with a smaller line width. However, the provided first and second insulating layers efficiently reduce the electron leakage, as compared to the configuration with only one of the first and second insulating layers.

The interconnect structure according to the aspect of the present disclosure may further include: an insulating layer covering an outer periphery of the metal layer.

With this configuration, the interconnect structure is achieved in which the interconnect passage including the interconnect layer, the metal layer, and the solid electrolyte layer is buried in the insulating layer.

In the interconnect structure according to the aspect of the present disclosure, in the cross-sectional view, a ratio of a thickness of the solid electrolyte layer to a thickness of the interconnect layer may be higher than $1/4$.

In the interconnect structure according to the aspect of the present disclosure, in the cross-sectional view, a sum of thicknesses of the solid electrolyte layer and the interconnect layer may be 20 nm or less.

In the interconnect structure according to the aspect of the present disclosure, in the cross-sectional view, the interconnect layer may have a width of 10 nm or less.

These configurations further improve the advantage of the solid electrolyte layer of reducing the resistance value of the interconnect layer, which further reduces an increase in the resistance value of the interconnect layer caused by a decrease in the line width.

In the interconnect structure according to the aspect of the present disclosure, in the cross-sectional view, the solid electrolyte layer may have a width of 5 nm or more.

This configuration reduces electron leakage.

In the interconnect structure according to the aspect of the present disclosure, ions move inside the solid electrolyte layer upon application of a voltage to the solid electrolyte layer. The ions may be at least one selected from the group consisting of proton ions, silver ions, copper ions, lithium ions, nickel ions, magnesium ions, iron ions, cobalt ions, and manganese ions.

With this configuration, the cations move inside the solid electrolyte layer upon application of a voltage to the solid electrolyte layer, which increases the electron concentration of the interconnect layer. Accordingly, the resistance value of the interconnect layer decreases, which reduces an increase in the resistance value of the interconnect layer caused by a decrease in the line width.

In the interconnect structure according to the aspect of the present disclosure, ions move inside the solid electrolyte layer upon application of a voltage to the solid electrolyte layer. The ions may be at least one selected from the group consisting of hydride ions, hydroxide ions, fluoride ions, chloride ions, bromide ions, iodide ions, and oxygen ions.

With this configuration, the anions move inside the solid electrolyte layer upon application of a voltage to the solid electrolyte layer, which increases the electron concentration of the interconnect layer. Accordingly, the resistance value of the interconnect layer decreases, which reduces an increase in the resistance value of the interconnect layer caused by a decrease in the line width.

In the interconnect structure according to the aspect of the present disclosure, the solid electrolyte layer may be made of at least one material selected from a group consisting of lithium phosphorus oxynitride and magnesium phosphorous oxynitride.

This configuration facilitates formation of the solid electrolyte layer by atomic layer deposition with a uniform film thickness. Accordingly, the advantage of the solid electrolyte layer of reducing the resistance value of the interconnect layer further improves, which further reduces an increase in the resistance value of the interconnect layer caused by a decrease in the line width.

In the interconnect structure according to the aspect of the present disclosure, the interconnect layer may be made of a material containing cobalt. The solid electrolyte layer may be made of a material containing lithium phosphorus oxynitride.

This configuration allows the solid electrolyte layer to sufficiently exhibit the advantage of reducing the resistance value of the interconnect layer.

A semiconductor device according to one aspect of the present disclosure includes: a substrate; a transistor in the substrate; and any of the interconnect structures described above, above the substrate.

With this configuration, the semiconductor device is achieved which has the interconnect structure including the interconnect layer whose resistance value decreases during the operation.

The semiconductor device according to the aspect of the present disclosure may further include: an interlayer insulating layer above the interconnect structure; and another interconnect layer in the interlayer insulating layer, the other interconnect layer having a larger line width than the interconnect layer of the interconnect structure and being made of a different material from the interconnect layer.

With this configuration, the semiconductor device including the interconnect layers is achieved. One of the interconnect layers includes the solid electrolyte layer and thus has a reduced resistance, whereas the other includes no solid electrolyte layer but has a low resistance.

One aspect of the present disclosure is directed to a method of operating an active element electrically connected to an interconnect structure. The interconnect structure includes: an interconnect layer containing metal as a main component and extending in a direction; a metal layer opposite to the interconnect layer; and a solid electrolyte layer between the interconnect layer and the metal layer, the solid electrolyte layer enclosing the interconnect layer in a cross-sectional view taken along a plane orthogonal to the direction. The method includes: electrically insulating the interconnect layer and the metal layer from each other by the solid electrolyte layer; electrically connecting the active element to the interconnect layer; and transmitting an electrical signal from the active element to the interconnect layer or from the interconnect layer to the active element with a voltage applied to the solid electrolyte layer.

This configuration reduces the resistance of the interconnect layer of the interconnect structure and transmits electrical signals without delay via the interconnect layer with the reduced resistance.

In the method of operating the active element according to the aspect of the present disclosure, a first voltage may be applied to the interconnect layer. A second voltage higher than the first voltage may be applied to the metal layer.

With this configuration, cations move toward the interconnect layer of the solid electrolyte layer, which reduces the resistance values of the interconnect layer.

One aspect of the present disclosure is directed to a method of manufacturing an interconnect structure. The method includes: forming a metal layer along an inner surface of a recess formed in an insulating layer and extending in a direction; forming a solid electrolyte layer to cover the metal layer and to not fill the recess; and forming a first interconnect layer to be enclosed by the solid electrolyte layer and to fill the recess. The first interconnect layer and the metal layer are electrically insulated from each other by the solid electrolyte layer.

This method provides the interconnect structure in which the interconnect passage including the solid electrolyte layer between the first interconnect layer and the metal layer that extend in the direction is buried in the recess of the insulating layer.

In the method of manufacturing the interconnect structure according to the aspect of the present disclosure, in the forming of the solid electrolyte layer, the solid electrolyte layer may be formed by atomic layer deposition.

This method facilitates formation of the solid electrolyte layer with a uniform film thickness even on an uneven underlying structure.

The method of manufacturing the interconnect structure according to the aspect of the present disclosure may further include: forming an interlayer insulating layer above the interconnect structure; and forming a second interconnect layer in the interlayer insulating layer, the second interconnect layer having a larger line width than the first interconnect layer of the interconnect structure and made of a different material from the first interconnect layer.

This method allows formation, on the interconnect structure, of the interlayer insulating layer including the second interconnect layer with a lower resistance than the interconnect layer of the interconnect structure.

The method of manufacturing the interconnect structure according to the aspect of the present disclosure may further include: forming a contact hole in the insulating layer; and forming a columnar contact plug in the contact hole.

This method allows manufacture of the interconnect structure with the columnar contact hole.

The present disclosure may be implemented as a method of using an interconnect structure. Specifically, one aspect of the present disclosure is directed to a method of using any of the interconnect structures described above. An electrical signal is transmitted to the interconnect layer with a voltage applied to the solid electrolyte layer.

The present disclosure may be implemented as a method of controlling an interconnect resistance of an interconnect structure. Specifically, one aspect of the present disclosure is directed to a method of controlling the interconnect resistance of any of the interconnect structures described above. A voltage to be applied to the solid electrolyte layer is changed to change a resistance value of the interconnect layer.

One aspect of the present disclosure is directed to a method of evaluating an interconnect structure. The interconnect structure includes: an interconnect layer; a solid electrolyte layer covering at least a part of the interconnect layer; and an electrode opposite to the interconnect layer with the solid electrolyte layer interposed therebetween. The method includes: applying a voltage to the solid electrolyte layer; and measuring a resistance value of the interconnect layer to evaluate the interconnect structure.

According to this method, the resistance value of the interconnect layer is changed by applying a voltage to the solid electrolyte layer. The resistance value of the interconnect layer is measured to evaluate the interconnect structure as an interconnect. For example, the resistance (i.e., the interconnect resistance) of the interconnect structure can be evaluated.

In addition, the method of evaluating the interconnect structure according to the aspect of the present disclosure may further include: measuring, as a first resistance value, the resistance value of the interconnect layer; then, applying another voltage to the solid electrolyte layer; then, measuring, as a second resistance value, the resistance value of the interconnect layer again; then, calculating a difference between the first resistance value and the second resistance value; and then, determining whether the difference falls within an acceptable range to evaluate the interconnect structure.

This method allows evaluation of the interconnect structure as an interconnect based on the difference between the resistance values of the interconnect layer measured twice.

One aspect of the present disclosure is directed to a method of evaluating a device including a plurality of interconnect passages, each including: an interconnect layer; a solid electrolyte layer covering at least a part of the interconnect layer; and an electrode opposite to the interconnect layer with the solid electrolyte layer interposed therebetween. The method includes: applying a voltage to the solid electrolyte layer; measuring a resistance value of the interconnect layer; and determining whether each of the plurality of interconnect passages falls within a specification to evaluate the device.

This method provides a highly reliable device which includes the plurality of interconnect passages whose resistance values (i.e., interconnect resistances) less differ from each other.

In addition, one aspect of the present disclosure is directed to a method of driving a device including a plurality of interconnect passages, each including: an interconnect layer; a solid electrolyte layer covering at least a part of the interconnect layer; and an electrode opposite to the interconnect layer with the solid electrolyte layer interposed therebetween. The method includes: applying a voltage to the solid electrolyte layer; measuring a resistance value of the interconnect layer; determining whether each of the plurality of interconnect passages falls within a specification; and driving the device upon determination that the plurality of interconnect passages fall within the specification.

In this manner, assume that the device includes the plurality of interconnect passages, each including the interconnect layer, the solid electrolyte layer, and the electrode. The device includes an interconnect passage that has initially fallen out of a design value. Even in the device, the resistance value of the interconnect layer of the interconnect passage is changed by applying the voltage to the solid electrolyte layer. After determination that the plurality of interconnect passages fall within the specification, the device is driven. As a result, the device can be obtained which includes the plurality of interconnect passages whose resistance values less differ from each other.

In addition, an evaluation device according to one aspect of the present disclosure includes: an interconnect structure including: an interconnect layer; a solid electrolyte layer covering at least a part of the interconnect layer; and an electrode opposite to the interconnect layer with the solid electrolyte layer interposed therebetween. Through application of voltages to the interconnect layer and the electrode, a voltage is applied to the solid electrolyte layer.

With this configuration, the resistance value of the interconnect layer is changed by applying the voltage to the solid electrolyte layer. Accordingly, the evaluation device can be provided whose interconnect structure can be evaluated as an interconnect. For example, an evaluation device can be provided whose resistance (i.e., the interconnect resistance) of an interconnect structure can be evaluated.

In addition, in the evaluation device according to the aspect of the present disclosure, at least a part of the electrode may enclose the interconnect layer.

This configuration facilitates application of a voltage to the solid electrolyte layer between the interconnect layer and the electrode to easily change the resistance value of the interconnect layer. Accordingly, the interconnect structure can be evaluated as an interconnect more accurately.

In addition, the evaluation device according to the aspect of the present disclosure, the electrode may include a first metal layer and a second metal layer. The solid electrolyte layer may include a first solid electrolyte layer and a second solid electrolyte layer. The first solid electrolyte layer may enclose the interconnect layer. The first metal layer may enclose the interconnect layer and the first solid electrolyte layer. The second solid electrolyte layer may be interposed between the interconnect layer and the second metal layer.

This configuration facilitates application of voltages to the first solid electrolyte layer and the second solid electrolyte layer to easily change the resistance value of the interconnect layer.

In addition, the evaluation device according to the aspect of the present disclosure, the interconnect layer may include a plurality of interconnect layers. The second metal layer may include a plurality of second metal layers in one-to-one correspondence to the plurality of interconnect layers.

This configuration allows evaluation on the evaluation device including the plurality of interconnect layers.

EMBODIMENTS

Now, embodiments of the present disclosure will be described with reference to the drawings. Note that the embodiments described below are mere comprehensive or specific examples of the present disclosure. The numerical values, shapes, materials, constituent elements, the arrangement and connection of the constituent elements, steps, step orders etc, shown in the following embodiments are thus mere examples, and are not intended to limit the scope of the present disclosure. Among the constituent elements in the following embodiments, those not recited in any of the independent claims defining the broadest concept of the present disclosure are described as optional constituent elements.

The figures are schematic representations and not necessarily drawn strictly to scale. The scales are thus not necessarily the same in the figures. In the figures, substantially the same constituent elements are assigned with the same reference marks, and redundant descriptions will be omitted or simplified.

In the specification and drawings, the X-, Y-, and Z-axes correspond to three axes of the three-dimensional orthogonal coordinate system. The X- and Y-axes are orthogonal to each other and to the Z-axis. In this embodiment, an interconnect structure and an interconnect layer(s) extend in a direction, namely, along the X-axis.

Embodiment 1

[Configurations of Interconnect Structure and Semiconductor Device]

Figure 1A:
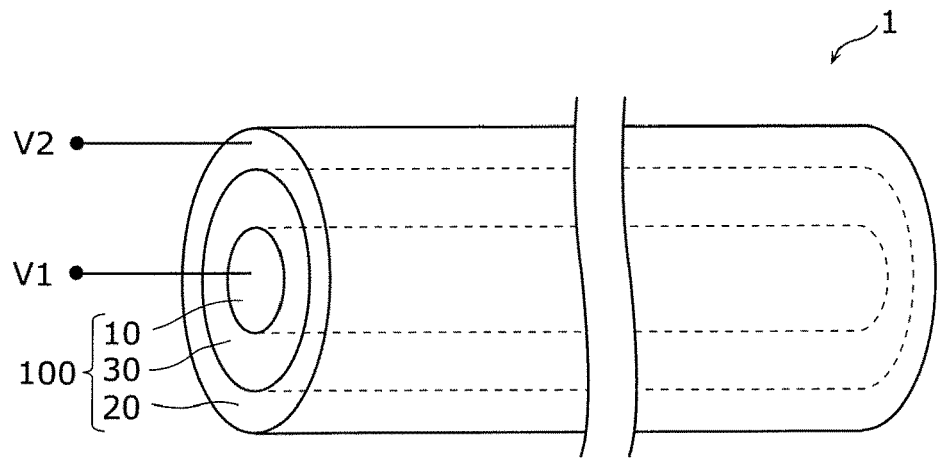
FIG. 1A schematically shows a configuration of an interconnect structure according to Aspect 1 of Embodiment 1.
Figure 1B:
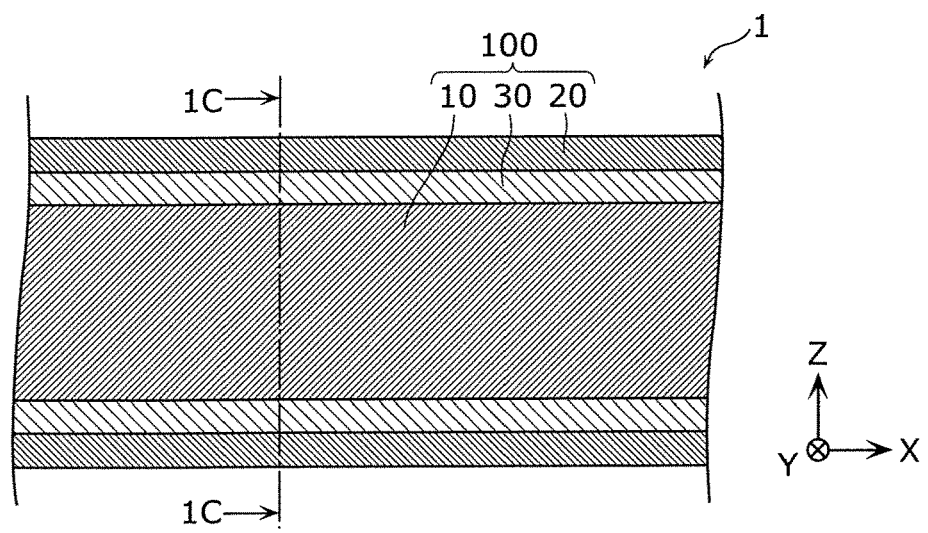
FIG. 1B is a cross-sectional view of the interconnect structure according to Aspect 1 of Embodiment 1.
Figure 1C:
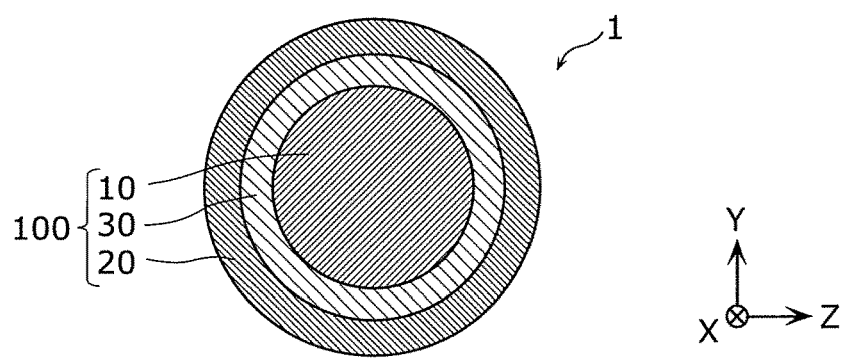
FIG. 1C is a cross-sectional view of the interconnect structure according to Aspect 1 of Embodiment 1 taken along line 1C-1C in FIG. 1B.

First, a configuration of interconnect structure 1 according to Aspect 1 of Embodiment 1 will be described with reference to FIGS. 1A to 1C. FIG. 1A schematically shows the configuration of interconnect structure 1 according to Aspect 1 of Embodiment 1. FIG. 1B is a cross-sectional view of this interconnect structure 1. FIG. 1C is a cross-sectional view of this interconnect structure 1 taken along line 1C-1C in FIG. 1B.

Interconnect structure 1 according to this embodiment is used in a semiconductor device such as a semiconductor integrated circuit device, for example. Specifically, interconnect structure 1 includes interconnect passage 100 for electrically connecting circuit elements in the semiconductor device. Accordingly, interconnect passage 100 of interconnect structure 1 transmits electrical signals.

As shown in FIGS. 1A to 1C, interconnect passage 100 of interconnect structure 1 is in the shape of a line extending in a direction (e.g., along the X-axis in this embodiment). In this case, interconnect passage 100 is, for example, a single straight passage in the shape of a straight line. As long as including a straight portion extending in a direction, the shape of interconnect passage 100 is not limited thereto and interconnect passage 100 may bend partially. Interconnect passage 100 may have a shape (i.e., an interconnect pattern) of a known interconnect passage used in a semiconductor integrated circuit device. Alternatively, interconnect passage 100 may include a curving portion.

As shown in FIGS. 1A to 1C, interconnect structure 1 includes interconnect layer 10, metal layer 20 opposite to interconnect layer 10, and solid electrolyte layer 30 between interconnect layer 10 and metal layer 20. Interconnect passage 100 includes interconnect layer 10, metal layer 20, and solid electrolyte layer 30. In this embodiment, interconnect structure 1 is interconnect passage 100 itself.

In interconnect passage 100, interconnect layer 10 functions as a signal line for mainly transmitting the electrical signals. Interconnect layer 10 is an interconnect containing a metal element as a main component. The metal element of interconnect layer 10 is at least one selected from the group consisting of cobalt (Co), tungsten (W), copper (Cu), and ruthenium (Ru). In this embodiment, interconnect layer 10 is made of a metal material containing cobalt.

Interconnect layer 10 has a long size extending in a direction (e.g., along the X-axis in this embodiment). Interconnect layer 10 forms the main shape of interconnect structure 1. Accordingly, interconnect layer 10 is in a straight line, as an example, but may bend partially as long as including a straight portion extending in a direction.

Metal layer 20 is made of a material containing a metal element as a main component. Specifically, metal layer 20 is made of at least one selected from the group consisting of titanium nitride (TiN), lithium cobalt oxide ($LiCoO_3$), lithium manganate ($LiMn_2O_4$), lithium chromate ($LiCrO_2$), silver tungstate ($Ag_2WO_4$), copper tungstate ($CuWO_4$), and lithium tungstate ($Li_2WO_4$). In this embodiment, metal layer 20 is made of titanium nitride (TiN). Note that the material of metal layer 20 is not limited thereto and may be a material containing, as a main component, any one of platinum, gold, iridium, tungsten, ruthenium, palladium, and rhodium.

The shape of metal layer 20 is not particularly limited as long as being opposite to interconnect layer 10. In this embodiment, metal layer 20 extends in the direction (i.e., along the X-axis in this embodiment) like interconnect layer 10.

In a cross-sectional view taken along the plane (i.e., the YZ cross section in this embodiment and hereinafter referred to as the "YZ cross section") orthogonal to the direction in which at least interconnect layer 10 extends, metal layer 20 encloses interconnect layer 10 and solid electrolyte layer 30. That is, metal layer 20 only needs to surround parts of interconnect layer 10 and solid electrolyte layer 30 in the YZ cross section. Specifically, metal layer 20 covers entire interconnect layer 10 and entire solid electrolyte layer 30 in the cross-sectional view taken along the YZ cross section. That is, metal layer 20 surrounds entire interconnect layer 10 and entire solid electrolyte layer 30 in the YZ cross section. While metal layer 20 serves as the outermost shell of interconnect passage 100 in this embodiment, the configuration is not limited thereto.

Solid electrolyte layer 30 is made of at least one material selected from the group consisting of lithium phosphorus oxynitride (LiPON) and magnesium phosphorous oxynitride (MgPON). In this embodiment, solid electrolyte layer 30 is made of a material containing LiPON. Specifically, solid electrolyte layer 30 is made only of LiPON. The LiPON has a non-crystalline, amorphous structure.

The material of solid electrolyte layer 30 is not limited thereto. For example, solid electrolyte layer 30 may be made of at least one material selected from the group consisting of polyethylene glycol, polyethylene oxide, polyvinylpyrrolidone, polyacrylonitrile, polyvinylidene fluoride, and polymethyl methacrylate.

Alternatively, solid electrolyte layer 30 may be made a polymer electrolyte made of a polymer containing metal salt. In this case, the metal salt may be silver salt, copper salt, nickel salt, magnesium salt, iron salt, cobalt salt, or manganese salt. The polymer may be polyethylene glycol, polyethylene oxide, polyvinylpyrrolidone, polyacrylonitrile, polyvinylidene fluoride, or polymethyl methacrylate.

Solid electrolyte layer 30 may be made of silver iodide (AgI), copper iodide (CuI), lithium iodide (LiI), silver bromide (Agar), copper bromide (CuBr), lithium bromide (LiBr), or rubidium silver iodide (RbAg$_4$I$_5$).

Alternatively, solid electrolyte layer 30 may be made of germanium sulfide (GeS), silver sulfide (Ag$_2$S), copper sulfide (Cu$_2$S), germanium selenide (GeSe), silver selenide (Ag$_2$Se), copper selenide (Cu$_2$Se), germanium telluride (GeTe), antimony telluride (SbTe), or germanium antimony telluride (GeSbTe).

Alternatively, solid electrolyte layer 30 may be made of a crystal. In this case, the crystal may be a silicon dioxide (SiO$_2$) crystal, an aluminum oxide (Al$_2$O$_3$) crystal, an yttrium oxide (Y$_2$O$_3$) crystal, a lanthanum oxide (La$_2$O$_3$), a tantalum pentoxide (Ta$_2$O$_5$) crystal, a tungsten oxide (WO$_3$) crystal, a hafnium dioxide (HfO$_2$) crystal, a titanium dioxide (TiO$_2$) crystal, a vanadium pentoxide (V$_2$O$_5$) crystal, a zirconium dioxide (ZrO$_2$) crystal, or a strontium titanate (SrTiO$_3$) crystal.

Upon application of a voltage to solid electrolyte layer 30, ions of the material(s) of solid electrolyte layer 30 move inside solid electrolyte layer 30. Specifically, if solid electrolyte layer 30 is of a cation-conducting type, cations are the ions moving inside solid electrolyte layer 30 upon application of a voltage to solid electrolyte layer 30. For example, the cations may be at least one selected from the group consisting of proton ions, silver ions, copper ions, lithium ions, nickel ions, magnesium ions, iron ions, cobalt ions, and manganese ions. The cation-conducting material may be, as an example, LiPON (i.e., a Li$^+$-conducting material), MgPON (i.e., a Mg$^{2+}$-conducting material), AgI (i.e., an Ag$^+$-conducting material), or CuI (i.e., a Cu$^+$-conducting material). On the other hand, if solid electrolyte layer 30 is of an anion-conducting type, anions are the ions moving inside solid electrolyte layer 30 upon application of a voltage to solid electrolyte layer 30. The ions may be oxygen ions, for example. The anion-conducting material may be, as an example, ZrO$_2$ (i.e., an O$^{2-}$-conducting material) or Y$_2$O$_3$ (i.e., an O$^{2-}$-conducting material).

In at least a cross-sectional view taken along an YZ cross section (i.e., in an YZ cross section), solid electrolyte layer 30 encloses interconnect layer 10. That is, in the YZ cross section, solid electrolyte layer 30 may surround at least a part of interconnect layer 10. In this embodiment, in the YZ cross section, solid electrolyte layer 30 covers entire interconnect layer 10. That is, in the YZ cross section, solid electrolyte layer 30 surrounds entire interconnect layer 10.

Like interconnect layer 10 and metal layer 20, solid electrolyte layer 30 extends in the direction (i.e., along the X-axis in this embodiment). That is, interconnect layer 10, metal layer 20, and solid electrolyte layer 30 extend in the same direction.

In this embodiment, solid electrolyte layer 30 is in contact with interconnect layer 10. Specifically, the side surface of solid electrolyte layer 30 and the side surface of interconnect layer 10 are in surface contact with each other. In addition, solid electrolyte layer 30 is in contact with metal layer 20. Specifically, the side surface of solid electrolyte layer 30 and the side surface of metal layer 20 are in surface contact with each other.

In this manner, interconnect structure 1 includes solid electrolyte layer 30 between interconnect layer 10 and metal layer 20. Interconnect layer 10 and metal layer 20 are electrically insulated from each other by solid electrolyte layer 30. In this embodiment, in a cross-sectional view taken along a YZ cross section, the entire periphery of interconnect layer 10 is covered by solid electrolyte layer 30. In addition, the entire periphery of solid electrolyte layer 30 is covered by metal layer 20. That is, interconnect structure 1 has a triple structure including interconnect layer 10 as a core line.

Note that interconnect structure 1 (i.e., interconnect passage 100) shown in FIGS. 1A to 1C has a long cylindrical shape. Interconnect layer 10 also has a long cylindrical shape. Accordingly, in a cross-sectional view taken along a YZ cross section, interconnect structure 1 and interconnect layer 10 have a circular or oval shape. Specifically, in the YZ cross section, interconnect structure 1 and interconnect layer 10 have a circular shape. The side surface of interconnect layer 10 thus curves. In this case, solid electrolyte layer 30 covering interconnect layer 10 has a thin cylindrical shape. Metal layer 20 covering solid electrolyte layer 30 also has a thin cylindrical shape.

Interconnect structure 1 configured as described above is used with voltages applied to solid electrolyte layer 30. Specifically, interconnect layer 10 and metal layer 20 are applied with voltages to have predetermined potentials. Accordingly, a predetermined voltage can be applied solid electrolyte layer 30. That is, interconnect layer 10 functions as a first electrode layer, and metal layer 20 as a second electrode layer. For example, as shown in FIG. 1A, first voltage V1 is applied to interconnect layer 10, whereas second voltage V2 different from first voltage V1 is applied to metal layer 20.

Metal layer 20 covering interconnect layer 10 and solid electrolyte layer 30 also functions as a barrier film that blocks the materials contained in interconnect layer 10 and solid electrolyte layer 30 leaking out of interconnect passage 100.

Now, the state inside solid electrolyte layer 30 when a voltage is applied to solid electrolyte layer 30 will be described with reference to FIGS. 2A and 2B.

Figure 2A:
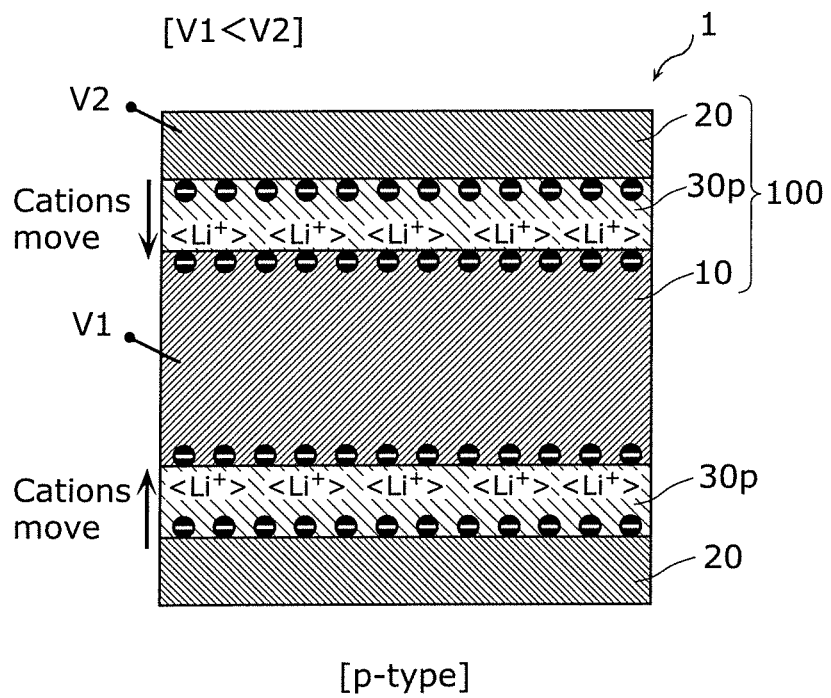
FIG. 2A is a schematic view showing a state inside a cation-conducting solid electrolyte layer included in an interconnect structure where voltages of V1<V2 are applied.

FIG. 2A shows the state inside solid electrolyte layer 30$p$. Solid electrolyte layer 30$p$ of a cation-conducting type (i.e., a p-type) is used as solid electrolyte layer 30. First voltage V1 applied to interconnect layer 10 of interconnect structure 1 is lower than second voltage V2 applied to metal layer 20 (i.e., V1<V2).

In this case, inside solid electrolyte layer 30$p$, cations (lithium ions (Li$^+$) here) charged with positive charge move toward interconnect layer 10 with a lower potential. As a result, the electron concentration increases in interconnect layer 10, which reduces the resistance value of interconnect layer 10. That is, the resistance value of interconnect structure 1 decreases. Incidentally, the movement of the cations (i.e., lithium ions) inside solid electrolyte layer 30$p$ causes a lack of the cations and generates negative charge which is accumulated in a region near metal layer 20.

Figure 2B:
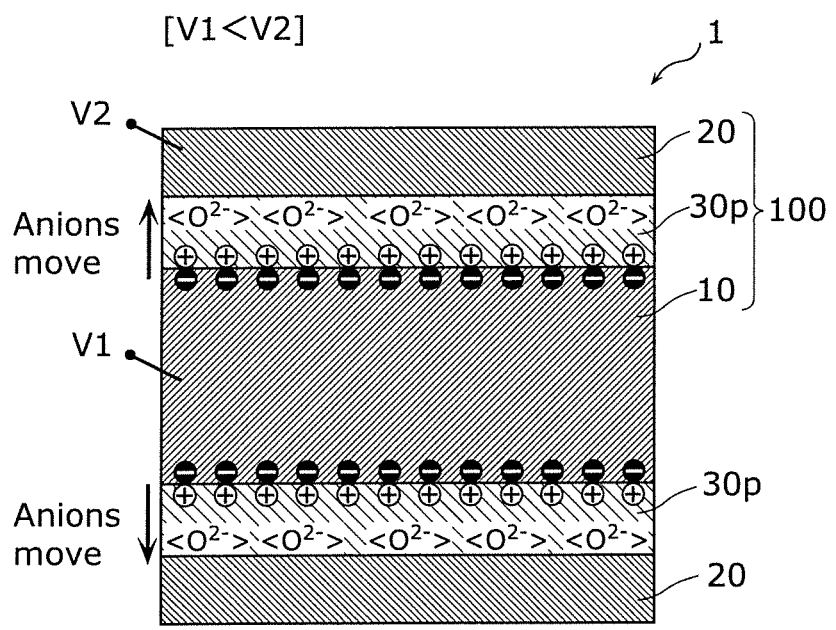
FIG. 2B is a schematic view showing a state inside an anion-conducting solid electrolyte layer included in an interconnect structure where the voltages of V1<V2 are applied.

On the other hand, FIG. 2B shows the state inside solid electrolyte layer 30$n$. Solid electrolyte layer 30$n$ of an anion-conducting type (i.e., an n-type) is used as solid electrolyte layer 30. First voltage V1 applied to interconnect layer 10 of interconnect structure 1 is lower than second voltage V2 applied to metal layer 20 (i.e., V1<V2).

In this case, inside solid electrolyte layer 30n, anions, such as oxygen ions ($O^{2-}$), charged with negative charge move toward metal layer 20 with a higher potential. Accordingly, in a region of solid electrolyte layer 30 near interconnect layer 10, the positive charge is accumulated which is caused by the lack of the anions. As a result, the electron concentration increases in interconnect layer 10, which reduces the resistance value of interconnect layer 10. That is, the resistance value of interconnect structure 1 decreases.

Note that whether solid electrolyte layer 30 is the anion-conducting type or the cation-conducting type may be determined depending on the material contained in solid electrolyte layer 30. The voltage (i.e., the potential difference) to be applied to solid electrolyte layer 30 is 3V, as an example, but not limited thereto.

Figure 3:
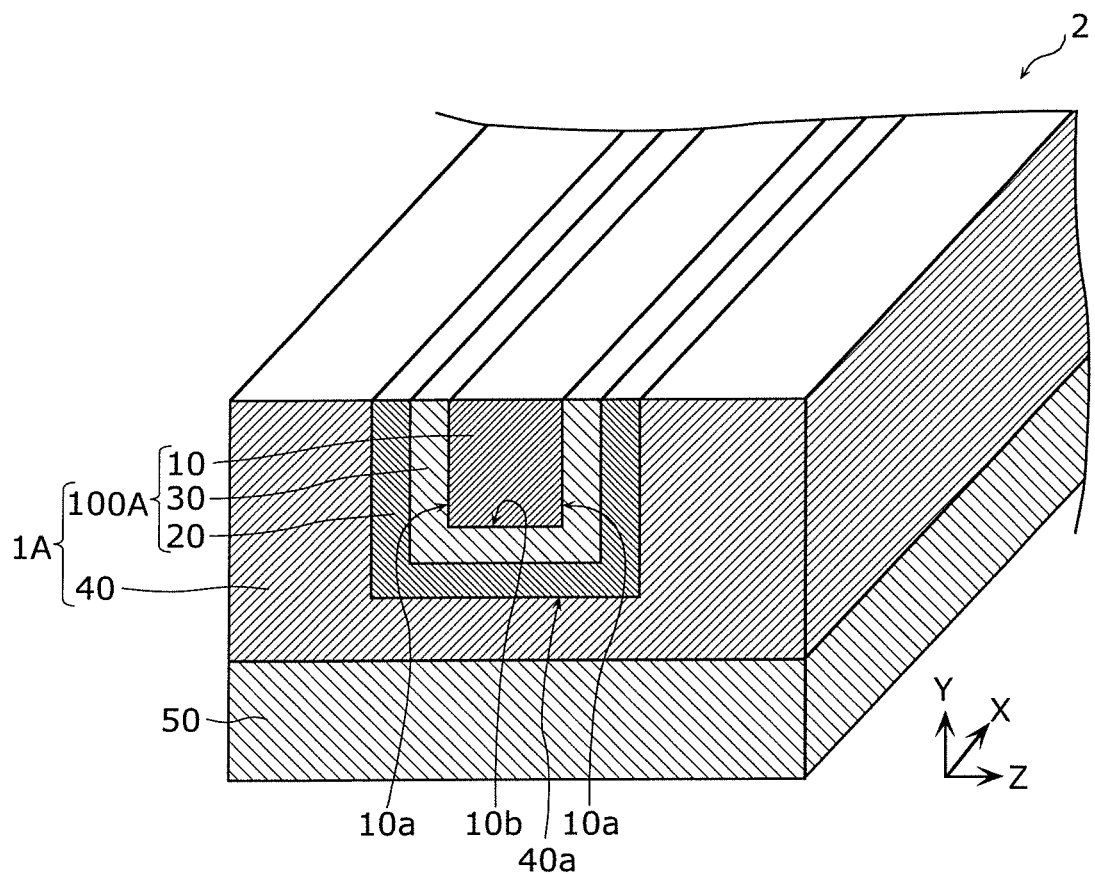
FIG. 3 shows configurations of an interconnect structure and a semiconductor device according to Aspect 2 of Embodiment 1.

Now, interconnect structure 1A according to Aspect 2 of Embodiment 1 will be described with reference to FIG. 3. FIG. 3 shows a configuration of interconnect structure 1A according to Aspect 2 of Embodiment 1 and a configuration of semiconductor device 2 employing interconnect structure 1A.

As shown in FIG. 3, interconnect structure 1A further includes insulating layer 40 in addition to interconnect layer 10, metal layer 20, and solid electrolyte layer 30. As in FIGS. 1A to 1C, interconnect layer 10, metal layer 20, and solid electrolyte layer 30 constitute interconnect passage 100A.

Insulating layer 40 has recess 40a. Recess 40a is a groove extending in the same direction as interconnect passage 100A. Interconnect passage 100A is buried in recess 40a. Accordingly, insulating layer 40 covers the outer periphery of metal layer 20 of interconnect passage 100A. That is, metal layer 20 is formed on insulating layer 40. In FIG. 3, metal layer 20 extends along the inner surface of recess 40a. Insulating layer 40 is made of a material such as silicon dioxide or silicon oxycarbide. Insulating layer 40 is formed on substrate 50.

While interconnect passage 100 shown in FIGS. 1A to 1C has a cylindrical shape as a whole, interconnect passage 100A shown in FIG. 3 has a cuboid shape as a whole. Specifically, in a cross-sectional view of interconnect passage 100A taken along a YZ cross section, interconnect layer 10 has a rectangular shape with a pair of side surfaces 10a opposite to each other and bottom surface 10b. Both metal layer 20 and solid electrolyte layer 30 are opposite to each of the pair of side surfaces 10a and bottom surface 10b of interconnect layer 10.

As in interconnect passage 100 shown in FIG. 1A, in interconnect passage 100A shown in FIG. 3, solid electrolyte layer 30 encloses interconnect layer 10. In addition, metal layer 20 encloses interconnect layer 10 and solid electrolyte layer 30.

In interconnect passage 100A shown in FIG. 3, however, solid electrolyte layer 30 does not cover the entire periphery of interconnect layer 10. In addition, metal layer 20 does not cover the entire peripheries of interconnect layer 10 and solid electrolyte layer 30, either. Specifically, metal layer 20 and solid electrolyte layer 30 cover each of the pair of side surfaces 10a and bottom surface 10b of interconnect layer 10 but does not cover the top of interconnect layer 10. In this embodiment, metal layer 20 and solid electrolyte layer 30 of interconnect passage 100A have a U-shaped cross section, and has a pair of sidewalls and a bottom surface. Note that solid electrolyte layer 30 is in contact with each of the pair of side surfaces 10a and bottom surface 10b of metal layer 20.

As shown in FIG. 3, semiconductor device 2 includes substrate 50 and interconnect structure 1A on substrate 50.

Substrate 50 may be a semiconductor substrate such as a silicon substrate or a gallium nitride (GaN) substrate, or may be an insulating substrate, such as a glass substrate or a resin substrate, made of an insulating material. In addition, substrate 50 may be a rigid substrate with no flexibility, or a flexible substrate with flexibility.

Note that the number of interconnect passage 100A, which is included in interconnect structure 1A formed on substrate 50, is not limited to one. Specifically, like semiconductor device 3 shown in FIG. 4, interconnect structure 1A on substrate 50 may include a plurality of interconnect passages 100A. In this case, insulating layer 40 has a plurality of recesses 40a, each including one of interconnect passages 100A buried therein.

Figure 5:
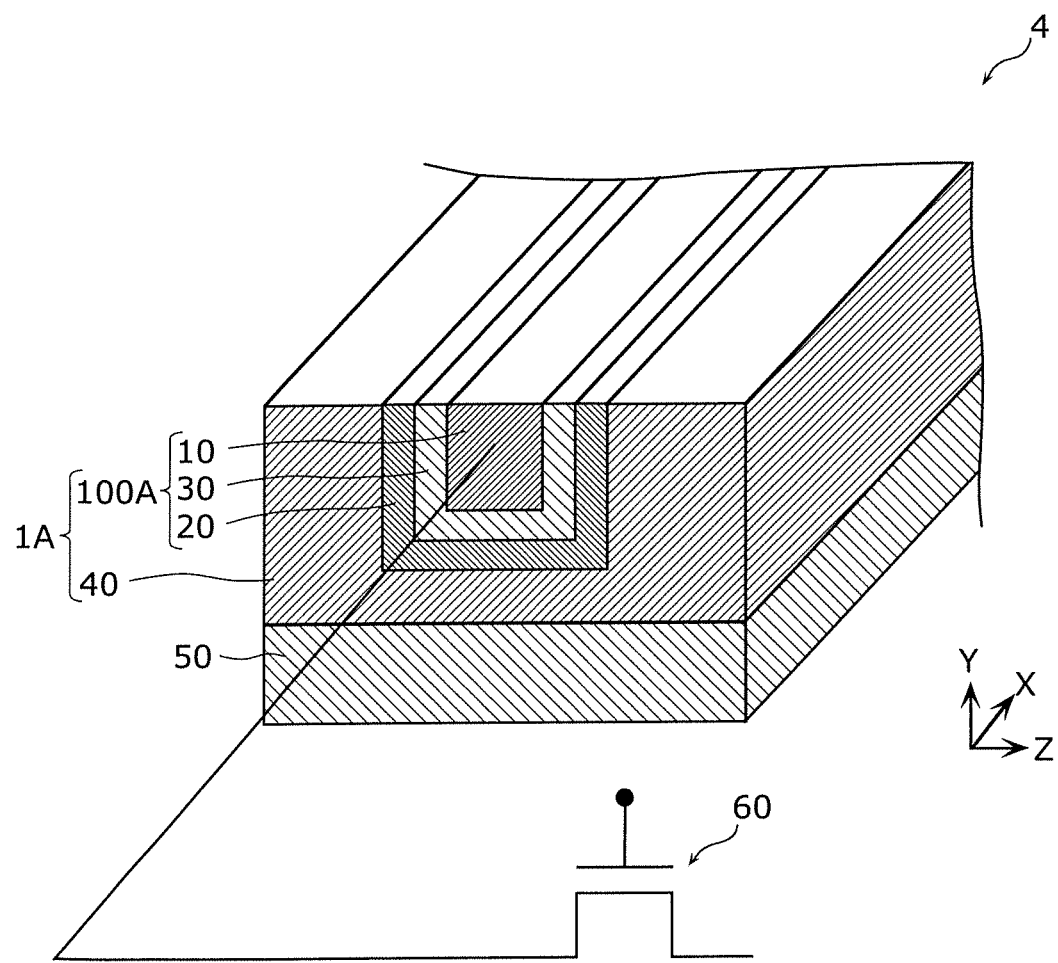
FIG. 5 shows a configuration of a second semiconductor device according to Aspect 2 of Embodiment 1.

As shown in FIG. 5, semiconductor device 4 may include substrate 50, interconnect structure 1A on substrate 50, and transistor 60 in substrate 50. Interconnect passage 100A of interconnect structure 1A is electrically connected to a source/drain of transistor 60. Transistor 60 is an example active element, and a metal oxide semiconductor field effect transistor (MOSFET), for example.

Note that semiconductor device 4 may include, as other circuit elements in addition to transistor 60, active elements such as diodes or passive elements such as capacitors or resistors. Interconnect passage 100A of interconnect structure 1A functions as an interconnect for electrically connecting these circuit elements.

Semiconductor device 4 configured as described above is used to achieve a method of operating transistor 60 that is an active element. In this case, with voltages applied to solid electrolyte layer 30 of interconnect structure 1A, electrical signals are transmitted from transistor 60 to interconnect layer 10 or from interconnect layer 10 to transistor 60. That is, in interconnect structure 1A, the voltages may be applied to solid electrolyte layer 30 to transmit the electrical signals from transistor 60 to interconnect layer 10. Alternatively, the voltages may be applied to solid electrolyte layer 30 to transmit the electrical signals from interconnect layer 10 to transistor 60.

For example, as shown in FIG. 2A described above, assume that a cation-conducting solid electrolyte layer is used as solid electrolyte layer 30. In this case, first voltage V1 is applied to interconnect layer 10, whereas second voltage V2 higher than first voltage V1 is applied to metal layer 20. Accordingly, cations move inside solid electrolyte layer 30 to the vicinity of interconnect layer 10, which increases the electron concentration in interconnect layer 10. As a result, the resistance value of interconnect layer 10 decreases.

On the other hand, as shown in FIG. 2B described above, assume that an anion-conducting solid electrolyte layer is used as solid electrolyte layer 30. In this case, first voltage V1 is applied to interconnect layer 10, whereas second voltage V2 higher than first voltage V1 is applied to metal layer 20. Accordingly, anions move inside solid electrolyte layer 30, which increases the electron concentration in the region of interconnect layer 10 near the solid electrolyte layer. As a result, the resistance value of interconnect layer 10 decreases.

The configuration of semiconductor device 4 reduces the resistance of interconnect passage 100A (i.e., interconnect layer 10) of interconnect structure 1A and allows transmission of electrical signals without any delay through interconnect passage 100A with a reduced resistance.

In addition, the method of using such interconnect structure 1A and semiconductor device 4 allows transmission of electrical signals to interconnect layer 10 of interconnect structure 1A. That is, with the use of interconnect structure 1A and semiconductor device 4 with voltages applied to solid electrolyte layer 30, electrical signals are transmitted to interconnect layer 10 of interconnect structure 1A.

Figure 6:
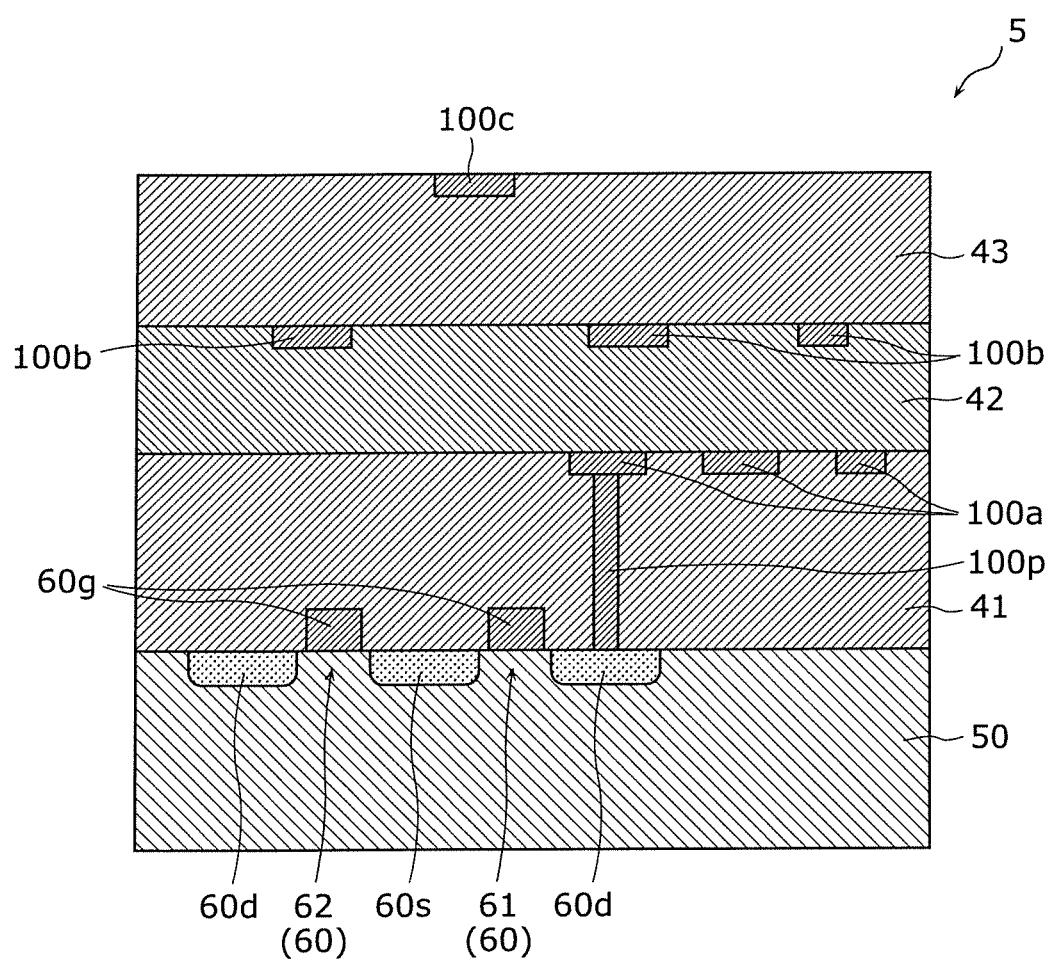
FIG. 6 shows a configuration of a third semiconductor device according to Aspect 2 of Embodiment 1.

A specific example of a semiconductor device including transistor 60 will be described with reference to FIG. 6. FIG. 6 is a specific cross-sectional view of semiconductor device 5 including transistor 60. Semiconductor device 5 shown in FIG. 6 has a multilayer interconnect structure. Semiconductor device 5 may be a semiconductor integrated circuit device of a solid-state imaging device, or a TFT substrate of a display device, for example.

As shown in FIG. 6, semiconductor device 5 includes substrate 50, first interlayer insulating layer 41 on substrate 50, second interlayer insulating layer 42 on first interlayer insulating layer 41, and third interlayer insulating layer 43 on second interlayer insulating layer 42.

Semiconductor device 5 further includes first, second, and third interconnects 100a, 100b, and 100c buried in first, second, and third interlayer insulating layers 41, 42, and 43, respectively.

Semiconductor device 5 further includes, as transistors 60, first transistor 61 and second transistor 62. In addition, semiconductor device 5 includes contact plug 100p that connects first transistor 61 and one of first interconnects 100a together.

In FIG. 6, substrate 50 is a semiconductor substrate. Substrate 50 includes impurity diffusion regions serving as drain regions 60d of first transistor 61 and second transistor 62, and an impurity region serving as source region 60s of first transistor 61 and second transistor 62. In addition, first interlayer insulating layer 41 includes gate electrodes 60g of first transistor 61 and second transistor 62.

Contact plug 100p is buried in first interlayer insulating layer 41 and connects drain region 60d of first transistor 61 to the one of first interconnect 100a.

Figure 4:
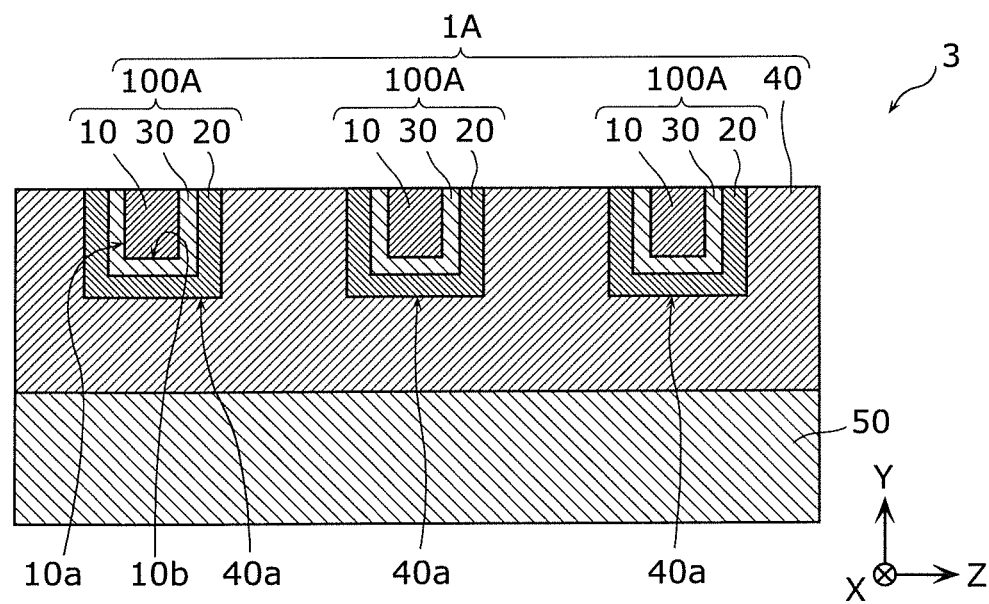
FIG. 4 shows a configuration of a first semiconductor device according to Aspect 2 of Embodiment 1.

Semiconductor device 5 employs interconnect structure 1A shown in FIGS. 3 to 5, for example. In this case, interconnect passage 100A of interconnect structure 1A is applied to at least any one of first, second, and third interconnects 100a, 100b, and 100c, and contact plug 100p.

Assume that interconnect passage 100A is applied to first interconnects 100a, second interconnects 100b, or third interconnect 100c. In this case, interconnect passage 100A and interconnect layer 10 extend in the direction (i.e., along the X-axis in this embodiment) which is perpendicular to the paper. On the other hand, if interconnect passage 100A is applied to contact plug 100p, interconnect passage 100A and interconnect layer 10 extend in the vertical direction on the paper.

Now, an interconnect structure according to another aspect of Embodiment 1 will be described with reference to FIG. 7. FIG. 7 is a cross-sectional view showing configurations of interconnect structure 1B according to Aspect 3 of Embodiment 1 and semiconductor device 6 employing this interconnect structure 1B.

Semiconductor device 6 shown in FIG. 7 includes substrate 50 and interconnect structure 1B on substrate 50.

Interconnect structure 1B includes three interconnect passages of first, second, and third interconnect passages 101, 102, and 103, and two insulating layers of first and second interlayer insulating layers 41 and 42.

Like interconnect passage 100 of interconnect structure 1 and interconnect passage 100A of interconnect structure 1A described above, first, second, and third interconnect passages 101, 102, and 103 include interconnect layer 10B, metal layer 20B, and solid electrolyte layer 30B.

In this embodiment, interconnect layer 10B includes first interconnect layer 11 and second interconnect layer 12. Metal layer 20B includes first metal layer 21 and second metal layer 22. Solid electrolyte layer 30B includes first solid electrolyte layer 31 and second solid electrolyte layer 32.

First interconnect layer 11 is a lower interconnect layer buried in recesses 41a. Specifically, first interconnect layer 11 is buried inside first solid electrolyte layer 31 in the shape of grooves in recesses 41a. Second interconnect layer 12 is an upper interconnect layer on first interconnect layer 11 and is formed on the surface of first solid electrolyte layer 31 without any recess 41a.

First metal layer 21 is a lower metal layer extending along the inner surface of each recess 41a. First metal layer 21 extends along the pair of side surfaces and the bottom surface of recess 41a. Second metal layer 22 is an upper metal layer on and above first metal layer 21 and covering second solid electrolyte layer 32.

First solid electrolyte layer 31 is a lower solid electrolyte layer between first metal layer 21 and interconnect layer 108. Second solid electrolyte layer 32 is an upper solid electrolyte layer on and above first solid electrolyte layer 31, between interconnect layer 10B and second metal layer 22.

In interconnect structure 18, first interconnect passage 101 and second interconnect passage 102 includes interconnect layer 108, metal layer 20B, and solid electrolyte layer 308. Interconnect layer 10B is composed of first interconnect layer 11 and second interconnect layer 12. Metal layer 208 is composed of first metal layer 21 and second metal layer 22. Solid electrolyte layer 30B is composed of first solid electrolyte layer 31 and second solid electrolyte layer 32.

On the other hand, third interconnect passage 10B includes interconnect layer 10B, metal layer 208, and solid electrolyte layer 30B. Interconnect layer 10B is composed only of first interconnect layer 11. Metal layer 20B is composed of first metal layer 21 and second metal layer 22. Solid electrolyte layer 30B is composed of first solid electrolyte layer 31 and second solid electrolyte layer 32. That is, unlike first interconnect passage 101 and second interconnect passage 102, third interconnect passage 103 includes no second interconnect layer 12.

Second interconnect passage 102 and third interconnect passage 103 share first metal layer 21 and second metal layer 22 as well as first solid electrolyte layer 31 and second solid electrolyte layer 32.

First interlayer insulating layer 41 is formed on substrate 50. First interlayer insulating layer 41 is the lowermost insulating layer. First interlayer insulating layer 41 has plurality of recesses 41a. Parts of first, second, and third interconnect passages 101, 102, and 103 are buried in recesses 41a.

Second interlayer insulating layer 42 is formed above first interlayer insulating layer 41 to cover first, second, and third interconnect passages 101, 102, and 103. That is, first, second, and third interconnect passages 101, 102, and 103 are buried between first interlayer insulating layer 41 and second interlayer insulating layer 42.

Except for these, interconnect structure 1B shown in FIG. 7 basically has the same or similar configuration as interconnect passage 100A of interconnect structure 1A described above. Note that first interconnect layer 11 and second interconnect layer 12 may be made of the same material as interconnect layer 10 of interconnect passage 100A described above. Similarly, first and second metal layers 21 and 22 and first and second solid electrolyte layers 31 and 32 may be made of the same material as metal layer 20 and solid electrolyte layer 30, respectively, of interconnect passage 100A described above. In addition, first interlayer insulating layer 41 and second interlayer insulating layer 42 may be made of the same material as insulating layer 40 of interconnect passage 100A described above.

[Advantage of Interconnect Structure]

Now, an advantage of the interconnect structure according to this embodiment will be described in comparison to an interconnect structure according to a comparative example.

Figure 8A:
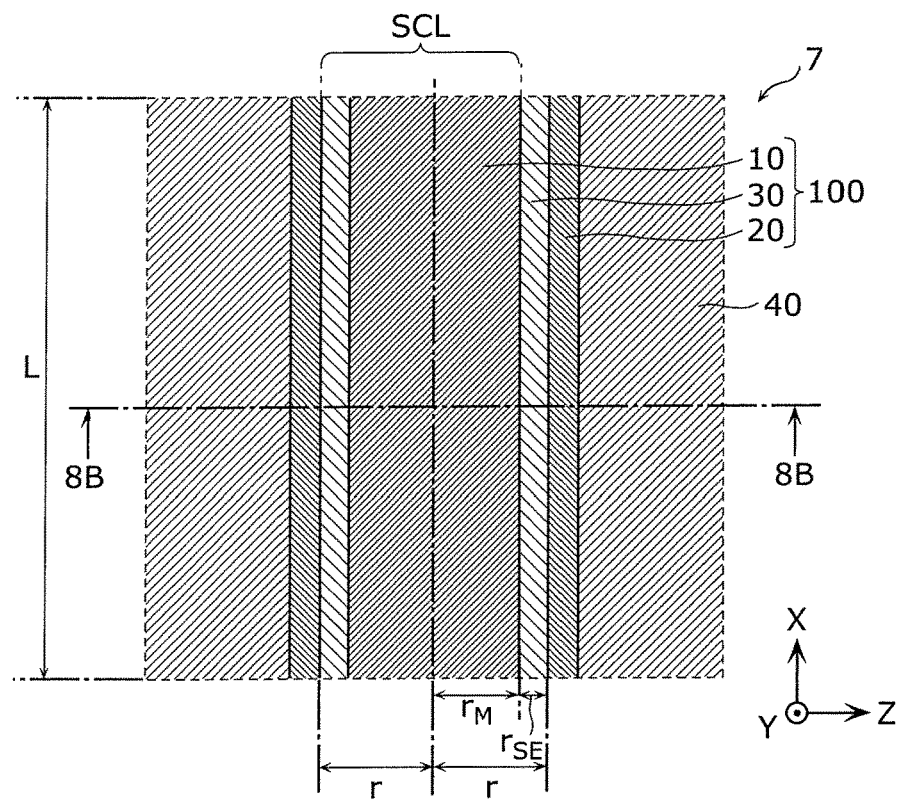
FIG. 8A is a cross-sectional view of an interconnect structure according to an example.
Figure 8B:
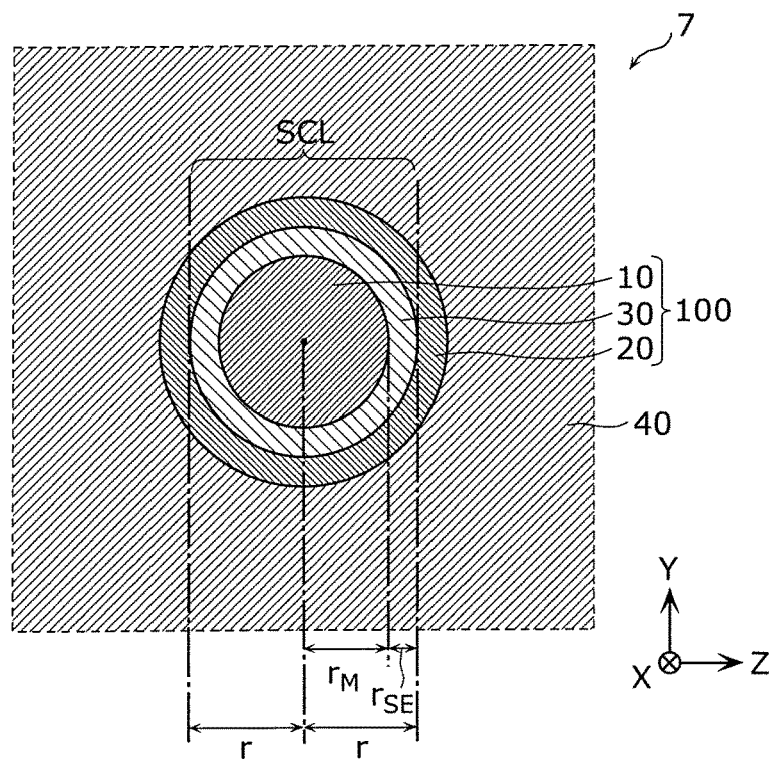
FIG. 8B is a cross-sectional view of the interconnect structure according to the example taken along line 8B-8B in FIG. 8A.

The interconnect structure according to this embodiment is interconnect structure 7 shown in FIGS. 8A and 8B assumed to be used for contact plug 100p of semiconductor device 5 shown in FIG. 6. FIG. 8A is a cross-sectional view of interconnect structure 7 according to the example, whereas FIG. 8B is a cross-sectional view taken along line 8B-8B in FIG. 8A. In FIG. 8A, interconnect passage 100 and interconnect layer 10 extend in the direction (i.e., along the X-axis in this embodiment) which is the vertical direction on the paper.

Interconnect structure 7 according to the example shown in FIGS. 8A and 8B includes interconnect layer 10, metal layer 20, and solid electrolyte layer 30. In addition, interconnect passage 100 composed of interconnect layer 10, metal layer 20 and solid electrolyte layer 30 has a cylindrical shape.

As shown in FIGS. 8A and 8B, interconnect structure 7 according to the example is configured as follows in a cross-sectional view taken along a YZ cross section. Interconnect structure 7 has height (i.e., interconnect length) L. Interconnect layer 10 has radius $r_M$. Solid electrolyte layer 30 has thickness $r_{SE}$. Semiconductor interconnect SCL including interconnect layer 10 and solid electrolyte layer 30 has radius r. Since thickness r of semiconductor interconnect SCL is the sum of radius $r_M$ of interconnect layer 10 and thickness $r_{SE}$ of solid electrolyte layer 30, the following equation is obtained: $r=r_M+r_{SE}$.

Figure 9A:
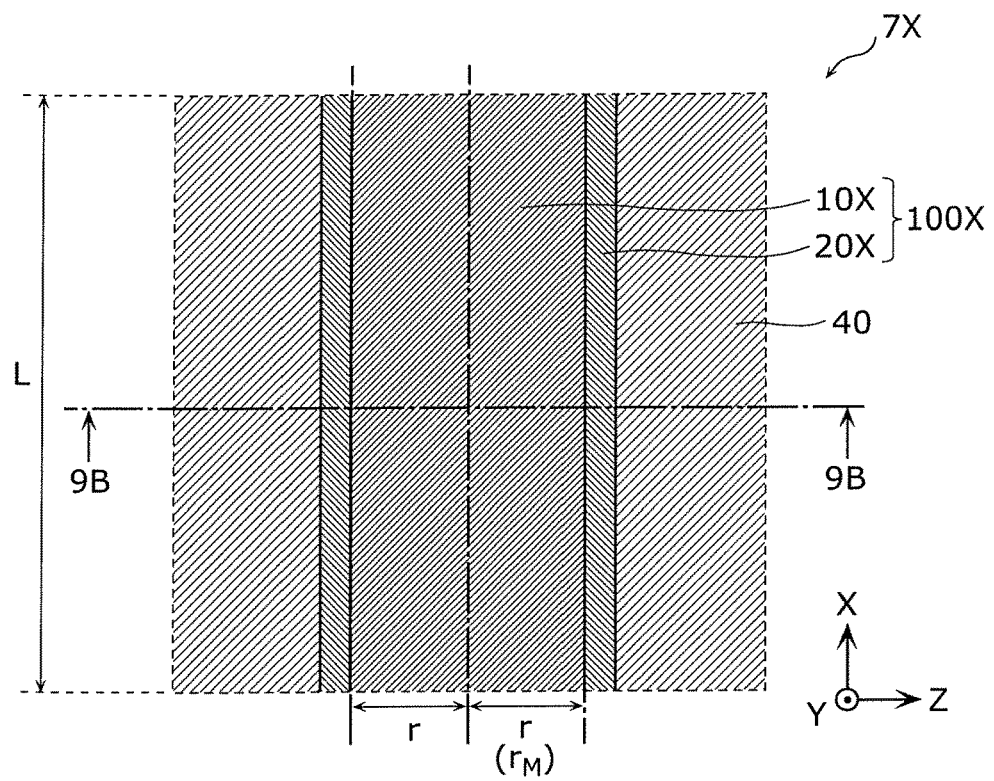
FIG. 9A is a cross-sectional view of an interconnect structure according to a comparative example.
Figure 9B:
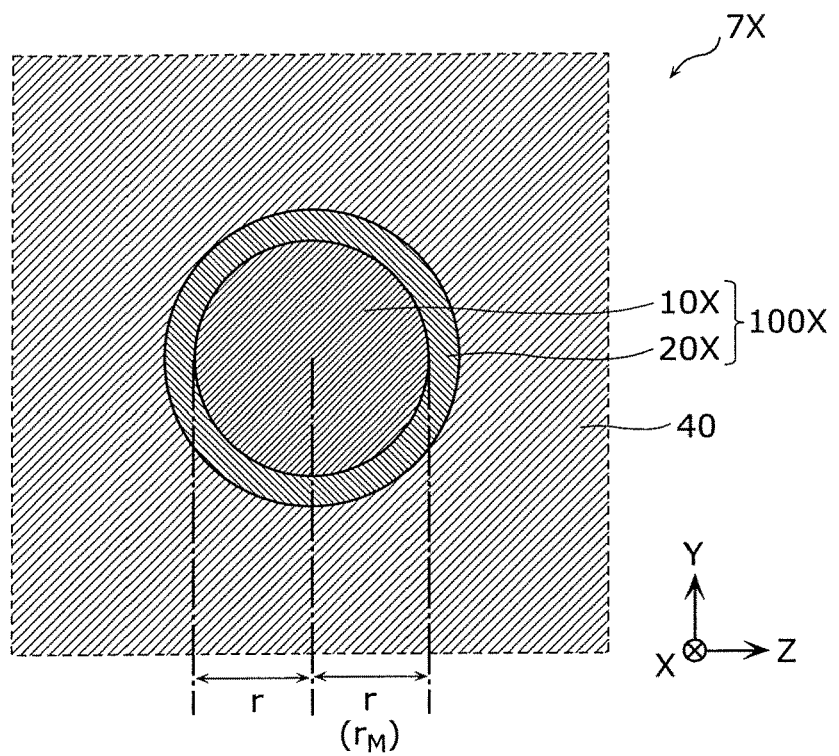
FIG. 9B is a cross-sectional view of the interconnect structure according to the comparative example taken along line 9B-9B in FIG. 9A.

On the other hand, the interconnect structure according to the comparative example is interconnect structure 7X shown in FIGS. 9A and 9B. FIG. 9A is a cross-sectional view of interconnect structure 7X according to the comparative example, whereas FIG. 9B is a cross-sectional view taken along line 9B-9B in FIG. 9A.

Interconnect structure 7X according to the comparative example shown in FIGS. 9A and 9B includes interconnect layer 10X and metal layer 20X. That is, interconnect structure 7X according to the comparative example includes no solid electrolyte layer 30. In addition, interconnect passage 100X including interconnect layer 10X and metal layer 20X has a cylindrical shape.

As shown in FIGS. 9A and 9B, interconnect structure 7X according to the comparative example has the following configuration in a cross-sectional view taken along a YZ cross section. Interconnect structure 7X has height (i.e., interconnect length) L. Interconnect layer 10X has radius $r_M$, which is equal to r.

In interconnect structure 7 according to the example and interconnect structure 7X according to the comparative example, interconnect layer 10 and interconnect layer 10X are made of the same material, namely, cobalt (Co). In addition, metal layer 20 and metal layer 20X are made of the same material, namely, titanium nitride (TiN). In interconnect structure 7 according to the example, solid electrolyte layer 30 is made of lithium phosphorus oxynitride (LiPON).

In addition, interconnect passage 100 of interconnect structure 7 according to the example and interconnect passage 100X of interconnect structure 7X according to the comparative example have the same overall shape. In the interconnect structure according to comparative example 1, interconnect layer 10X covers the region corresponding to solid electrolyte layer 30.

First, the advantage of reducing the resistance of interconnect structure 7X according to the comparative example will be estimated based on following non-patent literature NPL 1. In NPL 1, electrodes are made of gold (Au).

[NPL 1]

D. Daghero et al., "Large Conductance Modulation of Gold Thin Films by Huge Charge Injection via Electrochemical Gating", PHYSICAL REVIEW LETTERS, PRL 108, 066807 (2012)

A sample with the following configuration is used in the experiment according to NPL 1. Each electrode covered by a solid electrolyte layer and made of Au has surface area S represented by the equation $S=1.2\times10^{-4}$ (cm$^2$), and film thickness d represented by the equation $d=41\times10^{-7}$ (cm). Gold has resistivity ρ represented by the equation $\rho=2.2\times10^{-6}$ (Ω cm). In addition, gold has a carrier density of $1.85\times10^{15}$ (e/cm$^2$).

In this case, the equation $\Delta R/R (300k)=0.2/4.4$ is obtained from FIG. 4 of NPL 1. Accordingly, two-dimensional carrier density $n_{Au2D}$ (t=41 nm) of gold with thickness t=41 nm is expressed by: $n_{Au2D}$ (t=41 nm)$=1.85\times10^{15}/(0.2/4.4)=4.07\times10^{16}$ (e/cm$^2$).

Accordingly, three-dimensional carrier density $n_{Au3D}$ of gold is expressed by the equation $n_{Au3D}=(4.07\times10^{16})/(41\times10^{-7})=1\times10^{22}$ (e/cm$^3$), taken the thickness of 41 nm into consideration.

From the result of this calculation, the advantage of cobalt (Co) of interconnect layer 10 is estimated. Specifically, the resistance value of interconnect layer 10, whose side surface is covered by solid electrolyte layer 30, per unit length is calculated, In addition, solid electrolyte layer 30 covering the side surface of interconnect layer 10 is covered by metal layer 20 made of titanium nitride (TiN).

As described above, thickness r of semiconductor interconnect SCL including interconnect layer 10 and solid electrolyte layer 30 is expressed by the following equation: $r=r_M+r_{SE}$.

Here, resistance value R of semiconductor interconnect SCL can be expressed by following equation (1), where $r/r_M$ is ratio×of radius r of semiconductor interconnect SCL to radius $r_M$ of interconnect layer 10.

$$R=(1/R_{Co}+1/R_{SE})^{-1} \tag{1}$$

In equation (1), $R_{Co}$ is the resistance value of interconnect layer 10 made of cobalt (Co). $R_{SE}$ is the resistance value of the interface between interconnect layer 10 made of Co and lithium phosphorus oxynitride (LiPON), changed by the voltage applied to the LiPON.

Resistance value R (V0) of semiconductor interconnect SCL, where voltage Vg equal to 0 V is applied to solid electrolyte layer 30, can be expressed by following equation (2).

$$R(V0)=1/(e\times\mu)\times(n_{Co3D}\times n\times(\frac{1}{4})\times(2\times r/x)2)^{-1} \tag{2}$$

On the other hand, resistance value R (Vg) of semiconductor interconnect SCL, where voltage Vg not equal to 0V is applied to solid electrolyte layer 30, can be expressed by following equation (3).

$$R(Vg)=1/(e\times\mu)\times(n_{Co3D}\times n\times(\frac{1}{4})\times(2\times r/x)^2+n_{Au1D})^{-1} \tag{3}$$

In equations (2) and (3), μ represents the carrier mobility, and $n_{Co3D}$ represents the carrier volume density of cobalt. $n_{Au1D}$ represents the one-dimensional carrier density of Au.

Here, assume that voltage Vg of 5V is applied to solid electrolyte layer 30. Since semiconductor interconnect SCL has length L represented by the equation L=1×10$^{-4}$ cm and cobalt has resistivity ρ represented by the equation ρ=5.81× 10$^{-6}$ cm, carrier volume density $n_{Co3D}$ of cobalt is obtained by the following equation: $n_{Co3D}$=(2.2/5.8)×1×10$^{22}$ (e/cm$^3$) =3.8×10$^{21}$ (e/cm$^3$).

Accordingly, in equations (1) and (2), 1/(μ×e×$n_{Co3D}$) is 283 (cm$^2$/(V×sec)).

The density of the carriers injected by solid electrolyte layer 30 is the equal to carrier density $n_{Au1D}$ of Au, that is, obtained by the following equation: $n_{Au1D}$=$n_{Au2D}$×2×π×$r_M$.

As described above, voltage Vg of 5V is applied to solid electrolyte layer 30, where r/4 is radius $r_M$ of interconnect layer 10 and the rest ¾×r is thickness $r_{SE}$ of solid electrolyte layer 30. In this case, all the parameters are inserted into equation (3) to obtain R (Vg). The dependency of this R (Vg) as resistance value R of interconnect structure 7 according to the example shown in FIGS. 8A and 8B on line width 2×r is shown in FIG. 10.

On the other hand, assume that the interconnect layer is not covered by the solid electrolyte layer in the interconnect structure. In FIGS. 8A and 8B, no voltage is applied to solid electrolyte layer 30, where radius $r_M$ of interconnect layer 10 is equal to r. In this case, the related parameters are inserted into equation (2) to obtain R (V0). The dependency of this R (V0) as the resistance value of interconnect structure 7X according to the comparative example shown in FIGS. 9A and 9B on line width 2×r is shown in FIG. 10.

Figure 10:
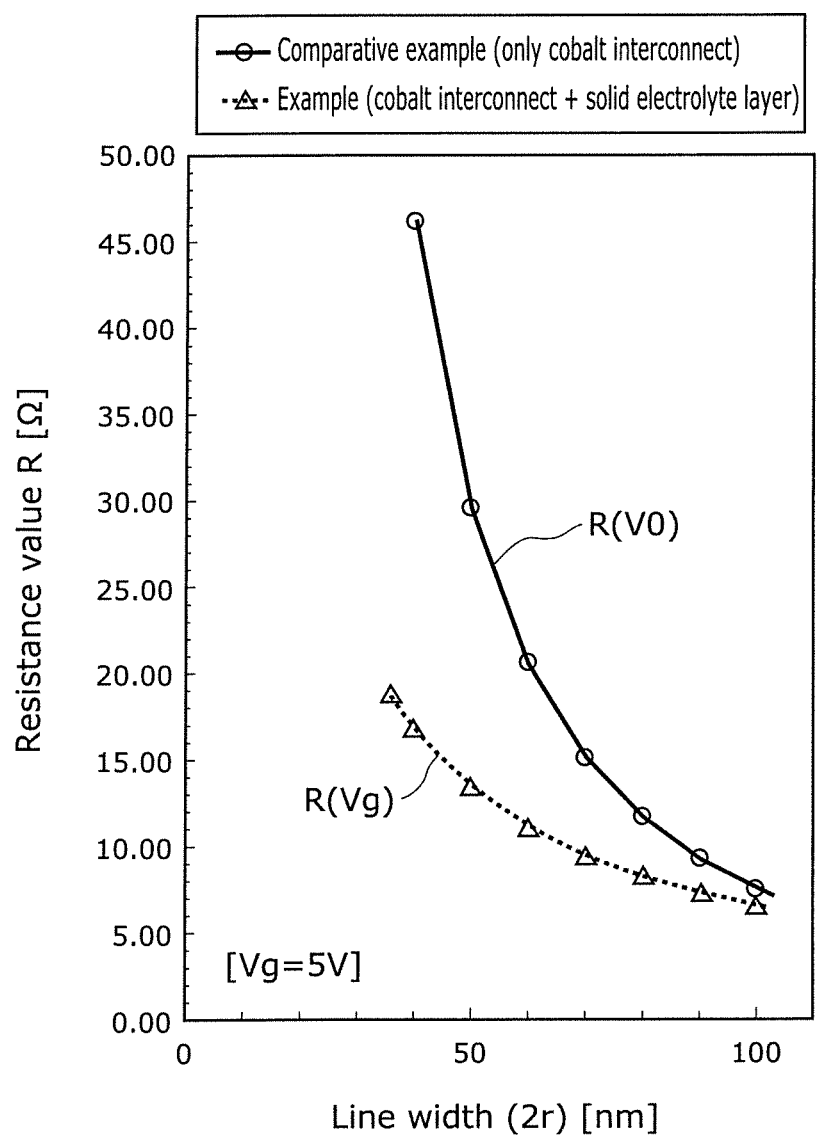
FIG. 10 shows the relationship between line widths and resistance values in the interconnect structure according to the example.

As shown in FIG. 10, each of the resistance values of interconnect structure 7 according to the example and interconnect structure 7X according to the comparative example increases with a decrease in the line width. It is found that, as compared to interconnect structure 7X according to the comparative example, interconnect structure 7 according to the example reduces the increase in the resistance value of the interconnect layer caused by the decrease in the line width. That is, as compared to interconnect structure 7X according to the comparative example with the same line width, interconnect structure 7 according to the example is advantageous in reducing the resistance value of interconnect layer 10.

Table 1 shows the rate of resistance reduction by (i.e., the resistance reduction rate of) interconnect structure 7 according to the example with respect to interconnect structure 7X according to the comparative example with the same line width.

TABLE 1

| Line Width (2 × r) [nm] | Resistance Reduction Rate [%] |
|---|---|
| 50 | 54.7 |
| 60 | 46.0 |
| 70 | 37.3 |
| 80 | 28.8 |
| 90 | 20.3 |
| 100 | 11.9 |
| 105 | 7.8 |
| 110 | 3.7 |

It is found from Table 1 that the resistance reduction rate of interconnect structure 7 according to the example increases with a decrease in the line width. That is, interconnect structure 7 according to the example provides a greater advantage of reducing the resistance with a decrease in the line width.

In interconnect structure 7 according to the example, assume that the ratio of radius $r_M$ of interconnect layer 10 to thickness $r_{SE}$ of solid electrolyte layer 30 is fixed to $r_M$:$r_{SE}$=1:3. In this case, interconnect structure 7 according to the example is advantageous in reducing the resistance where r is lower than or equal to 57.2 nm, that is, where line width (2×r) is smaller than or equal to 114.4 nm. That is, the ratio of the thickness of solid electrolyte layer 30 to the thickness of interconnect layer 10 is higher than ¼ in one preferred embodiment.

Interconnect structure 7 according to the example provides a greater advantage of reducing the resistance with an increase in the valence of the conductive ions moving inside solid electrolyte layer 30. For example, assume that solid electrolyte layer 30 is made of magnesium phosphorous oxynitride (MgPON). In this case, the conductive ions moving inside solid electrolyte layer 30 are Mg ions that are divalent cations. On the other hand, assume that solid electrolyte layer 30 is made of lithium phosphorus oxynitride (LiPON). In this case, the conductive ions moving inside solid electrolyte layer 30 are Li ions that are monovalent cations. Therefore, solid electrolyte layer 30 made of magnesium phosphorous oxynitride (MgPON) has a double advantage of reducing the resistance as compared to the layer made of LiPON.

In view of the advantage of reducing the resistance, the layers have the following sizes in one preferred embodiment in a cross-sectional view taken along a YZ cross section. The sum of the thicknesses of solid electrolyte layer 30 and interconnect layer 10 is smaller than or equal to 20 nm. Interconnect layer 10 has a width of 10 nm or lower.

In a cross-sectional view taken along a YZ cross section, solid electrolyte layer 30 has a thickness of 5 nm or more in one preferred embodiment. This is because an electron leakage may occur from a layer with a smaller thickness.

Note that not only cylindrical interconnect structure 1 shown in FIGS. 1A to 1C provides the advantage described above of interconnect structure 7 according to the example. An interconnect structure including solid electrolyte layer 30 between interconnect layer 10 and metal layer 20, and a semiconductor device including the interconnect structure also provide the advantage. Specifically, all semiconductor devices 2, 3, 4, 5, and 6 shown in FIGS. 3, 4, 5, 6 and 7, respectively, provide the advantage of reducing an increase in the resistance value of the interconnect layer caused by a decrease in the line width. As compared to the interconnect structure without solid electrolyte layer 30 but with the same line width, the above-discussed structures provide the advantage of reducing the resistance value of the interconnect layer.

[Method of Manufacturing Interconnect Structure and Semiconductor Device]

Figure 11A:
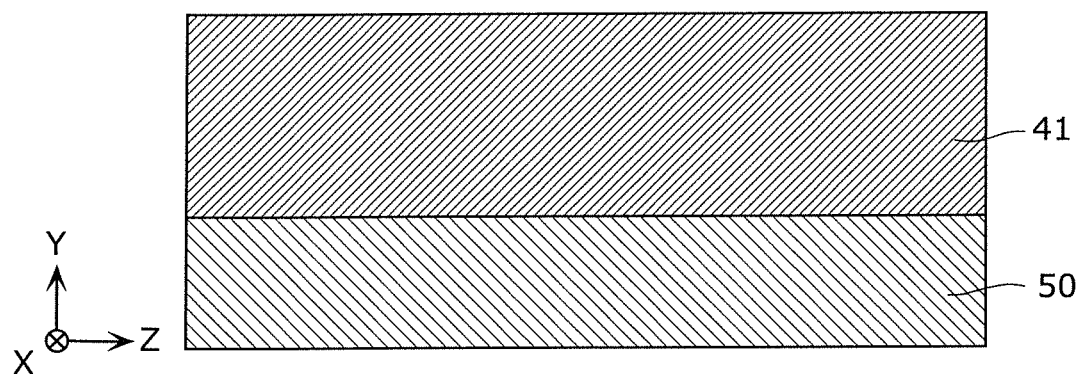
FIG. 11A is a cross-sectional view showing a first interlayer insulating layer formation step in a method of manufacturing a semiconductor device according to Embodiment 1.

Now, a method of manufacturing an interconnect structure and a semiconductor device according to Embodiment 1 will be described with reference to FIGS. 11A to 11Y. FIGS. 11A to 11Y are for illustrating the method of manufacturing semiconductor device 6 shown in FIG. 7.

Figure 11B:
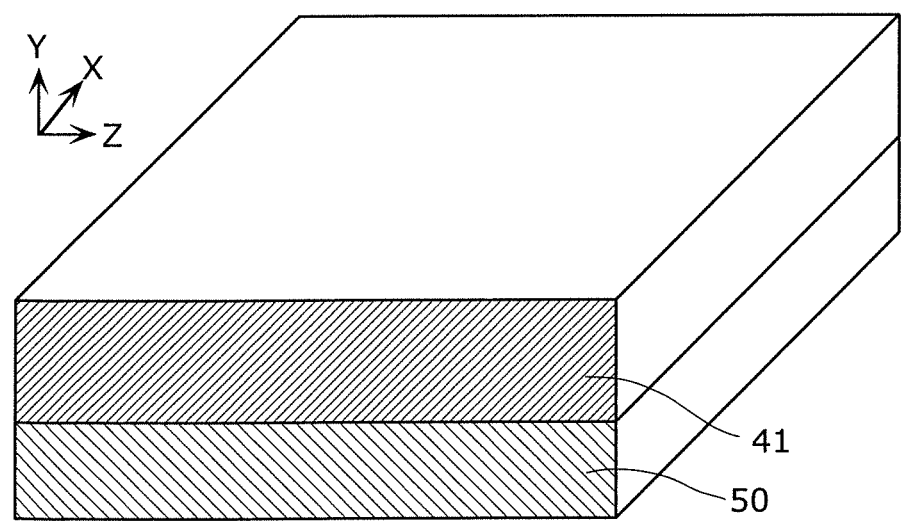
FIG. 11B is a perspective view of the first interlayer insulating layer formation step in the method of manufacturing the semiconductor device according to Embodiment 1.

First, as shown in FIGS. 11A and 11B, substrate 50 is prepared, and first interlayer insulating layer 41 is formed on substrate 50. Substrate 50 may be a semiconductor substrate or an insulating substrate. In this embodiment, substrate 50 is a semiconductor substrate. First interlayer insulating layer 41 is made of silicon dioxide or silicon oxycarbide (SiOC), for example. First interlayer insulating layer 41 may be formed by chemical vapor deposition (CVD), for example.

Figure 11C:
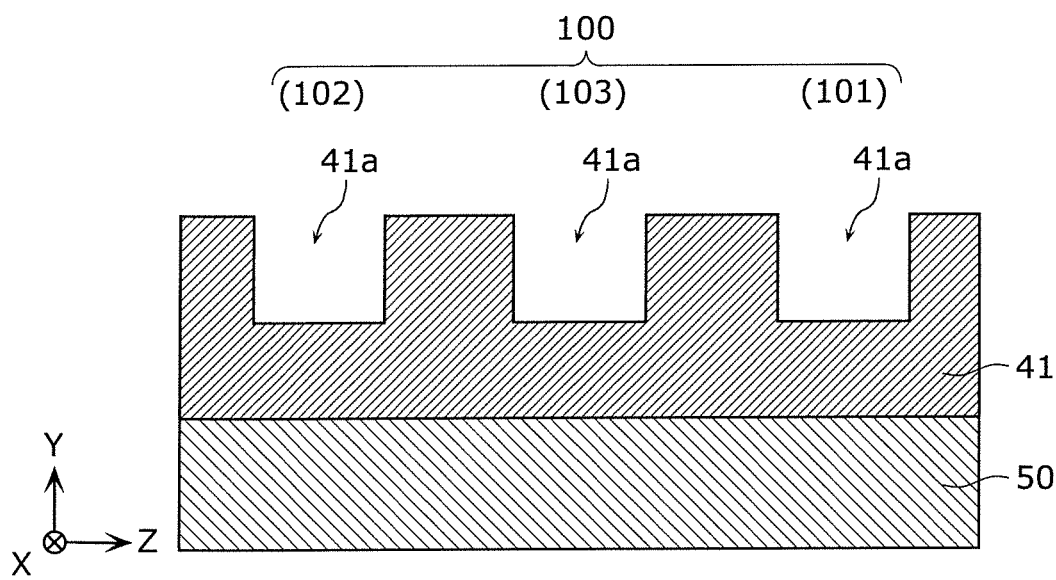
FIG. 11C is a cross-sectional view showing a recess formation step in the method of manufacturing the semiconductor device according to Embodiment 1.
Figure 11D:
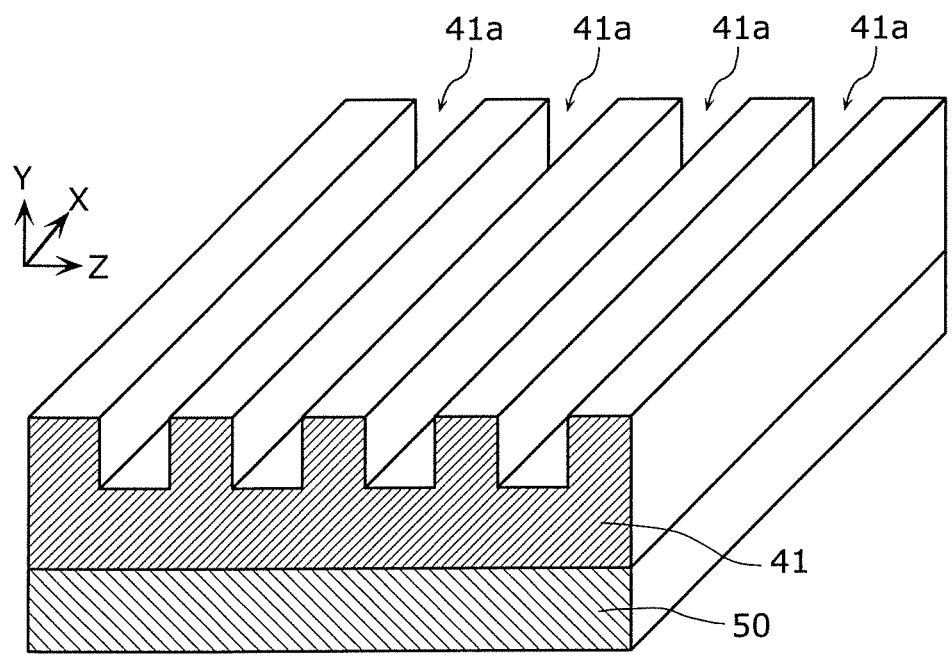
FIG. 11D is a perspective view of the recess formation step in the method of manufacturing the semiconductor device according to Embodiment 1.

Next, as shown in FIGS. 11C and 11D, recesses 41a for burying interconnect passages 100 are formed in first interlayer insulating layer 41. Recesses 41a are formed to extend in a direction (e.g., along the X-axis in this embodiment). For example, recesses 41a serving as trenches are formed in first interlayer insulating layer 41 by etching. In this embodiment, the plurality of recesses 41a are formed.

In this embodiment, three interconnect passages of first, second, and third interconnect passages 101, 102, and 103 are formed as interconnect passages 100. In correspondence to these three interconnect passages, three recesses 41a are shown in FIG. 11C. Specifically, in FIG. 11C, right recess 41a corresponds to first interconnect passage 101, left recess 41a to second interconnect passage 102, and central recess 41a to third interconnect passage 103. Based on this correspondence, first, second, and third interconnect passages 101, 102, and 103 in the subsequent steps will be described.

Figure 11E:
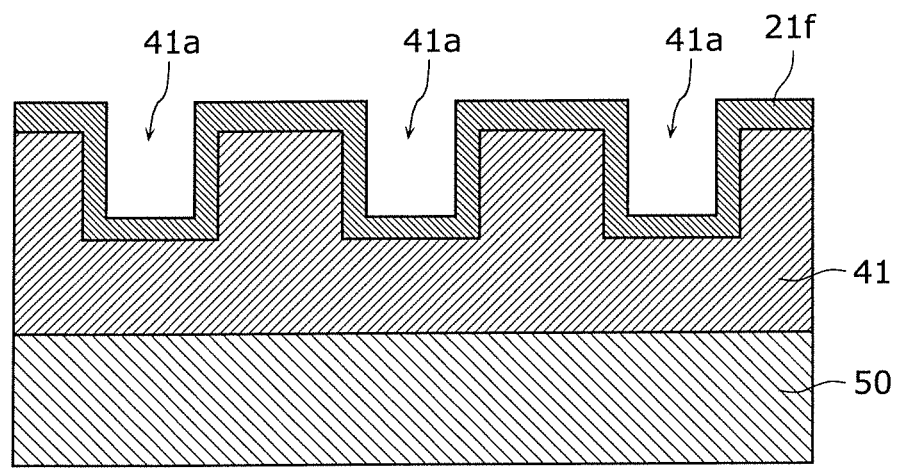
FIG. 11E is a cross-sectional view showing a first metal layer formation step in the method of manufacturing the semiconductor device according to Embodiment 1.

Then, as shown in FIG. 11E, first metal layer 21f is formed along the inner surfaces of recesses 41a extending in the direction in first interlayer insulating layer 41. Specifically, first metal layer 21f is formed to cover the surface of first interlayer insulating layer 41 and the inner side surfaces and the bottom surface of recesses 41a, that is, to cover entire first interlayer insulating layer 41. In this embodiment, a titanium nitride film made of titanium nitride is formed as first metal layer 21f by sputtering.

Figure 11F:
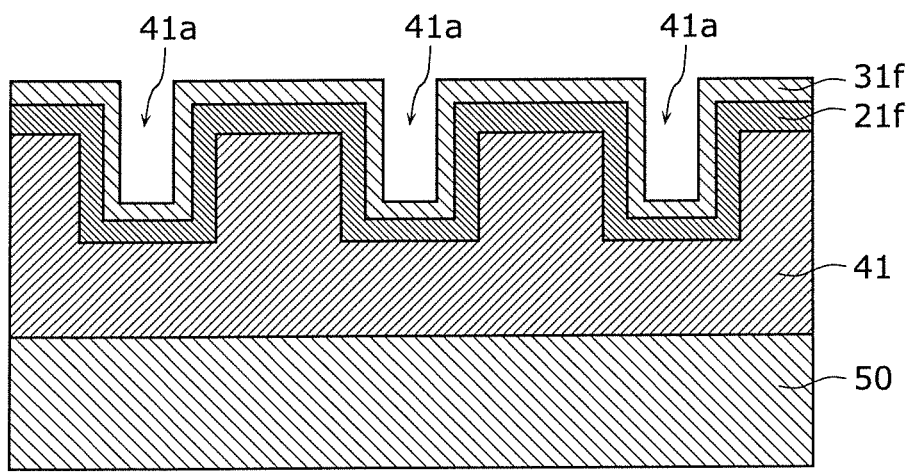
FIG. 11F is a cross-sectional view showing a first solid electrolyte layer formation step in the method of manufacturing the semiconductor device according to Embodiment 1.

After that, as shown in FIG. 11F, first solid electrolyte layer 31f is formed to cover first metal layer 21f and to not fill recesses 41a. Specifically, first solid electrolyte layer 31f is formed to cover the entire surface of first metal layer 21f. At this time, first solid electrolyte layer 31f is formed to cover the surface of first metal layer 21f that is not formed inside recesses 41a, and the inner side surfaces and the bottom surface of first metal layer 21f that are formed inside recesses 41a. First solid electrolyte layer 31f may be formed by sputtering or atomic layer deposition (ALD), for example.

In this case, first solid electrolyte layer 31f may be formed not by sputtering but by the ALD in one preferred embodiment. By the ALD, first solid electrolyte layer 31f is easily formed as a continuous film with a uniform thickness along an uneven surface, even if first solid electrolyte layer 31f is formed on an uneven underlying structure. That is, first solid electrolyte layer 31f can be formed with a uniform thickness not only on the surface of first metal layer 21f that is not formed inside recesses 41a but also on the inner side surfaces and the bottom surface of first metal layer 21f that are formed along the inner surface shapes of recesses 41a. In this embodiment, a lithium phosphorus oxynitride (LiPON) film is formed as first solid electrolyte layer 31f by the ALD. The detailed formation of the LiPON film is described in U.S. Pat. No. 9,809,490, for example.

Figure 11G:
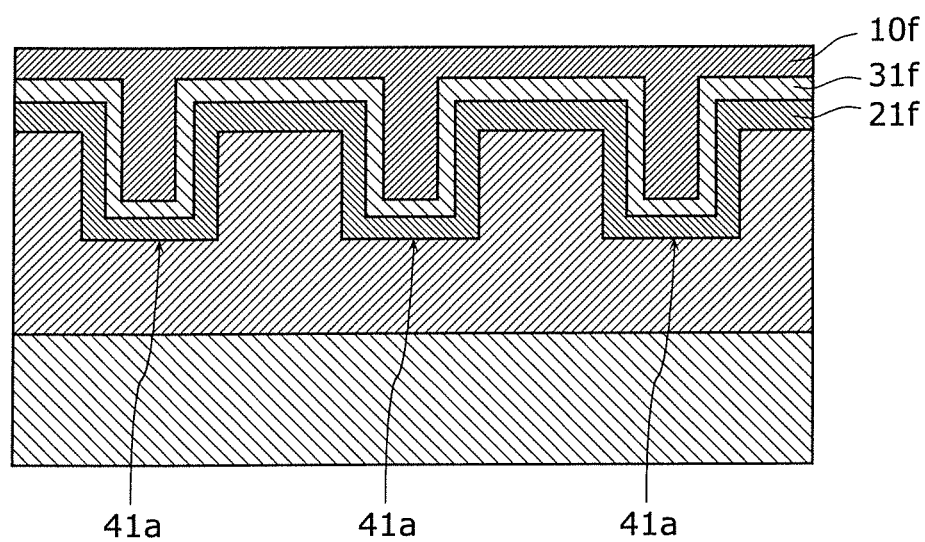
FIG. 11G is a cross-sectional view showing an interconnect layer formation step in the method of manufacturing the semiconductor device according to Embodiment 1.

Next, as shown in FIG. 11G, interconnect layer 10f is formed to be enclosed by first solid electrolyte layer 31f and to fill recesses 41a. Specifically, interconnect layer 10f is formed to fill the trenches of first solid electrolyte layer 31f. At this time, interconnect layer 10f is formed to cover the surface of first solid electrolyte layer 31f that is not formed inside recesses 41a and the inner side surfaces and the bottom surface of first solid electrolyte layer 31f that are formed inside recesses 41a. In this embodiment, a cobalt film is formed as interconnect layer 10f by the CVD. After that, the cobalt film is treated by heat.

Figure 11H:
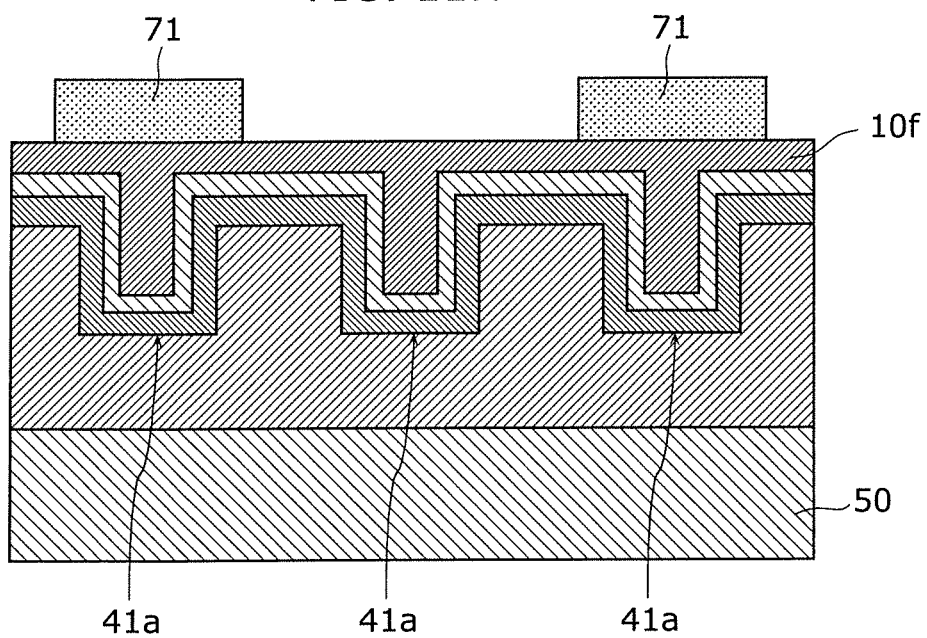
FIG. 11H is a cross-sectional view showing a first resist formation step in the method of manufacturing the semiconductor device according to Embodiment 1.

Then, as shown in FIG. 11H, in order to pattern interconnect layer 10f, first resist 71 is formed in a predetermined shape on interconnect layer 10f. For example, a film of a photosensitive resin material is formed on the entire upper surface of substrate 50, exposed to light, and developed. Accordingly, first resist 71 can be obtained in the predetermined shape. In FIG. 11H, first resist 71 is formed on first interconnect passage 101 and second interconnect passage 102 but not on third interconnect passage 103.

Figure 11I:
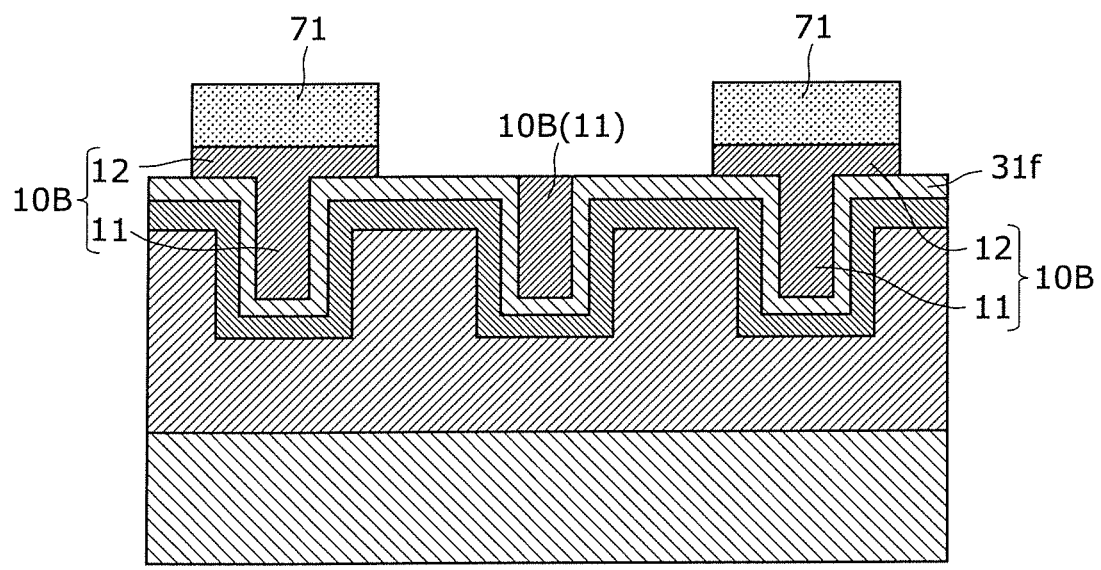
FIG. 11I is a cross-sectional view showing an interconnect layer patterning step in the method of manufacturing the semiconductor device according to Embodiment 1.

After that, as shown in FIG. 11I, interconnect layer 10f is etched using first resist 71 as a mask so as to be patterned. At this time, interconnect layer 10f is removed until first solid electrolyte layer 31f immediately under interconnect layer 10f is exposed. Accordingly, interconnect layer 10f is partially removed and separated to form interconnect layer 10B in a predetermined shape. Specifically, the part of interconnect layer 10f under first resist 71 is not etched and remains to serve as interconnect layer 10B composed of first interconnect layer 11 and second interconnect layer 12. On the other hand, the part of interconnect layer 10f not formed with first resist 71 on first solid electrolyte layer 31f is removed by etching to serve as interconnect layer 108 composed only of first interconnect layer 11. At this time, the part of first solid electrolyte layer 31f not formed with first resist 71 is exposed.

Figure 11J:
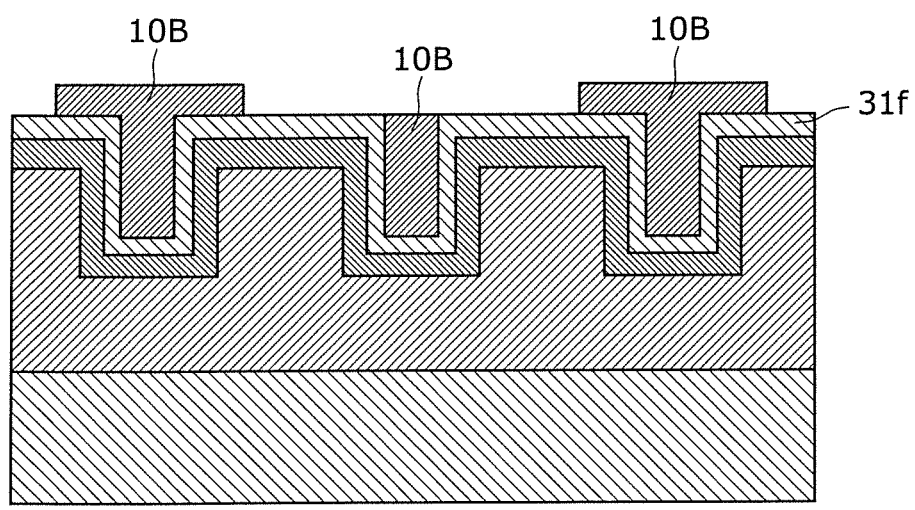
FIG. 11J is a cross-sectional view showing a first resist removal step in the method of manufacturing the semiconductor device according to Embodiment 1.

Next, as shown in FIG. 11J, first resist 71 is removed. Accordingly, interconnect layer 10B is exposed.

Figure 11K:
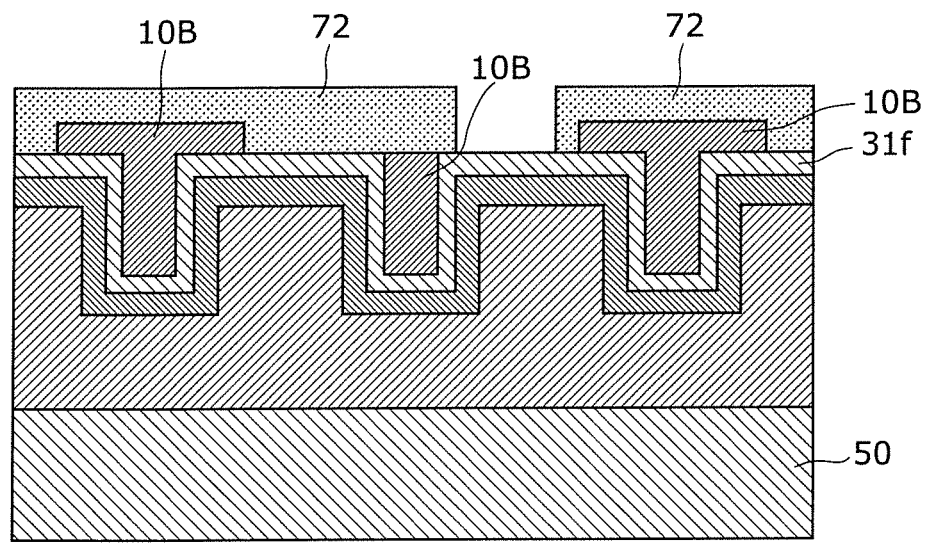
FIG. 11K is a cross-sectional view showing a second resist formation step in the method of manufacturing the semiconductor device according to Embodiment 1.

Then, as shown in FIG. 11K, in order to pattern first solid electrolyte layer 31f, second resist 72 is formed in a predetermined shape on first solid electrolyte layer 31f to cover interconnect layer 10B. For example, a film of a photosensitive resin material is formed on the entire upper surface of substrate 50 exposed to light, and developed. Accordingly, second resist 72 can be obtained in the predetermined shape. In FIG. 11K, second resist 72 is formed on first interconnect passage 101 and across second interconnect passage 102 and third interconnect passage 103 but not between first interconnect passage 101 and third interconnect passage 103.

Figure 11L:
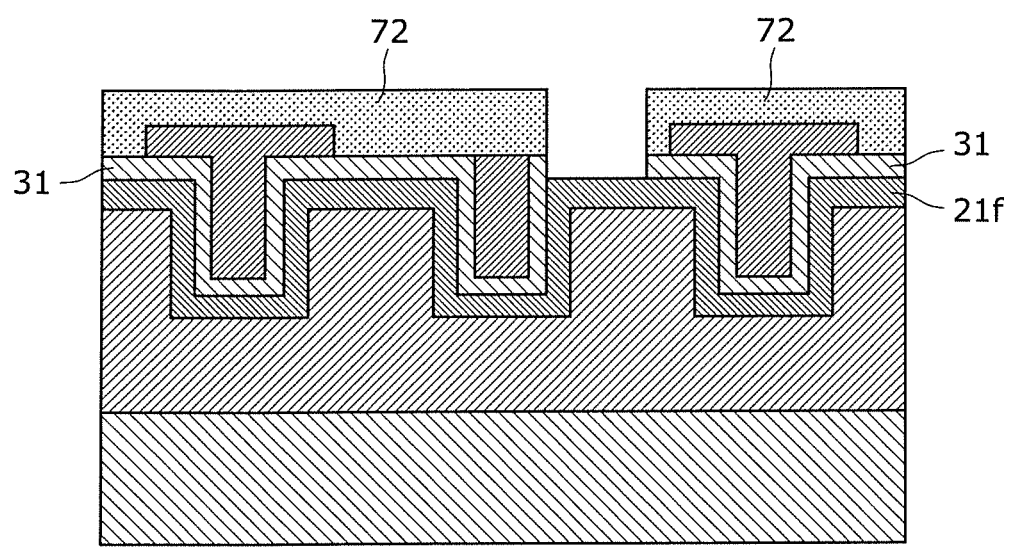
FIG. 11L is a cross-sectional view showing a first solid electrolyte layer patterning step in the method of manufacturing the semiconductor device according to Embodiment 1.

After that, as shown in FIG. 11L, first solid electrolyte layer 31f is etched using second resist 72 as a mask so as to be patterned. At this time, first solid electrolyte layer 31f is removed until first metal layer 21f immediately under first solid electrolyte layer 31f is exposed. Accordingly, first solid electrolyte layer 31f is partially removed and separated to form first solid electrolyte layer 31 in a predetermined shape. Specifically, the part of first solid electrolyte layer 31f under second resist 72 is not etched and remains to serve as first solid electrolyte layer 31. On the other hand, the part of first solid electrolyte layer 31f not formed with second resist 72 is removed by etching.

Figure 11M:
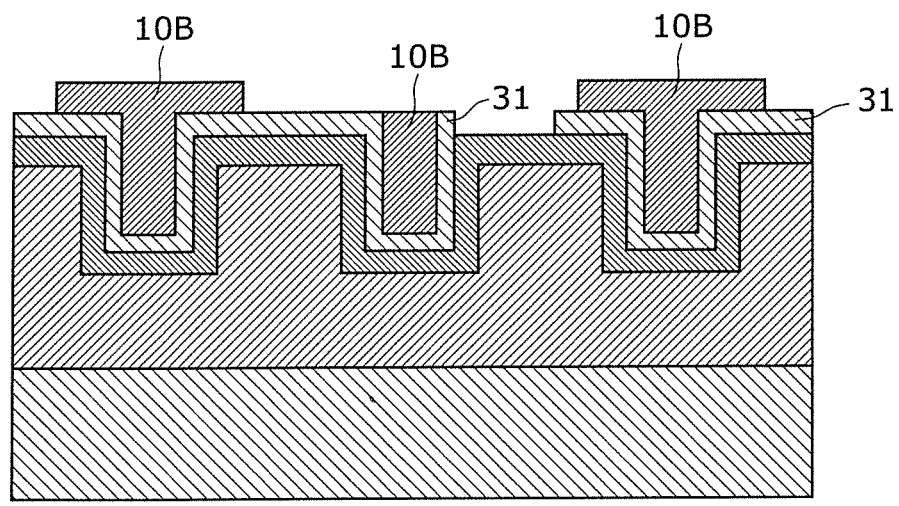
FIG. 11M is a cross-sectional view showing a second resist removal step in the method of manufacturing the semiconductor device according to Embodiment 1.

Next, as shown in FIG. 11M, second resist 72 is removed. Accordingly, interconnect layer 10B and first solid electrolyte layer 31 are exposed.

Figure 11N:
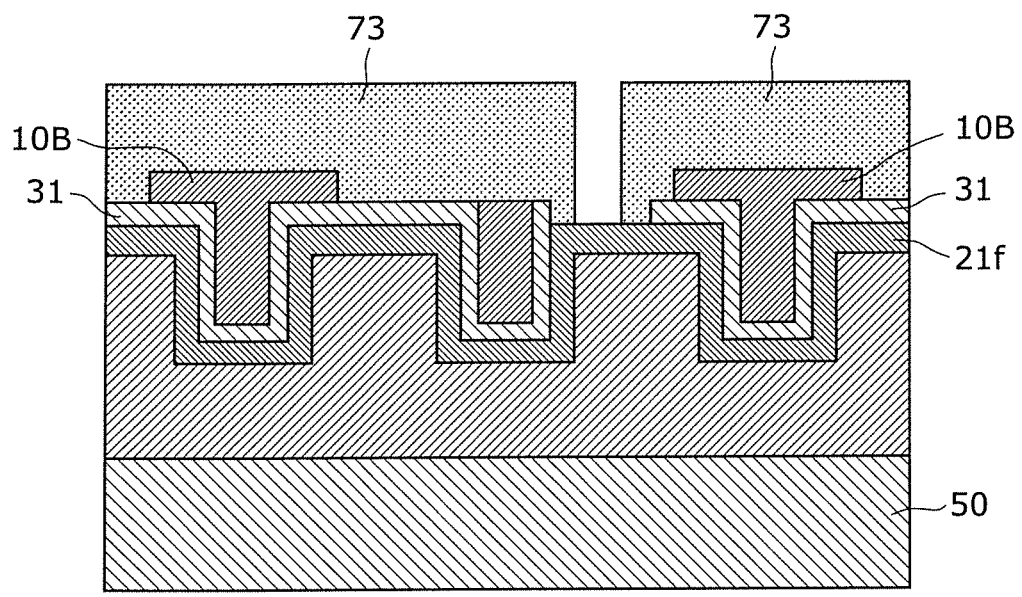
FIG. 11N is a cross-sectional view showing a third resist formation step in the method of manufacturing the semiconductor device according to Embodiment 1.

Then, as shown in FIG. 11N, in order to pattern first metal layer 21f, third resist 73 is formed in a predetermined shape on first metal layer 21f to cover interconnect layer 10B and first solid electrolyte layer 31. For example, a film of a photosensitive resin material is formed on the entire upper surface of substrate 50, exposed to light, and developed. Accordingly, third resist 73 can be obtained in the predetermined shape. In FIG. 11N, third resist 73 is formed on first interconnect passage 101 and across second interconnect passage 102 and third interconnect passage 103 but not between first interconnect passage 101 and third interconnect passage 103.

Figure 11O:
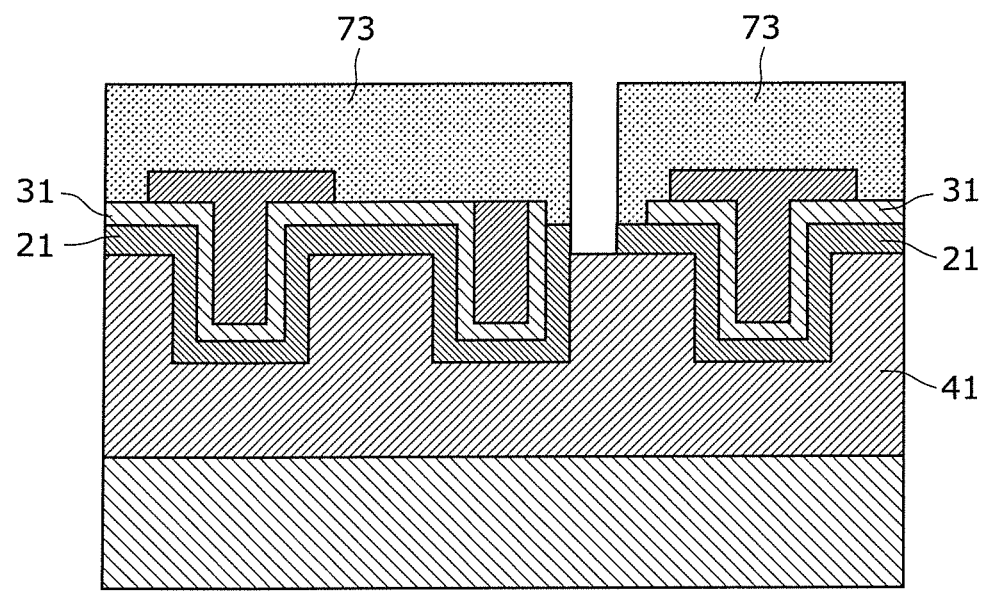
FIG. 11O is a cross-sectional view showing a first metal layer patterning step in the method of manufacturing the semiconductor device according to Embodiment 1.

After that, as shown in FIG. 11O, first metal layer 21f is etched using third resist 73 as a mask so as to be patterned. At this time, first metal layer 21f is removed until first interlayer insulating layer 41 immediately under first metal layer 21f is exposed. Accordingly, first metal layer 21f is partially removed and separated to form first metal layer 21 in a predetermined shape. Specifically, the part of first metal layer 21f under third resist 73 is not etched and remains to serve as first metal layer 21. On the other hand, the part of first metal layer 21f not formed with third resist 73 is removed by etching.

Figure 11P:
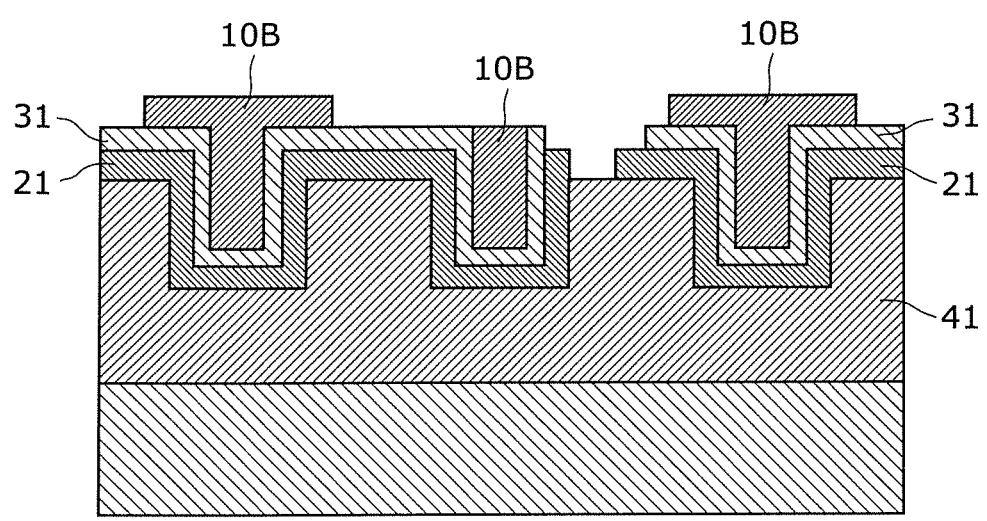
FIG. 11P is a cross-sectional view showing a third resist removal step in the method of manufacturing the semiconductor device according to Embodiment 1.

Next, as shown in FIG. 11P, third resist 73 is removed. Accordingly, interconnect layer 10B, first solid electrolyte layer 31, and first metal layer 21 are exposed.

Figure 11Q:
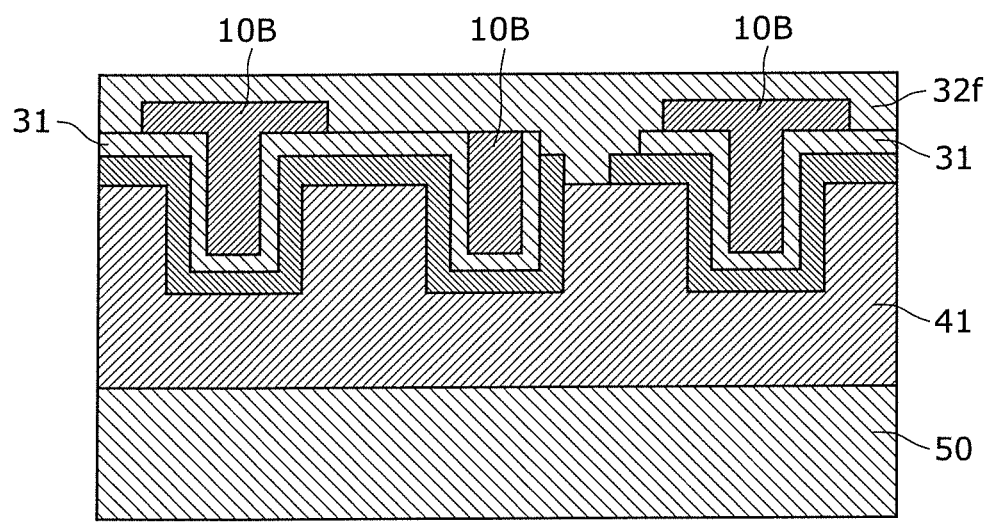
FIG. 11Q is a cross-sectional view showing a second solid electrolyte layer formation step in the method of manufacturing the semiconductor device according to Embodiment 1.

Then, as shown in FIG. 11Q, second solid electrolyte layer 32f is formed to cover interconnect layer 10B, first solid electrolyte layer 31, and first metal layer 21. Specifically, second solid electrolyte layer 32f is formed on the upper surface of substrate 50. Second solid electrolyte layer 32f may be formed by sputtering or atomic layer deposition (ALD), for example. Second solid electrolyte layer 32f may be made of the same material as first solid electrolyte layer 31f. In this embodiment, a lithium phosphorus oxynitride (LiPON) film is formed as second solid electrolyte layer 32f by the ALD.

Figure 11R:
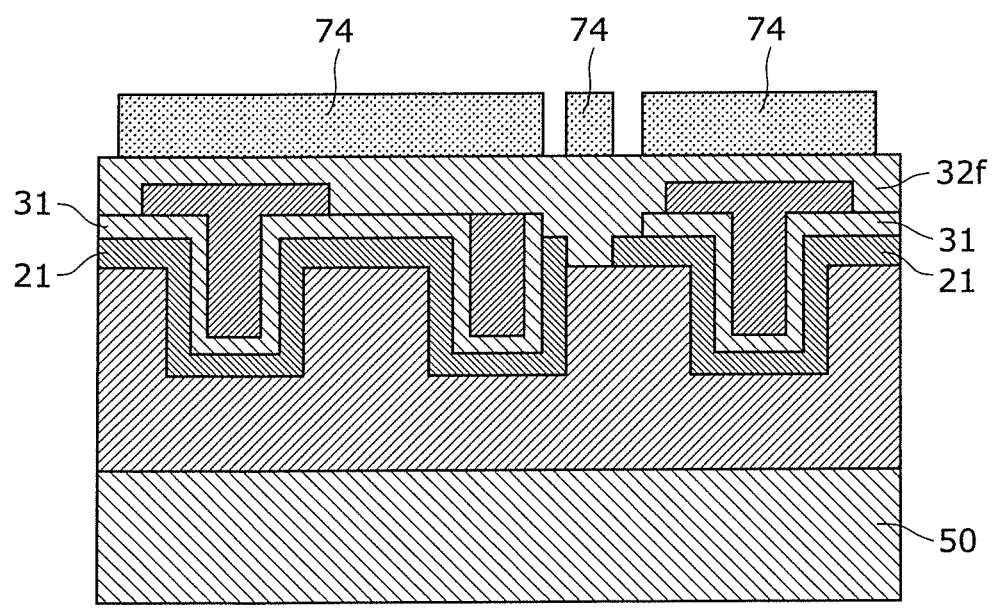
FIG. 11R is a cross-sectional view showing a fourth resist formation step in the method of manufacturing the semiconductor device according to Embodiment 1.

After that, as shown in FIG. 11R, in order to pattern second solid electrolyte layer 32f, fourth resist 74 is formed in a predetermined shape on second solid electrolyte layer 32f. For example, a film of a photosensitive resin material is formed on the entire surface of second solid electrolyte layer 32f, exposed to light, and developed. Accordingly, fourth resist 74 can be obtained in the predetermined shape. In FIG. 11R, fourth resist 74 is formed on first interconnect passage 101 but not across second interconnect passage 102 and third interconnect passage 103. Fourth resist 74 is not formed on the part of first metal layer 21 exposed from first solid electrolyte layer 31 between first interconnect passage 101 and third interconnect passage 103, either.

Figure 11S:
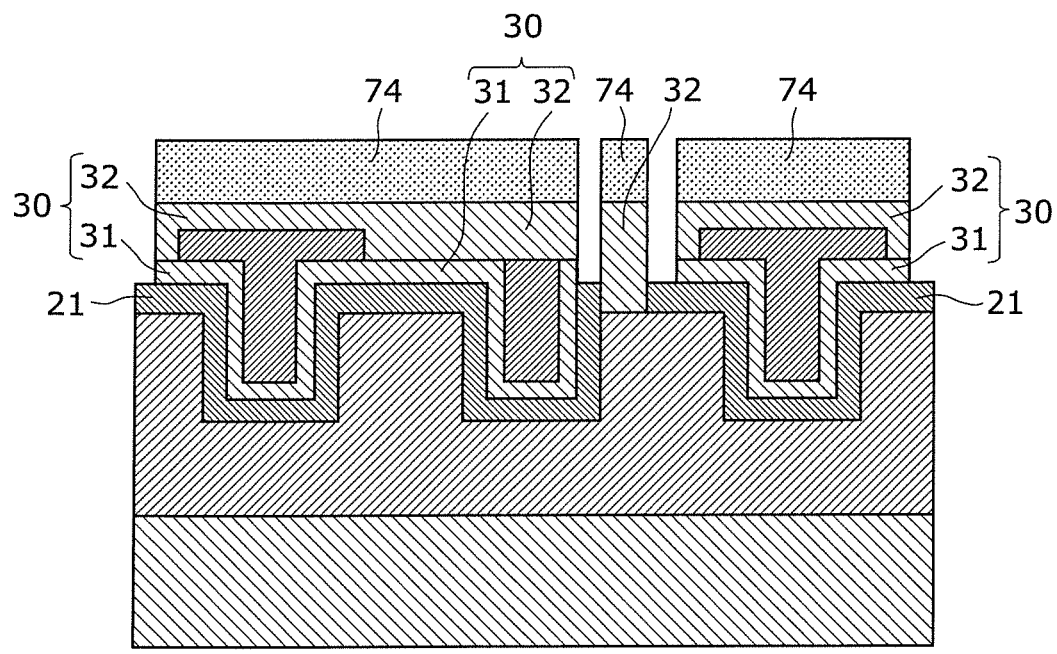
FIG. 11S is a cross-sectional view showing a second solid electrolyte layer patterning step in the method of manufacturing the semiconductor device according to Embodiment 1.

Next, as shown in FIG. 11S, second solid electrolyte layer 32f is etched using fourth resist 74 as a mask so as to be patterned. At this time, second solid electrolyte layer 32f is removed until first metal layer 21 is exposed. Accordingly, second solid electrolyte layer 32f is partially removed and separated to form second solid electrolyte layer 32 in a predetermined shape. Specifically, the part of second solid electrolyte layer 32f under fourth resist 74 is not etched and remains to serve as second solid electrolyte layer 32. On the other hand, the part of second solid electrolyte layer 32f not formed with fourth resist 74 is removed by etching.

Figure 11T:
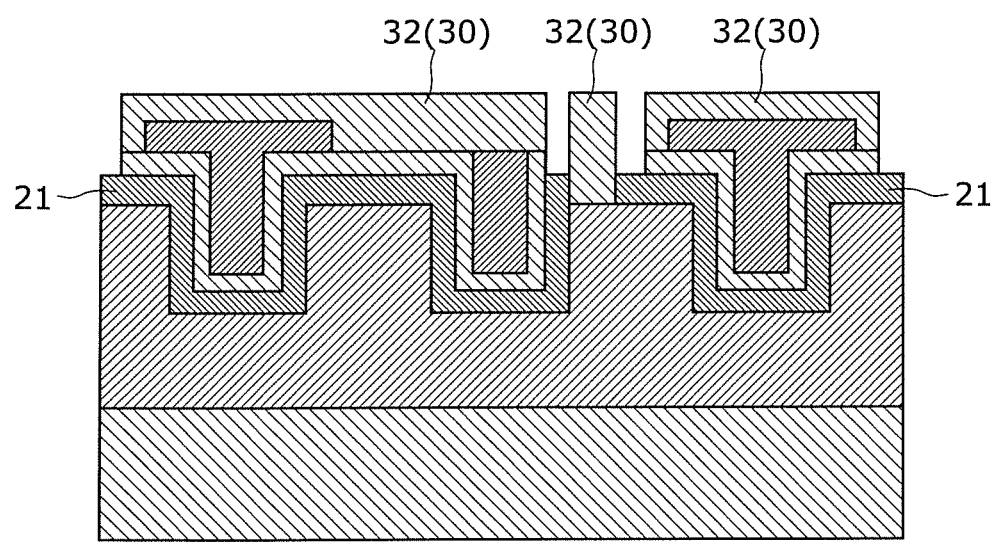
FIG. 11T is a cross-sectional view showing a fourth resist removal step in the method of manufacturing the semiconductor device according to Embodiment 1.

Then, as shown in FIG. 11T, fourth resist 74 is removed. Accordingly, second solid electrolyte layer 32 and the ends of first metal layer 21 are exposed.

Figure 11U:
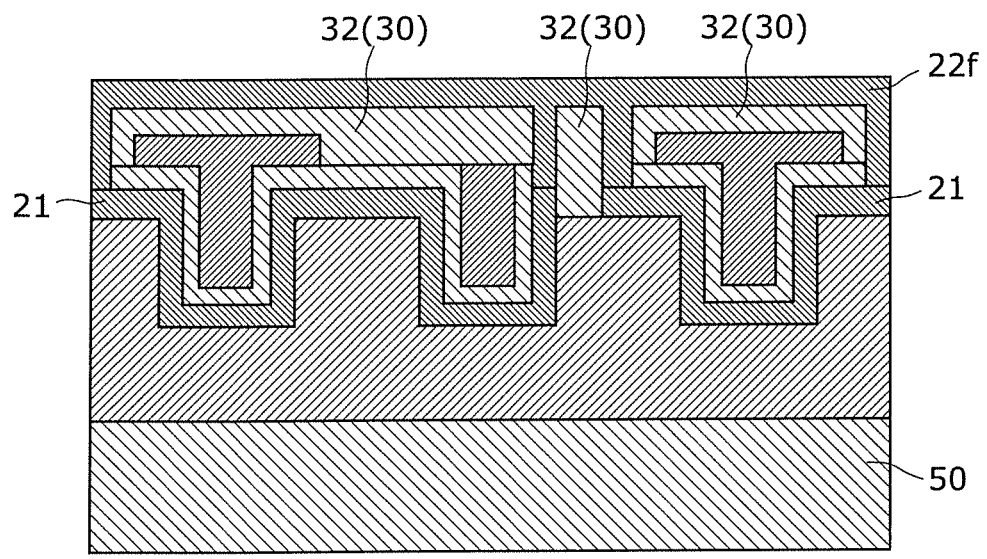
FIG. 11U is a cross-sectional view showing a second metal layer formation step in the method of manufacturing the semiconductor device according to Embodiment 1.

After that, as shown in FIG. 11U, second metal layer 22f is formed to cover second solid electrolyte layer 32 and the ends of first metal layer 21. Specifically, second metal layer 22f is formed above the entire upper surface of substrate 50 to fill the gaps in second solid electrolyte layer 32. Second metal layer 22f may be made of the same material as first metal layer 21f. In this embodiment, a titanium nitride film made of titanium nitride is formed as second metal layer 22f by sputtering.

Figure 11V:
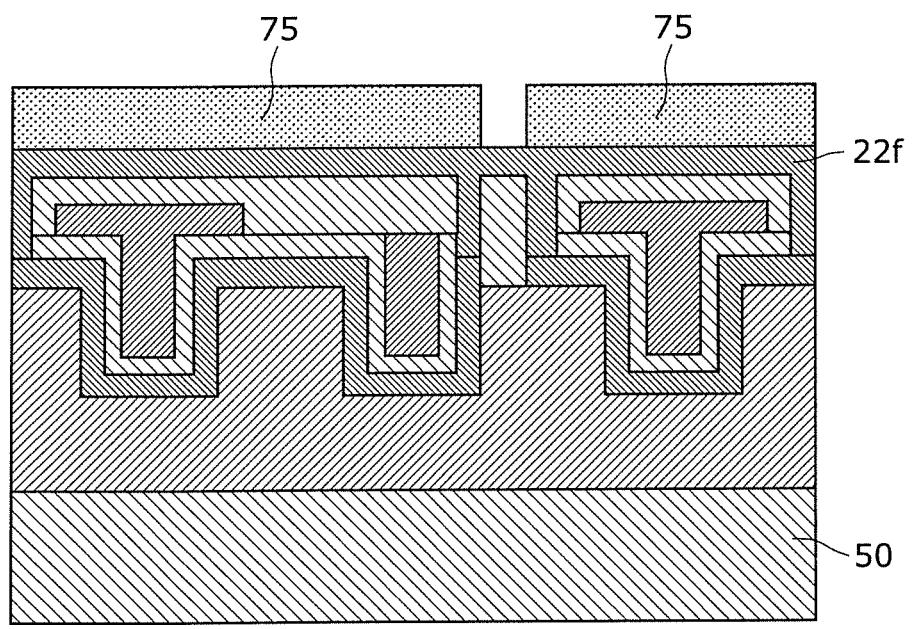
FIG. 11V is a cross-sectional view showing a fifth resist formation step in the method of manufacturing the semiconductor device according to Embodiment 1.

Next, as shown in FIG. 11V, in order to pattern second metal layer 22f, fifth resist 75 is formed in a predetermined shape on second metal layer 22. For example, a film of a photosensitive resin material is formed on the entire upper surface of second metal layer 22f, exposed to light, and developed. Accordingly, fifth resist 75 can be obtained in the predetermined shape. In FIG. 11V, fifth resist 75 is formed on first interconnect passage 101 and across second interconnect passage 102 and third interconnect passage 103 but not between first interconnect passage 101 and third interconnect passage 103.

Figure 11W:
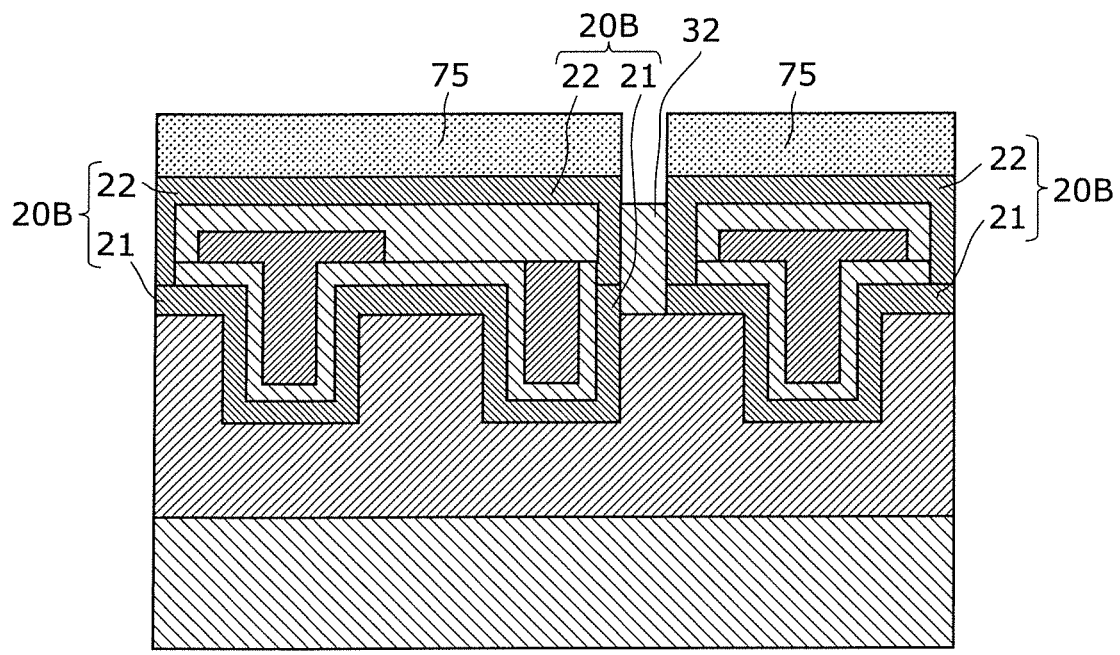
FIG. 11W is a cross-sectional view showing a second metal layer patterning step in the method of manufacturing the semiconductor device according to Embodiment 1.

Then, as shown in FIG. 11W, second metal layer 22f is etched using fifth resist 75 as a mask so as to be patterned. At this time, second metal layer 22f is removed until second solid electrolyte layer 32 is exposed. Accordingly, second metal layer 22f is partially removed and separated to form second metal layer 22 in a predetermined shape. Specifically, the part of second metal layer 22f under fifth resist 75 is not etched and remains to serve as second metal layer 22. On the other hand, the part of second metal layer 22f not formed with fifth resist 75 is removed by etching. Accordingly, metal layer 20B is formed which is composed of first metal layer 21 and second metal layer 22.

Figure 11X:
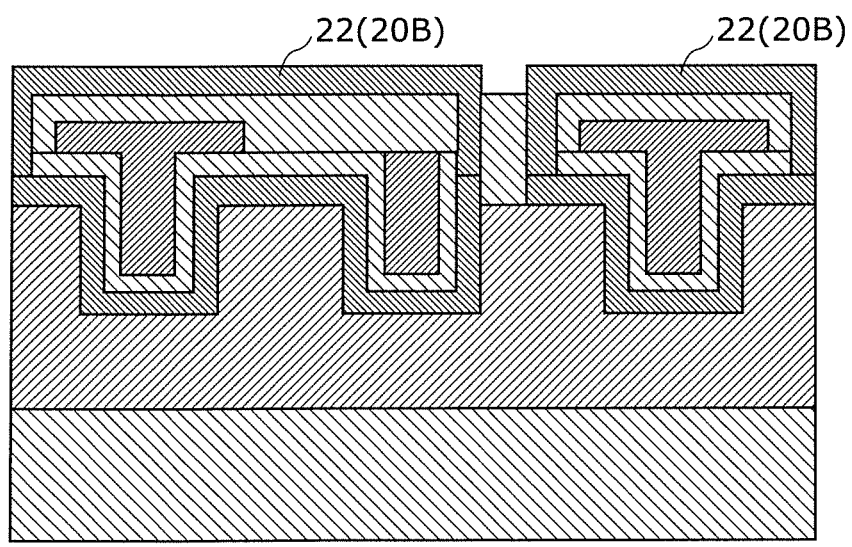
FIG. 11X is a cross-sectional view showing a fifth resist removal step in the method of manufacturing the semiconductor device according to Embodiment 1.
Figure 11Y:
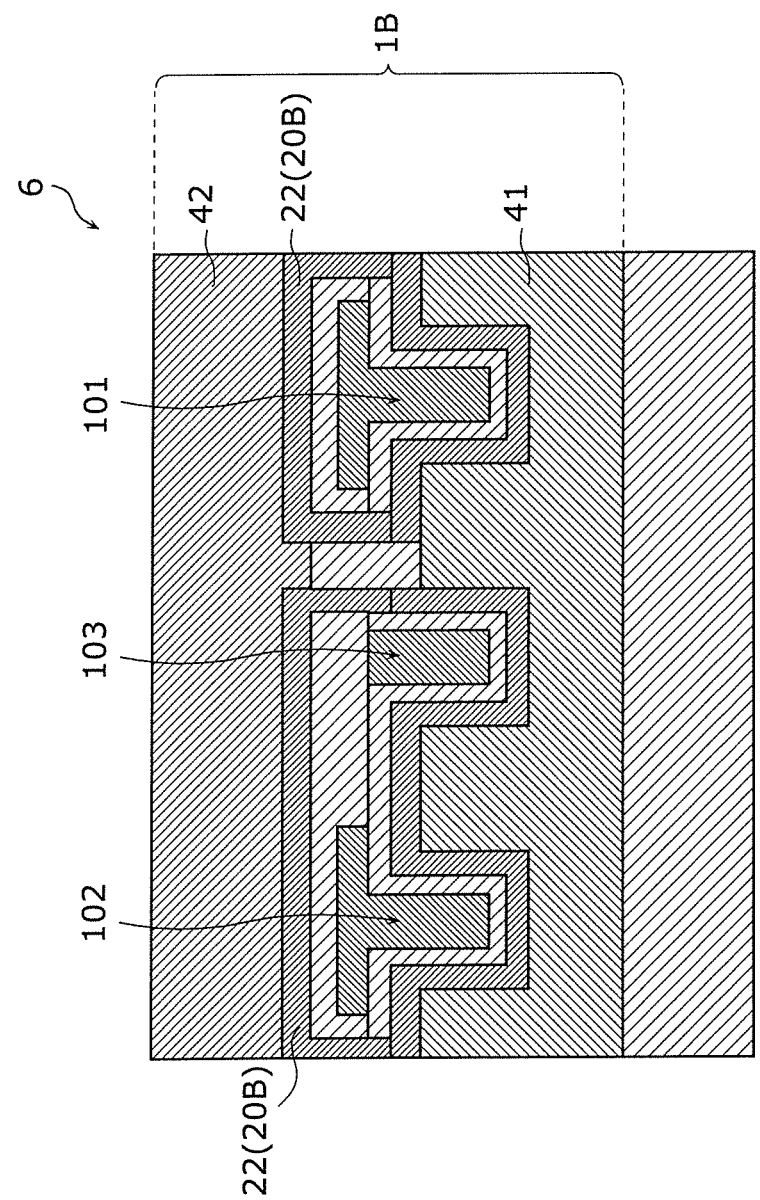
FIG. 11Y is a cross-sectional view showing a second interlayer insulating layer formation step in the method of manufacturing the semiconductor device according to Embodiment 1.

After that, as shown in FIG. 11X, fifth resist 75 is removed. Accordingly, second metal layer 22 is exposed.

Next, as shown in FIG. 11Y, second interlayer insulating layer 42 is formed to cover second metal layer 22. Like first interlayer insulating layer 41, second interlayer insulating layer 42 may be a silicon dioxide film or a silicon oxycarbide film, for example. Second interlayer insulating layer 42 may be formed by sputtering or the CVD, for example.

As described above, semiconductor device 6 can be fabricated which has interconnect structure 1B including first, second, and third interconnect passages 101, 102, and 103. That is, semiconductor device 6 shown in FIG. 7 can be fabricated.

Note that the semiconductor devices and interconnect structures other than semiconductor device 6 shown in FIG. 7 may be fabricated in accordance with the manufacturing method shown in FIGS. 11A to 11Y.

Variation 1 of Embodiment 1

Figure 12:
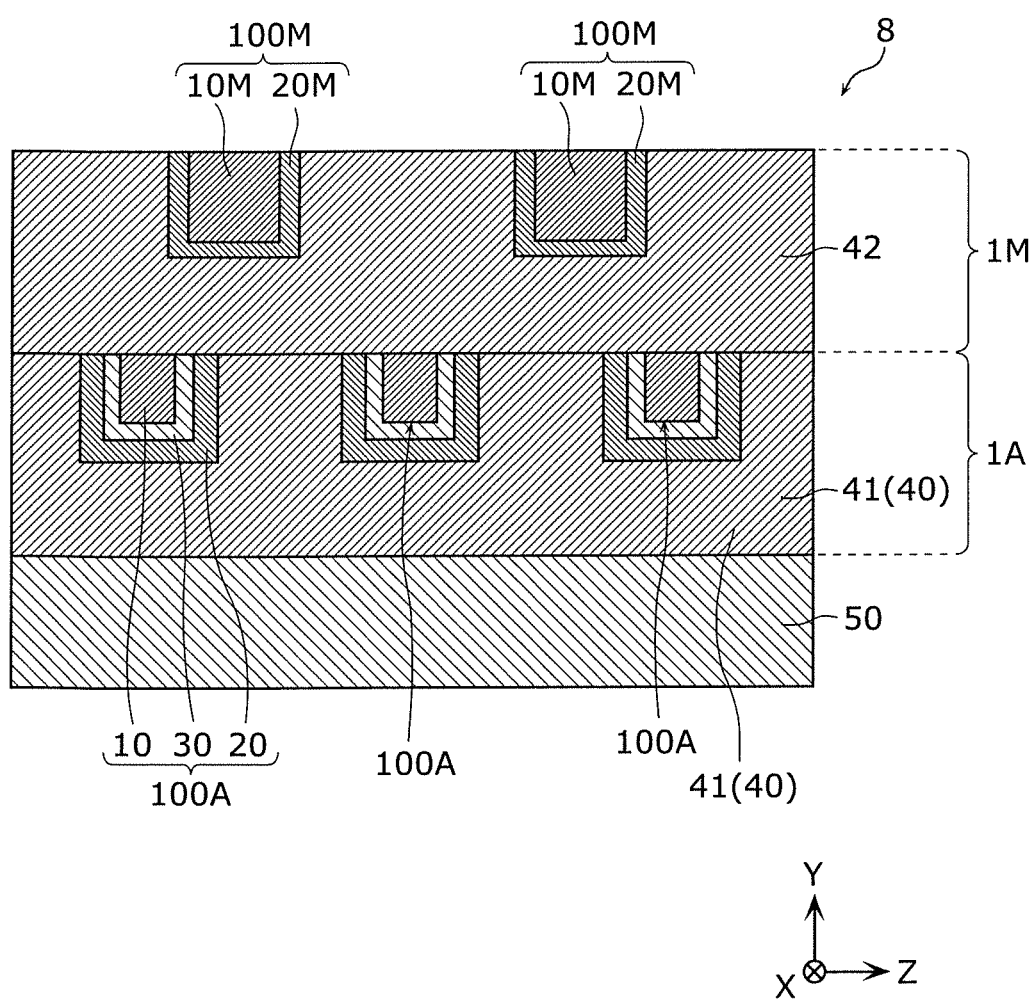
FIG. 12 is a cross-sectional view of a semiconductor device according to Variation 1 of Embodiment 1.

Now, semiconductor device 8 according to Variation 1 of Embodiment 1 will be described with reference to FIG. 12. FIG. 12 is a cross-sectional view of semiconductor device 8 according to Variation 1 of Embodiment 1.

As shown in FIG. 12, semiconductor device 8 according to this variation includes substrate 50, interconnect structure (or first interconnect structure) 1A on substrate 50, and second interconnect structure 1M on interconnect structure 1A.

Interconnect structure 1A according to this variation has the same configuration as interconnect structure 1A shown in FIG. 3. However, insulating layer 40 of interconnect structure 1A serves as first interlayer insulating layer 41. Specifically, first interlayer insulating layer 41 is formed on substrate 50.

Second interconnect structure 1M includes second interlayer insulating layer 42 on first interlayer insulating layer 41, and second interconnect passages 100M in second interlayer insulating layer 42.

Second interlayer insulating layer 42 may be made of the same or a different material from first interlayer insulating layer 41 (i.e., insulating layer 40) of interconnect structure 1A. In this variation, second interlayer insulating layer 42 is made of a low dielectric material such as fluorosilicate glass (FSG).

Each second interconnect passage 100M includes second interconnect layer 10M and second metal layer 20M. Like interconnect passages (or first interconnect passages) 100A of interconnect structure 1A, second interconnect passages 100M are interconnects for electrically connecting circuit elements in semiconductor device 8.

In second interconnect passage 100M, second interconnect layer 10M functions as a signal line for mainly transmitting electrical signals. In this variation, second interconnect layer 10M has a long size extending in the direction (i.e., along the X-axis in this embodiment) like interconnect layer (i.e., first interconnect layer) 10 of interconnect passage 100A.

Second interconnect layer 10M is an interconnect containing a metal element as a main component. Second interconnect layer 10M may be made of the same or a different material from interconnect layer (i.e., first interconnect layer) 10 of interconnect passage 100A. In this variation, second interconnect layer 10M is made of a different material from the first interconnect layer (i.e., interconnect layer 10). Specifically, second interconnect layer 10M is made of copper (Cu).

Second metal layer 20M is opposite to second interconnect layer 10M. In this variation, second metal layer 20M extends in the same direction as second interconnect layer 10M. In addition, second metal layer 20M encloses second interconnect layer 10M. Specifically, second metal layer 20M covers the pair of side surfaces and the bottom surface of second interconnect layer 10M.

Second metal layer 20M is made of a material containing a metal element as a main component. Second metal layer 20M may be made of the same or a different material from metal layer (i.e., first metal layer) 20 of interconnect passage 100A. In this variation, second metal layer 20M is made of tantalum nitride (TaN). Second metal layer 20M functions as a barrier film that blocks the material (i.e., Cu in this variation) contained in second interconnect layer 10M leaking out of second interconnect passage 100M.

In this variation, second interconnect layer 10M of second interconnect structure 1M has a larger line width than interconnect layer 10 of interconnect structure 1A. Accordingly, second interconnect layer 10M of second interconnect structure 1M has a smaller resistance value than interconnect layer 10 of interconnect structure 1A. Accordingly, second interconnect passage 100M of second interconnect structure 1M has a lower interconnect resistance than interconnect layer 10 of interconnect structure 1. As an example, second interconnect layer 10M of second interconnect structure 1M has a line width of 20 nm.

In this manner, semiconductor device 8 according to this variation has interconnect structure 1A according to Embodiment 1 described above, and thus provides the same advantage as Embodiment 1 described above. That is, the device reduces an increase in the resistance value of interconnect layer 10 caused by a decrease in the line width. In addition, the resistance value of interconnect layer 10 can be reduced as compared to the interconnect structure without solid electrolyte layer 30 but with the same line width.

Semiconductor device 8 according to this variation further includes second interconnect structure 1M including second interconnect layer 10M with a greater line width than interconnect layer 10 of interconnect structure 1A. Accordingly, semiconductor device 8 with a hybrid structure of interconnect layer 10 and 10M can be achieved. Interconnect layer 10 has a resistance reduced by solid electrolyte layer 30 included therein. Second interconnect layer 10M has a low resistance even without any solid electrolyte layer.

Now, a method of manufacturing semiconductor device 8 according to this variation will be described with reference to FIGS. 13A to 13D. FIGS. 13A to 13D are for illustrating the method of manufacturing semiconductor device 8 according to Variation 1 of Embodiment 1.

Figure 13A:
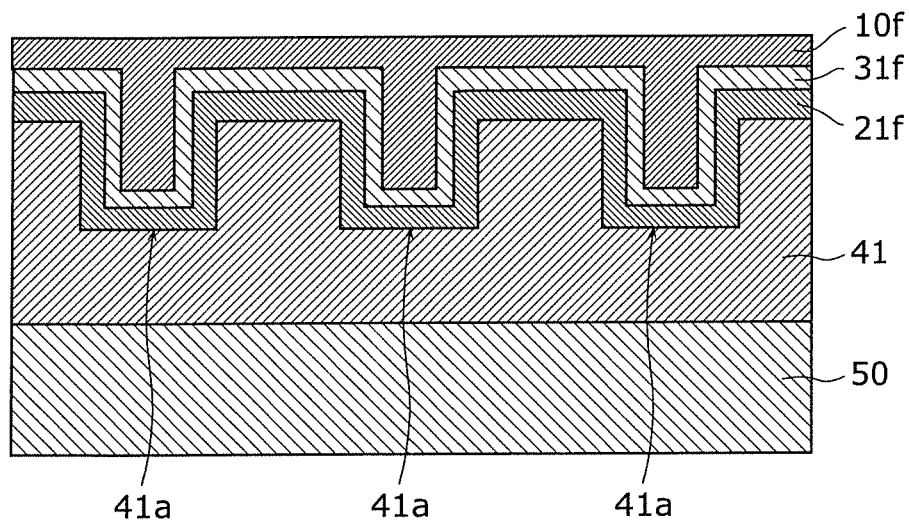
FIG. 13A is a cross-sectional view showing a step of burying and forming a first metal layer, a first solid electrolyte layer, and an interconnect layer in recesses of a first interlayer insulating layer in the method of manufacturing the semiconductor device according to Variation 1 of Embodiment 1.

As shown in FIG. 13A, first, first metal layer 21f, first solid electrolyte layer 31f, and interconnect layer 10f are buried in recesses 41a of first interlayer insulating layer 41 formed on substrate 50 in the same steps as shown in FIGS. 11A to 11G described above.

Figure 13B:
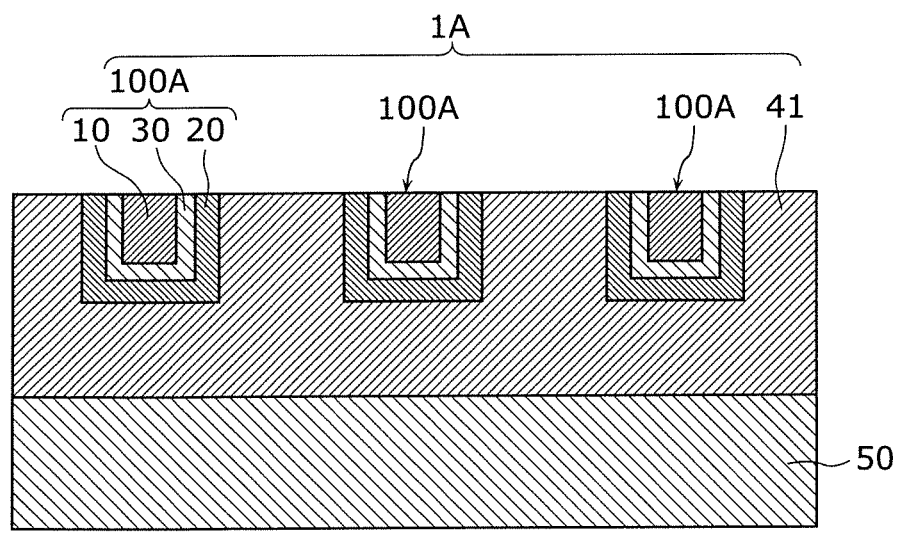
FIG. 13B is a cross-sectional view showing a polishing step in the method of manufacturing the semiconductor device according to Variation 1 of Embodiment 1.

Next, as shown in FIG. 13B, interconnect layer 10f, first solid electrolyte layer 31f, and first metal layer 21f are polished by chemical mechanical polishing (CMP), for example, until the surface of first interlayer insulating layer 41 is exposed. The parts of the layers on first interlayer insulating layer 41 is removed. Accordingly, interconnect structure 1A including interconnect passages 100A buried in first interlayer insulating layer 41 can be formed on substrate 50. In this variation, interconnect structure 1A is formed which includes the plurality of interconnect passages 100A.

Figure 13C:
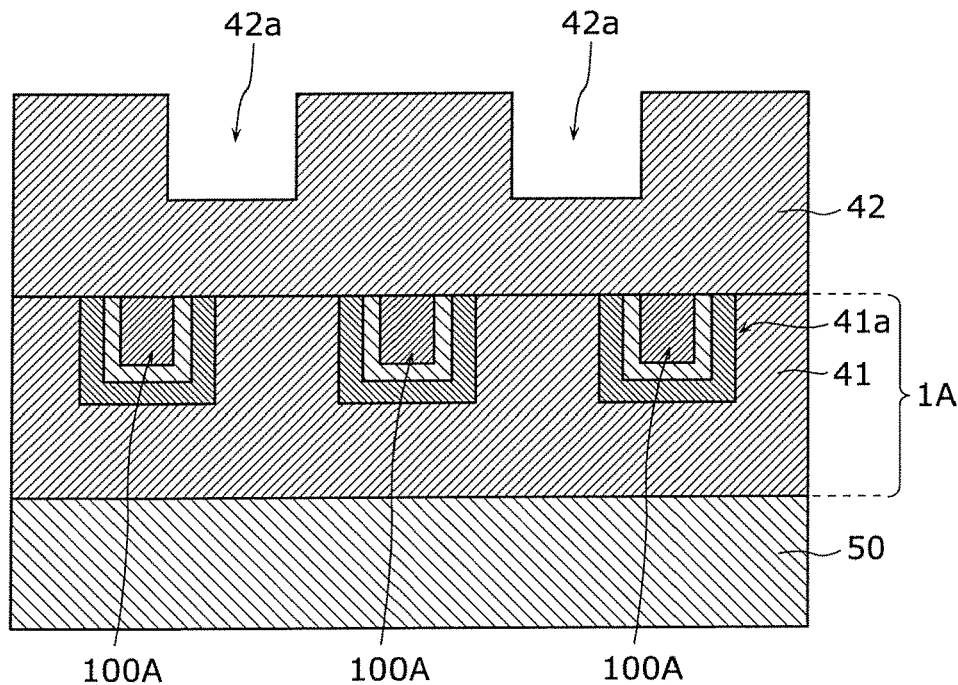
FIG. 13C is a cross-sectional view showing a step of forming, on an underlying interconnect structure, a second interlayer insulating layer with recesses in the method of manufacturing the semiconductor device according to Variation 1 of Embodiment 1.

Then, as shown in FIG. 13C, second interlayer insulating layer 42 having recesses 42a is formed on interconnect structure 1A. Specifically, first, second interlayer insulating layer 42 is formed by the CVD. Recesses 42a for burying second interconnect passages 100M are formed in second interlayer insulating layer 42 by etching. At this time, recesses 42a have a larger width than recesses 41a in first interlayer insulating layer 41 of interconnect structure 1A. Recesses 42a have a width of 20 nm, as an example.

Figure 13D:
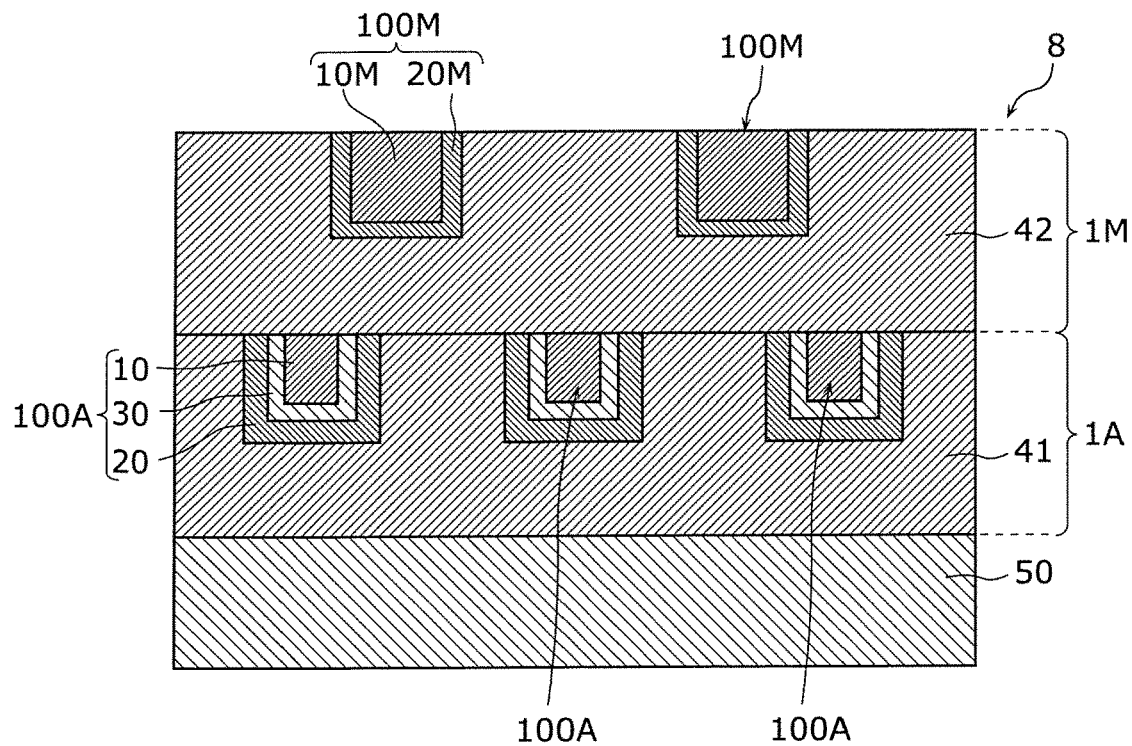
FIG. 13D is a cross-sectional view showing a step of burying and forming a second interconnect passage in the recesses of the second interlayer insulating layer in the method of manufacturing the semiconductor device according to Variation 1 of Embodiment 1.

After that, as shown in FIG. 13D, second interconnect passages 100M buried in recesses 42a of second interlayer insulating layer 42 are formed. Specifically, first, second metal layer 20M made of tantalum nitride is formed along the inner surfaces of recesses 42a by sputtering. Then, a thin copper film is formed on second metal layer 20M made of tantalum nitride by sputtering. With the thin copper film used as a seed layer, second interconnect layer 10M is deposited by plating to fill recesses 42a. Second interconnect layer 10M may be made of copper (Cu), for example. Note that the part of second interconnect layer 10M coming out of recesses 42a is polished by the CMP until second interlayer insulating layer 42 is exposed, so as to be removed.

As described above, semiconductor device 8 with the following configuration can be fabricated. In lowermost first interlayer insulating layer 41, interconnect passages 100A are buried and formed which include interconnect layer 10 made of cobalt and solid electrolyte layer 30. In second interlayer insulating layer 42 overlying first interlayer insulating layer 41, second interconnect passages 100M are buried and formed which include second interconnect layer 10M made of copper.

Note that at least one of first interlayer insulating layer 41 including interconnect passages 100A buried therein and second interlayer insulating layer 42 including second interconnect passages 100M buried therein may be repeatedly formed. Accordingly, semiconductor device 5 can be formed which has the multilayer interconnect structure, for example, as shown in FIG. 6 described above.

Variation 2 of Embodiment 1

Figure 14:
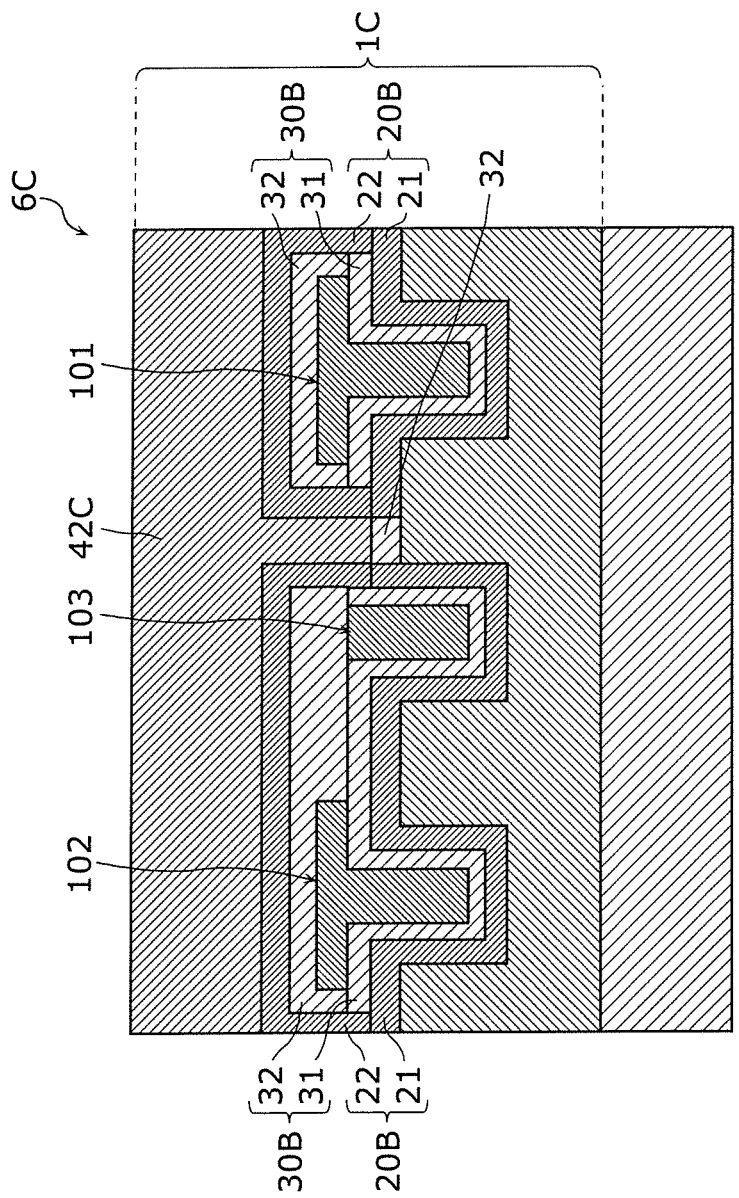
FIG. 14 is a cross-sectional view of a semiconductor device according to Variation 2 of Embodiment 1.

Now, semiconductor device 6C according to Variation 2 of Embodiment 1 will be described with reference to FIG. 14. FIG. 14 is a cross-sectional view of semiconductor device 6C according to Variation 2 of Embodiment 1.

As shown in FIG. 14, semiconductor device 6C according to this variation differs from semiconductor device 6 shown in FIG. 7 in the configuration of the region of interconnect structure 1C between first interconnect passage 101 and third interconnect passage 103.

Specifically, in semiconductor device 6 shown in FIG. 7, between first interconnect passage 101 and third interconnect passage 103, second solid electrolyte layer 32 reaches the level corresponding to the top of second metal layer 22 of metal layer 20B. On the other hand, as shown in FIG. 14, in semiconductor device 6C according to this variation, between first interconnect passage 101 and third interconnect passage 103, second solid electrolyte layer 32 does not reach the level corresponding to the top of second metal layer 22 of metal layer 20B. The part of second solid electrolyte layer 32 between first interconnect passage 101 and third interconnect passage 103 merely reaches the level corresponding to the top of first metal layer 21 of metal layer 20B. Accordingly, second interlayer insulating layer 42C is buried on the sides of second metal layer 22 between first interconnect passage 101 and third interconnect passage 103.

As described above, like semiconductor device 6 shown in FIG. 7, semiconductor device 6C according to this variation has interconnect structure 1C including solid electrolyte layer 30B between interconnect layer 10B and metal layer 20B. The semiconductor device provides thus the same advantage as semiconductor device 6 according to Embodiment 1 described above. That is, the semiconductor device is advantageous, for example, in reducing an increase in the resistance value of the interconnect layer caused by a decrease in the line width.

Variation 3 of Embodiment 1

Figure 15:
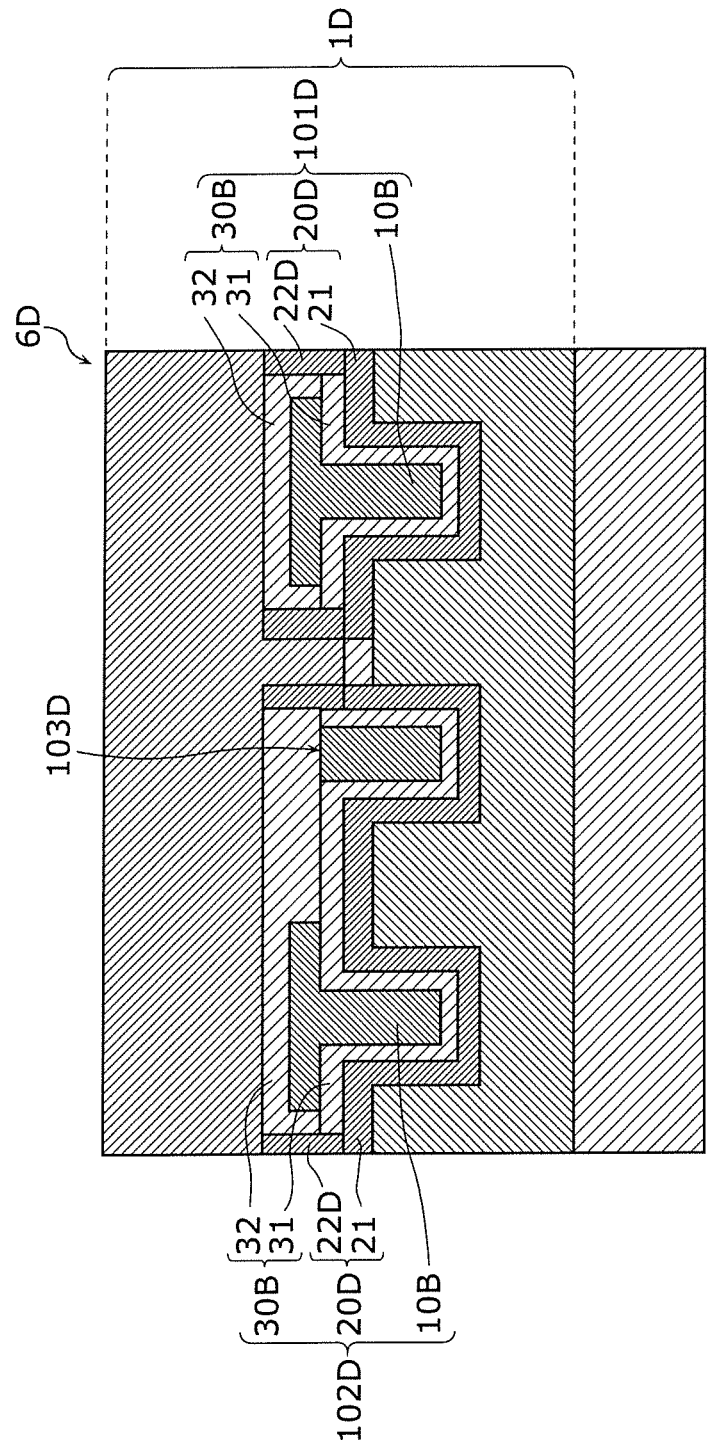
FIG. 15 is a cross-sectional view of a semiconductor device according to Variation 3 of Embodiment 1.

Now, semiconductor device 6D according to Variation 3 of Embodiment 1 will be described with reference to FIG. 15. FIG. 15 is a cross-sectional view of semiconductor device 6D according to Variation 3 of Embodiment 1.

As shown in FIG. 15, semiconductor device 6D according to this variation differs from semiconductor device 6C shown in FIG. 14 in the configuration of metal layer 20D in first, second, and third interconnect passages 101D, 102D, and 103D.

Specifically, as shown in FIG. 14, in interconnect structure 1C of semiconductor device 6C, metal layer 20B in first, second, and third interconnect passages 101, 102, and 103 covers solid electrolyte layer 30B. Specifically, second metal layer 22 of metal layer 20B is formed on the top of solid electrolyte layer 30B.

On the other hand, as shown in FIG. 15, in interconnect structure 1D of semiconductor device 6D according to this variation, metal layer 20D of first interconnect passage 101D, second interconnect passage 102D, and third interconnect passage 103D does not cover solid electrolyte layer 30B. Specifically, second metal layer 22D of metal layer 20D is not formed on the top of solid electrolyte layer 30B.

As described above, like semiconductor device 6C shown in FIG. 14, semiconductor device 6D according to this variation also has interconnect structure 1D including solid electrolyte layer 30B between interconnect layer 10B and metal layer 20D. The semiconductor device provides thus the same advantage as semiconductor device 6C according to Variation 2 described above. That is, the semiconductor device is advantageous, for example, in reducing an increase in the resistance value of interconnect layer 10B caused by a decrease in the line width.

Variation 4 of Embodiment 1

Figure 16:
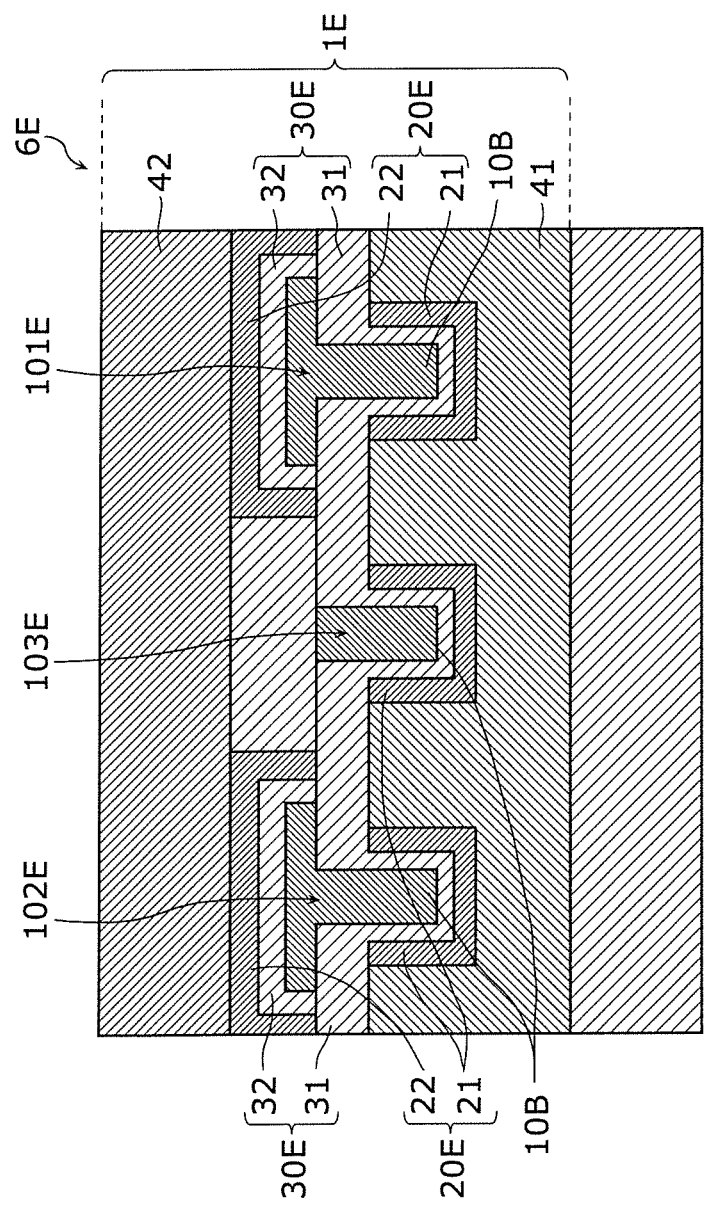
FIG. 16 is a cross-sectional view of a semiconductor device according to Variation 4 of Embodiment 1.

Now, semiconductor device 6E according to Variation 4 of Embodiment 1 will be described with reference to FIG. 16. FIG. 16 is a cross-sectional view of semiconductor device 6E according to Variation 4 of Embodiment 1.

As shown in FIG. 16, semiconductor device 6E according to this variation differs from semiconductor device 6 shown in FIG. 7 in the configurations of metal layer 20E and solid electrolyte layer 30E in first, second, and third interconnect passages 101D, 102D, and 103D.

Specifically, as shown in FIG. 7, in interconnect structure 1B of semiconductor device 6, first solid electrolyte layer 31 of solid electrolyte layer 30B is separated in first interconnect passage 101 and third interconnect passage 103. Solid electrolyte layer 30B of third interconnect passage 103 is covered by metal layer 20B.

On the other hand, as shown in FIG. 16, in interconnect structure 1E of semiconductor device 6E according to this variation, first solid electrolyte layer 31 of solid electrolyte layer 30E is not separated in first interconnect passage 101E and third interconnect passage 103E. First interconnect passage 101E, second interconnect passage 102E, and third interconnect passage 103E share first solid electrolyte layer 31. Accordingly, first metal layer 21 of metal layer 20E merely reaches the surface of first interlayer insulating layer 41. In this variation, third metal layer 20E of interconnect passage 103E does not cover solid electrolyte layer 30E. Specifically, second metal layer 22 of metal layer 20E is merely formed in the recesses of first interlayer insulating layer 41 and opposite to first solid electrolyte layer 31 formed in the recesses in first interlayer insulating layer 41.

Note that first metal layer 21 and second metal layer 22 are connected by points (not shown) in first, second, and third interconnect passages 101E, 102E, and 103E.

As described above, like semiconductor device 6 shown in FIG. 7, semiconductor device 6E according to this variation also has interconnect structure 1E including solid electrolyte layer 30E between interconnect layer 10B and metal layer 20E. The semiconductor device provides thus the same advantage as semiconductor device 6 shown in FIG. 7. That is, the semiconductor device is advantageous, for example, in reducing an increase in the resistance value of the interconnect layer caused by a decrease in the line width.

Variation 5 of Embodiment 1

Figure 17:
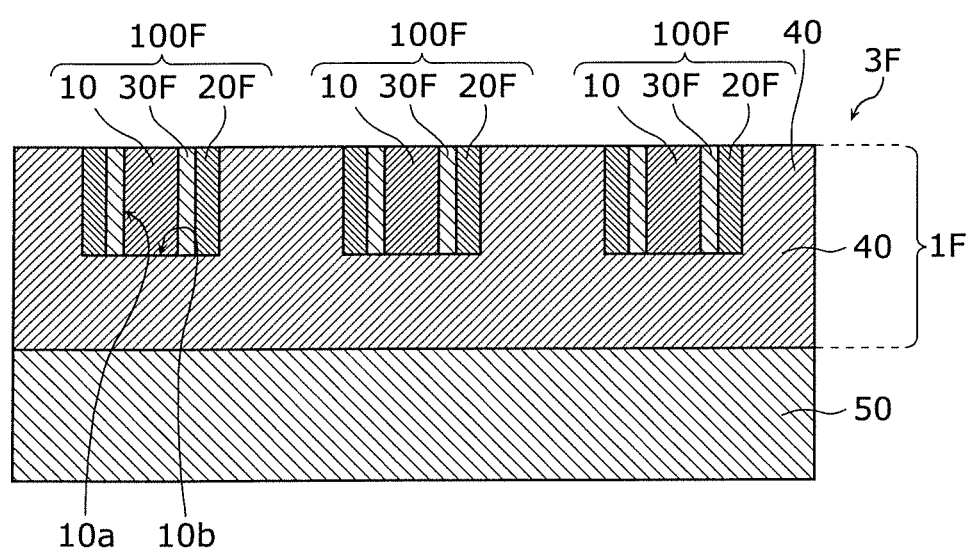
FIG. 17 is a cross-sectional view of a semiconductor device according to Variation 5 of Embodiment 1.

Now, semiconductor device 3F according to Variation 5 of Embodiment 1 will be described with reference to FIG. 17. FIG. 17 is a cross-sectional view of semiconductor device 3F according to Variation 5 of Embodiment 1.

As shown in FIG. 17, semiconductor device 3F according to this variation differs from semiconductor device 3 shown in FIG. 4 in the configurations of metal layer 20F and solid electrolyte layer 30F in interconnect passages 100F.

Specifically, as shown in FIG. 4, in interconnect structure 1A of semiconductor device 3, metal layer 20 and solid electrolyte layer 30 of interconnect passages 100A cover not only the pair of side surfaces but also the bottom surface of interconnect layer 10.

On the other hand, as shown in FIG. 17, in interconnect structure 1F of semiconductor device 3F according to this variation, metal layer 20F and solid electrolyte layer 30F of interconnect passages 100F cover only the pair of side surfaces of interconnect layer 10 and no bottom surface of interconnect layer 10.

As described above, like semiconductor device 3 shown in FIG. 4, semiconductor device 3F according to this variation also has interconnect structure 1F including solid electrolyte layer 30F between interconnect layer 10 and metal layer 20F. The semiconductor device provides thus the same advantage as semiconductor device 3 shown in FIG. 4. That is, the semiconductor device is advantageous, for example, in reducing an increase in the resistance value of interconnect layer 10 caused by a decrease in the line width.

Experiment

Now, a result of an experiment conducted by the present inventors will be described. Specifically, the present inventors have conducted the experiment to confirm the advantage of the interconnect structure according to Embodiment 1 described above. The result of the experiment will be described.

Figure 18A:
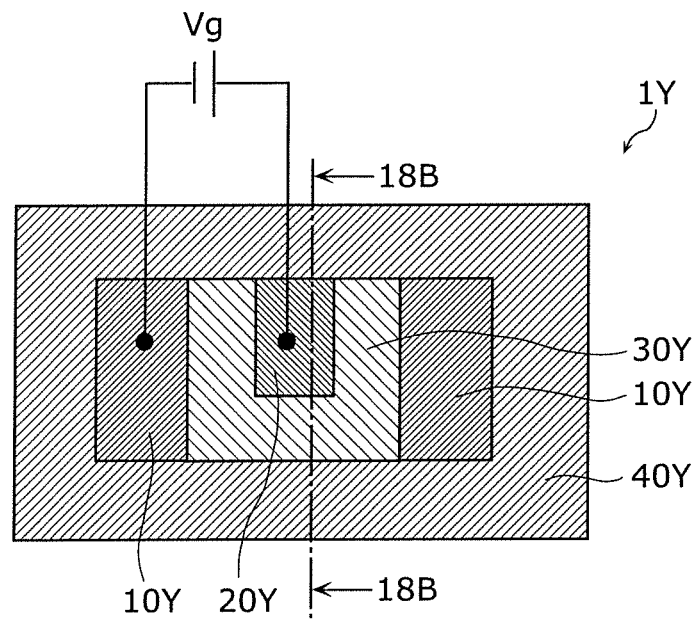
FIG. 18A is a plan view of an interconnect structure used in an experiment.
Figure 18B:
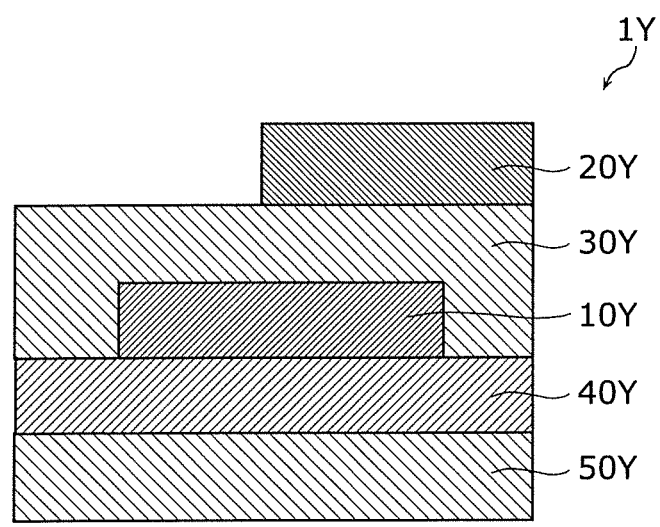
FIG. 18B is a cross-sectional view of the interconnect structure taken along line 18B-18B in FIG. 18A.

First, the outline of the experiment will be described with reference to FIGS. 18A and 18B. FIG. 18A is a plan view of interconnect structure 1Y used in this experiment. FIG. 18B is a cross-sectional view taken along line 18B-18B in FIG. 18A.

Interconnect structure 1Y shown in FIGS. 18A and 18B includes substrate 50Y, insulating layer 40Y on substrate 50Y, first electrode layer 10Y (corresponding to the "interconnect layer") on insulating layer 40Y, solid electrolyte layer 30Y on insulating layer 40Y to cover first electrode layer 10Y, and second electrode layer 20Y (corresponding to the "metal layer") on solid electrolyte layer 30Y.

Specifically, first, cobalt (Co) was deposited on substrate 50Y to form first electrode layer 10Y that is a cobalt film. Used as substrate 50Y was a silicon substrate with a thermal oxide film having a thickness of 2400 nm and made of silicon dioxide ($SiO_2$). In addition, first electrode layer 10Y was formed into the shape of a thin line with a width of 5 μm, a length of 9 mm, and a target film thickness of 40 nm.

Next, a lithium phosphorus oxynitride (LiPON) film with a thickness of 1 μm was formed using a mask sputtering device to form solid electrolyte layer 30Y that covers first electrode layer 10Y. Note that the mask was used to form solid electrolyte layer 30Y 2 mm away from the longitudinal ends of first electrode layer 10Y for contact.

Then, a gold film with 100 nm was deposited in a region having a length of 8 mm and obtained by stacking solid electrolyte layer 30Y on first electrode layer 10Y. Accordingly, second electrode layer 20Y was formed which was the gold film on solid electrolyte layer 30Y.

Although not shown in the figures, a silver paste was applied to the longitudinal ends of first electrode layer 10Y to form a contact. The ends applied with the silver paste were separated from each other by 8 mm.

After that, with respect to interconnect structure 1Y prepared in this manner, resistance value R of first electrode layer 10Y was obtained at a time of change in voltage Vg applied to second electrode layer 20Y.

Specifically, first, in interconnect structure 1Y, 4V was applied to one end of first electrode layer 10Y applied with the silver paste, whereas the other end was fixed to a ground voltage. Then, Vg of 0.8 V was applied to second electrode layer 20Y and value $I_{SD}$ of the current flowing through first electrode layer 10Y was measured. Voltage Vg applied to second electrode layer 20Y was reduced from 0.8 V in increments of 0.1 V, and current values $I_{SD}$ at voltages Vg within the range from 0 V to 0.8 V were repeatedly measured. Based on voltages Vg and results of the measurement of current values $I_{SD}$, resistance values R of first electrode layer 10Y were calculated. The result is shown in following Table 2 and FIG. 19. Note that current values $I_{SD}$ were measured using a digital source meter (namely, KEITHLEY 2400 series (manufactured by Tektronix)).

TABLE 2

| Vg (V) | $I_{SD}$ (mA) | R (Ω) |
|---|---|---|
| 0.8 | 0.20366 | 19641 |
| 0.7 | 0.20297 | 19707 |
| 0.6 | 0.20276 | 19728 |
| 0.5 | 0.20271 | 19733 |
| 0.4 | 0.20261 | 19742 |
| 0.3 | 0.20246 | 19757 |
| 0.2 | 0.20230 | 19773 |
| 0.1 | 0.20217 | 19785 |
| 0 | 0.20201 | 19801 |

Figure 19:
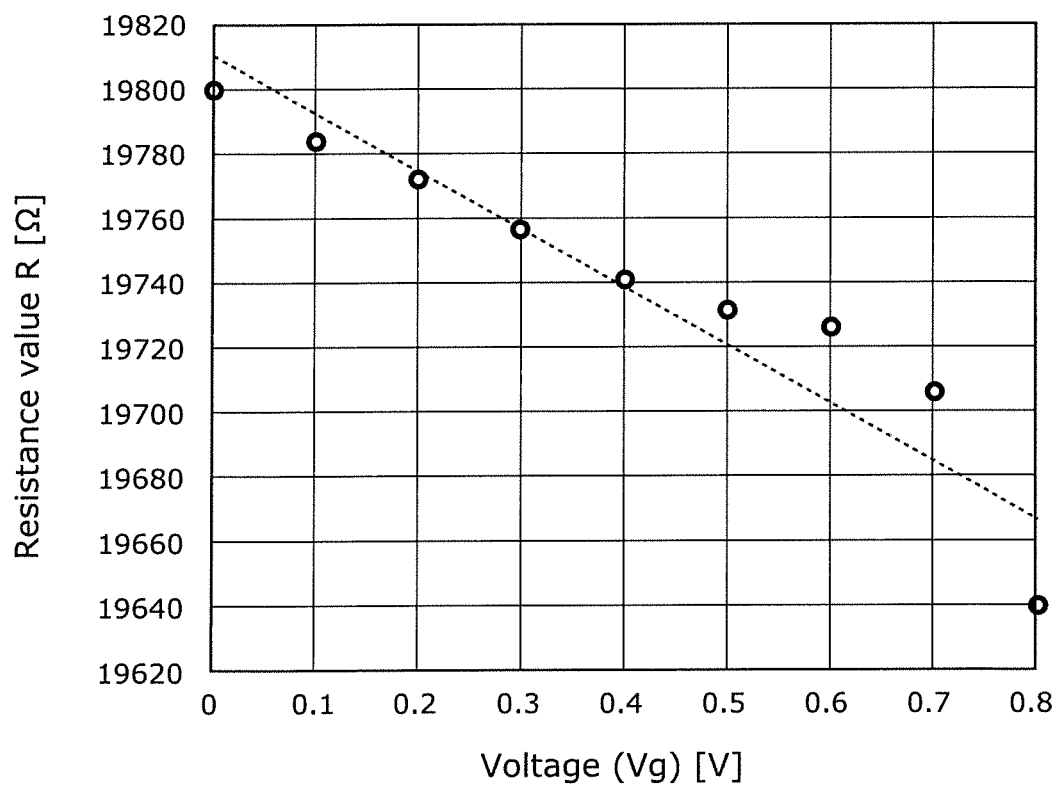
FIG. 19 shows the relationship between a resistance value of a first electrode layer and an applied voltage in an interconnect structure according to an example experiment.

It is known from Table 2 and FIG. 19 that actual (i.e., actually measured) resistance value R of first electrode layer 10Y was about $1.98 \times 10^4 \Omega$, when no voltage Vg was applied.

On the other hand, the resistance value of first electrode layer 10Y in the following region was calculated where the cobalt of first electrode layer 10Y has a resistivity of $5.81 \times 10^{-6}$ Ωcm. The region had a length of 8 mm and was obtained by stacking solid electrolyte layer 30Y on first electrode layer 10Y with a width of 5 μm and a target film thickness of 40 nm. Then, (theoretical) resistance value R of first electrode layer 10Y was $2.32 \times 10^3 \Omega$.

Accordingly, (actually measured) resistance value R of first electrode layer 10Y obtained by the experiment is greater than (theoretical) resistance value R of first electrode layer 10Y by $1.75 \times 10^4 \Omega$. Such a difference in the resistance value may be attributed to the facts that an oxide film is formed on the surface of first electrode layer 10Y which has a low crystallinity.

It is known from Table 2 and FIG. 19 that the resistance value of interconnect structure 1Y operating at voltage of 0.8 V is smaller than that of interconnect structure 1Y not operating, that is, at voltage Vg of 0 V. In short, it is known that the resistance value is reduced by applying a voltage to solid electrolyte layer 30Y.

From the result described above, the following was known. In interconnect structure 1Y according to this example experiment, the cobalt was used as the material of first electrode layer 10Y corresponding to the interconnect layer of the interconnect structure according to Embodiment 1 described above. In this case, the resistance value of the interconnect structure was reduced by 0.8%(=100×(19801−19641)/19801). This may be because the ions moved in solid electrolyte layer 30Y through application of the voltage.

(Example Application of Interconnect Structure)

A method of controlling the electrical resistance using the "interconnect structure" described so far will be described with reference to FIGS. 20A to 20C.

Figure 20A:
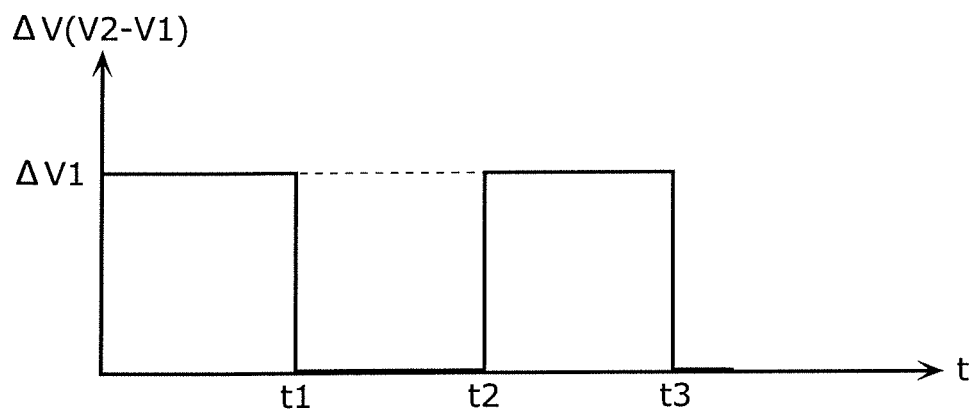
FIG. 20A shows a change in a potential difference over time.

FIG. 20A shows a change in potential difference ΔV with time t. Horizontal axis t represents the time, whereas the vertical axis represents potential difference ΔV.

Figure 20B:
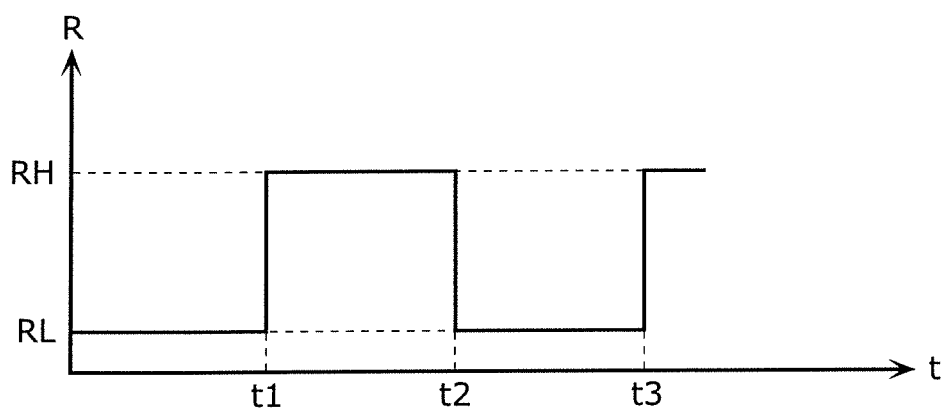
FIG. 20B shows a change in a resistance over time.

FIG. 20B shows a change in resistance R with time t. Horizontal axis t represents the time as in FIG. 20A, whereas the vertical axis represents resistance R.

Figure 20C:
FIG. 20C shows a change in a current over time.

FIG. 20C shows a change in current I with time t. Horizontal axis t represents the time as in FIG. 20A, whereas the vertical axis represents current I.

In the "interconnect structure" shown in FIGS. 1A to 1C, voltage V1 and voltage V2, where V1<V2, are applied to interconnect layer 10 and metal layer 20, respectively. Then, the voltage corresponding to potential difference ΔV1 (V2−V1) is applied to solid electrolyte layer 30. Voltages V1 and V2 are applied at the following times. As shown in FIG. 20A, until t1, the voltage corresponding to potential difference ΔV1 is applied. From t1 to t2, ΔV is zero (i.e., there is no potential difference). From t2 to t3, the voltage corresponding to ΔV1 is applied.

As shown in FIG. 20B, until t1, since there is potential difference ΔV1, the resistance of interconnect layer 10 is RL (i.e., low). From t1 to t2, since ΔV is zero (i.e., there is no potential difference), the resistance becomes RH (i.e., high). Similarly, from t2 to t3, the voltage of ΔV1 is applied to change the resistance to RL (i.e., low).

In this manner, the voltages applied to interconnect layer 10 and metal layer 20 are changed over time to change the resistance (i.e., the resistance value) of interconnect layer 10. That is, the voltage to be applied to solid electrolyte layer 30 is changed to control the resistance of interconnect layer 10.

The current changes as follows as shown in FIG. 20C. Until t1, since interconnect layer 10 has a low resistance, the current is IH (i.e., high). From t1 to t2, since the resistance is RH (i.e., high), the current is IL (i.e., low). Similarly, from t2 to t3, since the resistance changes to RL (i.e., low), the current becomes IH.

In this manner, the voltages applied to interconnect layer 10 and metal layer 20 are changed over time to change the value of the current flowing through interconnect layer 10. That is, the voltage to be applied to solid electrolyte layer 30 is changed to control the value of the current flowing through interconnect layer 10.

Embodiment 2

Figure 21A:
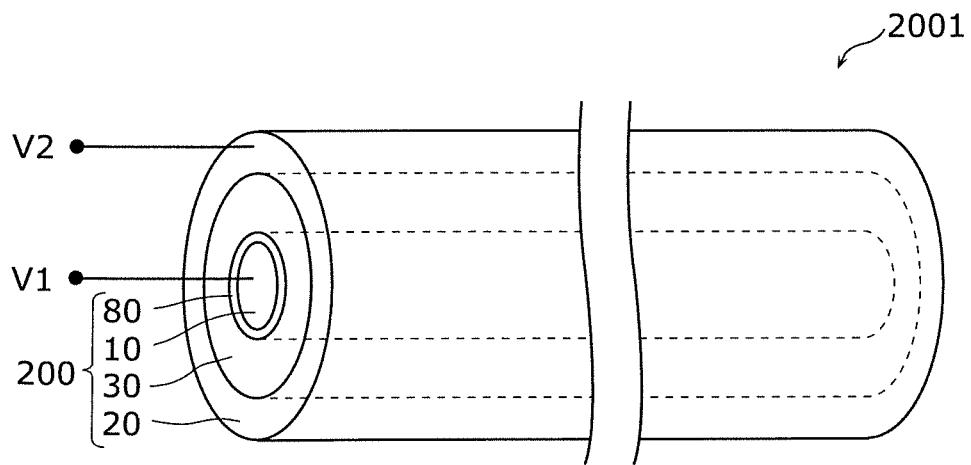
FIG. 21A schematically shows a configuration of an interconnect structure according to Aspect 1 of Embodiment 2.
Figure 21B:
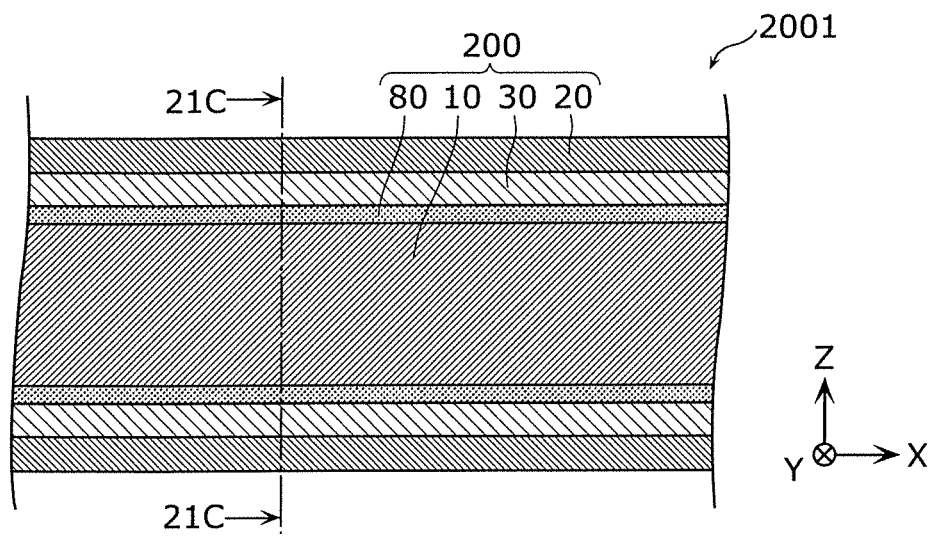
FIG. 21B is a cross-sectional view of the interconnect structure according to Aspect 1 of Embodiment 2.
Figure 21C:
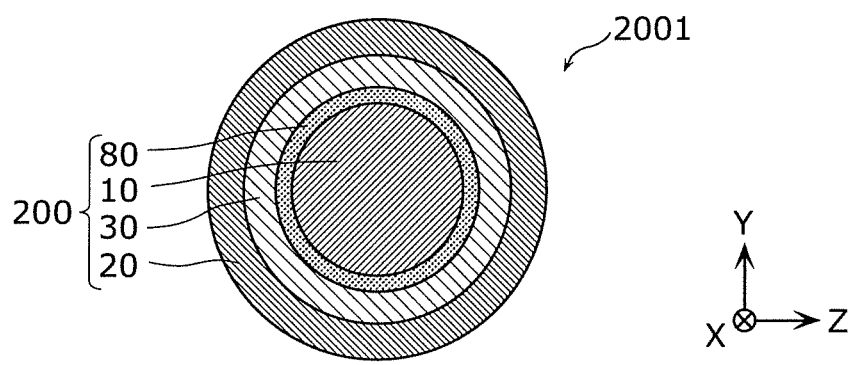
FIG. 21C is a cross-sectional view of the interconnect structure according to Aspect 1 of Embodiment 2 taken along line 21C-21C in FIG. 21B.

Now, Embodiment 2 will be described. First, a configuration of interconnect structure 2001 according to Aspect 1 of Embodiment 2 will be described with reference to FIGS. 21A to 21C. FIG. 21A schematically shows the configuration of interconnect structure 2001 according to Aspect 1 of Embodiment 2. FIG. 21B is a cross-sectional view of this interconnect structure 2001. FIG. 21C is a cross-sectional view of this interconnect structure 2001 taken along line 21C-21C in FIG. 21B.

As in Embodiment 1 described above, interconnect structure 2001 according to this embodiment is used in a semiconductor device such as a semiconductor integrated circuit device. In the semiconductor device, interconnect structure 2001 includes interconnect passage 200 for electrically connecting circuit elements.

As shown in FIGS. 21A to 21C, interconnect passage 200 according to this embodiment further includes insulating layer 80 in addition to the components of interconnect passage 100 according to Embodiment 1 described above. In the other respects, interconnect passage 200 has the same or similar configuration as interconnect passage 100 according to Embodiment 1 described above.

Specifically, interconnect structure 2001 includes interconnect layer 10, metal layer 20, solid electrolyte layer 30, and insulating layer 80.

Insulating layer 80 is, as a first insulating layer of interconnect structure 2001, interposed between interconnect layer 10 and solid electrolyte layer 30. Accordingly, interconnect structure 2001 includes interconnect layer 10, insulating layer 80, solid electrolyte layer 30, and metal layer 20 formed in this order from the inside to the outside. Metal layer 20 encloses not only interconnect layer 10 and solid electrolyte layer 30 but also insulating layer 80.

Specifically, in a cross-sectional view taken along a YZ cross section, the entire periphery of interconnect layer 10 is covered by insulating layer 80. The entire periphery of insulating layer 80 is covered by solid electrolyte layer 30. The entire periphery of solid electrolyte layer 30 is covered by metal layer 20.

Insulating layer 80 is an insulating films made of an insulating material. Insulating layer 80 may be an alumina ($Al_2O_3$) film made of aluminum oxide ($Al_2O_3$), a silicon oxynitride (SiON) film made of SiON, or a silicon nitride ($Si_3N_4$) film made of $Si_3N_4$, for example.

Figure 22:
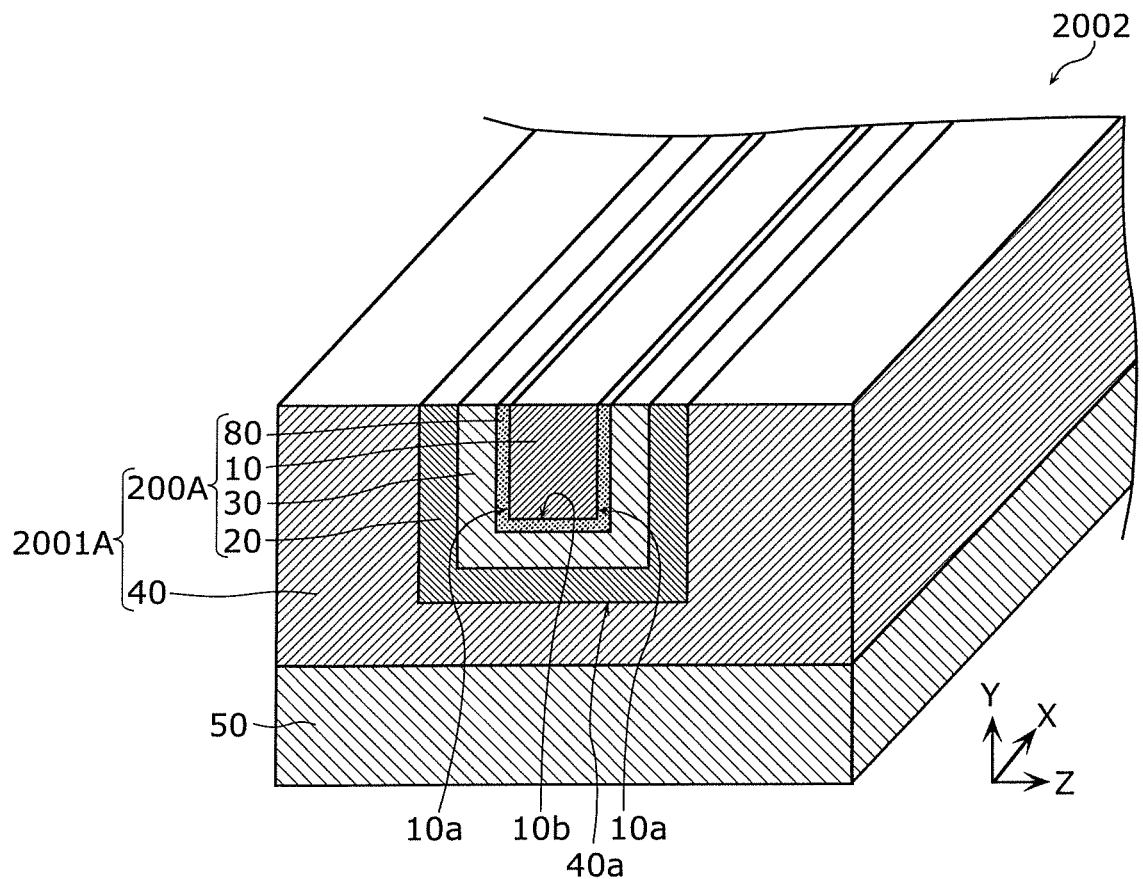
FIG. 22 shows configurations of an interconnect structure and a semiconductor device according to Aspect 2 of Embodiment 2.

Now, interconnect structure 2001A according to Aspect 2 of Embodiment 2 will be described with reference to FIG. 22. FIG. 22 shows configurations of interconnect structure 2001A according to Aspect 2 of Embodiment and semiconductor device 2002 employing this interconnect structure 2001A.

As shown in FIG. 22, interconnect structure 2001A further includes insulating layer 40 in addition to interconnect layer 10, metal layer 20, solid electrolyte layer 30, and insulating layer 80. Interconnect layer 10, metal layer 20, solid electrolyte layer 30, and insulating layer 80 constitute interconnect passage 200A like interconnect passage 200 shown in FIGS. 21A to 21C. In FIG. 22, semiconductor device 2002 includes substrate 50 and interconnect structure 2001A on substrate 50.

Figure 23:
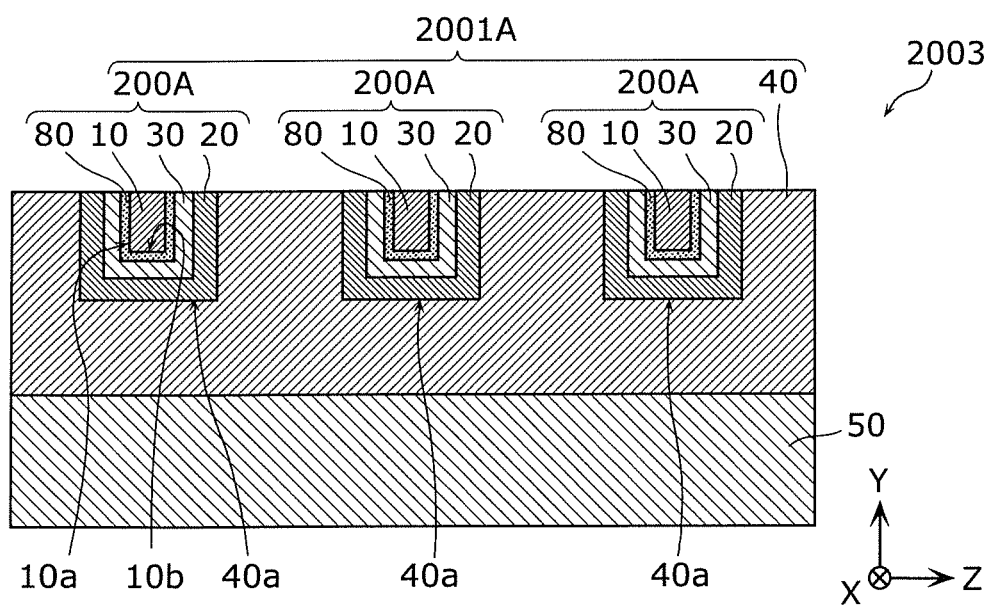
FIG. 23 shows the configuration of the semiconductor device according to Aspect 2 of Embodiment 2.

The number of interconnect passage 200A, which is included in interconnect structure 2001A formed on substrate 50, is not limited to one. Specifically, like semiconductor device 2003 shown in FIG. 23, interconnect structure 2001A on substrate 50 may include a plurality of interconnect passages 200A. In this case, insulating layer 40 has a plurality of recesses 40a, each including one of interconnect passages 200A buried therein.

Note that the semiconductor device according to this embodiment may include transistor 60 like semiconductor device 4 shown in FIG. 5, and may have a multilayer interconnect structure like semiconductor device 5 shown in FIG. 6.

Figure 24:
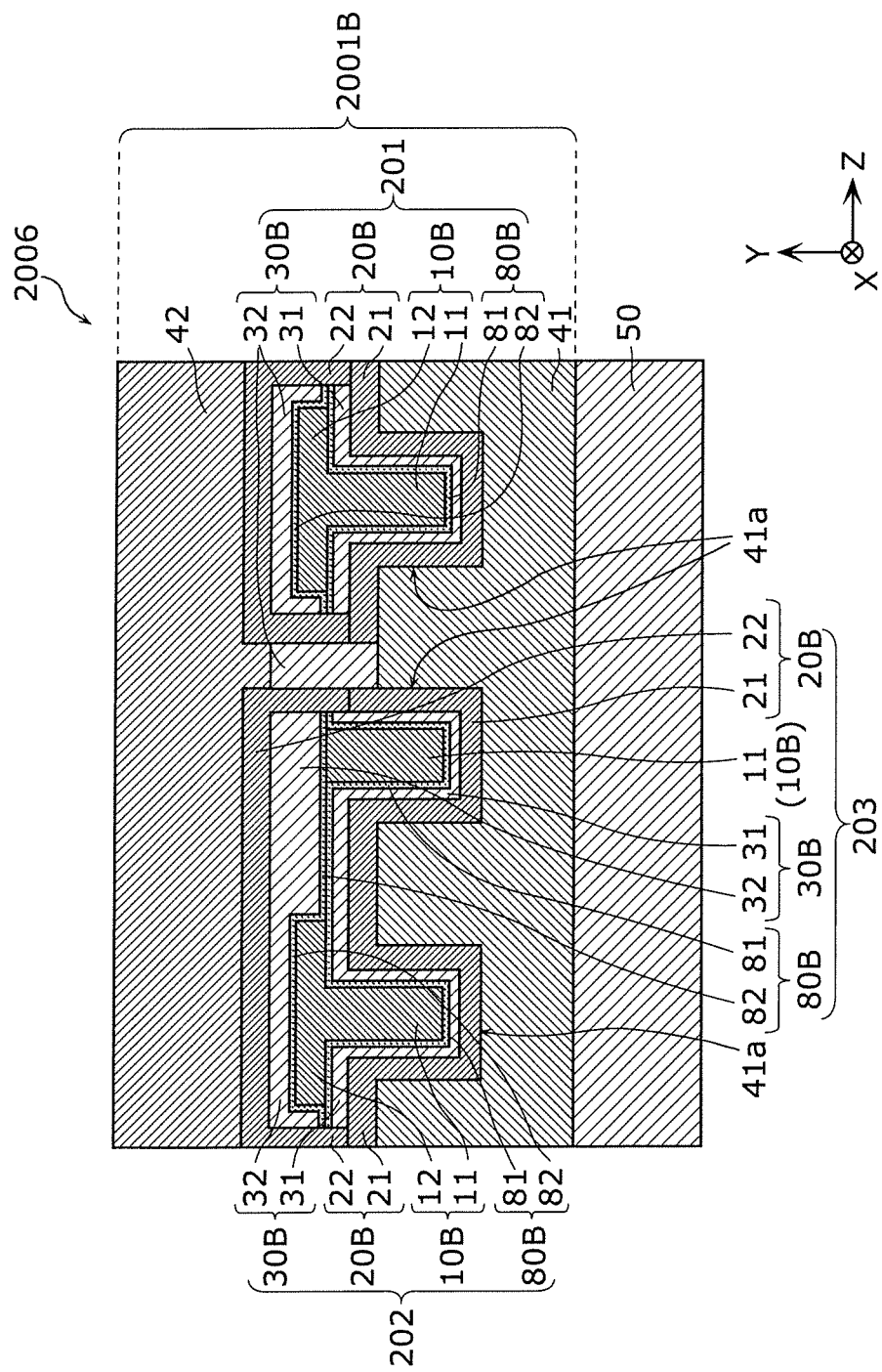
FIG. 24 is a cross-sectional view showing configurations of an interconnect structure and a semiconductor device according to Aspect 3 of Embodiment 2.

Now, an interconnect structure according to another aspect of Embodiment 2 will be described with reference to FIG. 24. FIG. 24 is a cross-sectional view showing configurations of interconnect structure 2001B according to Aspect 3 of Embodiment 2 and semiconductor device 2006 employing this interconnect structure 2001B.

Semiconductor device 2006 shown in FIG. 24 includes substrate 50 and interconnect structure 2001B on substrate 50. Interconnect structure 2001B includes three interconnect passages of first, second, and third interconnect passage 201, 202, and 203, and two interlayer insulating layers of first and second interlayer insulating layers 41 and 42.

First, second, and third interconnect passages 201, 202, and 203 further include insulating layer 803 in first, second, and third interconnect passages 101, 102, and 103 of interconnect structure 13 according to Embodiment 1 described above.

In this aspect as well, insulating layer 80B is interposed between interconnect layer 10B and solid electrolyte layer 30B. Specifically, in a cross-sectional view taken along a YZ cross section, the entire periphery of interconnect layer 10B is covered by insulating layer 80B.

Insulating layer 80B includes first insulating layer 81 and second insulating layer 82. First insulating layer 81 is a lower insulating film, at least a part of which is buried in recesses 41a, between first interconnect layer 11 and first solid electrolyte layer 31. Second insulating layer 82 is an upper insulating film on and above first insulating layer 81, between second interconnect layer 12 and second solid electrolyte layer 32. First insulating layer 81 and second insulating layer 82 are insulating films, such as alumina films, silicon oxynitride films, or silicon nitride film, made of an insulating material.

In this manner, each of interconnect structures 2001, 2001A, and 2001B according to this embodiment has the same or similar configuration as interconnect structure 1 according to Embodiment 1 described above. Upon application of a voltage to solid electrolyte layer 30 or 30B, ions move inside solid electrolyte layer 30 or 30B. This reduces an increase in the resistance value of layer 30 or 30B caused by a decrease in the line width of the interconnect layer. The structures are thus advantageous in reducing the resistances.

Each of interconnect structures 2001, 2001A, and 2001B according to this embodiment includes insulating layer 80 or 80B, which reduces electron leakage from interconnect layer 10 or 10B. In particular, the electron leakage tends to occur from interconnect layer 10 or 10B with a smaller width. However, provided insulating layer 80 or 80B efficiently reduces the electron leakage.

Figure 25A:
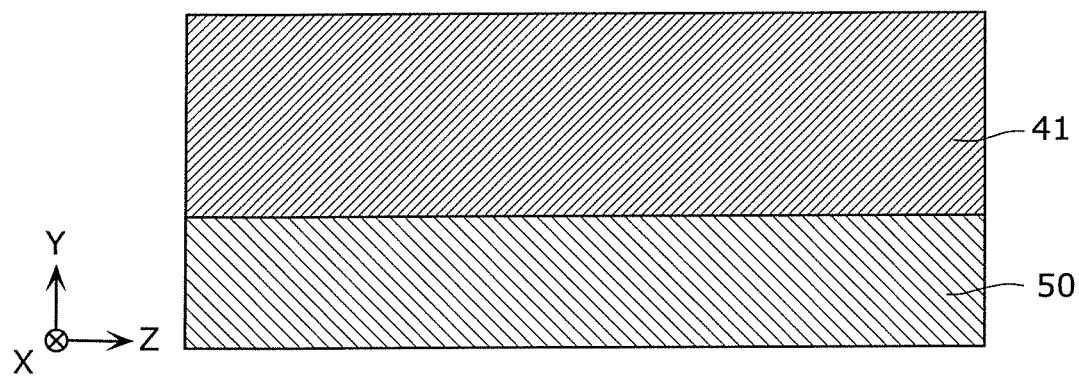
FIG. 25A is a cross-sectional view showing a first interlayer insulating layer formation step in a method of manufacturing a semiconductor device according to Embodiment 2.
Figure 25B:
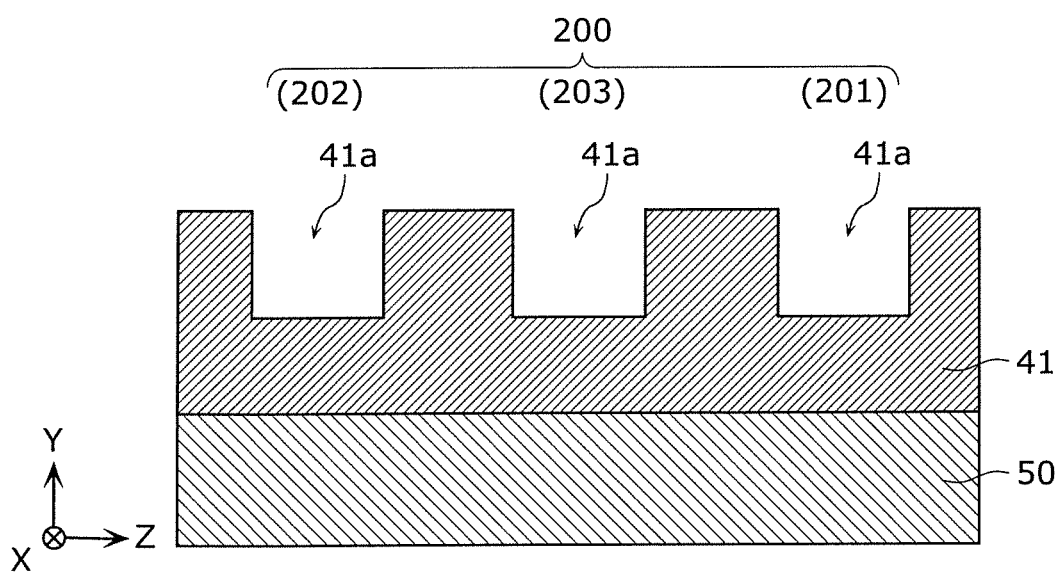
FIG. 25B is a cross-sectional view showing a recess formation step in the method of manufacturing the semiconductor device according to Embodiment 2.
Figure 25C:
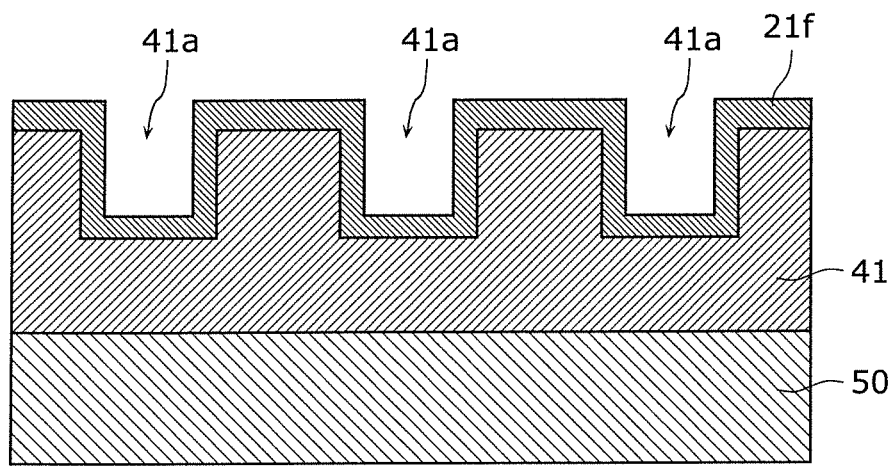
FIG. 25C is a cross-sectional view showing a first metal layer formation step in the method of manufacturing the semiconductor device according to Embodiment 2.
Figure 25D:
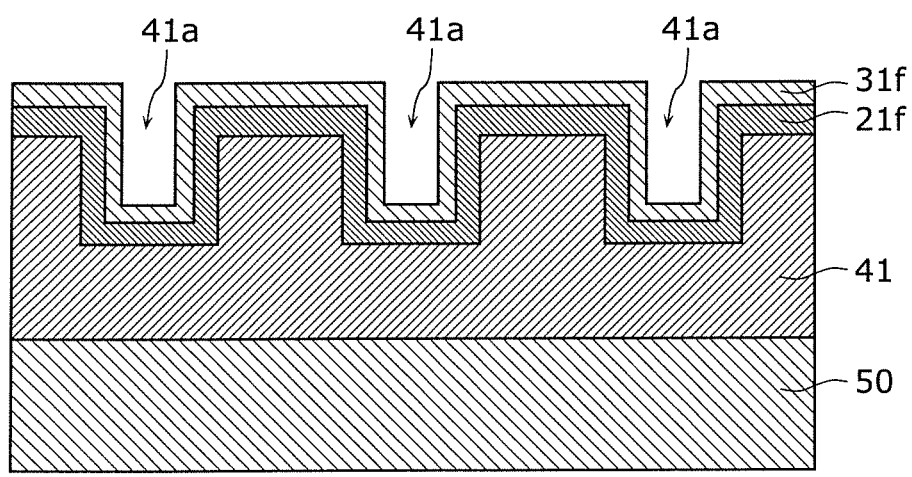
FIG. 25D is a cross-sectional view showing a first solid electrolyte layer formation step in the method of manufacturing the semiconductor device according to Embodiment 2.

Now, a method of manufacturing the interconnect structure and the semiconductor device according to Embodiment 2 will be described with reference to FIGS. 25A to 25Y. FIG. 25A to 25Y are for illustrating the method of manufacturing semiconductor device 2006 shown in FIG. 24.

The steps shown in FIGS. 25A to 25D are the same or similar to those in FIGS. 11A to 11F.

Specifically, as shown in FIG. 25A, substrate 50 is prepared, and first interlayer insulating layer 41 is formed on substrate 50. Next, as shown in FIG. 25B, recesses 41a for burying interconnect passages 200 are formed in first interlayer insulating layer 41. Then, as shown in FIG. 25C, first metal layer 21f is formed along the inner surfaces of recesses 41a formed in first interlayer insulating layer 41 and extending in a direction. After that, as shown in FIG. 25D, first solid electrolyte layer 31f is formed to cover first metal layer 21f and to not fill recesses 41a. In this embodiment, as shown in FIG. 25B, three interconnect passages of first, second, and third interconnect passages 201, 202, and 203 are formed as interconnect passages 200. In correspondence to these three interconnect passages, three recesses 41a are shown in FIGS. 25B to 25D.

Figure 25E:
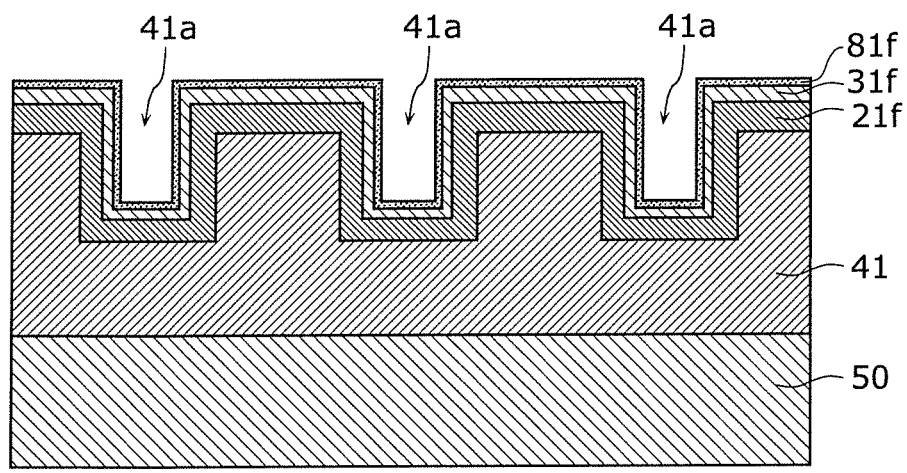
FIG. 25E is a cross-sectional view showing a first insulating layer formation step in the method of manufacturing the semiconductor device according to Embodiment 2.

Next, as shown in FIG. 25E, first insulating layer 81f is formed to cover first solid electrolyte layer 31f and to not fill recesses 41a. Specifically, first insulating layer 81f is formed to cover the entire surface of first solid electrolyte layer 31f. At this time, first insulating layer 81f is formed to cover the surface of first solid electrolyte layer 31f that is not formed in recesses 41a and the inner side surfaces and the bottom surface of first solid electrolyte layer 31f that are formed inside recesses 41a. First insulating layer 81f may be formed by the CVD, for example.

Figure 25F:
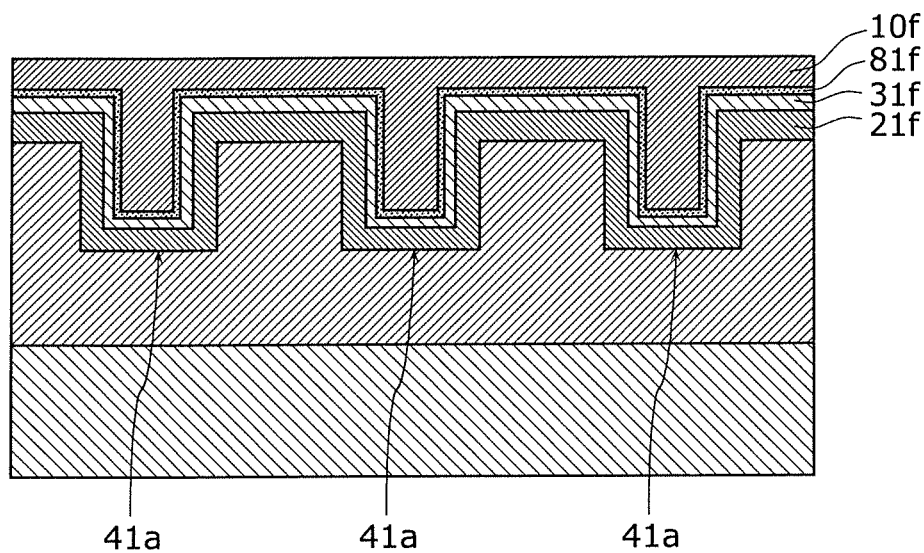
FIG. 25F is a cross-sectional view showing an interconnect layer formation step in the method of manufacturing the semiconductor device according to Embodiment 2.

Then, as shown in FIG. 25F, interconnect layer 10f is formed so as to be enclosed by first solid electrolyte layer 31f and first insulating layer 81f and to fill recesses 41a. Specifically, interconnect layer 10f is formed to fill the trenches of first solid electrolyte layer 31f and first insulating layer 81f. The step of FIG. 25F is the same or similar to that in FIG. 11G.

Figure 25G:
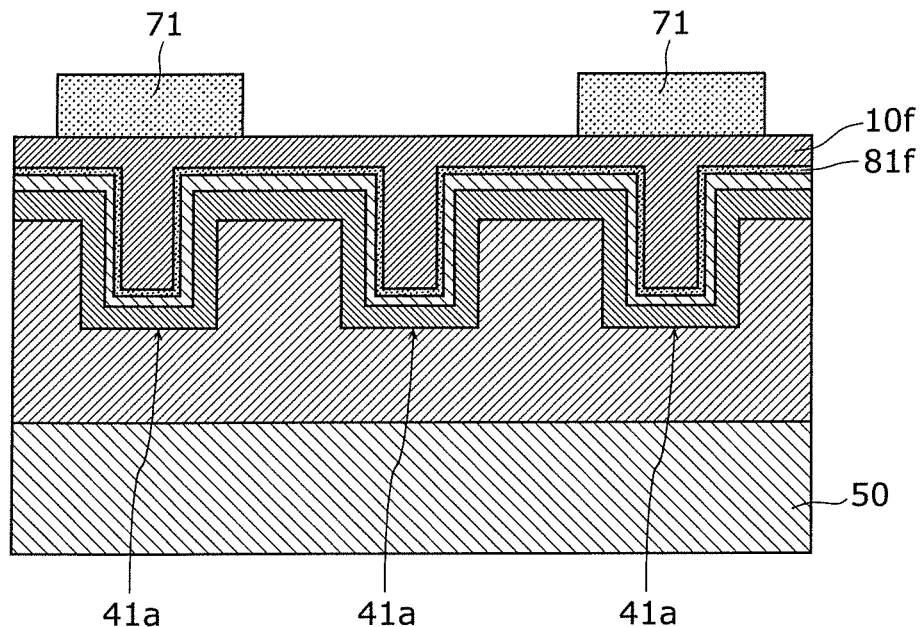
FIG. 25G is a cross-sectional view showing a first resist formation step in the method of manufacturing the semiconductor device according to Embodiment 2.
Figure 25H:
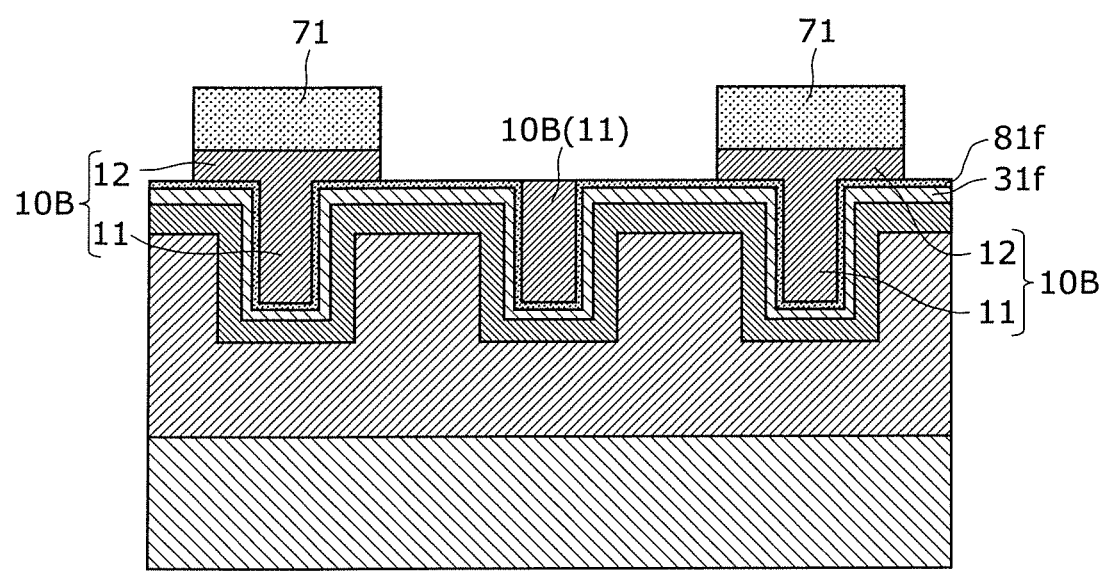
FIG. 25H is a cross-sectional view showing an interconnect layer patterning step in the method of manufacturing the semiconductor device according to Embodiment 2.
Figure 25I:
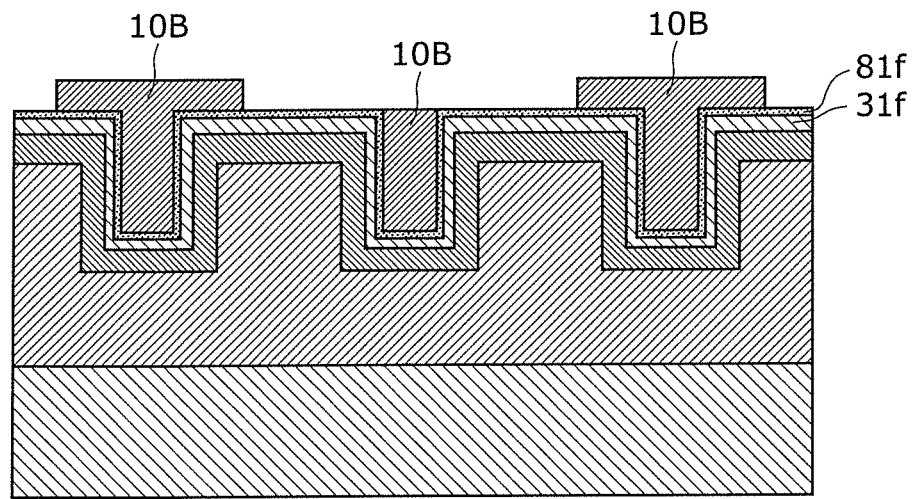
FIG. 25I is a cross-sectional view showing a first resist removal step in the method of manufacturing the semiconductor device according to Embodiment 2.

After that, the steps shown in FIGS. 25G to 25I follow, which are the same or similar to those in FIGS. 11H to 11J.

Specifically, as shown in FIG. 25G, first resist 71 is formed in a predetermined shape on interconnect layer 10f. Next, as shown in FIG. 25H, interconnect layer 10f is etched using first resist 71 as a mask so as to be patterned. Accordingly, interconnect layer 10f is partially removed and separated to form interconnect layer 10B in a predetermined shape. At this time, the part of first insulating layer 81f not formed with first resist 71 is exposed. Then, as shown in FIG. 25I, first resist 71 is removed. Accordingly, interconnect layer 10B is exposed.

Figure 25J:
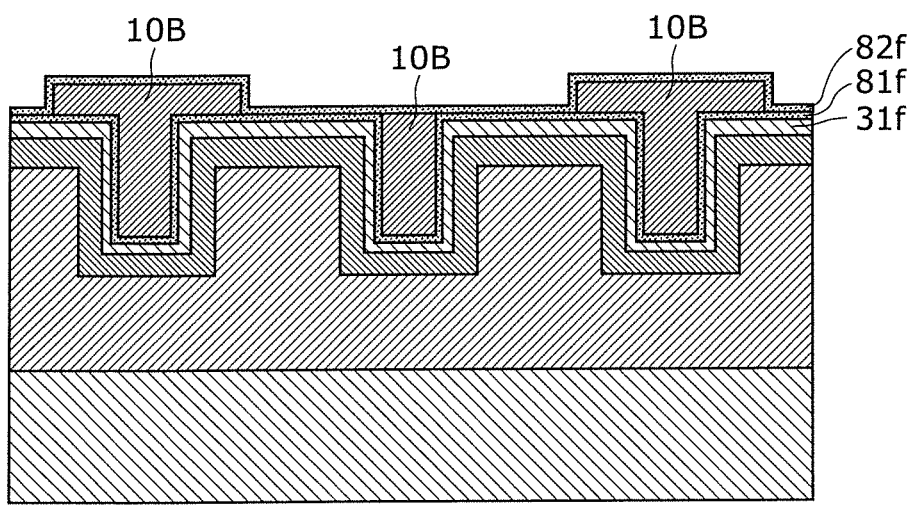
FIG. 25J is a cross-sectional view showing a second insulating layer formation step in the method of manufacturing the semiconductor device according to Embodiment 2.

After that, as shown in FIG. 25J, second insulating layer 82f is formed to cover interconnect layer 10B. Specifically, second insulating layer 82f is formed to cover the entire surface of exposed interconnect layer 10B and the entire surface of first insulating layer 81f. Second insulating layer 82f may be formed by the CVD, for example.

Subsequently, the steps shown in FIGS. 25K to 25Y follow, which are the same or similar to those in FIGS. 11K to 11Y.

Figure 25K:
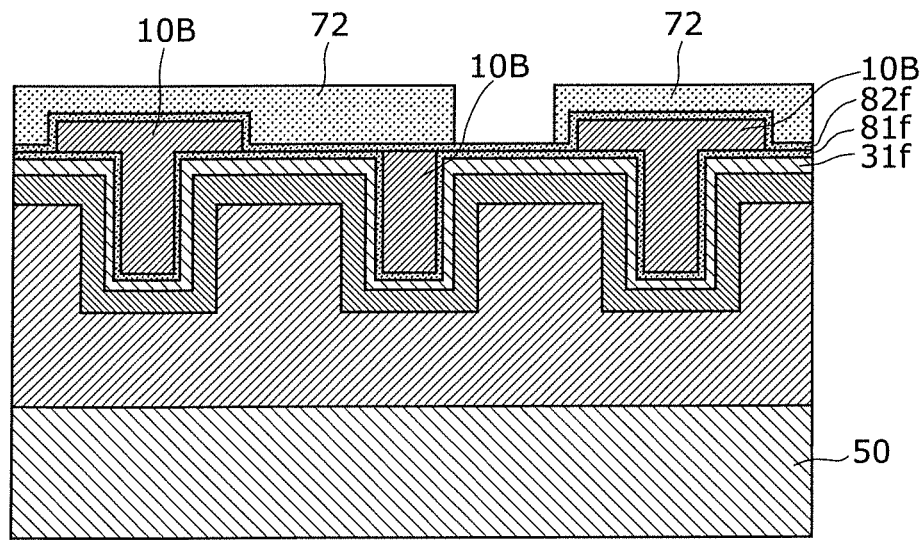
FIG. 25K is a cross-sectional view showing a second resist formation step in the method of manufacturing the semiconductor device according to Embodiment 2.
Figure 25L:
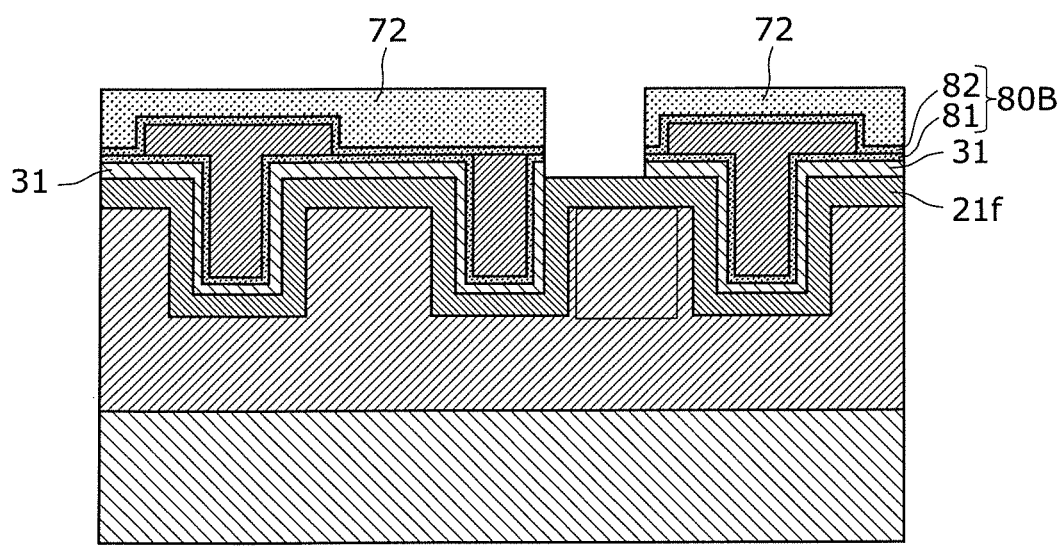
FIG. 25L is a cross-sectional view showing a first solid electrolyte layer patterning step in the method of manufacturing the semiconductor device according to Embodiment 2.
Figure 25M:
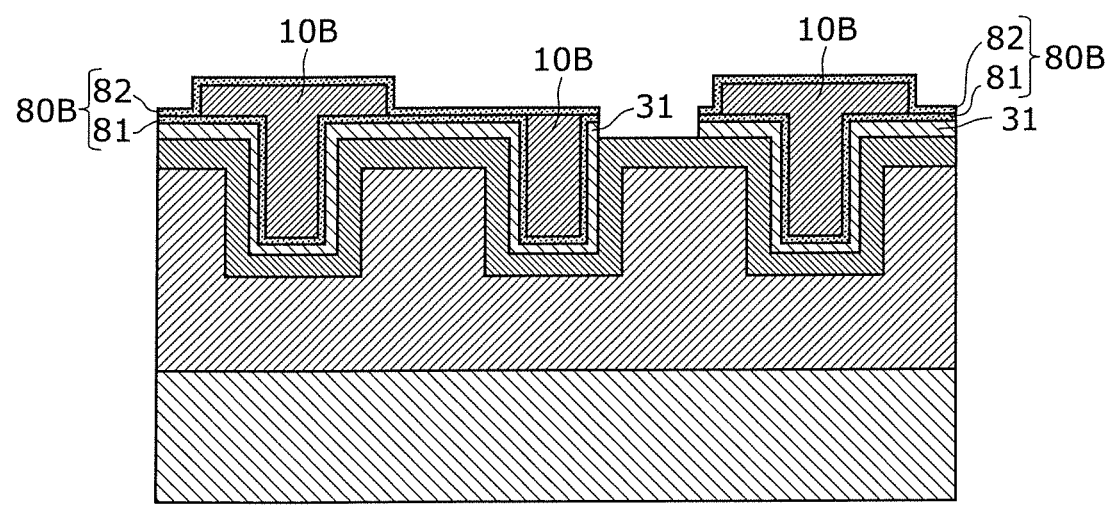
FIG. 25M is a cross-sectional view showing a second resist removal step in the method of manufacturing the semiconductor device according to Embodiment 2.

Specifically, as shown in FIG. 25K, second resist 72 is formed in a predetermined shape on second insulating layer 82f to cover interconnect layer 10B. Next, as shown in FIG. 25L, first solid electrolyte layer 31f is etched using second resist 72 as a mask so as to be patterned. At this time, first insulating layer 81f and second insulating layer 82f may also be etched using second resist 72 as a mask. Accordingly, first insulating layer 81f and second insulating layer 82f are partially removed to form insulating layer 80B composed of first insulating layer 81 and second insulating layer 82. Then, as shown in FIG. 25M, second resist 72 is removed.

Figure 25N:
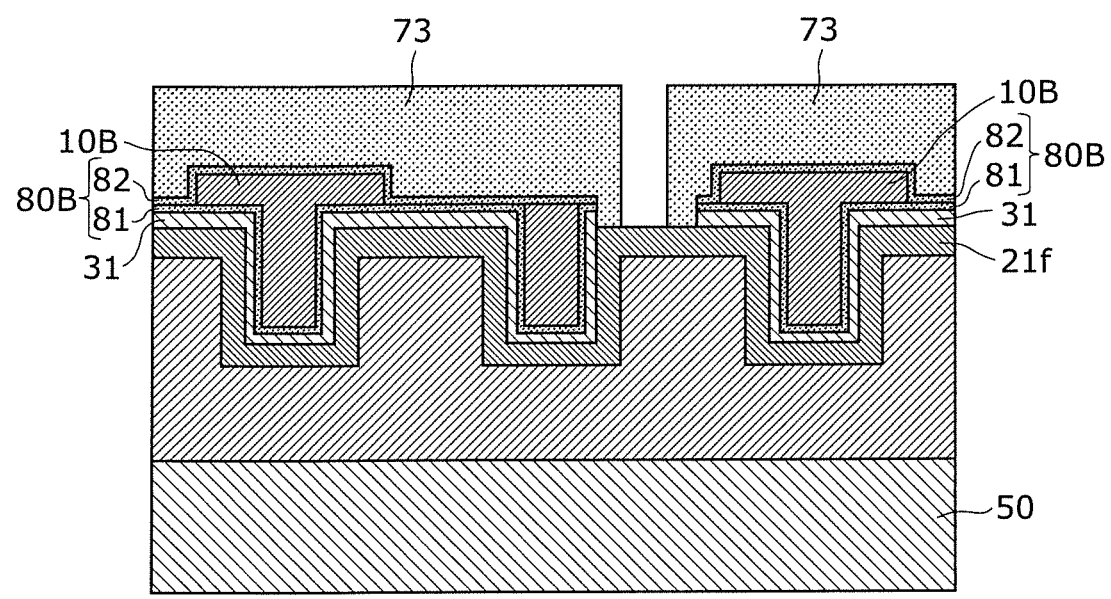
FIG. 25N is a cross-sectional view showing a third resist formation step in the method of manufacturing the semiconductor device according to Embodiment 2.
Figure 25O:
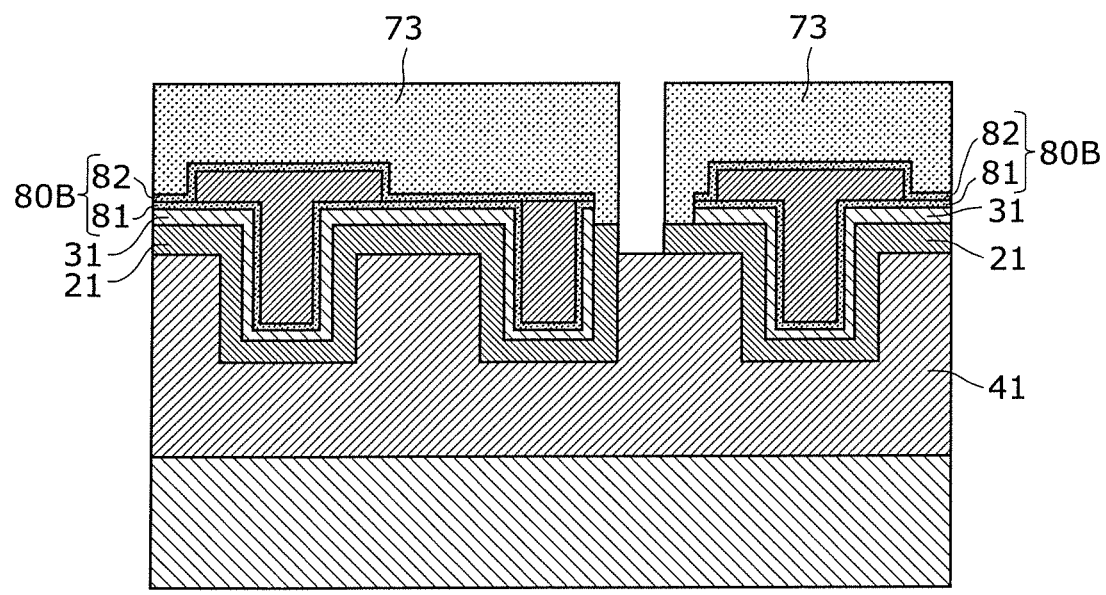
FIG. 25O is a cross-sectional view showing a first metal layer patterning step in the method of manufacturing the semiconductor device according to Embodiment 2.
Figure 25P:
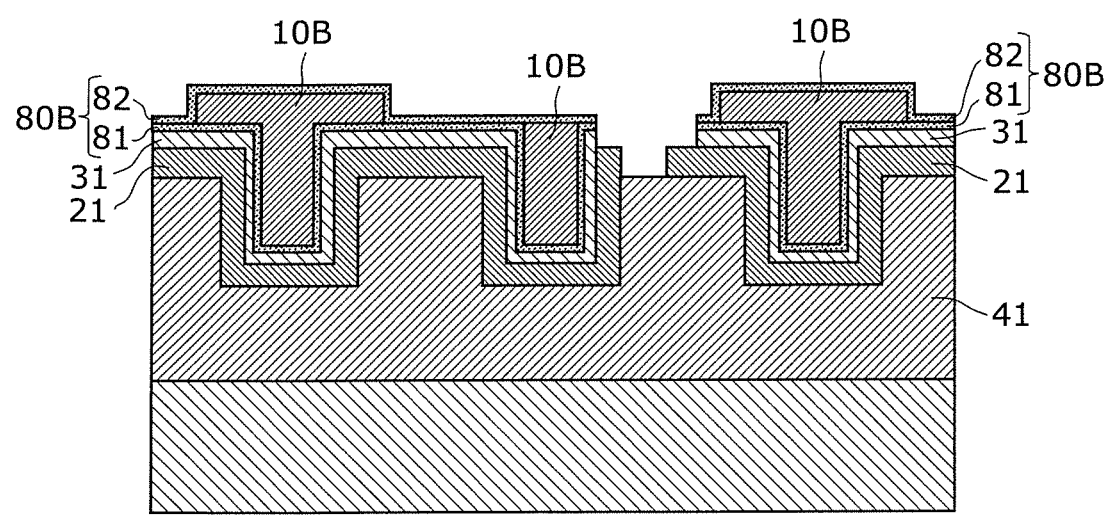
FIG. 25P is a cross-sectional view showing a third resist removal step in the method of manufacturing the semiconductor device according to Embodiment 2.
Figure 25Q:
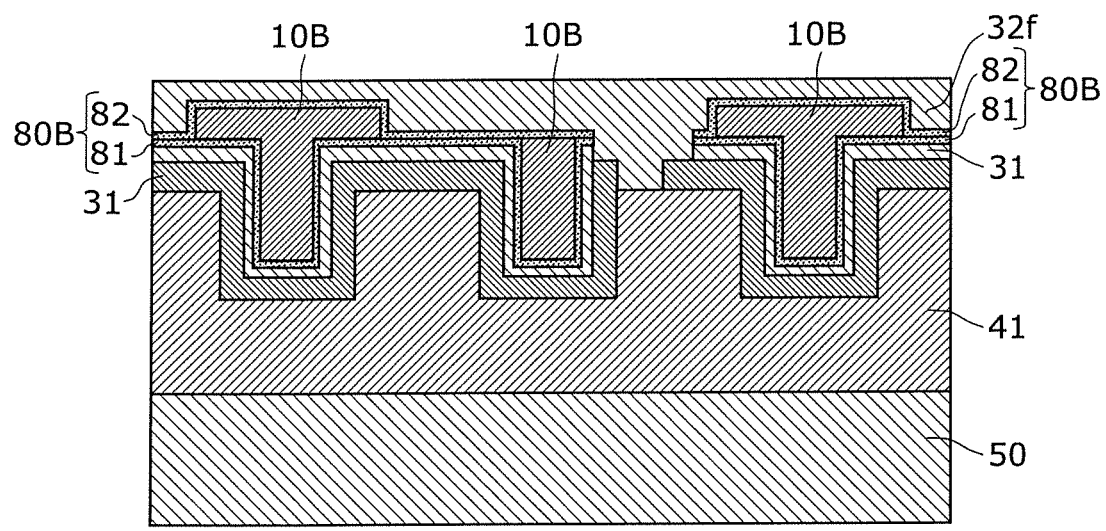
FIG. 25Q is a cross-sectional view showing a second solid electrolyte layer formation step in the method of manufacturing the semiconductor device according to Embodiment 2.

Next, as shown in FIG. 25N, third resist 73 is formed in a predetermined shape on first metal layer 21f to cover interconnect layer 10B, first solid electrolyte layer 31, and second insulating layer 82. Then, as shown in FIG. 25O, first metal layer 21f is etched using third resist 73 as a mask so as to be patterned. After that, as shown in FIG. 25P, third resist 73 is removed. Next, as shown in FIG. 25Q, second solid electrolyte layer 32f is formed to cover interconnect layer 10B, first solid electrolyte layer 31, first metal layer 21, and second insulating layer 82.

Figure 25R:
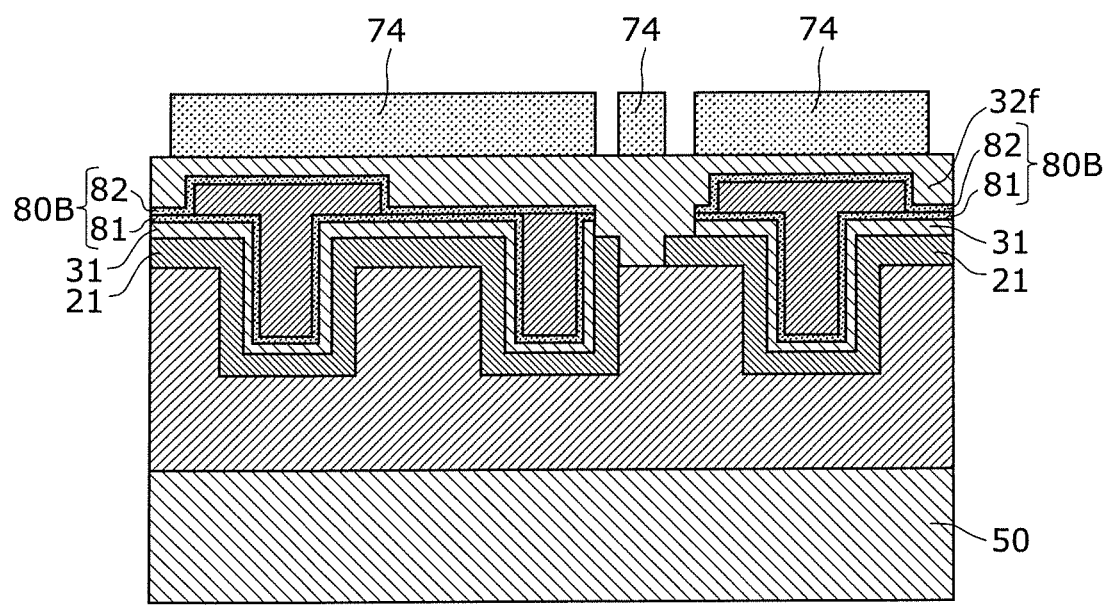
FIG. 25R is a cross-sectional view showing a fourth resist formation step in the method of manufacturing the semiconductor device according to Embodiment 2.
Figure 25S:
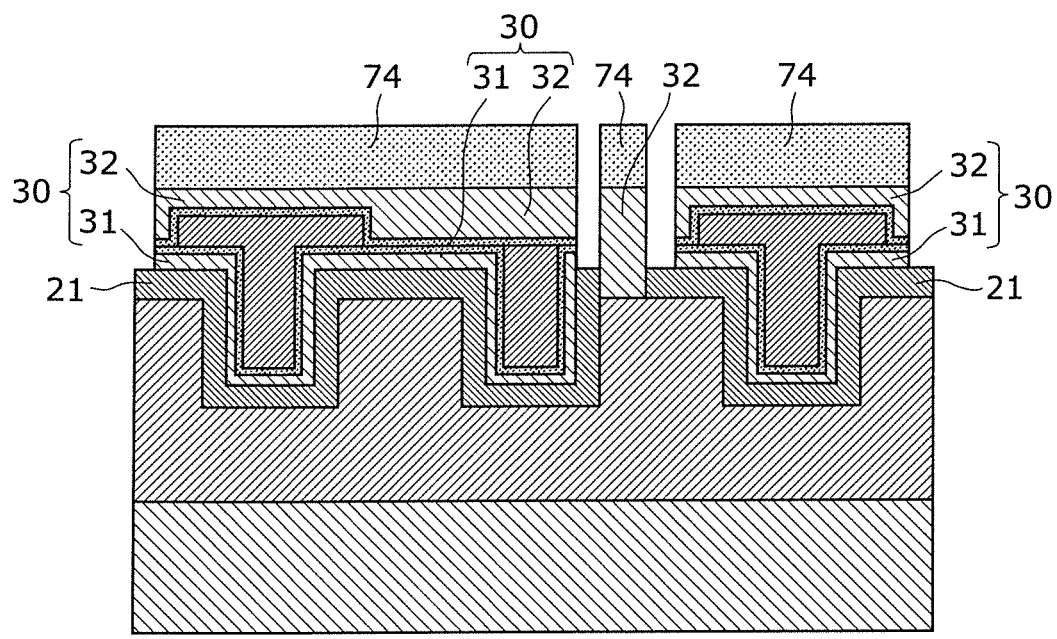
FIG. 25S is a cross-sectional view showing a second solid electrolyte layer patterning step in the method of manufacturing the semiconductor device according to Embodiment 2.
Figure 25T:
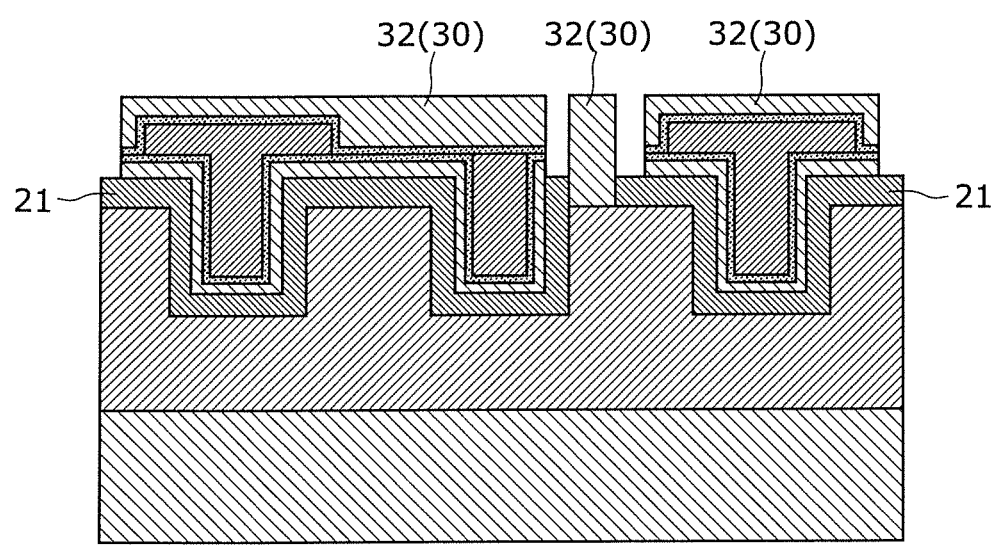
FIG. 25T is a cross-sectional view showing a fourth resist removal step in the method of manufacturing the semiconductor device according to Embodiment 2.
Figure 25U:
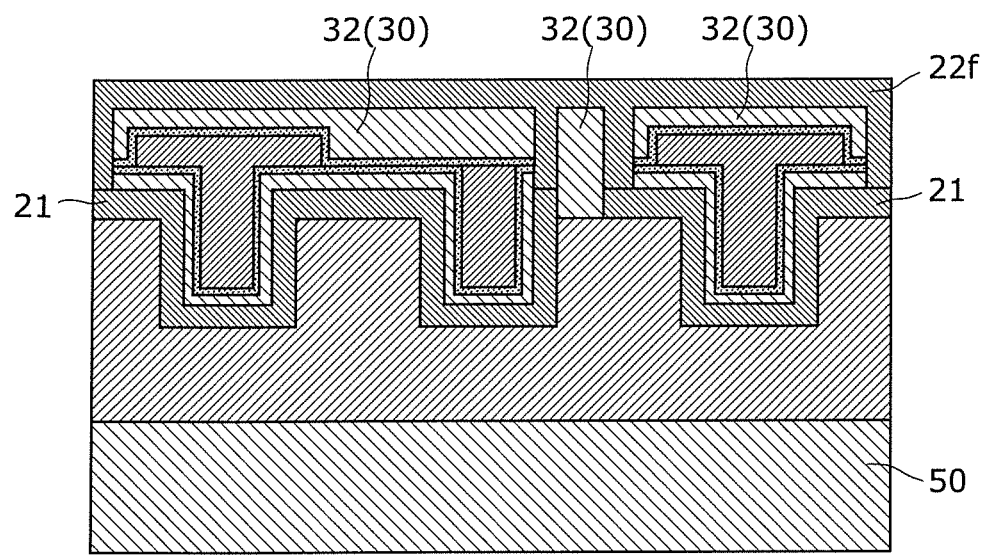
FIG. 25U is a cross-sectional view showing a second metal layer formation step in the method of manufacturing the semiconductor device according to Embodiment 2.
Figure 25V:
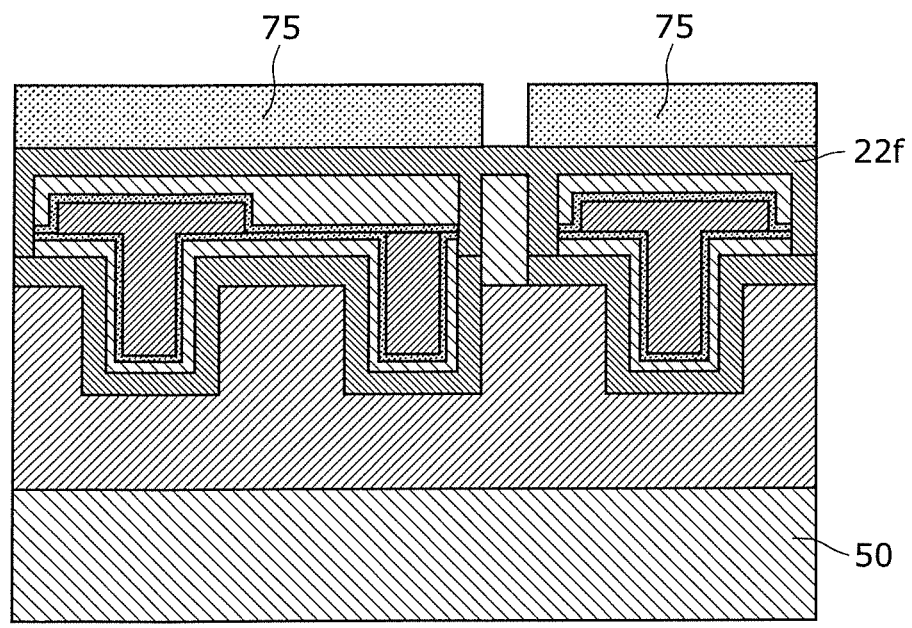
FIG. 25V is a cross-sectional view showing a fifth resist formation step in the method of manufacturing the semiconductor device according to Embodiment 2.
Figure 25W:
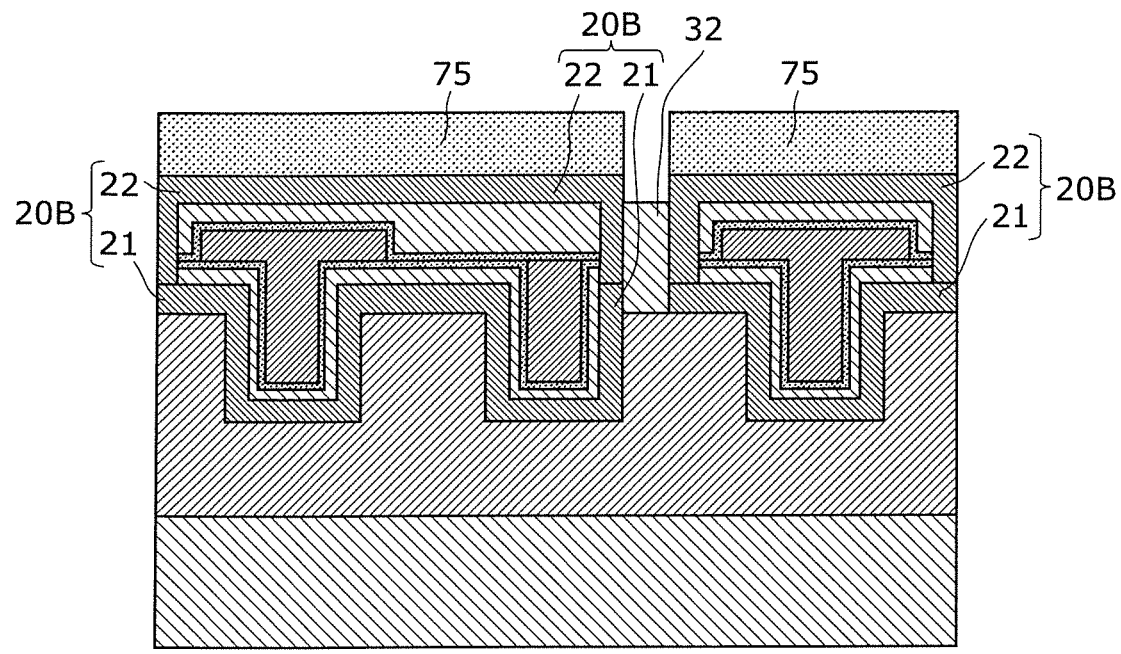
FIG. 25W is a cross-sectional view showing a second metal layer patterning step in the method of manufacturing the semiconductor device according to Embodiment 2.
Figure 25X:
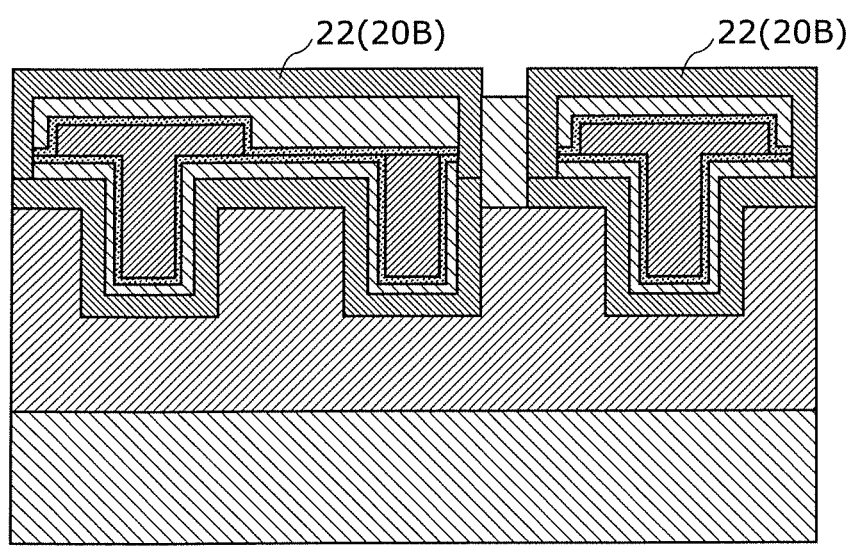
FIG. 25X is a cross-sectional view showing a fifth resist removal step in the method of manufacturing the semiconductor device according to Embodiment 2.
Figure 25Y:
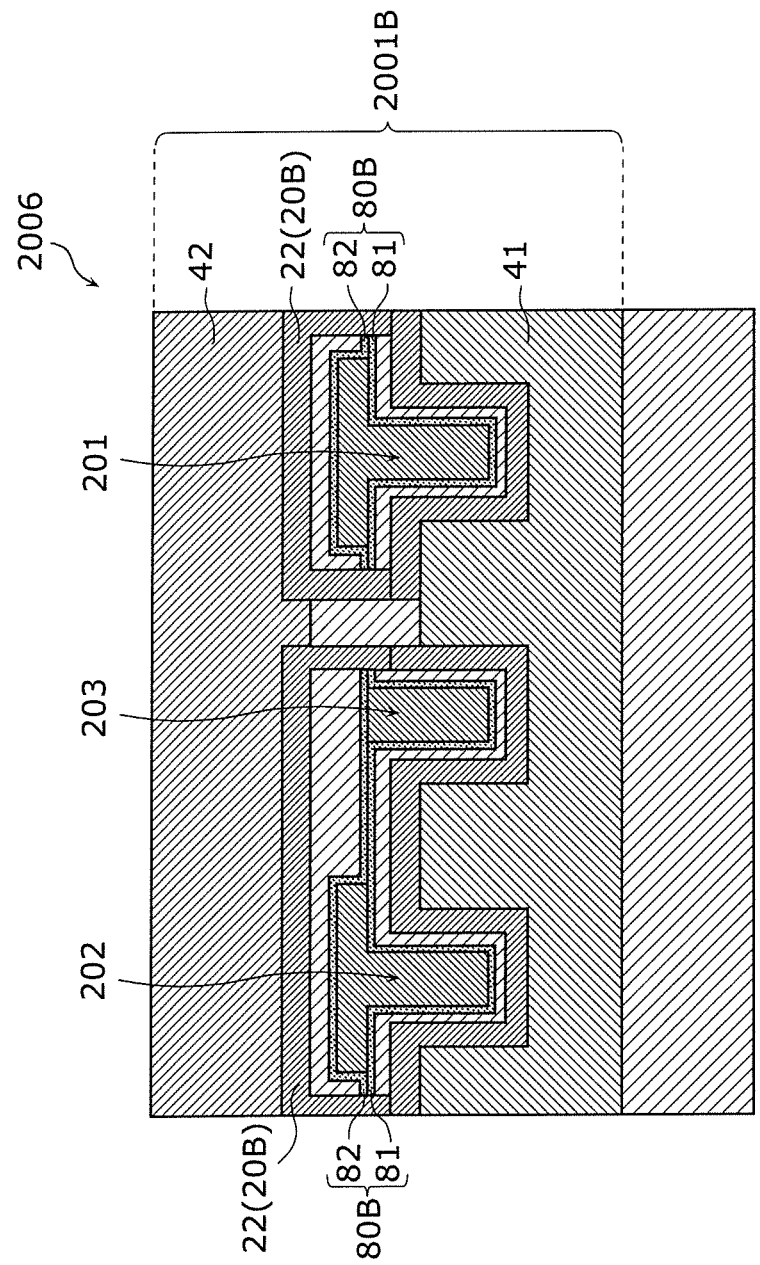
FIG. 25Y is a cross-sectional view showing a second interlayer insulating layer formation step in the method of manufacturing the semiconductor device according to Embodiment 2.

Then, as shown in FIG. 25R, fourth resist 74 is formed in a predetermined shape on second solid electrolyte layer 32f. After that, as shown in FIG. 25S, second solid electrolyte layer 32f is etched using fourth resist 74 as a mask so as to be patterned. Next, as shown in FIG. 25T, fourth resist 74 is removed. Accordingly, second solid electrolyte layer 32 and the ends of first metal layer 21 are exposed. Then, as shown in FIG. 25U, second metal layer 22f is formed to cover second solid electrolyte layer 32 and the ends of first metal layer 21. After that, as shown in FIG. 25V, fifth resist 75 is formed in a predetermined shape on second metal layer 22f. Next, as shown in FIG. 25W, second metal layer 22f is etched using fifth resist 75 as a mask so as to be patterned. Then, as shown in FIG. 25X, fifth resist 75 is removed. Accordingly, second metal layer 22 is exposed. After that, as shown in FIG. 25Y, second interlayer insulating layer 42 is formed to cover second metal layer 22.

As described above, semiconductor device 2006 can be fabricated which has interconnect structure 2001B including first, second, and third interconnect passages 201, 202, and 203. That is, as shown in FIG. 24, semiconductor device 2006 can be fabricated which includes insulating layer 80 composed of first insulating layer 81 and second insulating layer 82.

The variations of Embodiment 1 shown in FIGS. 12 to 17 are also applicable to this embodiment. The semiconductor devices other than semiconductor device 2006 shown in FIG. 24 and the interconnect structures may be fabricated in accordance with the manufacturing method shown in FIGS. 25A to 25Y.

Embodiment 3

Figure 26A:
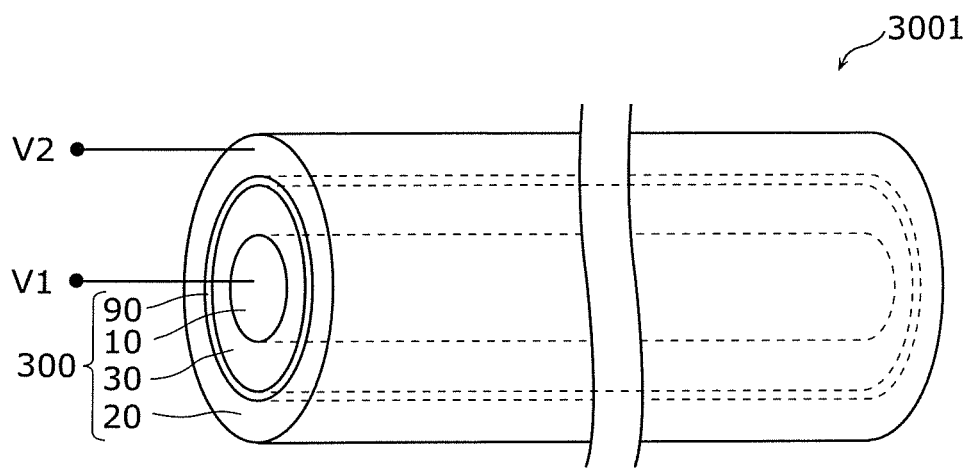
FIG. 26A schematically shows a configuration of an interconnect structure according to Aspect 1 of Embodiment 3.
Figure 26B:
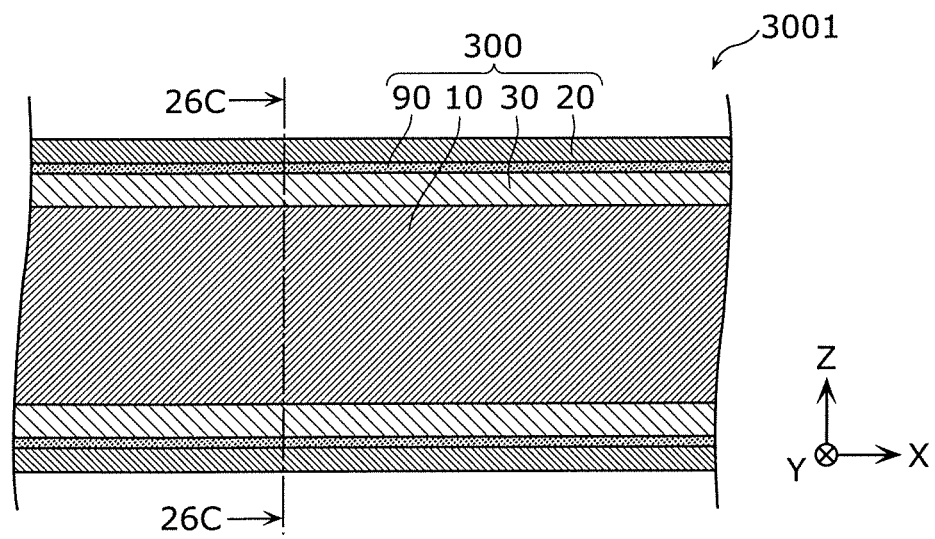
FIG. 26B is a cross-sectional view of the interconnect structure according to Aspect 1 of Embodiment 3.
Figure 26C:
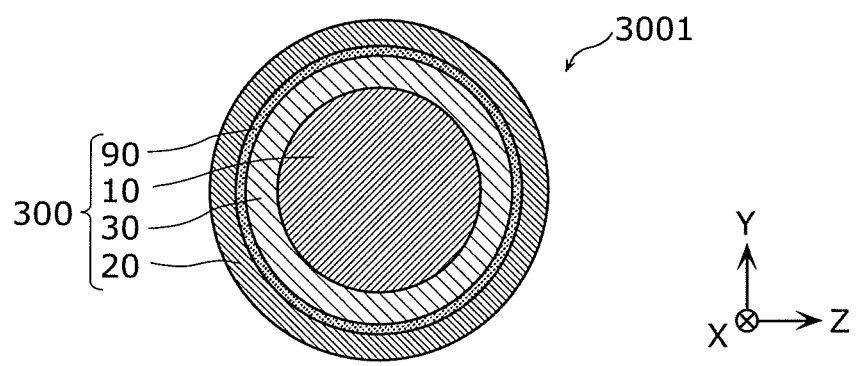
FIG. 26C is a cross-sectional view of the interconnect structure according to Aspect 1 of Embodiment 3 taken along line 26C-26C in FIG. 26B.

Now, Embodiment 3 will be described. First, a configuration of interconnect structure 3001 according to Aspect 1 of Embodiment 3 will be described with reference to FIGS. 26A to 26C. FIG. 26A schematically shows the configuration of interconnect structure 3001 according to Aspect 1 of Embodiment 3. FIG. 26B is a cross-sectional view of this interconnect structure 3001. FIG. 26C is a cross-sectional view of this interconnect structure 3001 taken along line 26C-26C in FIG. 26B.

As in Embodiment 1 described above, interconnect structure 3001 according to this embodiment is used in a semiconductor device such as a semiconductor integrated circuit device. In the semiconductor device, interconnect structure 3001 includes interconnect passage 300 for electrically connecting circuit elements.

As shown in FIGS. 26A to 26C, interconnect passage 300 according to this embodiment further includes insulating layer 90 in addition to the components of interconnect passage 100 according to Embodiment 1 described above. In other respects, interconnect passage 300 has the same or similar configuration as interconnect passage 100 according to Embodiment 1 described above.

Specifically, interconnect structure 3001 includes interconnect layer 10, metal layer 20, solid electrolyte layer 30, and insulating layer 90.

Insulating layer 90 is a second insulating layer different from insulating layer (i.e., first insulating layer) 80 of interconnect structure 2001 according to Embodiment 2 described above. The layer is interposed between solid electrolyte layer 30 and metal layer 20. Accordingly, interconnect structure 3001 includes interconnect layer 10, solid electrolyte layer 30, insulating layer 90, and metal layer 20 formed in this order from the inside to the outside. Metal layer 20 encloses not only interconnect layer 10 and solid electrolyte layer 30 but also insulating layer 90.

Specifically, in a cross-sectional view taken along a YZ cross section, the entire periphery of interconnect layer 10 is covered by solid electrolyte layer 30. The entire periphery of solid electrolyte layer 30 is covered by insulating layer 90. The entire periphery of insulating layer 90 is covered by metal layer 20.

Insulating layer 90 is an insulating film made of an insulating material. Insulating layer 90 may be an alumina film, a silicon oxynitride film, or a silicon nitride film, for example.

Figure 27:
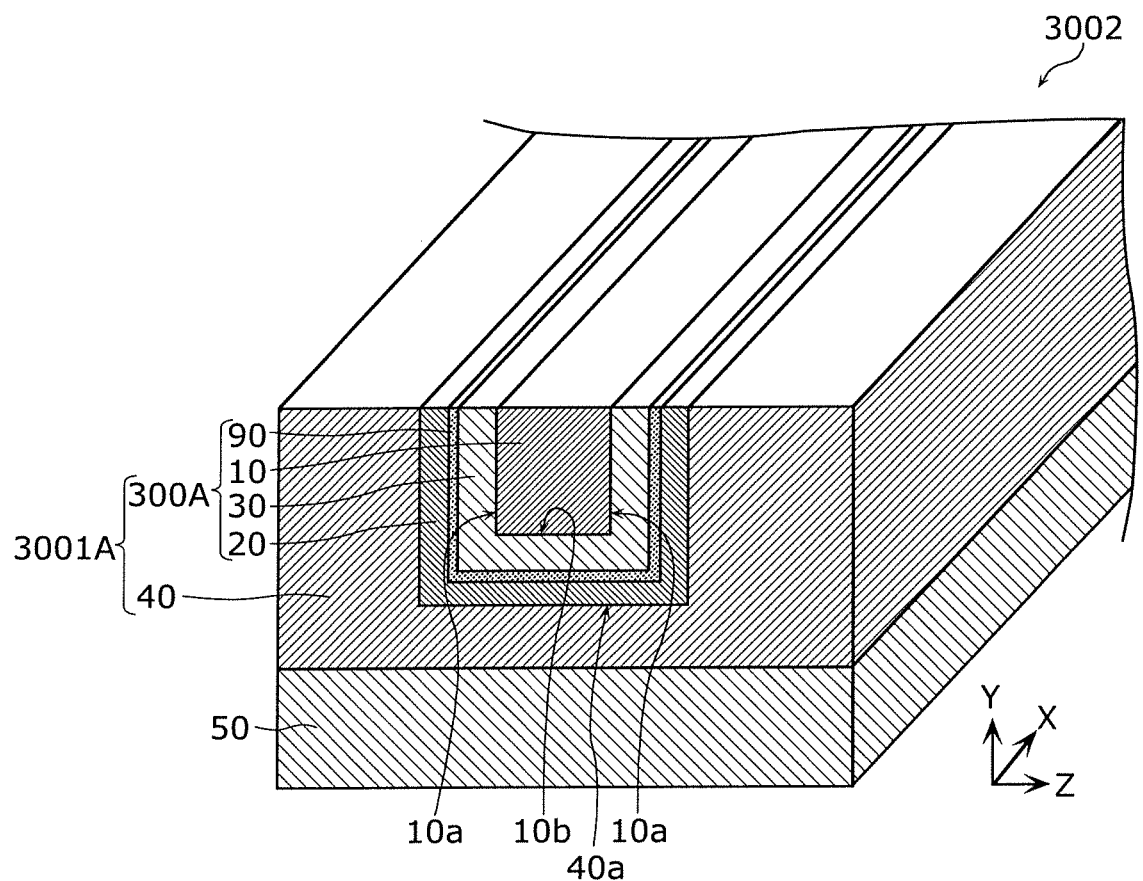
FIG. 27 shows configurations of an interconnect structure and a semiconductor device according to Aspect 2 of Embodiment 3.

Now, interconnect structure 3001A according to Aspect 2 of Embodiment 3 will be described with reference to FIG. 27. FIG. 27 shows configurations of interconnect structure 3001A according to Aspect 2 of Embodiment 3 and semiconductor device 3002 employing this interconnect structure 3001A.

As shown in FIG. 27, interconnect structure 3001A further incudes insulating layer 40 in addition to interconnect layer 10, metal layer 20, solid electrolyte layer 30, and insulating layer 90. Interconnect layer 10, metal layer 20, solid electrolyte layer 30, and insulating layer 90 constitute interconnect passage 300A like interconnect passage 300 shown in FIGS. 26A to 26C. In FIG. 27, semiconductor device 3002 includes substrate 50 and interconnect structure 3001A on substrate 50.

Figure 28:
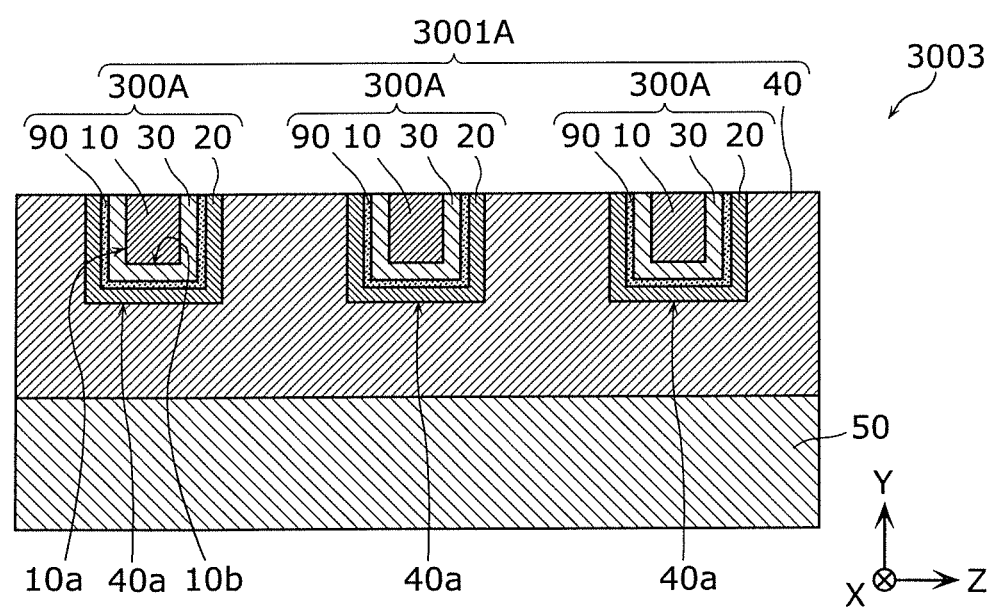
FIG. 28 shows the configuration of the semiconductor device according to Aspect 2 of Embodiment 3.

Note that the number of interconnect passage 300A, which is included in interconnect structure 3001A formed on substrate 50, is not limited to one. Specifically, like semiconductor device 3003 shown in FIG. 28, interconnect structure 3001A on substrate 50 may include a plurality of interconnect passages 300A. In this case, insulating layer 40 has a plurality of recesses 40a, each including one of interconnect passages 300A buried therein.

Note that the semiconductor device according to this embodiment may include transistor 60 like semiconductor device 4 shown in FIG. 5, or may have a multilayer interconnect structure like semiconductor device 5 shown in FIG. 6.

Figure 29:
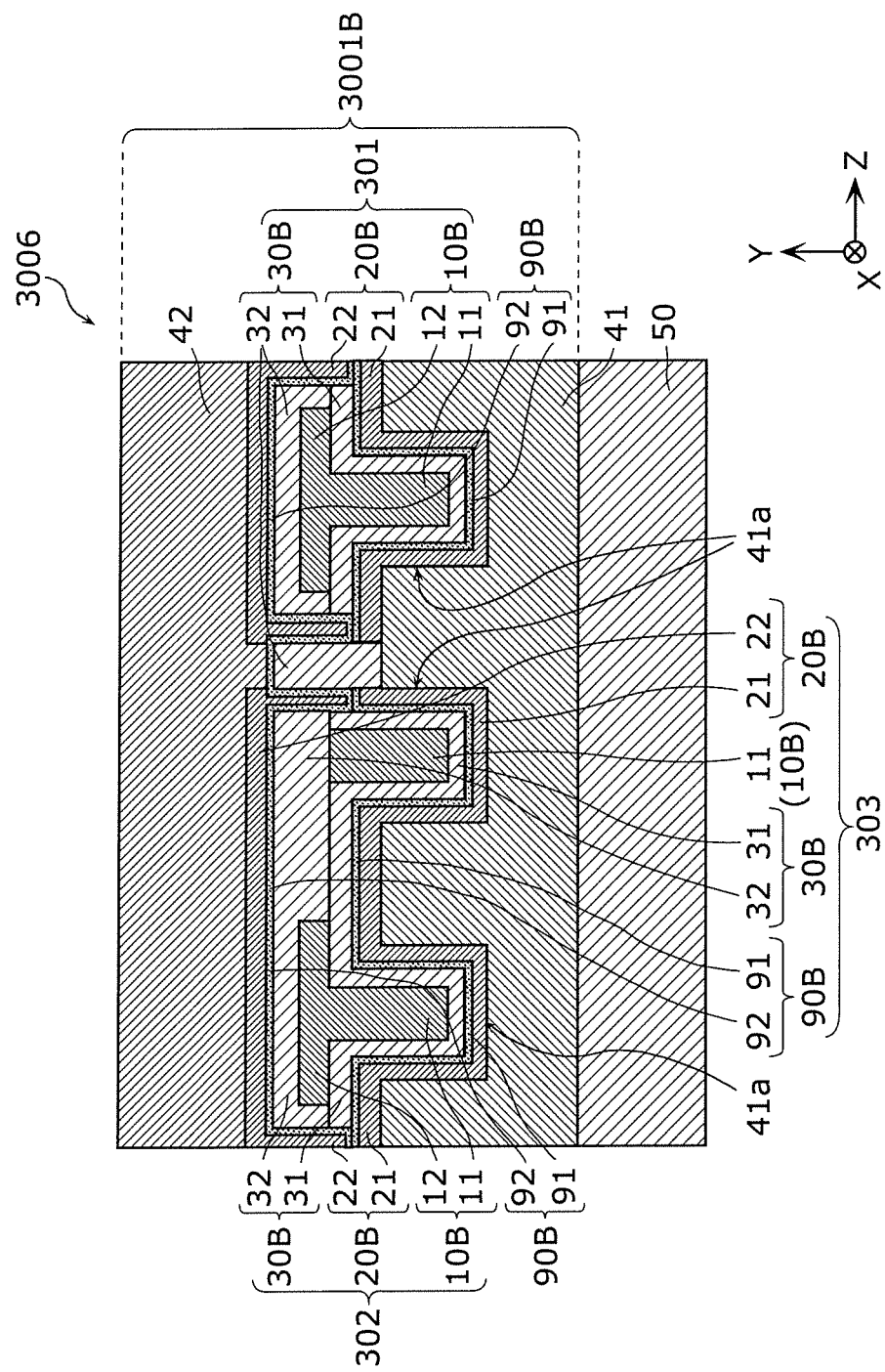
FIG. 29 is a cross-sectional view showing configurations of an interconnect structure and a semiconductor device according to Aspect 3 of Embodiment 3.

Now, an interconnect structure according to another aspect of Embodiment 3 will be described with reference to FIG. 29. FIG. 29 is a cross-sectional view showing configurations of interconnect structure 3001B according to Aspect 3 of Embodiment 3 and semiconductor device 3006 employing this interconnect structure 3001B.

Semiconductor device 3006 shown in FIG. 29 includes substrate 50 and interconnect structure 3001B on substrate 50. Interconnect structure 3001B includes three interconnect passages of first, second, and third interconnect passages 301, 302, and 303, and two interlayer insulating layers of first and second interlayer insulating layers 41 and 42.

First, second, and third interconnect passages 301, 302, and third interconnect passage 303 further include insulating layer 90B in addition to the components of first, second, and third interconnect passages 101, 102, and 103 of interconnect structure 1B according to Embodiment 1 described above.

In this aspect as well, insulating layer 90B is interposed between solid electrolyte layer 30B and metal layer 20B. Specifically, in a cross-sectional view taken along a YZ cross section, the entire periphery of solid electrolyte layer 30B is covered by insulating layer 90B. The entire periphery of insulating layer 90B is covered by metal layer 20B.

Insulating layer 90B includes first insulating layer 91 and second insulating layer 92. First insulating layer 91 is a lower insulating film, at least a part of which is buried in recesses 41a, between first solid electrolyte layer 31 and first metal layer 21. Second insulating layer 92 is an upper insulating film on first insulating layer 91, between second solid electrolyte layer 32 and second metal layer 22. First insulating layer 91 and second insulating layer 92 are insulating films, such as alumina films, silicon oxynitride films, or silicon nitride films, made of an insulating material.

In this manner, each of interconnect structures 3001, 3001A, and 3001B according to this embodiment has the same or similar configuration as interconnect structure 1 according to Embodiment 1 described above. Upon application of a voltage to solid electrolyte layer 30 or 30B, ions move inside solid electrolyte layers layer 30 or 30B, which increases the electron concentration in interconnect layer 10 or 10B. This reduces the resistance value of interconnect layer 10 or 10B. That is, an increase in the resistance value of interconnect layer 10 or 10B can be reduced which is caused by a decrease in the line width of the interconnect layer. The structures are thus advantageous in reducing the resistances.

Interconnect structure 3001, 3001A, and 3001B according to this embodiment includes insulating layer 90 or 90B, which reduces electron leakage from interconnect layer 10 or 10B. In particular, the electron leakage tends to occur from interconnect layer 10 or 10B with smaller line widths. However, provided insulating layer 90 or 90B efficiently reduces the electron leakage.

Figure 30A:
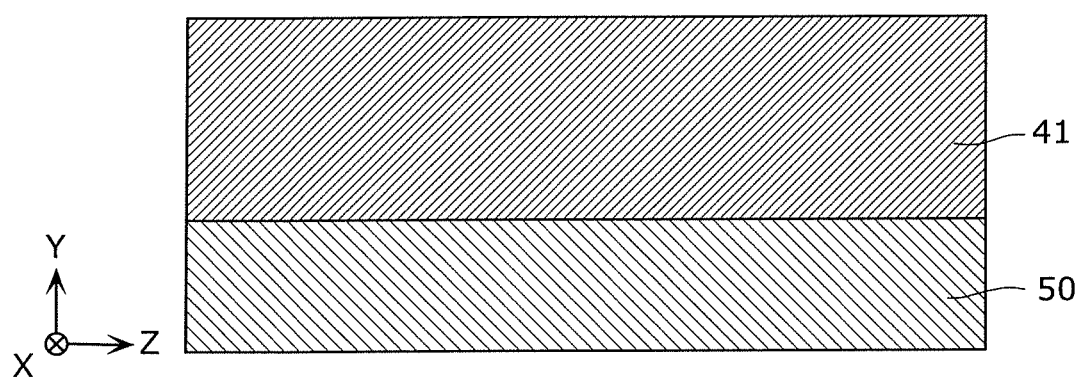
FIG. 30A is a cross-sectional view showing a first interlayer insulating layer formation step in a method of manufacturing a semiconductor device according to Embodiment 3.

Next, a method of manufacturing an interconnect structure and a semiconductor device according to Embodiment 3 will be described with reference to FIGS. 30A to 30Y. FIGS. 30A to 30Y are for illustrating the method of manufacturing semiconductor device 3006 shown in FIG. 29.

Figure 30B:
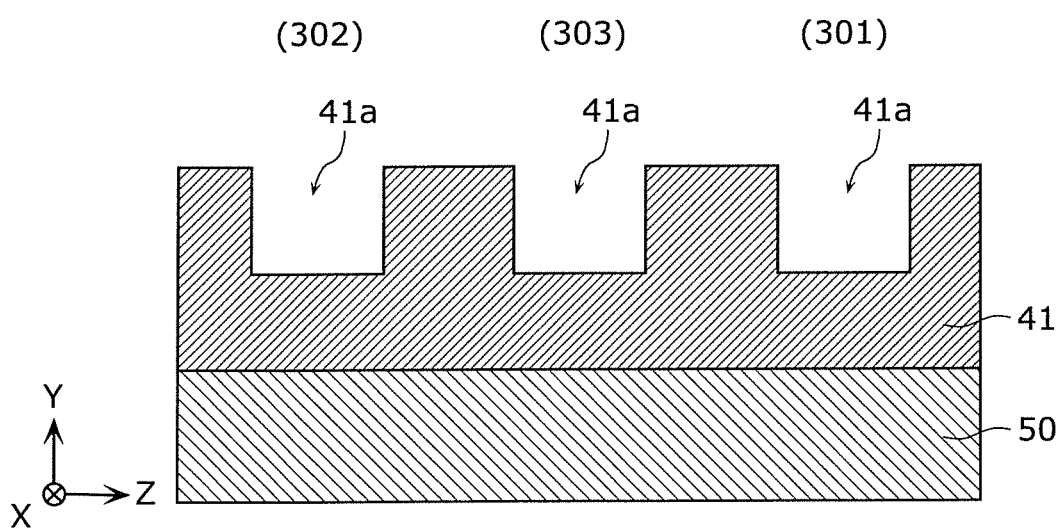
FIG. 30B is a cross-sectional view showing a recess formation step in the method of manufacturing the semiconductor device according to Embodiment 3.
Figure 30C:
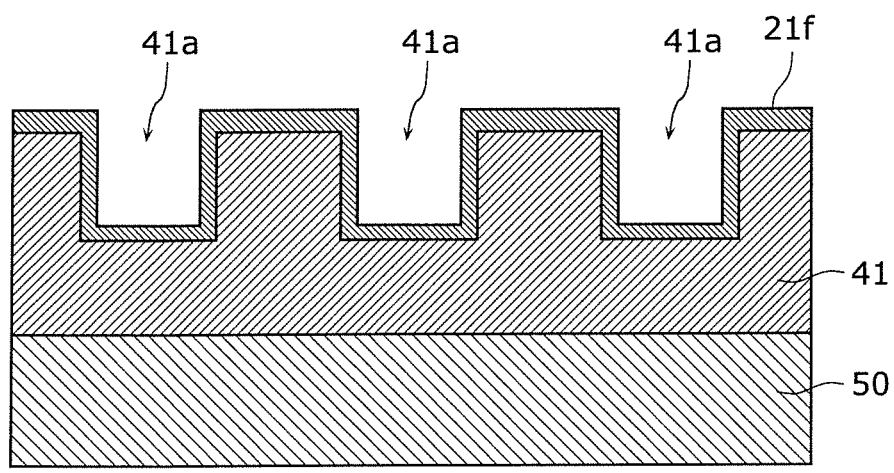
FIG. 30C is a cross-sectional view showing a first metal layer formation step in the method of manufacturing the semiconductor device according to Embodiment 3.

The steps shown in FIGS. 30A to 30C are the same or similar to those in FIGS. 11A to 11E.

Specifically, as shown in FIG. 30A, substrate 50 is prepared, and first interlayer insulating layer 41 is formed on substrate 50. Next, as shown in FIG. 30B, recesses 41a for burying interconnect passages 300 are formed in first interlayer insulating layer 41. Then, as shown in FIG. 30C, first metal layer 21f is formed along the inner surfaces of recesses 41a extending in the direction in first interlayer insulating layer 41. In this embodiment, as shown in FIG. 30B, three interconnect passages of first, second, and third interconnect passages 301, 302, and 303 are formed as interconnect passages 300. In correspondence to these three interconnect passages, three recesses 41a are shown in FIGS. 30B and 30C.

Figure 30D:
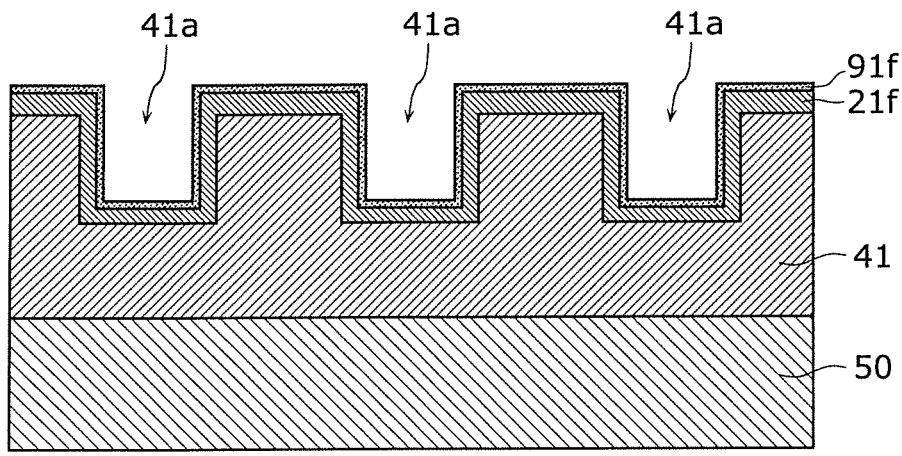
FIG. 30D is a cross-sectional view showing a first insulating layer formation step in the method of manufacturing the semiconductor device according to Embodiment 3.

Next, as shown in FIG. 30D, first insulating layer 91f is formed to cover first metal layer 21f and to not fill recesses 41a. Specifically, first insulating layer 91f is formed to cover the entire surface of first metal layer 21f. At this time, first insulating layer 91f is formed to cover the surface of first metal layer 21f that is not formed in recesses 41a, and the inner side surfaces and the bottom surface of first metal layer 21f that are formed inside recesses 41a. First insulating layer 91f may be formed by the CVD, for example.

Figure 30E:
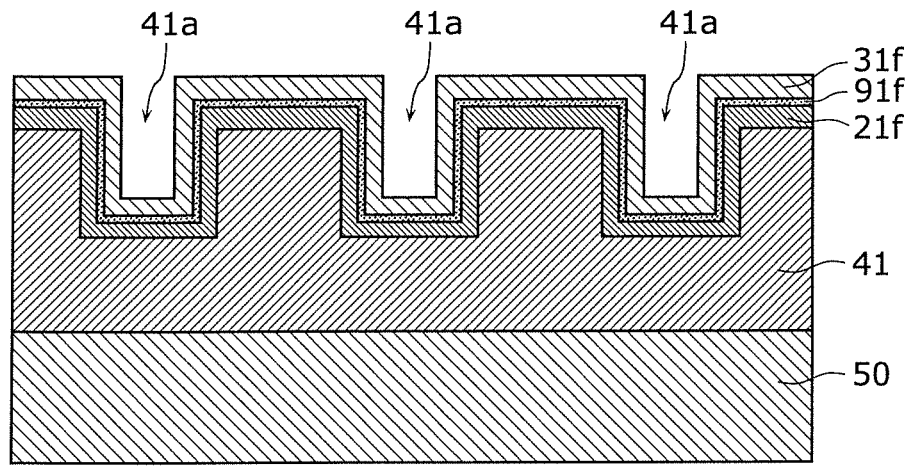
FIG. 30E is a cross-sectional view showing a first solid electrolyte layer formation step in the method of manufacturing the semiconductor device according to Embodiment 3.

Then, as shown in FIG. 30E, first solid electrolyte layer 31f is formed to cover first insulating layer 91f and to not fill recesses 41a. The step shown in FIG. 30E is the same or similar to that in FIG. 11E.

Figure 30F:
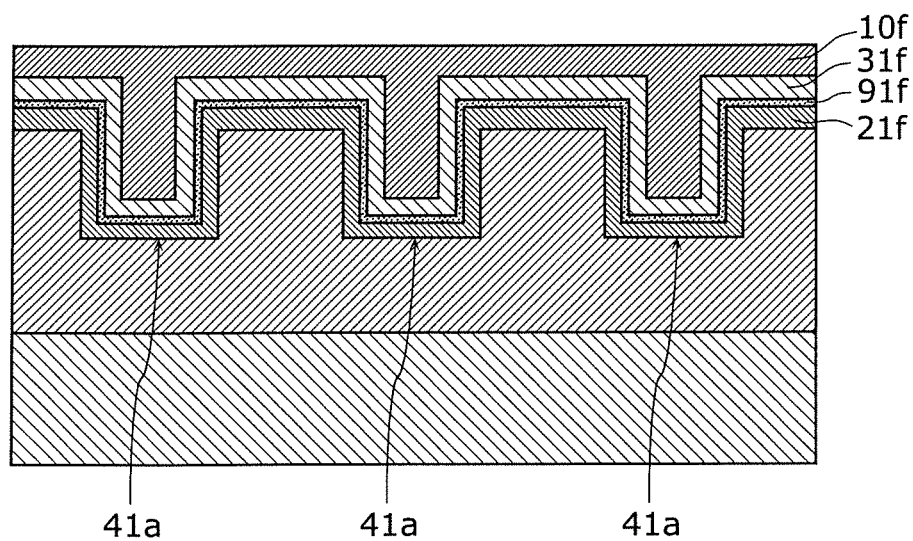
FIG. 30F is a cross-sectional view showing an interconnect layer formation step in the method of manufacturing the semiconductor device according to Embodiment 3.
Figure 30G:
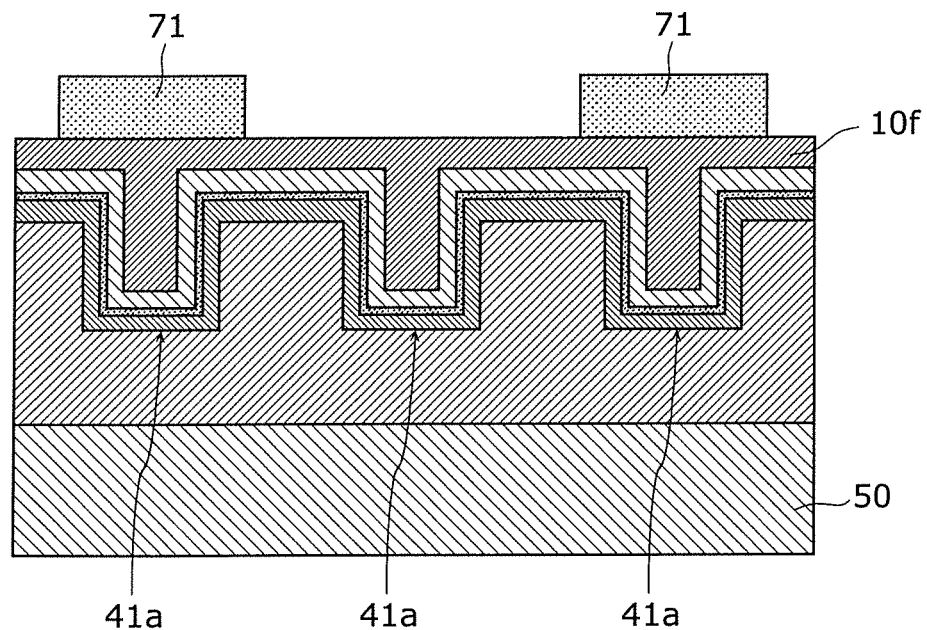
FIG. 30G is a cross-sectional view showing a first resist formation step in the method of manufacturing the semiconductor device according to Embodiment 3.
Figure 30H:
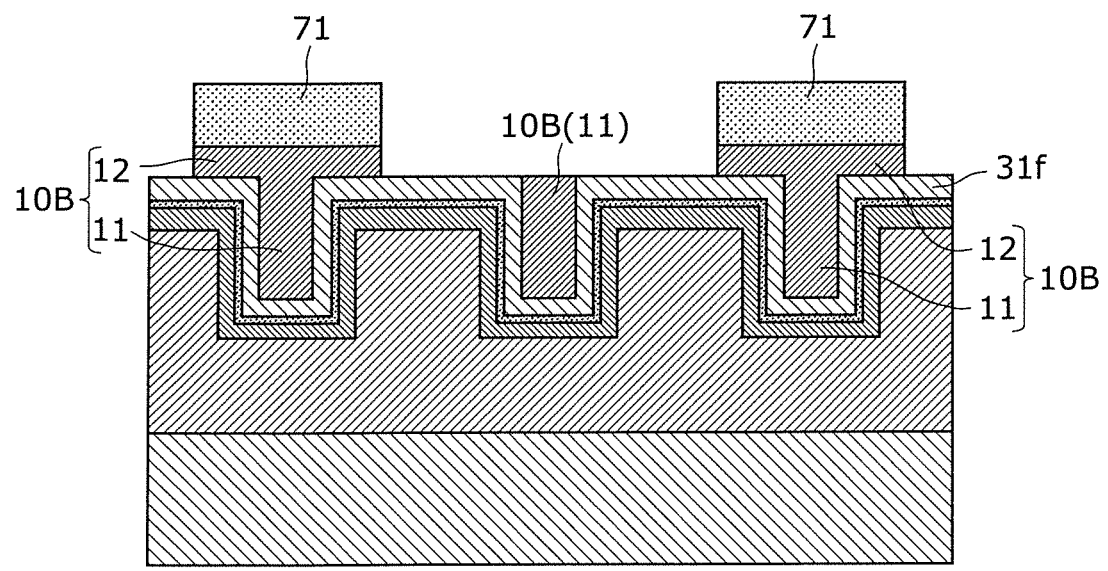
FIG. 30H is a cross-sectional view showing an interconnect layer patterning step in the method of manufacturing the semiconductor device according to Embodiment 3.
Figure 30I:
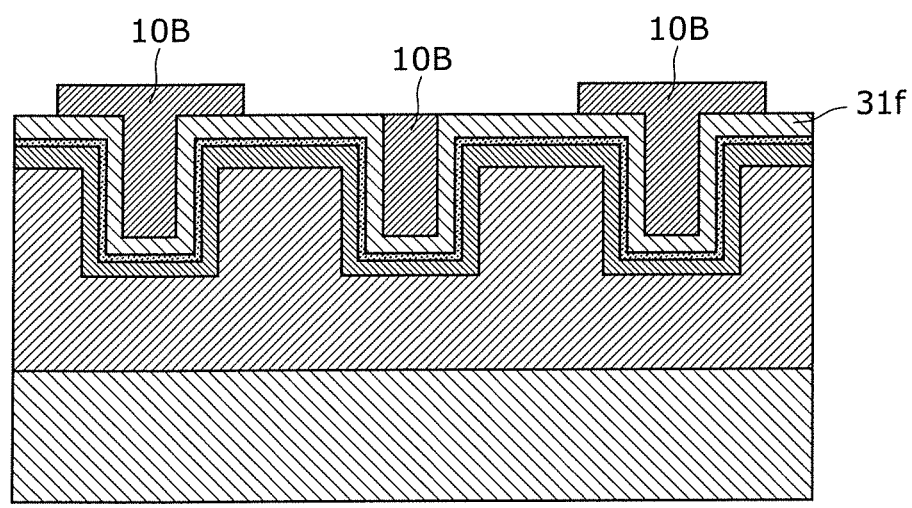
FIG. 30I is a cross-sectional view showing a first resist removal step in the method of manufacturing the semiconductor device according to Embodiment 3.
Figure 30J:
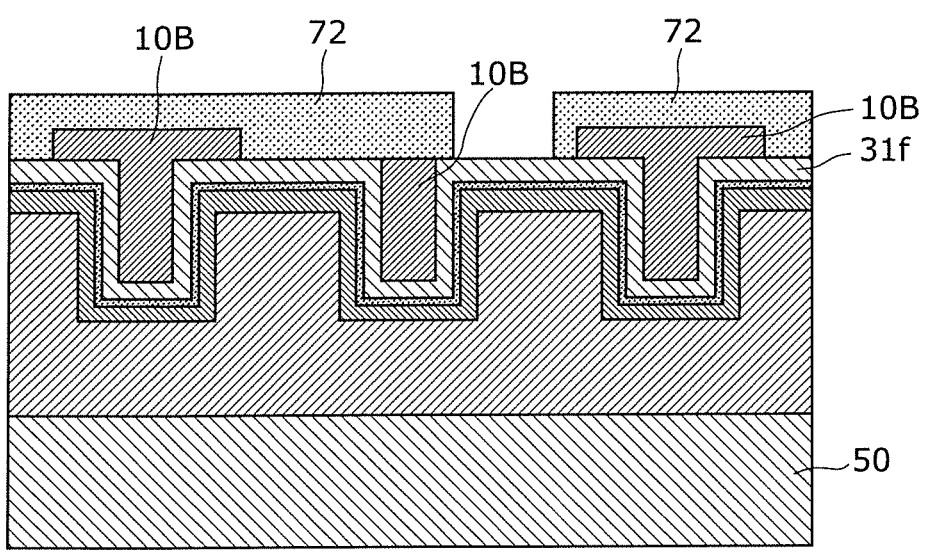
FIG. 30J is a cross-sectional view showing a second resist formation step in the method of manufacturing the semiconductor device according to Embodiment 3.
Figure 30K:
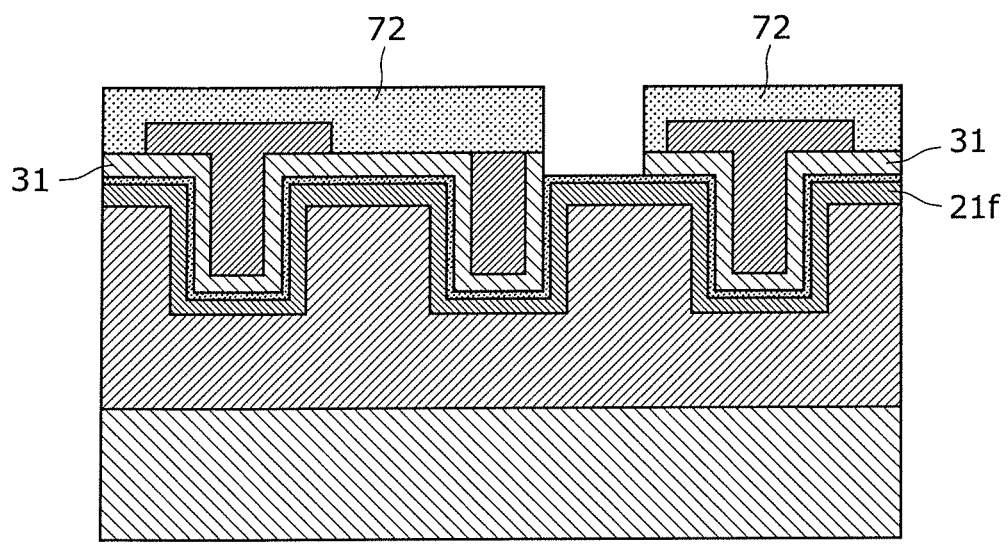
FIG. 30K is a cross-sectional view showing a first solid electrolyte layer patterning step in the method of manufacturing the semiconductor device according to Embodiment 3.
Figure 30L:
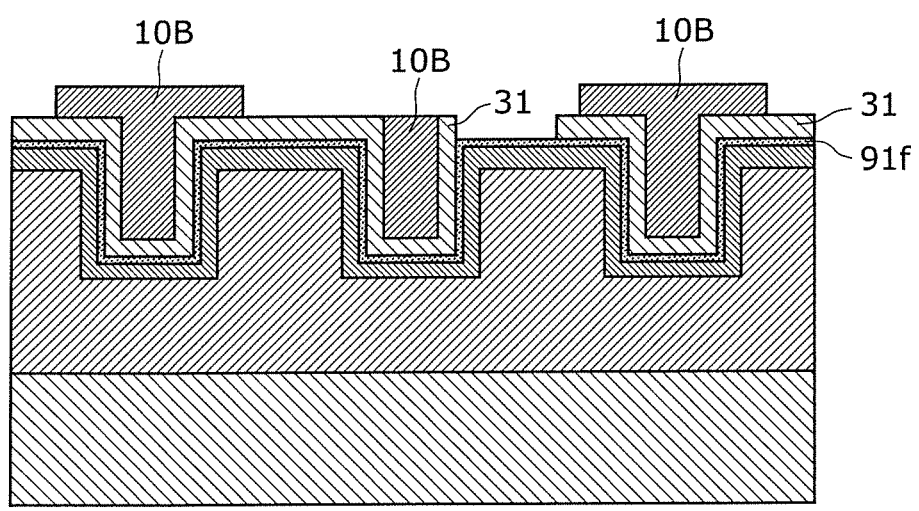
FIG. 30L is a cross-sectional view showing a second resist removal step in the method of manufacturing the semiconductor device according to Embodiment 3.
Figure 30M:
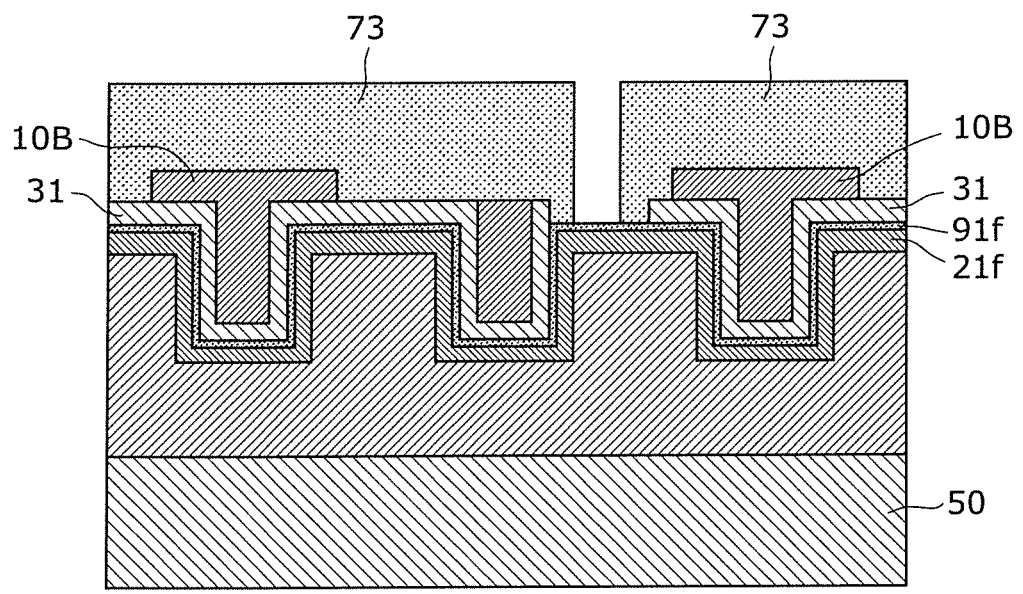
FIG. 30M is a cross-sectional view showing a third resist formation step in the method of manufacturing the semiconductor device according to Embodiment 3.
Figure 30N:
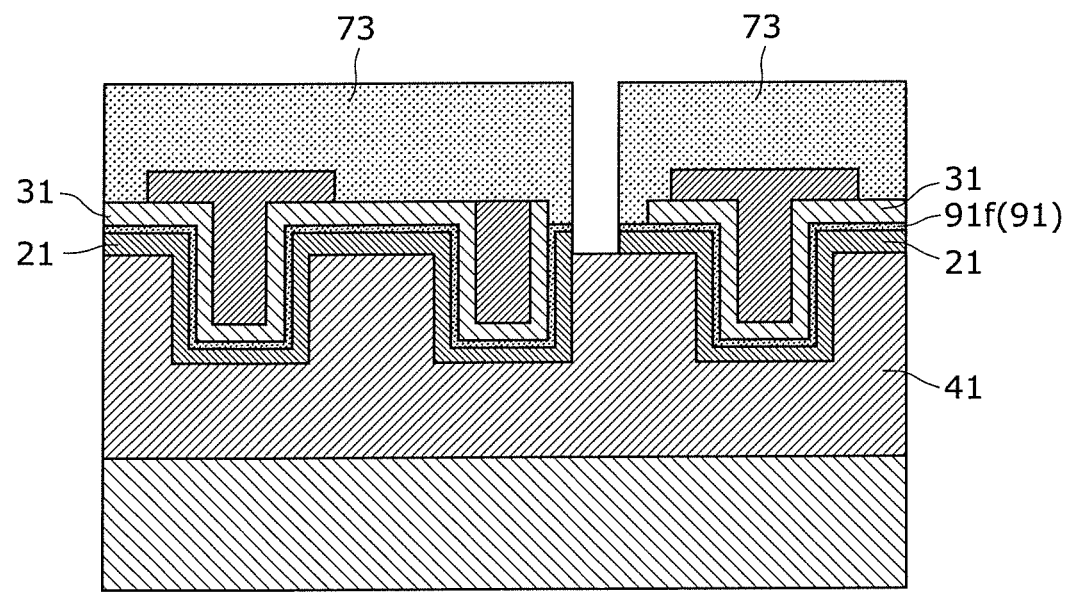
FIG. 30N is a cross-sectional view showing a first metal layer patterning step in the method of manufacturing the semiconductor device according to Embodiment 3.
Figure 30O:
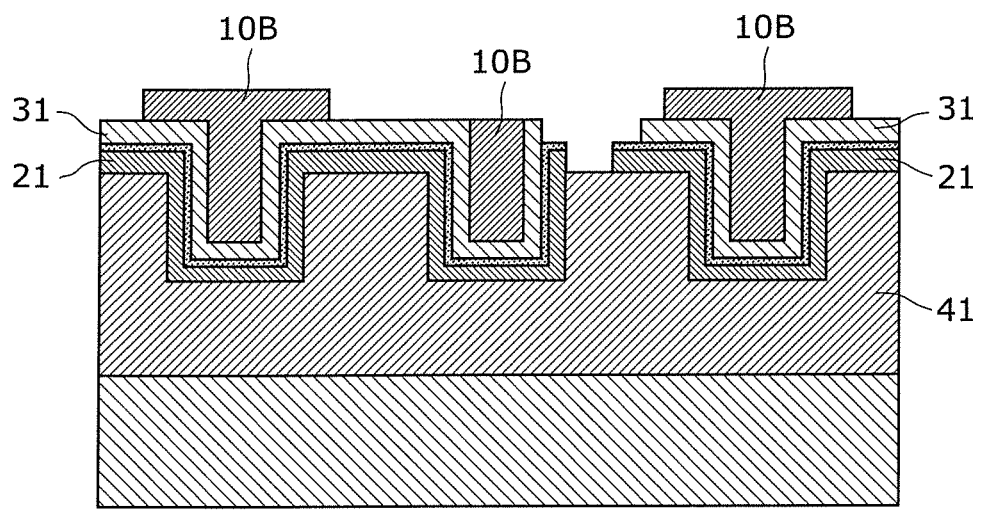
FIG. 30O is a cross-sectional view showing a third resist removal step in the method of manufacturing the semiconductor device according to Embodiment 3.
Figure 30P:
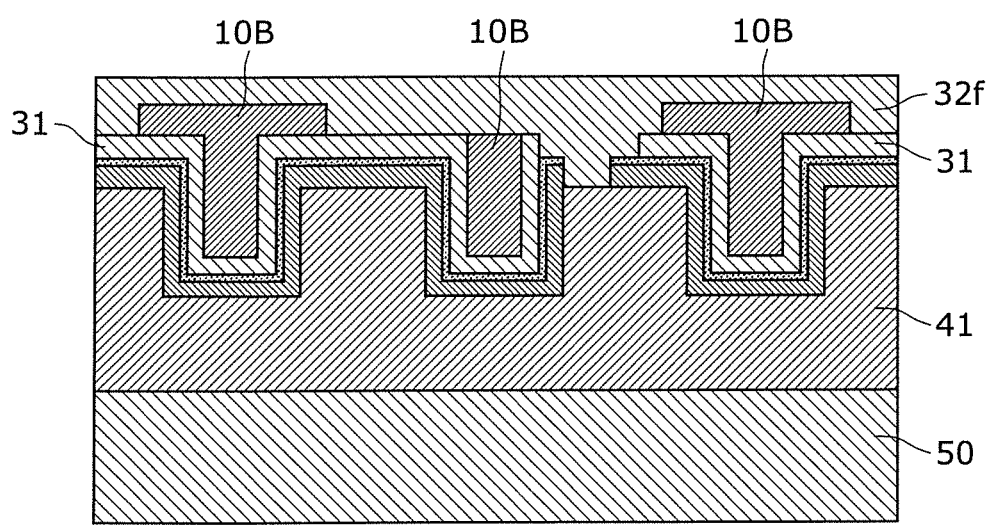
FIG. 30P is a cross-sectional view showing a second solid electrolyte layer formation step in the method of manufacturing the semiconductor device according to Embodiment 3.
Figure 30Q:
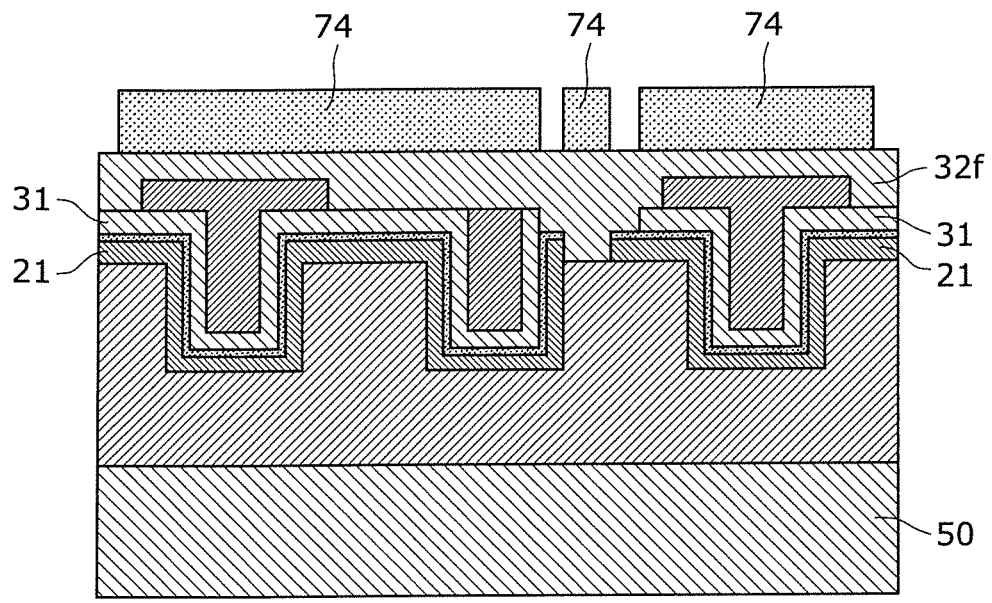
FIG. 30Q is a cross-sectional view showing a fourth resist formation step in the method of manufacturing the semiconductor device according to Embodiment 3.
Figure 30R:
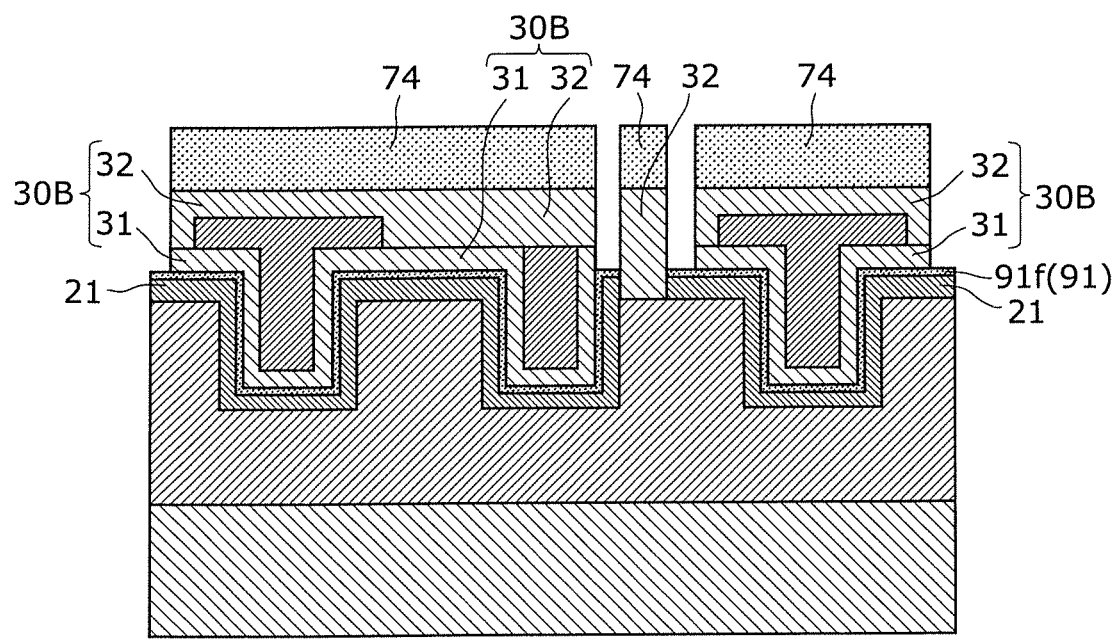
FIG. 30R is a cross-sectional view showing a second solid electrolyte layer patterning step in the method of manufacturing the semiconductor device according to Embodiment 3.
Figure 30S:
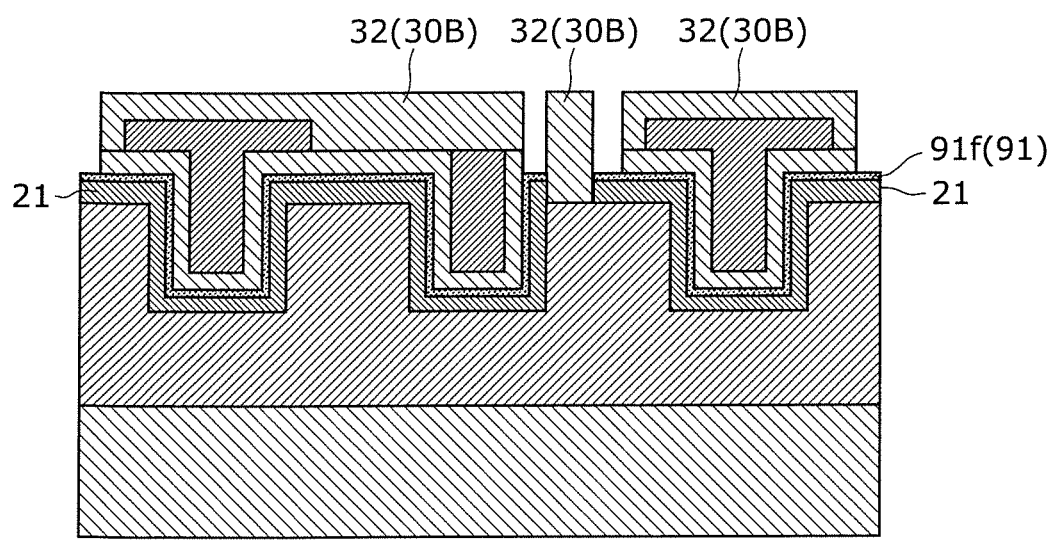
FIG. 30S is a cross-sectional view showing a fourth resist removal step in the method of manufacturing the semiconductor device according to Embodiment 3.

After that, the steps shown in FIGS. 30F to 30S follow, which are the same or similar to those in FIGS. 11G to 11T.

Specifically, as shown in FIG. 30F, interconnect layer 10f is formed so as to be enclosed by first solid electrolyte layer 31f and to fill recesses 41a. Next, as shown in FIG. 30G, first resist 71 is formed in a predetermined shape on interconnect layer 10f. Then, as shown in FIG. 30H, interconnect layer 10f is etched using first resist 71 as a mask so as to be patterned. Accordingly, interconnect layer 10f is partially removed and separated to form interconnect layer 10B in a predetermined shape. After that, as shown in FIG. 30I, first resist 71 is removed. Accordingly, interconnect layer 10B is exposed.

Next, as shown in FIG. 30J, second resist 72 is formed in a predetermined shape on first solid electrolyte layer 31f to cover interconnect layer 10B. Then, as shown in FIG. 30K, first solid electrolyte layer 31f is etched using second resist 72 as a mask so as to be patterned. After that, as shown in FIG. 30L, second resist 72 is removed.

Then, as shown in FIG. 30M, third resist 73 is formed in a predetermined shape on first metal layer 21f to cover interconnect layer 10B and first solid electrolyte layer 31. After that, as shown in FIG. 30N, first metal layer 21f is etched using third resist 73 as a mask so as to be patterned. At this time, first insulating layer 91f may be also etched using third resist 73 as a mask. Accordingly, first insulating layer 91f are partially removed to form first insulating layer 91. Then, as shown in FIG. 30O, third resist 73 is removed.

After that, as shown in FIG. 30P, second solid electrolyte layer 32f is formed to cover interconnect layer 10B, first solid electrolyte layer 31, and first metal layer 21. Next, as shown in FIG. 30Q, fourth resist 74 is formed in a predetermined shape on second solid electrolyte layer 32f. Then, as shown in FIG. 30R, second solid electrolyte layer 32f is etched using fourth resist 74 as a mask so as to be patterned. Accordingly, solid electrolyte layer 30B is formed which is composed of first solid electrolyte layer 31 and second solid electrolyte layer 32. After that, as shown in FIG. 30S, fourth resist 74 is removed.

Figure 30T:
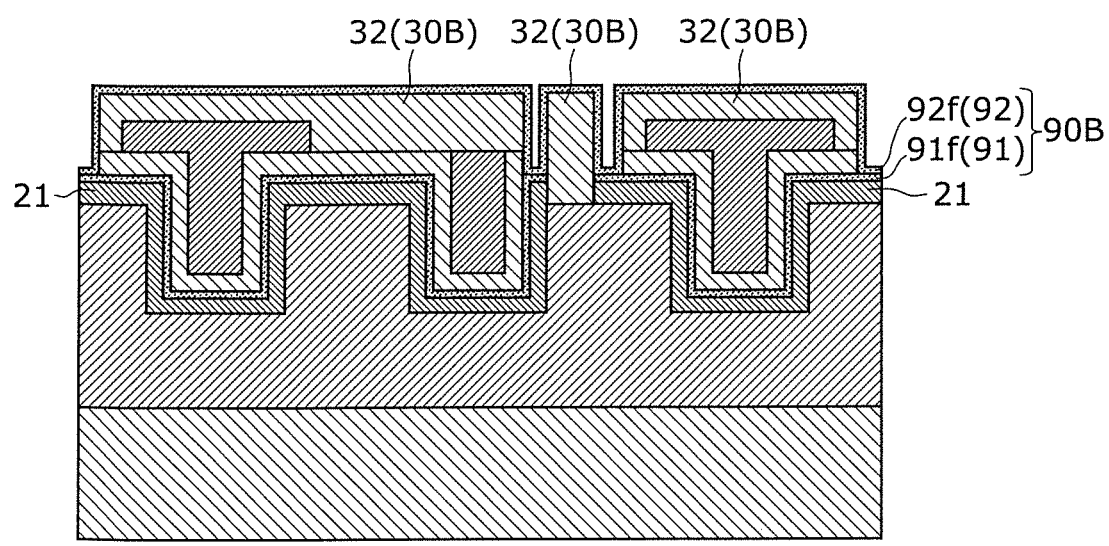
FIG. 30T is a cross-sectional view showing a second insulating layer formation step in the method of manufacturing the semiconductor device according to Embodiment 3.

Next, as shown in FIG. 30T, second insulating layer 92f is formed to cover solid electrolyte layer 30B. Specifically, second insulating layer 92f is formed to cover the entire surface of solid electrolyte layer 30 and the entire surface of exposed first insulating layer 91f. Accordingly, insulating layer 90B can be formed which is composed of first insulating layer 91 and second insulating layer 92, Note that second insulating layer 92f may be formed by the CVD, for example.

Figure 30U:
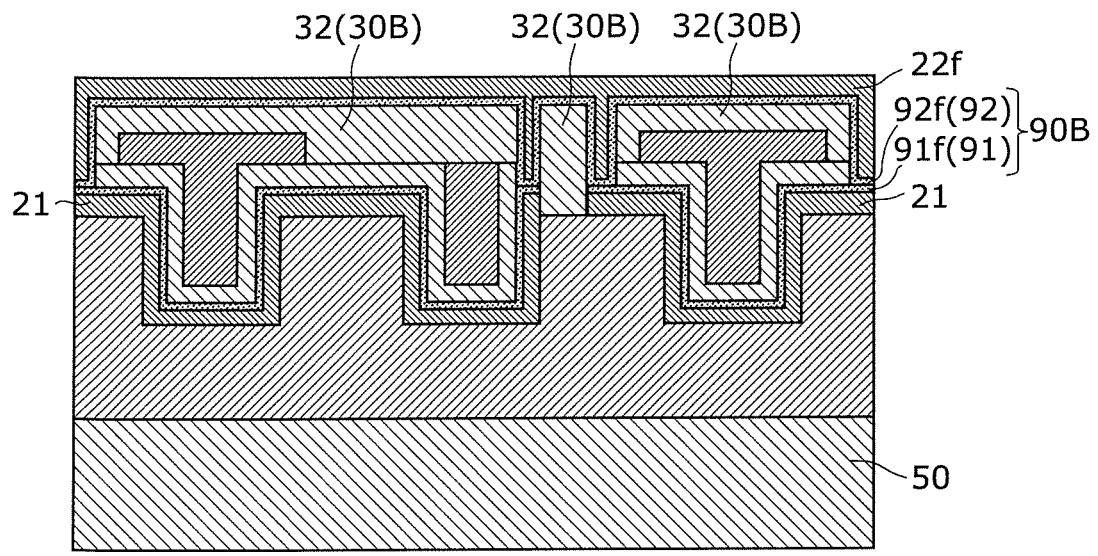
FIG. 30U is a cross-sectional view showing a second metal layer formation step in the method of manufacturing the semiconductor device according to Embodiment 3.

Then, as shown in FIG. 30U, second metal layer 22f is formed to cover second insulating layer 92f. The step shown in FIG. 30U is the same or similar to that in FIG. 11U.

Subsequently, the steps shown in FIGS. 30V to 30Y follow, which are the same or similar to those in FIGS. 11V to 11Y.

Figure 30V:
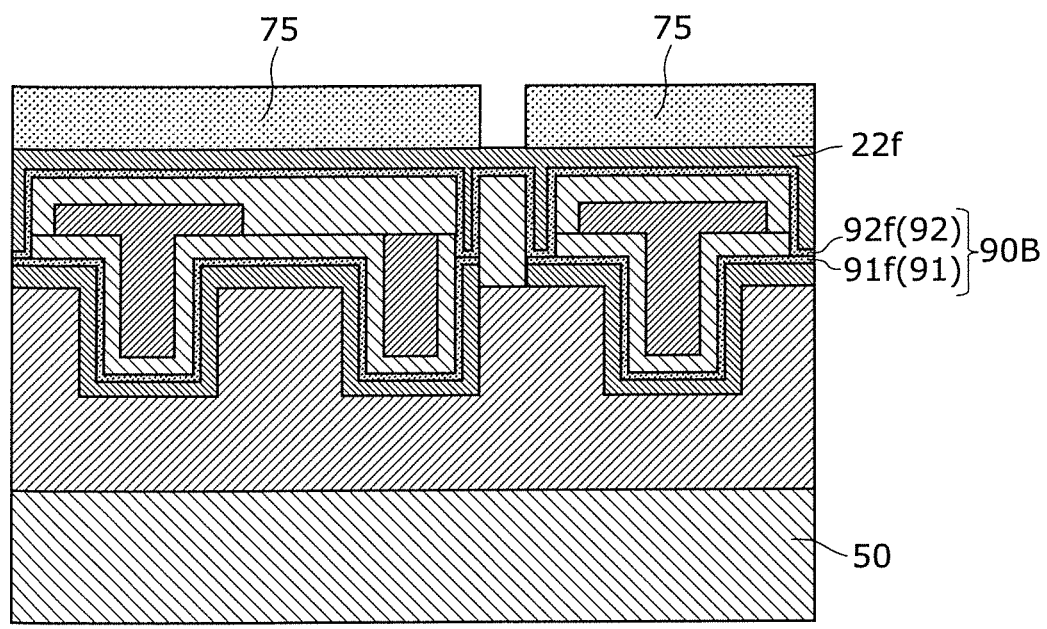
FIG. 30V is a cross-sectional view showing a fifth resist formation step in the method of manufacturing the semiconductor device according to Embodiment 3.
Figure 30W:
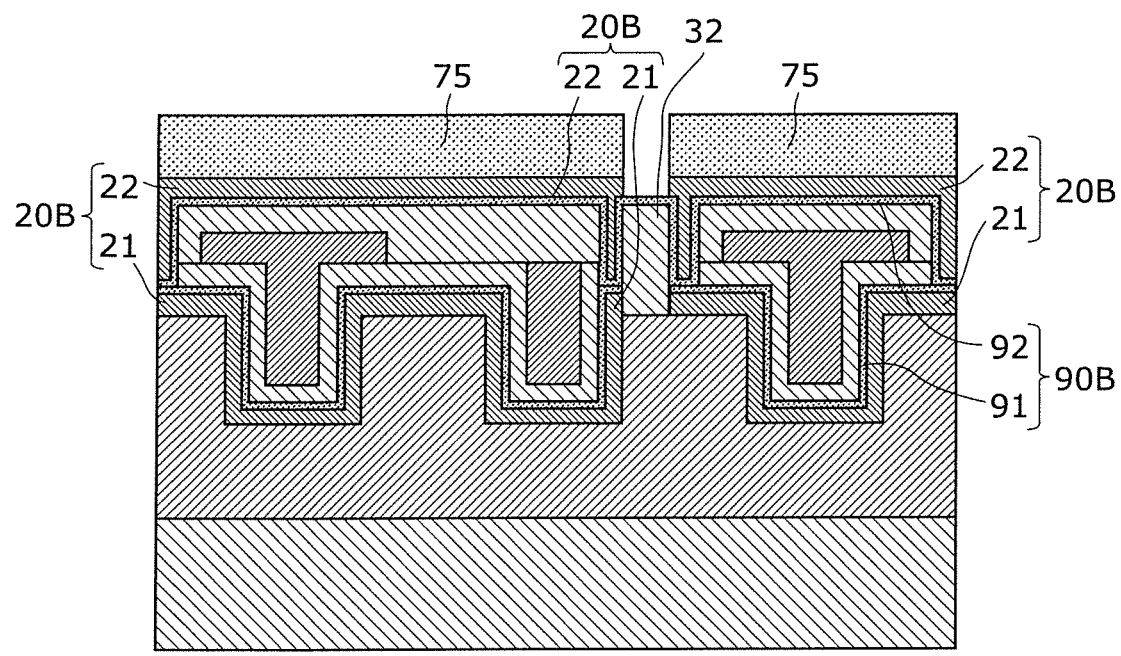
FIG. 30W is a cross-sectional view showing a second metal layer patterning step in the method of manufacturing the semiconductor device according to Embodiment 3.
Figure 30X:
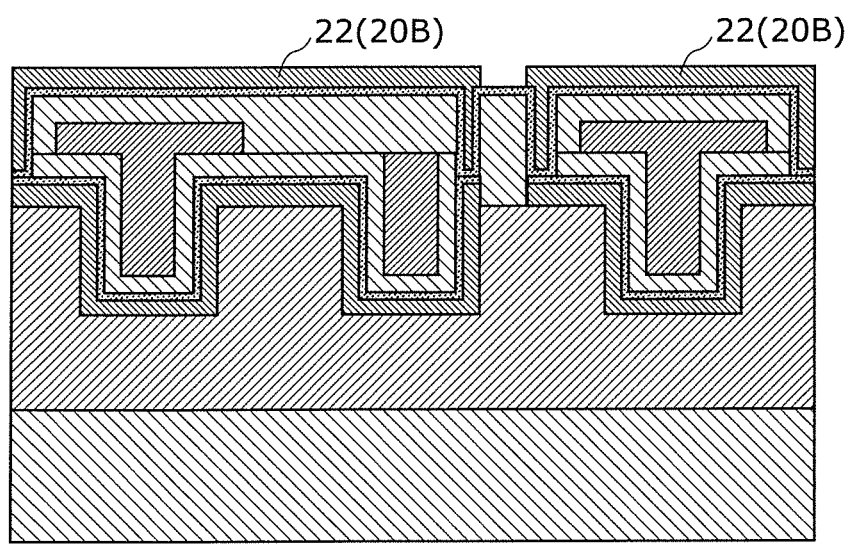
FIG. 30X is a cross-sectional view showing a fifth resist removal step in the method of manufacturing the semiconductor device according to Embodiment 3.
Figure 30Y:
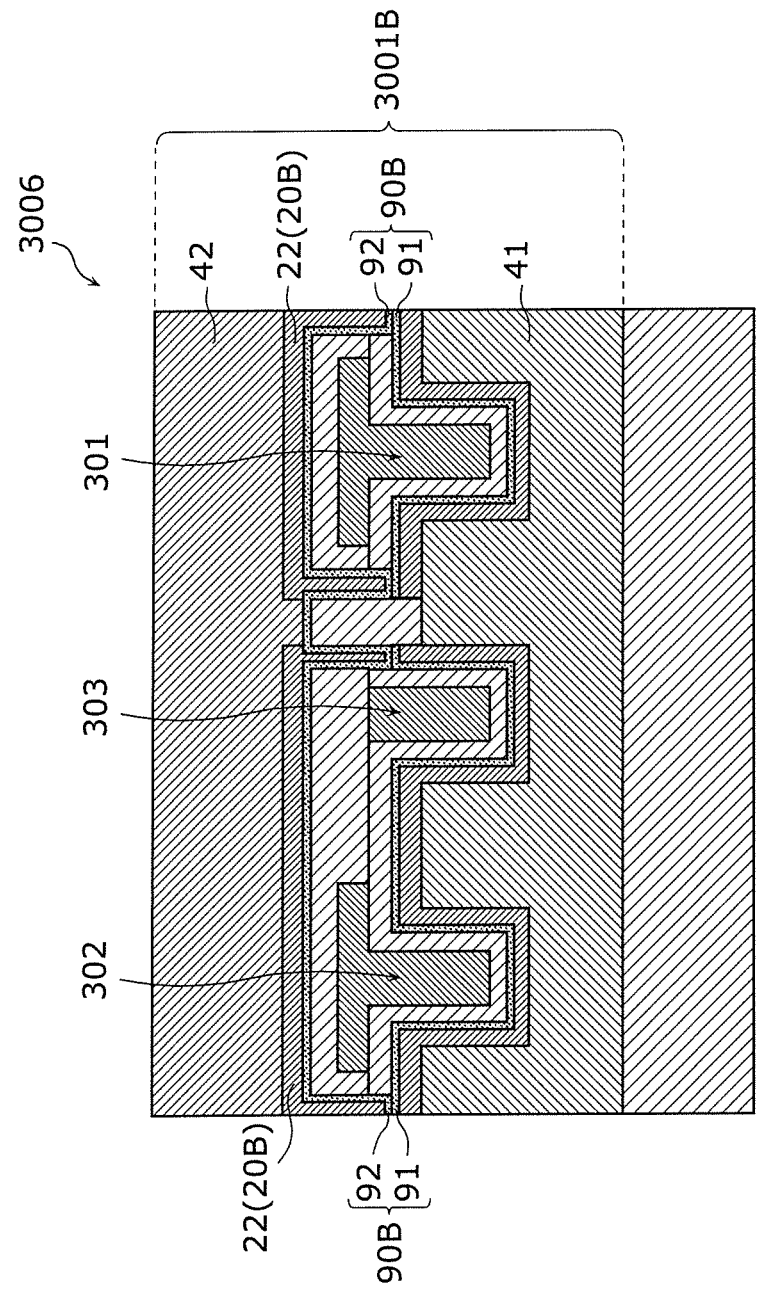
FIG. 30Y is a cross-sectional view showing a second interlayer insulating layer formation step in the method of manufacturing the semiconductor device according to Embodiment 3.

Specifically, as shown in FIG. 30V, fifth resist 75 is formed in a predetermined shape on second metal layer 22f. Next, as shown in FIG. 30W, second metal layer 22f is etched using fifth resist 75 as a mask so as to be patterned. Then, as shown in FIG. 30X, fifth resist 75 is removed. Accordingly, second metal layer 22 is exposed. After that, as shown in FIG. 30Y, second interlayer insulating layer 42 is formed to cover second metal layer 22.

As described above, semiconductor device 3006 can be fabricated which has interconnect structure 3001B including first, second, and third interconnect passages 301, 302, and 303. That is, as shown in FIG. 29, semiconductor device 3006 can be fabricated which includes insulating layer 90 composed of first insulating layer 91 and second insulating layer 92.

The variations of Embodiment 1 shown in FIGS. 12 to 17 are also applicable to this embodiment. The semiconductor devices other than semiconductor device 3006 shown in FIG. 29 and the interconnect structures may be fabricated in accordance with the manufacturing method shown in FIGS. 30A to 30Y.

Embodiment 4

Figure 31A:
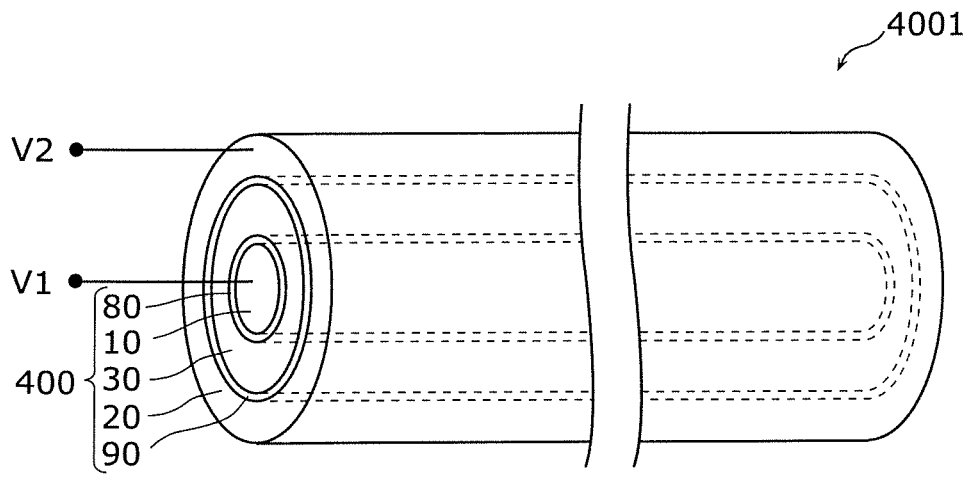
FIG. 31A schematically shows a configuration of an interconnect structure according to Aspect 1 of Embodiment 4.
Figure 31B:
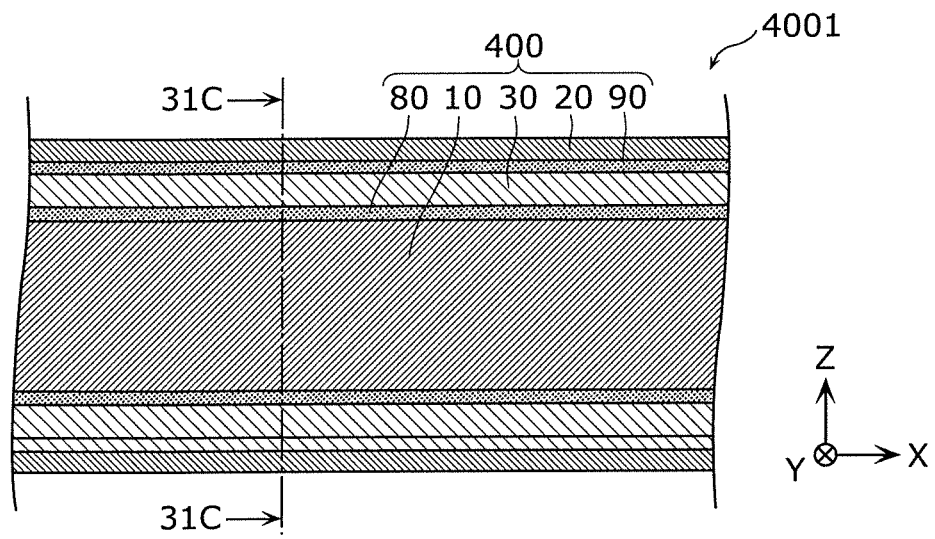
Figure 31C:
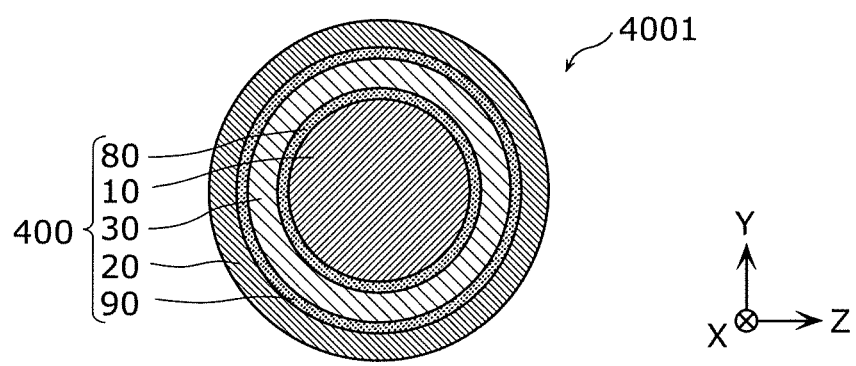

Now, Embodiment 4 will be described. First, a configuration of interconnect structure 4001 according to Aspect 1 of Embodiment 4 will be described with reference to FIGS. 31A to 31C. FIG. 31A schematically shows the configuration of interconnect structure 4001 according to Aspect 1 of Embodiment 4. FIG. 31B is a cross-sectional view of this interconnect structure 4001. FIG. 31C is a cross-sectional view of this interconnect structure 4001 taken along line 31C-31C in FIG. 31B.

As in Embodiment 1 described above, interconnect structure 4001 according to this embodiment is used in a semiconductor device such as a semiconductor integrated circuit device. In the semiconductor device, interconnect structure 4001 includes interconnect passage 400 for electrically connecting circuit elements.

As shown in FIGS. 31A to 31C, interconnect passage 400 according to this embodiment further includes insulating layer 80 as a first insulating layer and insulating layer 90 as a second insulating layer in addition to the components of interconnect passage 100 according to Embodiment 1 described above. In the other respects, interconnect passage 400 has the same or similar configuration as interconnect passage 100 according to Embodiment 1 described above.

Specifically, interconnect structure 4001 includes interconnect layer 10, metal layer 20, solid electrolyte layer 30, and insulating layers 80 and 90.

Insulating layer 80 is interposed between interconnect layer 10 and solid electrolyte layer 30. Insulating layer 90 is interposed between solid electrolyte layer 30 and metal layer 20. Accordingly, interconnect structure 4001 includes interconnect layer 10, insulating layer 80, solid electrolyte layer 30, insulating layer 90, and metal layer 20 formed in this order from the inside to the outside. Metal layer 20 encloses not only interconnect layer 10 and solid electrolyte layer 30 but also insulating layers 80 and 90.

Specifically, in a cross-sectional view taken along a YZ cross section, the entire periphery of interconnect layer 10 is covered by insulating layer 80 that is the first insulating layer. The entire periphery of insulating layer 80 is covered by solid electrolyte layer 30. The entire periphery of solid electrolyte layer 30 is covered by insulating layer 90 that is the second insulating layer. The entire periphery of insulating layer 90 is covered by metal layer 20.

Insulating layers 80 and 90 are insulating films made of an insulating material. Insulating layers 80 and 90 may be alumina films, silicon oxynitride films, or silicon nitride films, for example. Note that insulating layer 80 and insulating layer 90 may be made of the same or different materials.

Figure 32:
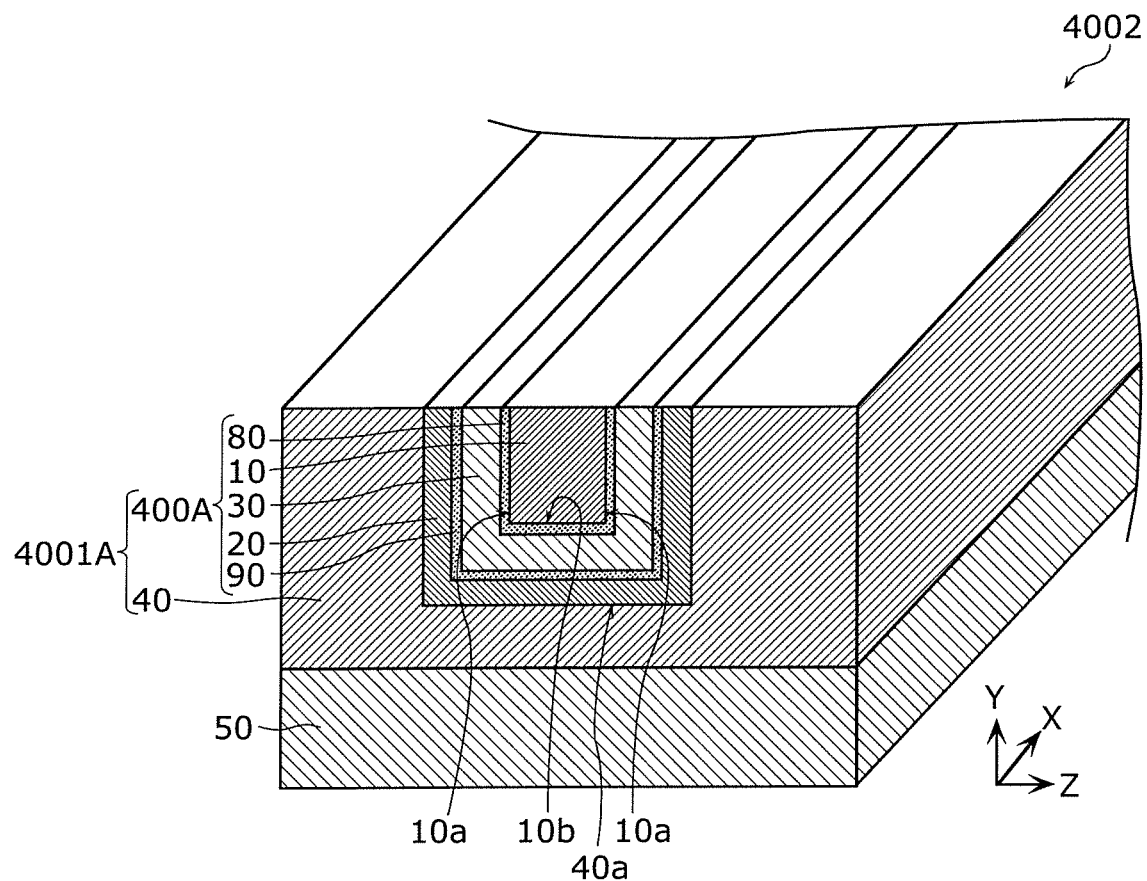

Now, interconnect structure 4001A according to Aspect 2 of Embodiment 4 will be described with reference to FIG. 32. FIG. 32 shows configurations of interconnect structure 4001A according to Aspect 2 of Embodiment 4 and semiconductor device 4002 employing this interconnect structure 4001A.

As shown in FIG. 32, interconnect structure 4001A further includes insulating layer 40 as a third insulating layer in addition to interconnect layer 10, metal layer 20, solid electrolyte layer 30, insulating layer 80 as a first insulating layer, and insulating layer 90 as a second insulating layer. Interconnect layer 10, metal layer 20, solid electrolyte layer 30, insulating layer 80, and insulating layer 90 constitute interconnect passage 400A like interconnect passage 400 shown in FIGS. 31A to 31C. In FIG. 32, semiconductor device 4002 includes substrate 50 and interconnect structure 4001A on substrate 50.

Figure 33:
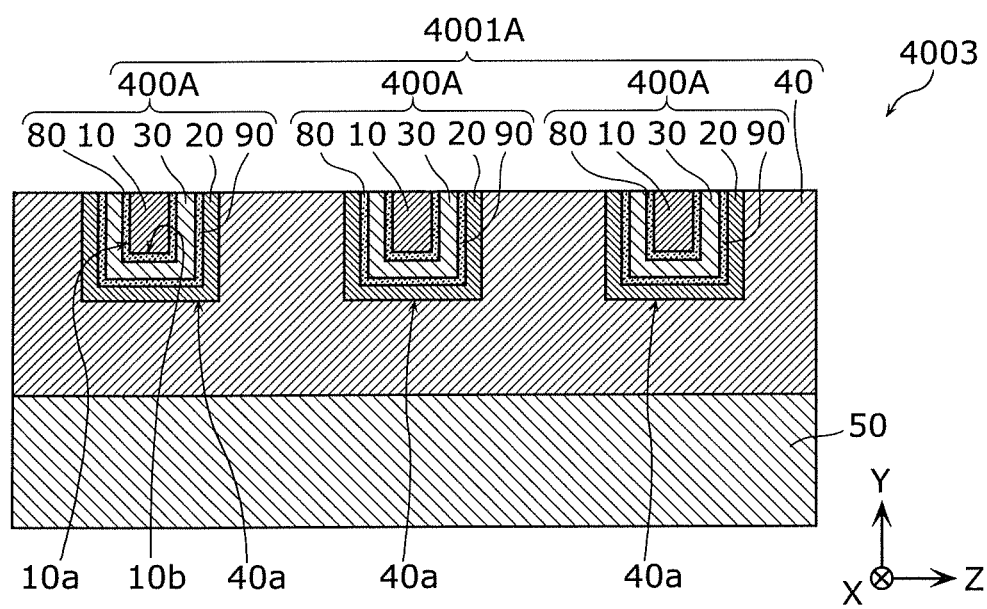

Note that the number of interconnect passage 400A, which is included in interconnect structure 4001A formed on substrate 50, is not limited to one. Specifically, like semiconductor device 4003 shown in FIG. 33, interconnect structure 3001A on substrate 50 may include a plurality of interconnect passages 400A. In this case, insulating layer 40 has a plurality of recesses 40a, each including one of interconnect passages 400A buried therein.

Note that the semiconductor device according to this embodiment may include transistor 60 like semiconductor device 4 shown in FIG. 5, or may have a multilayer interconnect structure like semiconductor device 5 shown in FIG. 6.

Figure 34:
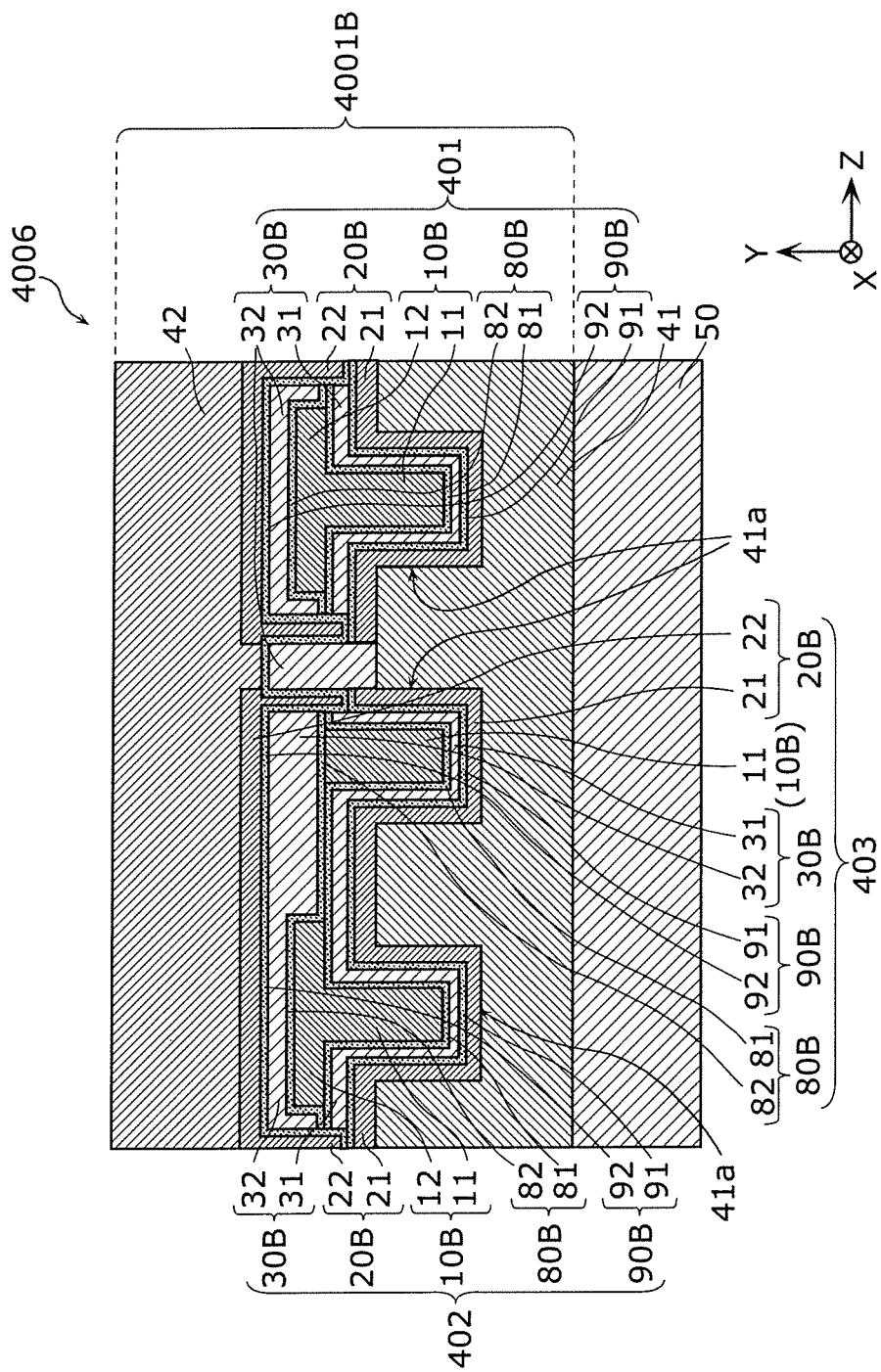

Now, an interconnect structure according to another aspect of Embodiment 4 will be described with reference to FIG. 34. FIG. 34 is a cross-sectional view showing configurations of interconnect structure 4001B according to Aspect 3 of Embodiment 4 and semiconductor device 4006 employing this interconnect structure 4001B.

Semiconductor device 4006 shown in FIG. 34 includes substrate 50 and interconnect structure 4001B on substrate 50. Interconnect structure 4001B includes three interconnect passages of first, second, and third interconnect passages 401, 402, and 403, and two interlayer insulating layers of first and second interlayer insulating layers 41 and 42.

First, second, and third interconnect passages 401, 402, and 403 further include insulating layer 80B and insulating layer 90B in addition to the components of first, second, and third interconnect passages 101, 102, and 103 of interconnect structure 1B according to Embodiment 1 described above.

In this aspect as well, insulating layer 80B is interposed between interconnect layer 10B and solid electrolyte layer 30B. In addition, insulating layer 90B is interposed between solid electrolyte layer 30B and metal layer 20B. Specifically, in a cross-sectional view taken along a YZ cross section, the entire periphery of interconnect layer 10B is covered by insulating layer 80B. The entire periphery of solid electrolyte layer 30B is covered by insulating layer 90B. The entire periphery of insulating layer 90B is covered by metal layer 20B.

Insulating layer 80B is the same as insulating layer 80B according to Embodiment 2 described above and including first insulating layer 81 and second insulating layer 82. In addition, insulating layer 90B is the same as insulating layer 90B according to Embodiment 3 described above and including first insulating layer 91 and second insulating layer 92.

Semiconductor device 4006 shown in FIG. 34 may be fabricated in accordance with the method of manufacturing semiconductor devices 2006 and 3006 according to Embodiments 2 and 3, respectively.

In this manner, each of interconnect structures 4001, 4001A, and 4001B according to this embodiment has the same or similar configuration as interconnect structure 1 according to Embodiment 1 described above. Upon application of a voltage to solid electrolyte layer 30 or 30B, ions move inside solid electrolyte layer 30 or 30B, which increases the electron concentration in interconnect layer 10 or 10B. This reduces the resistance value of interconnect layer 10 or 10B. That is, this increases the resistance value of interconnect layer 10 or 10B caused by a decrease in the line width of the interconnect layer. The structures are thus advantageous in reducing the resistances.

Interconnect structure 4001, 4001A, and 4001B according to this embodiment further include insulating layer 80 or 80B and insulating layer 90 or 90B, which efficiently reduces the electron leakage from interconnect layer 10 or 10B. In particular, the electron leakage tends to occur from interconnect layer 10 or 10B with a smaller line width. However, two provided insulating layers 80 or 80B and 90 or 90B efficiently reduce the electron leakage as compared to the case with only one of insulating layer 80 or 80B and insulating layer 90 or 90B.

The variations of Embodiment 1 shown in FIGS. 12 to 17 are also applicable to this embodiment. In this case, the semiconductor device and the interconnect structure according to this embodiment may be fabricated in accordance with the methods of manufacturing the semiconductor devices and the interconnect structures according to Embodiments 1 to 3 described above.

Embodiment 5

Now, Embodiment 5 will be described. In Embodiment 5, evaluation on the interconnect structure described above as an interconnect according to an aspect will be described. In this embodiment, the interconnect structure is evaluated using evaluation device 9 with the interconnect structure.

Figure 35:
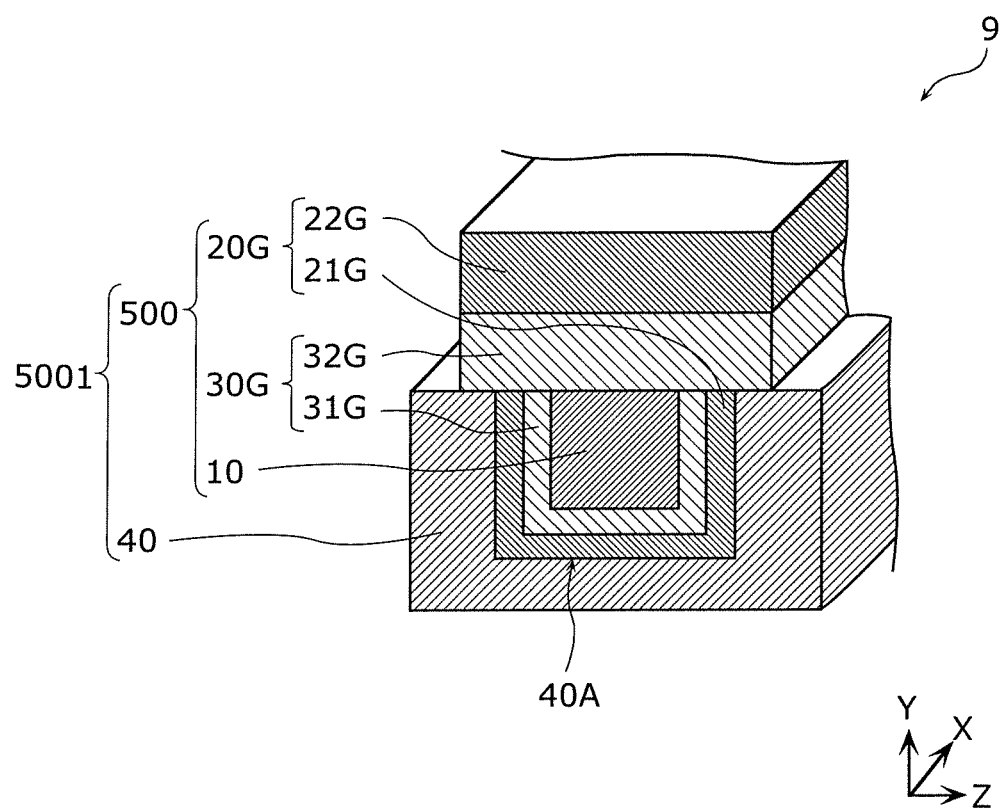

FIG. 35 is a perspective view showing a configuration of evaluation device 9 according to Embodiment 5.

As shown in FIG. 35, evaluation device 9 includes interconnect structure 5001. Interconnect structure 5001 includes interconnect passage 500. Interconnect passage 500 has a linear shape like interconnect passage 100 according to Embodiment 1 described above.

Interconnect structure 5001 includes interconnect layer 10, solid electrolyte layer 30G, electrode 20G, and insulating layer 40. Solid electrolyte layer 30G covers at least a part of interconnect layer 10. Electrode 20G is opposite to interconnect layer 10 with solid electrolyte layer 30G interposed therebetween. Insulating layer 40 has recess 40A.

In this embodiment as well, interconnect structure 5001 is interconnect passage 500 itself. Specifically, interconnect passage 500 includes interconnect layer 10, electrode 20G, and solid electrolyte layer 30G.

Evaluation device 9 is configured as follows. Through application of voltages to interconnect layer 10 and electrode 20G, a voltage is applied to solid electrolyte layer 30G. Specifically, the voltages are applied to interconnect layer 10 and electrode 20G. The potential difference between interconnect layer 10 and electrode 20G causes an electric field which covers solid electrolyte layer 30G. The voltage is then applied to solid electrolyte layer 30G. Accordingly, in the YZ cross section, at least a part of solid electrolyte layer 30G is surround by interconnect layer 10 and at least a part of electrode 20G.

Interconnect layer 10 has a long size extending in a direction (i.e., along the X-axis in this embodiment). Interconnect layer 10 is located inside recess 40A of insulating layer 40. Note that interconnect layer 10 has the same or similar configuration as interconnect layer 10 of interconnect structure 1A shown in FIG. 3.

Solid electrolyte layer 30G encloses interconnect layer 10. In this embodiment, solid electrolyte layer 30G includes first solid electrolyte layer 31G and second solid electrolyte layer 32G. First solid electrolyte layer 31G is a lower solid electrolyte layer between interconnect layer 10 and first metal layer 21G. Second solid electrolyte layer 32G is an upper solid electrolyte layer located above first solid electrolyte layer 31G, between interconnect layer 10 and second metal layer 22G.

In a cross-sectional view taken along a YZ cross section, first solid electrolyte layer 31G encloses interconnect layer 10. That is, in the YZ cross section, first solid electrolyte layer 31G only needs to surround at least a part of interconnect layer 10. In this embodiment, first solid electrolyte layer 31G is formed like a groove in recesses 40A of insulating layer 40. Interconnect layer 10 is buried inside groove-like first solid electrolyte layer 31. Note that first solid electrolyte layer 31G has the same or similar configuration as solid electrolyte layer 30 of interconnect structure 2 shown in FIG. 3.

Second solid electrolyte layer 32G is formed on interconnect layer 10. Specifically, second solid electrolyte layer 32G is in contact with the upper surface of interconnect layer 10. In this embodiment, in the YZ cross section, entire interconnect layer 10 is surrounded by first solid electrolyte layer 31G and second solid electrolyte layer 32G. While second solid electrolyte layer 32G has, along the Z-axis, a greater width than each recess 40A, the configuration is not limited thereto.

First solid electrolyte layer 31G and second solid electrolyte layer 32G may be made of the same or similar material as solid electrolyte layer 30 according to Embodiment 1 described above. In this case, first solid electrolyte layer 31G and second solid electrolyte layer 32G are made of the same material in one preferred embodiment but may be made of different materials.

Electrode 20G is an electrode layer for applying voltages to solid electrolyte layer 30G. At least a part of electrode 20G encloses interconnect layer 10. In this embodiment, electrode 20G includes first metal layer 21G that is a lower electrode, and second metal layer 22G that is an upper electrode. Note that first metal layer 21G and second metal layer 22G are physically separated from each other in the YZ cross section shown in FIG. 35. First metal layer 21G and second metal layer 22G may be physically connected together in any cross section other than the YZ cross section shown in FIG. 35.

First metal layer 21G is opposite to interconnect layer 10 with first solid electrolyte layer 31G interposed therebetween. For example, first solid electrolyte layer 31G is interposed bets teen interconnect layer 10 and first metal layer 21G.

Specifically, in a cross-sectional view taken along a YZ cross section, first metal layer 21G encloses interconnect layer 10 and first solid electrolyte layer 31G. That is, in the YZ cross section, first metal layer 21 only needs to surround at least a part of interconnect layer 10 and first solid electrolyte layer 31G. In this embodiment, first metal layer 21G is formed like a groove in recess 40A of insulating layer 40. First solid electrolyte layer 31G is buried between groove-like first metal layer 21G and interconnect layer 10. Note that first metal layer 21G has the same or similar configuration as metal layer 20 of interconnect structure 2 shown in FIG. 3.

Second metal layer 22G is opposite to interconnect layer 10 with second solid electrolyte layer 32G interposed therebetween. For example, second solid electrolyte layer 32G is interposed between interconnect layer 10 and second metal layer 22G.

Specifically, second metal layer 22G is formed on second solid electrolyte layer 32G. In this embodiment, in the YZ cross section, entire interconnect layer 10 is not only covered by first solid electrolyte layer 31G and second solid electrolyte layer 32G but also by first metal layer 21G and second metal layer 22G. While second metal layer 22G has, along the Z-axis, a greater width than each recess 40A, the configuration is not limited thereto. In addition, while second metal layer 22G has, along the Z-axis, a greater width than second solid electrolyte layer 32G, the configuration is not limited thereto.

In FIG. 35, interconnect layer 10, first metal layer 21G, first solid electrolyte layer 31G, and insulating layer 40 have the same or similar configurations as in interconnect structure 2 shown in FIG. 3. Like interconnect structure 2 shown in FIG. 3, insulating layer 40 may be formed on substrate 50. Alternatively, insulating layer 40 may be an insulating substrate itself.

Next, a method of evaluating interconnect structure 5001 will be described with reference to FIG. 35 using evaluation device 9. This method is for evaluating the degree of the reduction in the resistance value.

The method of evaluating interconnect structure 5001 according to this embodiment is as follows. A voltage is applied to solid electrolyte layer 30G of interconnect structure 5001 of evaluation device 9 to measure the resistance value of interconnect layer 10. Accordingly, interconnect structure 5001 is evaluated. In this embodiment, interconnect structure 5001 is evaluated as an interconnect. Specifically, the resistance (i.e., the interconnect resistance) of interconnect structure 5001 is evaluated.

Figure 36:
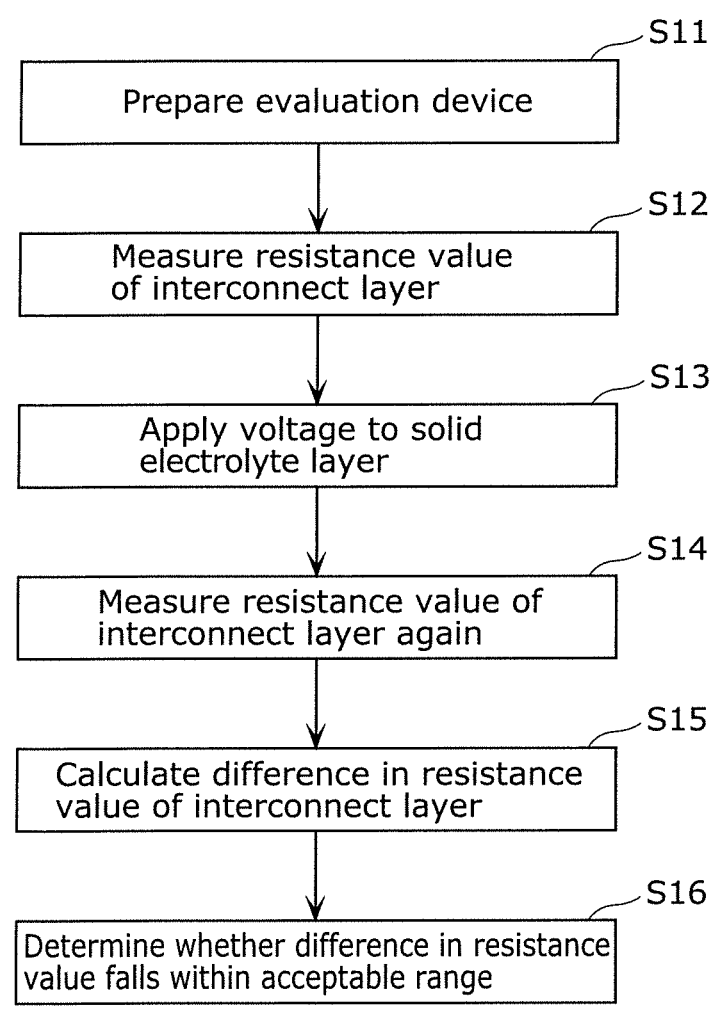
Figure 37:
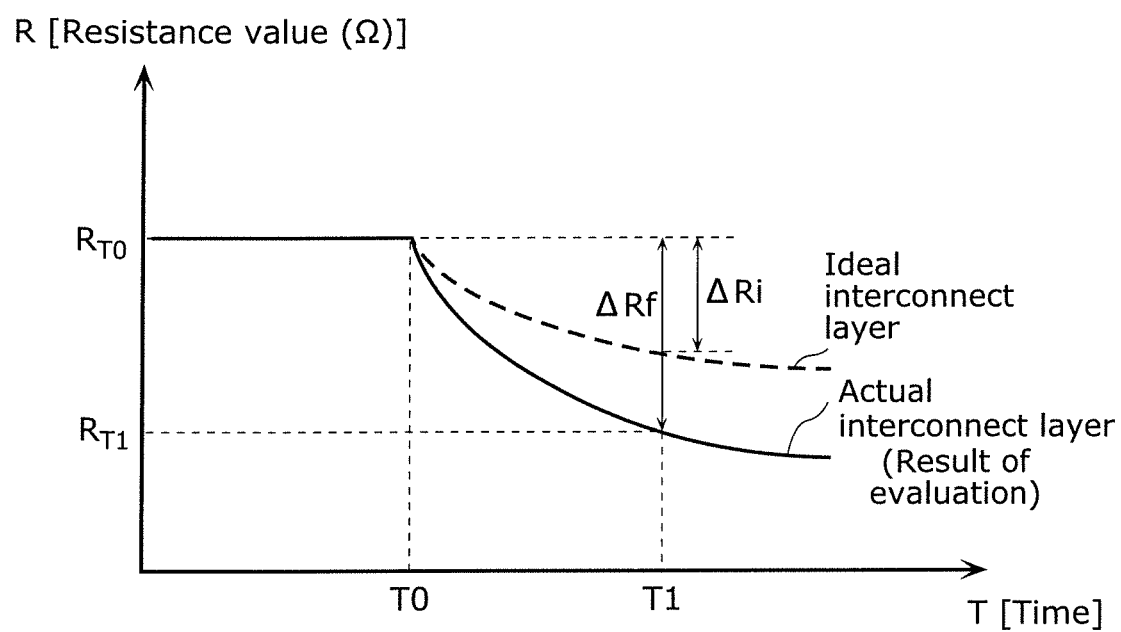

Now, details of the method of evaluating interconnect structure 5001 will be described with reference to FIGS. 36 and 37. FIG. 36 is a flowchart for illustrating the method of evaluating interconnect structure 5001 of evaluation device 9 according to Embodiment 5. FIG. 37 shows a change in the resistance value of interconnect layer 10 of this evaluation device 9 over time.

As shown in FIG. 36, first, evaluation device 9 with interconnect structure 5001 is prepared as an evaluation target device (step S11).

Next, the resistance value of interconnect layer 10 of interconnect structure 5001 is measured as a first resistance value (step S12). At this time, the resistance value (i.e., the first resistance value) of interconnect layer 10 before applying a voltage to solid electrolyte layer 30G is measured.

Then, a voltage is applied to solid electrolyte layer 30G of interconnect structure 5001 (step S13). For example, first voltage V1 is applied to interconnect layer 10, whereas second voltage V2 different from first voltage V1 is applied to electrode 20G. Specifically, second voltage V2 is applied to first metal layer 21G and second metal layer 22G of electrode 20G. If first metal layer 21G and second metal layer 22G are electrically or physically connected to each other, second voltage V2 only needs to be applied to any one of first metal layer 21G and second metal layer 22G.

In this manner, first voltage V1 is applied to interconnect layer 10, and second voltage V2 is applied to electrode 20G. Accordingly, voltage V corresponding to the potential difference (i.e., V1−V2) between first voltage V1 and second voltage V2 is applied to solid electrolyte layer 30G. In this embodiment, first solid electrolyte layer 31G and second solid electrolyte layer 32G surround entire interconnect layer 10. First voltage V1 is applied to interconnect layer 10, whereas second voltage V2 is applied to electrode 20G. Accordingly, voltage V is applied to each of first solid electrolyte layer 31G and second solid electrolyte layer 32G.

At this time, as shown in FIG. 37, assume that voltage V starts being applied to solid electrolyte layer 30G at time T0. The resistance value (i.e., the initial resistance value) of interconnect layer 10 at time T0 is resistance value $R_{T0}$. That is, the first resistance value of interconnect layer 10 measured in step S13 before applying voltage V to solid electrolyte layer 30G is resistance value $R_{T0}$.

As described above, upon application of voltage V (i.e., V1−V2) to solid electrolyte layer 30G, the resistance value of interconnect layer 10 decreases under the principle described with reference to FIGS. 2A and 2B. For example, as represented by the solid curve in FIG. 37, resistance value R(T) of interconnect layer 10 gradually decreases with time.

Next, the resistance value of interconnect layer 10 of interconnect structure 5001 is measured again as a second resistance value (step S14). For example, as shown in FIG. 37, resistance value $R_{T1}$ of interconnect layer 10 is measured as the second resistance value of interconnect layer 10 at any time T1.

Note that the second resistance value of interconnect layer 10 may be measured before or after the resistance value of interconnect layer 10 has decreased completely. Thus, the time difference between times T0 and T1 is not limited to the order of seconds, and may be the order of milliseconds, microseconds, or nanoseconds, as long as the resistance value of interconnect layer 10 varies even slightly.

Then, the difference between the first resistance value of interconnect layer 10 measured in step S11 and the second resistance value of interconnect layer 10 measured in step S14 is calculated (step S15). That is, the amount of the change (i.e., the difference) in the resistance value of interconnect layer 10 before and after applying a voltage to solid electrolyte layer 30G is calculated.

Specifically, as shown in FIG. 37, resistance value ΔRf that is the difference between resistance value (i.e., first resistance value) $R_{T0}$ of interconnect layer 10 at time T0 and resistance value (i.e., second resistance value) $R_{T1}$ of interconnect layer 10 at time T1 is calculated.

After that, whether the difference obtained in step S15 falls within the acceptable range is determined to evaluate interconnect structure 5001.

For example, depending on whether the difference (i.e., resistance value ΔRf in FIG. 37) obtained in step S15 falls within a specification, whether interconnect structure 5001 can be, as an interconnect, treated as an acceptable product can be evaluated.

Alternatively, as shown in FIG. 37, data on a resistance value of ideal interconnect layer 10 is prepared in advance. Based on resistance value ΔRi that is the difference in the resistance value of ideal interconnect layer 10 between times T1 and T0, the following two may be compared. One is the difference (resistance value ΔRf) in the resistance value of actual interconnect layer 10 between times T1 and T0. The other is the difference (resistance value ΔRi) in the resistance value of interconnect layer 10 employing an ideal interconnect layer. Whether interconnect structure 5001 can be, as an interconnect, treated as an acceptable product may be evaluated. For example, the amount of the difference between the difference (resistance value ΔRf) of the resistance value of actual interconnect layer 10 and the difference (resistance value ΔRi) in the resistance value of interconnect layer 10 employing ideal interconnect layer. Interconnect structure 5001 may be evaluated based on whether the amount of the difference falls within a specified value.

Figure 38A:
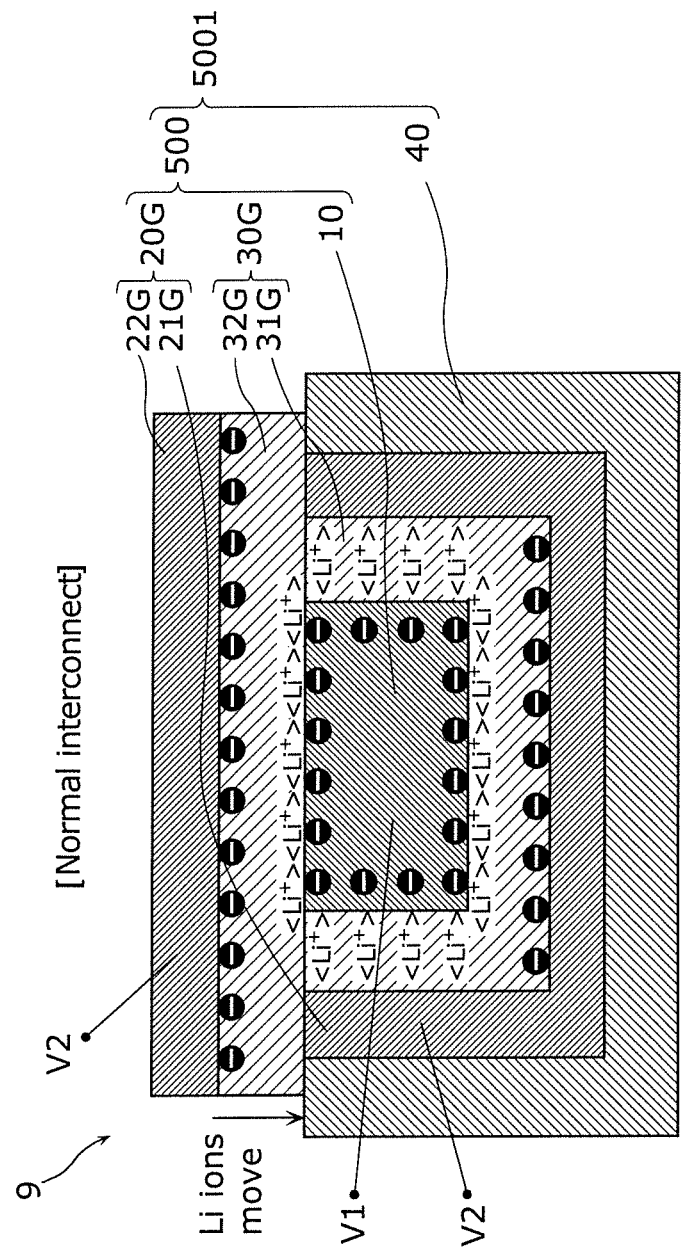
Figure 38B:
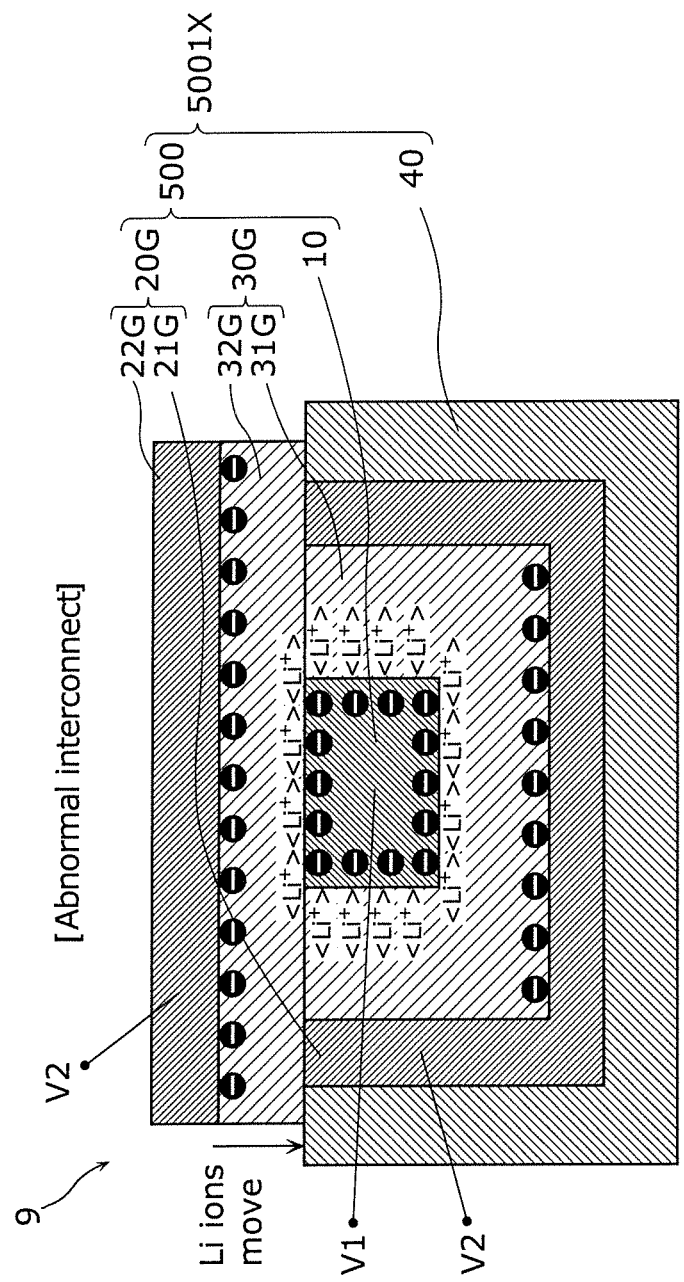

Causes for a difference in the degree of the reduction in the resistance value of interconnect layer 10 of interconnect structure 5001 will be described with reference to FIGS. 38A and 38B under the principle (or mechanism) of reduction in the resistance value of interconnect layer 10. FIG. 38A shows an example of normal interconnect structure (i.e., normal interconnect) 5001. FIG. 38B shows an example of abnormal interconnect structure (i.e., abnormal interconnect) 5001X in contrast to the normal interconnect. FIG. 38A shows formation of interconnect layer 10 to have a design value within size and manufacturing errors. FIG. 38B shows formation of thinner interconnect layer 10 than the design value over the size and manufacturing errors. That is, interconnect layer 10 has a smaller cross-sectional area in FIG. 38B than in FIG. 38A.

As shown in FIGS. 38A and 38B, first voltage V1 is applied to interconnect layer 10, whereas second voltage V2 is applied to electrode 20G (i.e., first metal layer 21G and second metal layer 22G). A voltage is then applied to solid electrolyte layer 30G. Accordingly, the resistance value of interconnect layer 10 decreases. This principle (or mechanism) is the same as described with reference to FIGS. 2A and 2B.

For example, a cation-conducting (i.e., a p-type) solid electrolyte layer is used as solid electrolyte layer 30G. If first voltage V1 applied to interconnect layer 10 is lower than second voltage V2 applied to electrode 20G (i.e., V1<V2), voltage V (V2−V1) is applied to solid electrolyte layer 30G. Accordingly, as shown in FIGS. 38A and 38B, as in FIG. 2A, lithium ions inside solid electrolyte layer 30G move toward interconnect layer 10. Specifically, lithium ions of first solid electrolyte layer 31G and second solid electrolyte layer 32G move toward interconnect layer 10. As a result, the electron concentration increases on the entire surface of the periphery of interconnect layer 10 in a cross section A negative charge (i.e., electrons) is inducted on the entire periphery of interconnect layer 10. That is, the negative charge is induced to the entire surface of interconnect layer 10 opposite to first metal layer 21G and second metal layer 22G. Accordingly, the resistance value of interconnect layer 10 decreases.

At this time, interconnect layer 10 of interconnect structure 5001X shown in FIG. 38B is thinner than interconnect layer 10 of interconnect structure 5001 shown in FIG. 38A. Thus, interconnect layer 10 of interconnect structure 5001X has a higher ratio (i.e., a larger induction area) of the induced negative charge to entire interconnect layer 10 than interconnect structure 5001 shown in FIG. 38A. As a result, interconnect layer 10 of interconnect structure 5001X shown in FIG. 38B has a resistance value decreasing at a higher degree than interconnect layer 10 of interconnect structure 5001 shown in FIG. 38A.

Assume that interconnect structure 5001 shown in FIG. 38A is a normal interconnect. In this case, the degree of the reduction in the resistance value of interconnect layer 10 of interconnect structure 5001 shown in FIG. 38A is compared to that of interconnect structure 5001X shown in FIG. 38B. Accordingly, interconnect structure 5001X shown in FIG. 38B can be determined as an abnormal interconnect (i.e., a thinner interconnect in this embodiment).

In this manner, according to the method of evaluating interconnect structure 5001 according to this embodiment using evaluation device 9, a voltage is applied to solid electrolyte layer 30G to reduce the resistance value of interconnect layer 10. Utilizing this phenomenon, interconnect structure 5001 can be evaluated as an interconnect. Specifically, the resistance (i.e., the interconnect resistance) of interconnect structure 5001 can be evaluated.

In this embodiment, thinner interconnect layer 10 has been illustrated as an abnormal interconnect in contrast to the normal interconnect. The configuration is however not limited thereto. For example, the method of evaluating interconnect structure 5001 according to this embodiment is also applicable to thicker interconnect layer 10 as an abnormal interconnect in contrast to the normal interconnect.

In this embodiment, as shown in FIG. 36, electrode 20G including first metal layer 21G and second metal layer 22G has been described. The configuration is not limited thereto. For example, like evaluation device 9A and interconnect structure 5001A shown in FIG. 39, electrode 20H includes no first metal layer 21G as a lower electrode and includes only second metal layer 22G as an upper electrode. That is, evaluation device 9 and interconnect structure 5001 shown in FIG. 38A include first metal layer 21G in the recess of insulating layer 40. In evaluation device 9A and interconnect structure 5001A shown in FIG. 39, however, no first metal layer 21G is formed in the recess of insulating layer 40.

Figure 39:
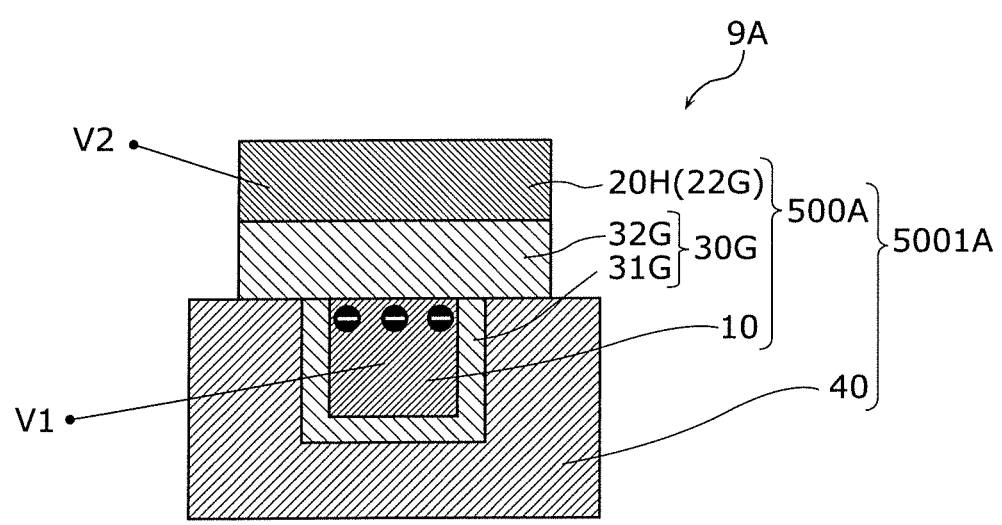

In this case, assume that first voltage V1 is applied to interconnect layer 10 and second voltage G is applied to electrode 20H. The voltage is then applied mainly to second solid electrolyte layer 32G, out of first solid electrolyte layer 31G and second solid electrolyte layer 32G of solid electrolyte layer 30G. As a result, lithium ions inside first solid electrolyte layer 31G hardly move and lithium ions inside second solid electrolyte layer 32G mainly move toward interconnect layer 10. The negative charge is induced only toward second solid electrolyte layer 32G of interconnect layer 10. That is, the negative charge is induced not to the entire peripheral surface of interconnect layer 10 but only to the surface of interconnect layer 10 opposite to second metal layer 22G. In this case as well, the resistance value of interconnect layer 10 decreases. In FIG. 39, interconnect passage 500A includes interconnect layer 10, electrode 20H (i.e., only second metal layer 22G), and solid electrolyte layer 30G.

In this manner, even if no first metal layer 21 is formed, a voltage is applied to solid electrolyte layer 30G to change the resistance value of interconnect layer 10. Accordingly, interconnect structure 5001A can be evaluated.

Figure 40:
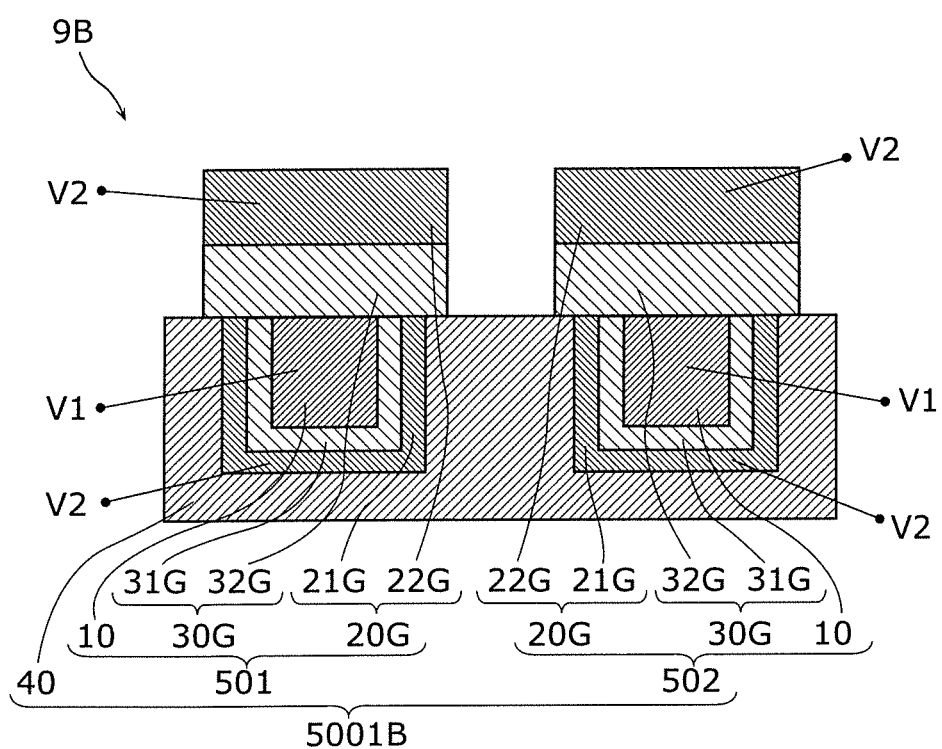

While a case has been described with reference to FIG. 35 where evaluation device 9 includes single interconnect layer 10, the configuration is not limited thereto. For example, as shown in FIG. 40, evaluation device 9B may include a plurality of interconnect layers 10. In this case, at least a plurality of second metal layers 22G may be provided in correspondence to the plurality of interconnect layers 10. Note that evaluation device 9B and interconnect structure 5001B shown in FIG. 40 include two interconnect layers 10 and two second metal layers 22G.

Specifically, evaluation device 9B and interconnect structure 5001B include first interconnect passage 501 and second interconnect passage 502. First interconnect passage 501 is composed of single interconnect layer 10, electrode 20G, and solid electrolyte layer 30G, whereas second interconnect passage 502 is composed of single interconnect layer 10, electrode 20G, and solid electrolyte layer 30G. First interconnect passage 501 and second interconnect passage 502 are arranged in parallel to each other. That is, interconnect layer 10 of first interconnect passage 501 and interconnect layer 10 of second interconnect passage 502 are arranged in parallel to each other. Note that first interconnect passage 501 and second interconnect passage 502 have the same configuration but may have different configurations.

In this manner, interconnect structure 5001B in evaluation device 9B including the plurality of interconnect layers 10 can also be evaluated by the same evaluation method as in FIG. 36. That is, voltages are applied to solid electrolyte layers 30G corresponding to the plurality of interconnect layers 10 to evaluate interconnect structure 5001B.

Next, an evaluation method of evaluating a resistance value (e.g., an absolute value) will be described.

Having been described above as evaluation devices that are used only for the evaluation, evaluation devices 9, 9A, and 9B shown in FIGS. 35, 39, and 40 may be manufactured as actual products.

For example, assume that evaluation device 9 is manufactured as an actual product. The method of evaluating interconnect structure 5001 shown in FIG. 41 may serve as a method of evaluating a device with interconnect structure 5001 as an actual product. As shown in FIG. 41, the method of evaluating an actual product is as follows. An actual product is prepared as an evaluation target (S11). A voltage is applied to solid electrolyte layer 30G (S13). The resistance value of interconnect layer 10 is measured (S14). Whether the resistance value (i.e., the absolute value) falls within the acceptable range is determined (S16). Accordingly, a wafer with interconnect structure 5001 is evaluated as an actual product device.

This also applies to evaluation devices 9A and 9B. For example, as shown in FIG. 9B, the evaluation devices including the plurality of interconnect passages can be evaluated as an actual product device (e.g., a wafer.

In this case, evaluated by the following method is a device including first interconnect passage 501 and second interconnect 502 as the plurality of interconnect passages like evaluation device 9B shown in FIG. 40. Voltages are applied to the plurality of solid electrolyte layers 30. The resistance values of the plurality of interconnect layers 10 are measured to determine whether first interconnect passage 501 and second interconnect passage 502 fall within the specification. Accordingly, the device is evaluated.

As a result, a highly reliable device can be obtained which includes the plurality of interconnect passages whose resistances (i.e., the interconnect resistances) less differ from each other. For example, in FIG. 42, (a) shows, as a normal interconnect, interconnect passage 500 with a design value within size and manufacturing errors. In FIG. 42, (b) shows, as an abnormal interconnect, thinner interconnect passage 500 than the design value over the size and manufacturing errors. Assume that a device including, out of a plurality of interconnect passages 500, an excessive number of abnormal interconnects shown in (b) of FIG. 42. In this case, the device is treated as a defective product. Accordingly, a device can be obtained which includes a plurality of interconnect passages whose resistances (i.e., interconnect resistances) less differ from each other.

Now, a specific method of evaluating a device including a plurality of interconnect passages will be described with reference to FIGS. 43 and 44. FIG. 43 is a flowchart for illustrating the method of evaluating a device according to Embodiment 5, FIG. 44 shows changes in the resistance values of interconnect layers 10 of two interconnect passages of this device over time. Note that a method will be described below where evaluation device 9B shown in FIG. 40 is used as an actual product device. That is, this device includes first interconnect passage 501 and second interconnect passage 502 as a plurality of interconnect passages.

As shown in FIG. 43, first, a device including a plurality of interconnect passages is prepared as an evaluation target device (step S21). For example, a device with the same configuration as evaluation device 9B including first and second interconnect passages 501 and 502 is prepared as the device including a plurality of interconnect passages.

Next, the resistance values of interconnect layers 10 of first interconnect passage 501 and second interconnect passage 502 are measured as first resistance values (step S22). At this time, the resistance values (i.e., the first resistance values) of interconnect layers 10 are measured before applying voltages to solid electrolyte layer 30G of first interconnect passage 501 and second interconnect passage 502. Here, a case will be described where first resistance values of interconnect layers 10 are measured. Since the second resistance values are more important in an actual product, this step S22 may be omitted and only step S23 may be executed which applies voltages to solid electrolyte layers 30G.

Then, voltages are applied to solid electrolyte layers 30G of first interconnect passage 501 and second interconnect passage 502 (step S23).

For example, in each of first interconnect passage 501 and second interconnect passage 502, first voltage V1 is applied to interconnect layer 10, and second voltage V2 different from first voltage V1 is applied to electrode 20G (specifically, first metal layer 21G and second metal layer 22G). Accordingly, in each of first interconnect passage 501 and second interconnect passage 502, voltage V corresponding to the potential difference (i.e., V1–V2) between first voltage V1 and second voltage V2 is applied to solid electrolyte layer 30G. That is, voltage V is applied to each of first solid electrolyte layer 31G and second solid electrolyte layer 32G.

At this time, as shown in FIG. 44, assume that voltages V start being applied to solid electrolyte layers 30G at time T0. The resistance values (i.e., the initial resistance values) of interconnect layers 10 of first interconnect passage 501 and second interconnect passage 502 at time T0 are resistance value $R1_{T0}$ and resistance value $R2_{T0}$, respectively. In FIG. 44, first interconnect passage 501 with initial resistance value $R1_{T0}$ corresponds to interconnect passage 500 that is the normal interconnect shown in (a) of FIG. 42, for example. On the other hand, second interconnect passage 502 with initial resistance value $R2_{T0}$ corresponds to interconnect passage 500 that is the abnormal interconnect shown in (b) of FIG. 42, for example.

As described above, upon application of voltage V (i.e., V1–V2) to solid electrolyte layers 30G, resistance values R(T) of interconnect layers 10 of first interconnect passage 501 and second interconnect passage 502 gradually decrease over time under the principle described with reference to FIGS. 2A and 2B. For example, as in FIG. 44, curves are obtained which indicate the changes in the resistance values of interconnect layers 10 of first interconnect passage 501 and second interconnect passage 502.

Now, the resistance values of interconnect layers 10 of first interconnect passage 501 and second interconnect passage 502 are measured again as the second resistance values (step S24). For example, as shown in FIG. 44, the resistance values of interconnect layers 10 are measured as the second resistance values of interconnect layers 10 of first interconnect passage 501 and second interconnect passage 502 at any time T1. The resistance values (i.e., the second resistance values) of interconnect layers 10 of first interconnect passage 501 and second interconnect passage 502 at time T1 are resistance value $R1_{T1}$ and resistance value $R2_{T2}$, respectively.

Then, whether any of first interconnect passage 501 and second interconnect passage 502 is an interconnect passage out of the specification is determined based on the resistance values measured in step S24 after applying the voltages (step S25).

As a result, if none of first interconnect passage 501 and second interconnect passage 502 is an interconnect passage out of the specification (No in step S25), the evaluation target device is determined as an acceptable product. For example, if none of the resistance values of first interconnect passage 501 and second interconnect passage 502 measured in step S24 falls out of the acceptable range, the evaluation target device is determined as an acceptable product.

On the other hand, if any of first interconnect passage 501 and second interconnect passage 502 is an interconnect passage out of the specification (Yes in step S25), the evaluation target device is determined as a defective product. For example, if the resistance value of any one of first interconnect passage 501 and second interconnect passage 502 measured in step S24 falls out of the acceptable range, the evaluation target device is determined as a defective product.

Note that interconnect layer 10 is thinner than the design value like interconnect passage 500 that is the abnormal interconnect shown in (b) of FIG. 42. The resistance value of interconnect layer 10 increases (see R2(T) of second interconnect passage 502 in FIG. 44). As shown in FIG. 44, through application of a voltage to solid electrolyte layer 30G, there becomes no difference in the resistance from interconnect layer 10 of the normal interconnect (see R1(T) of first interconnect passage 501 in FIG. 44). The resistance value of interconnect layer 10 falls within the acceptable range. Then, the interconnect can be treated as a normal interconnect. That is, even a device treated as a defective product including an abnormal interconnect before applying a voltage to solid electrolyte layer 30G can be treated as a device that is an acceptable product, if the abnormal interconnects are reduced or eliminated by applying the voltages to solid electrolyte layers 30G.

In this embodiment, the method of evaluating an interconnect structure is implemented as a method of evaluating an actual product device with an interconnect structure, or a method of evaluating an actual product device including a plurality of interconnect passages. In this case, the method of evaluating an actual product device may be implemented as a method of driving an actual product device.

In this case, the method of driving the device including the plurality of interconnect passages is as follows. Voltages are applied to the plurality of solid electrolyte layers 30G to measure the plurality of resistance values of interconnect layers 10. Whether the plurality of interconnect passages fall within a predetermined specification is determined. If the plurality of interconnect passages are determined as falling within the specification, the device is driven.

For example, in the method of evaluating an actual product device including the plurality of interconnect passages, the device may be driven after the lapse of time T1. In one preferred embodiment, the device may be driven when the resistance value is substantially equal to the resistance value of ideal interconnect layer 10 according to the data.

Assume that a device includes, out of interconnect layers 10 of a plurality of interconnect passages, any interconnect layer 10 not finished with a design value, that is, out of the design value. In the device, a voltage is applied to solid electrolyte layer 30G to change the resistance value of this interconnect layer 10 of the interconnect passage. If the plurality of interconnect passages are determined as falling within the specification, the device is driven. Accordingly, the device can be obtained which includes the plurality of interconnect passages whose resistance values less differ from each other. As a result, the device is not determined as a defective product but can be treated as an acceptable product.

Other Variations

The interconnect structures and the semiconductor devices, for example, according to the present disclosure have been described above based on the embodiments and variations. The present disclosure is however not limited thereto.

For example, in each of the interconnect structures according to the embodiments described above, the interconnect layer(s) extends in the direction like a straight line. The configuration is not limited thereto. The layer(s) may extend as a curve(s).

In Embodiment 1 described above, first resist 71, second resist 72, third resist 73, fourth resist 74, and fifth resist 75 are made of organic materials. The materials are not limited thereto. For example, first resist 71, second resist 72, third resist 73, fourth resist 74, and fifth resist 75 may be made of inorganic materials.

In Embodiment 5 described above, the evaluation device with the interconnect structure has been described as a device manufactured as an actual product. The devices with the interconnect structures according to Embodiments 1 to 4 described above may be used as evaluation devices.

An example has been described above in the embodiments where the interconnect structure and the evaluation device include, as the plurality of interconnect passages, two interconnect passages. The configuration is not limited thereto. The interconnect structure and the evaluation device may include three or more interconnect passages. For example, the interconnect structure and the evaluation device may include tens, hundreds or more interconnect passages at a wafer level.

The present disclosure includes other embodiments, such as those obtained by variously modifying the embodiments and variations as conceived by those skilled in the art or those achieved by freely combining the constituent elements and functions in the embodiments and variations without departing from the scope and spirit of the present disclosure.

INDUSTRIAL APPLICABILITY

The present disclosure is applicable to various devices, with an interconnect structure, including semiconductor devices such as semiconductor integrated circuit devices.

The invention claimed is:
1. A semiconductor device, comprising:
a substrate;
a transistor;
an interconnect structure; and
an interlayer insulating layer,
wherein the interconnect structure further includes:
    a first interconnect layer containing a metal element as a main component and extending in a direction;
    a metal layer opposite to the first interconnect layer; and
    a single solid electrolyte layer between the first interconnect layer and the metal layer, the single solid electrolyte layer enclosing the first interconnect layer at least in a cross-sectional view taken along a plane orthogonal to the direction,
wherein:
the first interconnect layer and the metal layer are electrically insulated from each other by the single solid electrolyte layer;
the interlayer insulating layer includes a second interconnect layer;
the second interconnect layer has a larger line width than the first interconnect layer and is made of a different material from the first interconnect layer;
the transistor is in the substrate; and
the interconnect structure is above the substrate; and
the interlayer insulating layer is above the interconnect structure.
2. The semiconductor device according to claim 1, wherein:
in the cross-sectional view, the first interconnect layer has a pair of side surfaces opposite to each other and a bottom surface; and
both the metal layer and the single solid electrolyte layer are opposite to each of the pair of side surfaces and the bottom surface.
3. The semiconductor device according to claim 1, wherein
in the cross-sectional view, the first interconnect layer has a circular or oval shape.
4. The semiconductor device according to claim 3, wherein
the first interconnect layer serves as a columnar contact plug.
5. The semiconductor device according to claim 1, wherein:
in the cross-sectional view, an entire periphery of the first interconnect layer is covered by the single solid electrolyte layer; and
in the cross-sectional view, an entire periphery of the single solid electrolyte layer is covered by the metal layer.
6. The semiconductor device according to claim 1, wherein, in the cross-sectional view:
an entire periphery of the first interconnect layer is covered by a first insulating layer;
an entire periphery of the first insulating layer is covered by the single solid electrolyte layer; and an entire periphery of the single solid electrolyte layer is covered by the metal layer.

7. The semiconductor device according to claim 1, wherein, in the cross-sectional view:
an entire periphery of the first interconnect layer is covered by the single solid electrolyte layer;
an entire periphery of the single solid electrolyte layer is covered by a second insulating layer; and
an entire periphery of the second insulating layer is covered by the metal layer.

8. The semiconductor device according to claim 1, wherein, in the cross-sectional view:
an entire periphery of the first interconnect layer is covered by a first insulating layer;
an entire periphery of the first insulating layer is covered by the single solid electrolyte layer;
an entire periphery of the single solid electrolyte layer is covered by a second insulating layer; and
an entire periphery of the second insulating layer is covered by the metal layer.

9. The semiconductor device according to claim 1, further comprising:
an insulating layer covering an outer periphery of the metal layer.

10. The semiconductor device according to claim 1, wherein
in the cross-sectional view, a ratio of a thickness of the single solid electrolyte layer to a thickness of the first interconnect layer is higher than ¼.

11. The semiconductor device according to claim 1, wherein
in the cross-sectional view, a sum of a thickness of the single solid electrolyte layer and a thickness of the first interconnect layer is 20 nm or less.

12. The semiconductor device according to claim 1, wherein
in the cross-sectional view, the first interconnect layer has a width of 10 nm or less.

13. The semiconductor device according to claim 1, wherein
in the cross-sectional view, the single solid electrolyte layer has a width of 5 nm or more.

14. The semiconductor device according to claim 1, wherein
the interconnect structure is configured such that, upon application of a voltage to the single solid electrolyte layer, a lithium ion moves inside the single solid electrolyte layer.

15. The semiconductor device according to claim 1, wherein
the interconnect structure is configured such that, upon application of a voltage to the single solid electrolyte layer, an oxygen ion moves inside the single solid electrolyte layer.

16. The semiconductor device according to claim 1, wherein
the single solid electrolyte layer is made of at least one material selected from the group consisting of lithium phosphorus oxynitride and magnesium phosphorous oxynitride.

17. The semiconductor device according to claim 1, wherein:
the first interconnect layer is made of a material containing cobalt; and
the single solid electrolyte layer is made of a material containing lithium phosphorus oxynitride.

18. The semiconductor device according to claim 1, wherein
the single solid electrolyte layer includes an electrolyte including conductive ions.

* * * * *